US011702550B2

(12) United States Patent
Kang et al.

(10) Patent No.: US 11,702,550 B2
(45) Date of Patent: Jul. 18, 2023

(54) COATING COMPOSITION, ORGANIC LIGHT-EMITTING DIODE USING SAME, AND METHOD FOR PREPARING SAME

(71) Applicant: LG Chem, Ltd., Seoul (KR)

(72) Inventors: Sungkyoung Kang, Daejeon (KR); Hyeonah Shin, Daejeon (KR); Kwanghyun Kim, Daejeon (KR); Youngju Park, Daejeon (KR); Hwakyung Kim, Daejeon (KR); Hyungil Park, Daejeon (KR); Jaesoon Bae, Daejeon (KR); Jaechol Lee, Daejeon (KR); Ho Gyu Lee, Daejeon (KR); Seog Jae Seo, Daejeon (KR)

(73) Assignee: LG Chem, Ltd.

( * ) Notice: Subject to any disclaimer, the term of this patent is extended or adjusted under 35 U.S.C. 154(b) by 509 days.

(21) Appl. No.: 16/649,450

(22) PCT Filed: May 30, 2019

(86) PCT No.: PCT/KR2019/006509
§ 371 (c)(1),
(2) Date: Mar. 20, 2020

(87) PCT Pub. No.: WO2019/231257
PCT Pub. Date: Dec. 5, 2019

(65) Prior Publication Data

US 2020/0277502 A1 Sep. 3, 2020

(30) Foreign Application Priority Data

May 30, 2018 (KR) ........................ 10-2018-0061817

(51) Int. Cl.
*C09D 4/06* (2006.01)
*H10K 85/60* (2023.01)
(Continued)

(52) U.S. Cl.
CPC ............ *C09D 4/06* (2013.01); *H10K 85/615* (2023.02); *H10K 85/633* (2023.02);
(Continued)

(58) Field of Classification Search
CPC ........................................................ C09D 4/06
See application file for complete search history.

(56) References Cited

U.S. PATENT DOCUMENTS

2005/0186106 A1 8/2005 Li et al.
2012/0001127 A1 1/2012 Brown et al.
(Continued)

FOREIGN PATENT DOCUMENTS

CN 105733562 A 7/2016
EP 0710663 A1 5/1996
(Continued)

OTHER PUBLICATIONS

Extended European Search Report for Application No. EP19810354 dated Dec. 21, 2020.
(Continued)

*Primary Examiner* — William D Young
(74) *Attorney, Agent, or Firm* — Lerner David LLP

(57) ABSTRACT

A coating composition, an organic light emitting device using the same, and a method for manufacturing the same are disclosed herein. In some embodiments, a coating composition including a compound represented by Formula 1 and a compound represented by Formula 2. In some embodiments, an organic light emitting device includes a first electrode, a second electrode, and an organic material layer having one or more layers provided between the first electrode and the second electrode, wherein the one or more layers comprise the coating composition or a cured product thereof.

10 Claims, 1 Drawing Sheet

(51) Int. Cl.
*H10K 50/15* (2023.01)
*H10K 50/17* (2023.01)

(52) U.S. Cl.
CPC .......... *H10K 85/653* (2023.02); *H10K 50/15* (2023.02); *H10K 50/17* (2023.02)

(56) References Cited

U.S. PATENT DOCUMENTS

| | | | | |
|---|---|---|---|---|
| 2015/0094437 A1* | 4/2015 | Caille | H01L 51/0072 548/440 |
| 2019/0019956 A1* | 1/2019 | Gorohmaru | H01L 51/5084 |
| 2020/0277502 A1 | 9/2020 | Kang et al. | |

FOREIGN PATENT DOCUMENTS

| | | | |
|---|---|---|---|
| EP | 2610240 | A1 | 7/2013 |
| EP | 3514140 | A1 | 7/2019 |
| EP | 3670610 | A1 | 6/2020 |
| JP | H08127611 | A | 5/1996 |
| JP | H11286491 | A | 10/1999 |
| JP | 2000178281 | A | 6/2000 |
| JP | 2005243300 | A | 9/2005 |
| JP | 2013536570 | A | 9/2013 |
| JP | 2015511215 | A | 4/2015 |
| JP | 2018065873 | A | 4/2018 |
| KR | 20090117078 | A | 11/2009 |
| KR | 20120112277 | A | 10/2012 |
| KR | 20140107594 | A | 9/2014 |
| KR | 20140132562 | A | 11/2014 |
| KR | 20150093995 | A | 8/2015 |
| KR | 20160041124 | A | 4/2016 |
| KR | 20160116219 | A | 10/2016 |
| KR | 20190136999 | A | 12/2019 |
| WO | 2017164268 | A1 | 9/2017 |
| WO | 2018065357 | A1 | 4/2018 |

OTHER PUBLICATIONS

International Search Report from Application No. PCT/KR2019/006509 dated Sep. 11, 2019, 2 pages.

* cited by examiner

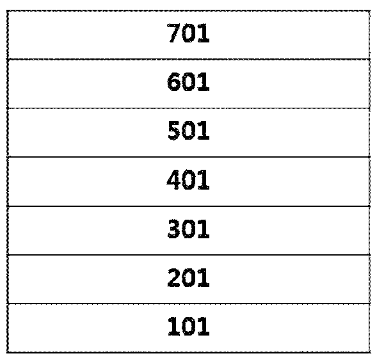
701
601
501
401
301
201
101

COATING COMPOSITION, ORGANIC LIGHT-EMITTING DIODE USING SAME, AND METHOD FOR PREPARING SAME

CROSS-REFERENCE TO RELATED APPLICATION(S)

The present application is a national phase entry under 35 U.S.C. § 371 of International Application No. PCT/KR2019/006509, filed on May 30, 2019, which claims priority from Korean Patent Application No. 10-2018-0061817, filed on May 30, 2018, the contents of which are incorporated by reference herein.

TECHNICAL FIELD

The present specification relates to a coating composition, an organic light emitting device formed using the coating composition, and a method for manufacturing the same.

BACKGROUND ART

An organic light emission phenomenon is one of the examples of converting an electric current into visible rays through an internal process of a specific organic molecule. The principle of the organic light emission phenomenon is as follows. When an organic material layer is disposed between an anode and a cathode and an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic light emitting device using this principle may be generally composed of a cathode, an anode, and an organic material layer disposed therebetween, for example, an organic material layer including a hole injection layer, a hole transport layer, a light emitting layer, and an electron transport layer.

The materials used in the organic light emitting device are mostly pure organic materials or complex compounds in which organic materials and metals form a complex, and may be classified into a hole injection material, a hole transport material, a light emitting material, an electron transport material, an electron injection material, and the like according to the use thereof. Here, an organic material having a p-type property, that is, an organic material, which is easily oxidized and electrochemically stable when the material is oxidized, is usually used as the hole injection material or the hole transport material. Meanwhile, an organic material having an n-type property, that is, an organic material, which is easily reduced and electrochemically stable when the material is reduced, is usually used as the electron injection material or the electron transport material. As the light emitting layer material, a material having both p-type and n-type properties, that is, a material, which is stable in both the oxidation and reduction states, is preferred, and when an exciton is formed, a material having high light emitting efficiency for converting the exciton into light is preferred.

In order to obtain a high-efficiency organic light emitting device which is capable of being driven at low voltage, holes or electrons injected into the organic light emitting device need to be smoothly transferred to a light emitting layer, and simultaneously, the injected holes and electrons need not go out of the light emitting layer. For this purpose, the materials used in the organic light emitting device need to have an appropriate band gap and HOMO or LUMO energy levels.

In addition, the materials used in the organic light emitting device need to have excellent chemical stability, excellent charge mobility, excellent interface characteristics with electrodes or adjacent layers, and the like. That is, the materials used in the organic light emitting device need to be minimally deformed by moisture or oxygen. Further, the material used in the organic light emitting device needs to have appropriate hole or electron mobility so as to make a balance between densities of holes and electrons in a light emitting layer of the organic light emitting device, thereby maximally forming excitons. Moreover, the material used in the organic light emitting device needs to improve the interface with an electrode including a metal or a metal oxide for the stability of the device.

In addition to those mentioned above, a coating composition used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or easily forms the crystals even though the material forms a solution, it is highly likely that according to the storage period, the concentration gradient of the solution varies or a defective device is formed.

Second, layers in which a solution process is performed need to have resistance to a solvent and a material, which are used during a process of forming other layers, and are required to have excellent current efficiency and an excellent service life characteristic when an organic light emitting device is manufactured.

DETAILED DESCRIPTION OF INVENTION

Technical Problem

An object of the present specification is to provide a fluorene-based compound, which can be used in an organic light emitting device for a solution process, and an organic light emitting device including the same.

Technical Solution

Provided is a coating composition including a compound represented by the following Formula 1 and a compound represented by the following Formula 2.

[Formula 1]

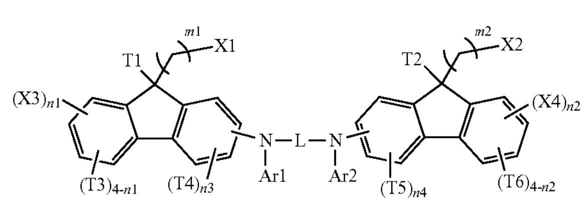

-continued

[Formula 2]

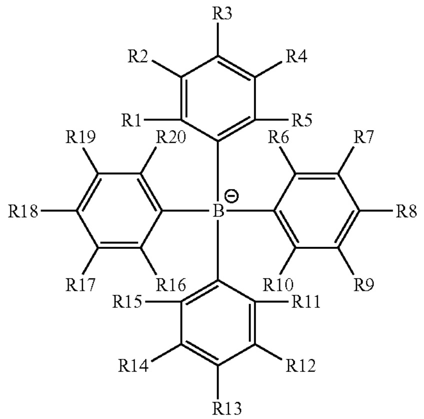

In Formulae 1 and 2,

L is a substituted or unsubstituted arylene group; or a substituted or unsubstituted heteroarylene group, T1 to T6 are the same as or different from each other, and are each independently hydrogen; deuterium; a halogen group; a substituted or unsubstituted alkyl group; a substituted or unsubstituted alkoxy group; a substituted or unsubstituted cycloalkyl group; a substituted or unsubstituted aryl group; or a substituted or unsubstituted heterocyclic group, Ar1 and Ar2 are the same as or different from each other, and are each independently a substituted or unsubstituted aryl group; or a substituted or unsubstituted heterocyclic group, X1 to X4 are the same as or different from each other, and are each independently a photocurable group or a thermosetting group, at least one of R1 to R20 is F, a cyano group, or a substituted or unsubstituted fluoroalkyl group, at least another of R1 to R20 is a photocurable group or a thermosetting group, and the remaining R1 to R20 are the same as or different from each other, and are each independently hydrogen; deuterium; a halogen group; a nitro group; —C(O)$R_{100}$; —O$R_{101}$; —S$R_{102}$; —$SO_3R_{103}$; —COO$R_{104}$; —OC(O) $R_{105}$; —C(O) N$R_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are the same as or different from each other, and are each independently hydrogen; deuterium; or a substituted or unsubstituted alkyl group, n1 and n2 are each independently an integer from 0 to 4, n3 and n4 are each independently an integer from 0 to 3, when n1 to n4 are each 2 or more, each X3, X4, T3, T4, T5, and T6 in the parenthesis of formula 1 are the same as or different from each other, and m1 and m2 are each an integer from 0 to 12.

The present specification also provides an organic light emitting device including: a first electrode; a second electrode; and an organic material layer having one or more layers provided between the first electrode and the second electrode, in which one or more layers of the organic material layer include the above-described coating composition or a cured product thereof.

Finally, the present specification provides a method for manufacturing an organic light emitting device, the method including: preparing a substrate; forming a first electrode on the substrate; forming an organic material layer having one or more layers by depositing the above-described coating composition on the first electrode; and forming a second electrode on the organic material layer.

Advantageous Effects

Since the coating composition of the present invention includes a compound represented by Formula 1 and a compound represented by Formula 2 and the compounds of Formulae 1 and 2 are not crystallized in a solution, a homogenous coating composition may be formed.

Further, when an organic material layer is produced using the coating composition, a stable thin film which is not damaged by the next solution process is formed, and an organic light emitting device including an organic material layer formed using the coating composition has a low driving voltage and excellent service life.

BRIEF DESCRIPTION OF DRAWINGS

FIG. 1 illustrates an example of an organic light emitting device according to an exemplary embodiment of the present specification.

EXPLANATION OF REFERENCE NUMERALS AND SYMBOLS

101: Substrate
201: Anode
301: Hole injection layer
401: Hole transport layer
501: Light emitting layer
601: Layer which simultaneously injects and transports electrons
701: Cathode

BEST MODE

In general, a material for a coating composition for a solution process need not be crystallized in the solution, and needs to have excellent resistance to a solvent/solution of the next solution process so as for an organic material layer formed by the solution process not to be damaged by the next solution process. For the coating composition of the present invention, compounds of Formulae 1 and 2 is not crystallized in the coating composition, so that a homogenous solution may be formed, and an organic material layer formed using the coating composition of the present invention is a stable thin film which is not affected by the next solution process. In addition, an organic light emitting device including an organic material layer formed using the coating composition of the present invention has an excellent service life characteristic.

Hereinafter, the present specification will be described in detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

In the present specification, the term "combination thereof" included in the Markush type expression means a mixed or combined state of two or more selected from the group consisting of constituent elements described in the Markush type expression, and means including one or more selected from the group consisting of the above-described constituent elements.

An exemplary embodiment of the present invention provides a coating composition including a compound represented by the following Formula 1 and a compound represented by the following Formula 2.

[Formula 1]

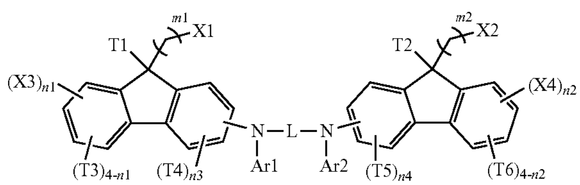

[Formula 2]

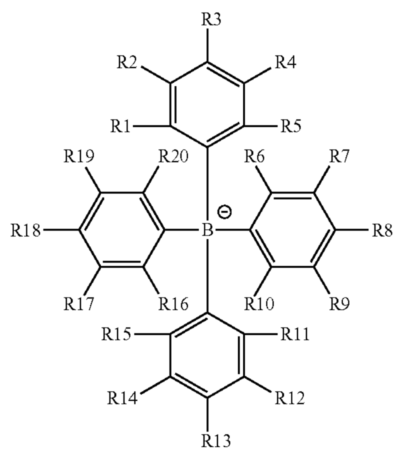

In Formulae 1 and 2,

L is a substituted or unsubstituted arylene group; or a substituted or unsubstituted heteroarylene group, T1 to T6 are the same as or different from each other, and are each independently hydrogen; deuterium; a halogen group; a substituted or unsubstituted alkyl group; a substituted or unsubstituted alkoxy group; a substituted or unsubstituted cycloalkyl group; a substituted or unsubstituted aryl group; or a substituted or unsubstituted heterocyclic group, Ar1 and Ar2 are the same as or different from each other, and are each independently a substituted or unsubstituted aryl group; or a substituted or unsubstituted heterocyclic group, X1 to X4 are the same as or different from each other, and are each independently a photocurable group or a thermosetting group, at least one of R1 to R20 is F, a cyano group, or a substituted or unsubstituted fluoroalkyl group, at least another of R1 to R20 is a photocurable group or a thermosetting group, and the remaining R1 to R20 are the same as or different from each other, and are each independently hydrogen; deuterium; a halogen group; a nitro group; —C(O)$R_{100}$; —$OR_{101}$; —$SR_{102}$; —$SO_3R_{103}$; —$COOR_{104}$; —OC(O) $R_{105}$; —C(O) $NR_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, $R_{100}$ to $R_{107}$ are the same as or different from each other, and are each independently hydrogen; deuterium; or a substituted or unsubstituted alkyl group, n1 and n2 are each independently an integer from 0 to 4, n3 and n4 are each independently an integer from 0 to 3, when n1 to n4 are each 2 or more, substituents in the parenthesis are the same as or different from each other, and m1 and m2 are each an integer from 0 to 12.

In an exemplary embodiment of the present specification, the compound of Formula 1 and the compound of Formula 2 are preferably compounds having solubility to a suitable organic solvent.

In the present specification, "a thermosetting group or a photocurable group" may mean a reactive substituent which cross-links compounds by being exposed to heat or light. The cross-linkage may be produced while radicals produced by decomposing carbon-carbon multiple bonds and cyclic structures by means of a heat treatment or light irradiation are linked to each other.

In an exemplary embodiment of the present specification, the thermosetting group or the photocurable group may be any one selected from the following Group of curing groups, but are not limited thereto.

[Group of Curing Groups]

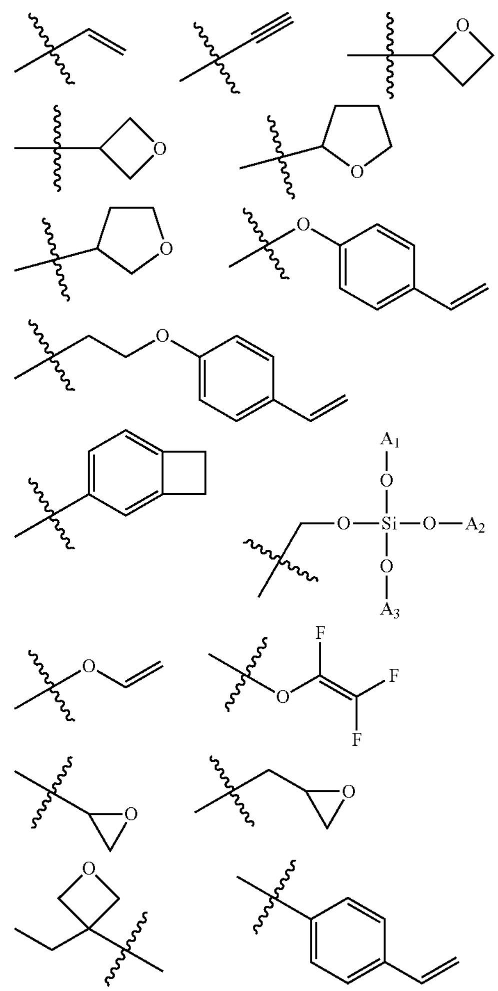

-continued

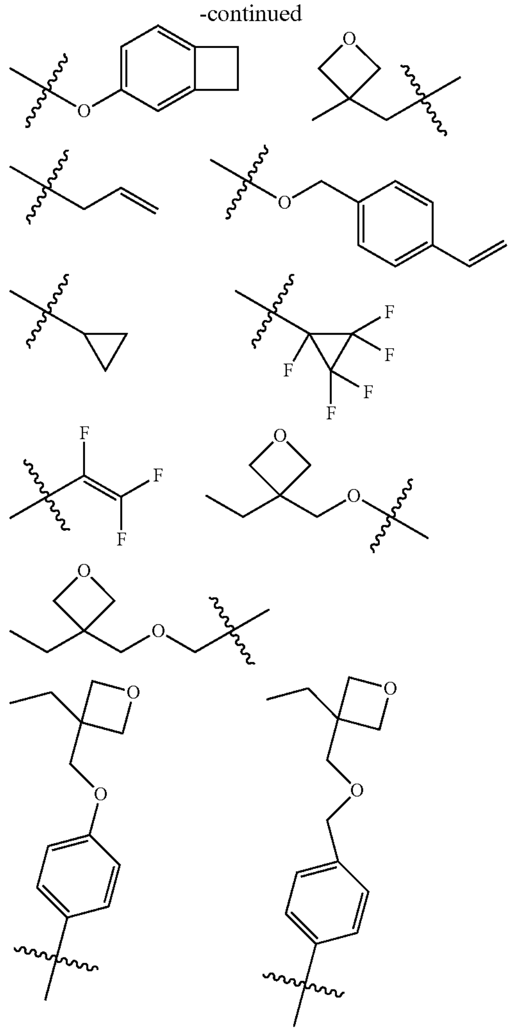

In the structures, $A_1$ to $A_3$ are the same as or different from each other, and are each independently a substituted or unsubstituted alkyl group having 1 to 6 carbon atoms.

Further, when a coating layer is formed using a coating composition including compounds of Formulae 1 and 2, which include a thermosetting group or a photocurable group, the thermosetting group or the photocurable group forms a cross-linkage by heat or light, so that when an additional layer is stacked on the upper portion of the coating layer, it is possible to maintain the coating layer and stack the additional layer on the upper portion thereof by preventing the compounds of Formulae 1 and 2 included in the coating composition from being washed away by a solvent.

Additionally, when the thermosetting group or the photocurable group forms a cross-linkage, so that a coating layer is formed, there is an effect in that chemical resistance of the coating layer to the solvent is enhanced, and the film retention rate is high.

Further, in the case of a coating composition according to an exemplary embodiment of the present specification, an organic light emitting device may be manufactured by a solution application method, thereby implementing a large area of the device.

The compounds of Formulae 1 and 2, in which a cross-linkage is formed by a heat treatment or light irradiation, according to an exemplary embodiment of the present specification have an effect in that the thermal stability is excellent because a plurality of compounds of Formulae 1 and 2 is cross-linked, and thus the cross-linkage is provided in the form of a thin film in the organic light emitting device.

In addition, the compound of Formula 1 according to an exemplary embodiment of the present specification includes an amine structure in the core structure and thus may have an appropriate energy level and bandgap as a hole injection material, a hole transport material or a light emitting material in the organic light emitting device. Furthermore, it is possible to finely adjust an appropriate energy level and bandgap by adjusting a substituent of a compound of Formula 1 according to an exemplary embodiment of the present specification, and to provide an organic light emitting device having a low driving voltage and high light emitting efficiency by improving an interfacial characteristic between the organic materials.

Hereinafter, the substituents of the present specification will be described in detail.

Hydrogen or deuterium may be bonded to a position where a substituent is not bonded to the compound described in the present specification.

In the present specification,

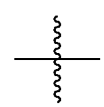

and ------ mean a moiety bonded to another substituent or a bonding portion.

In the present specification, the term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being unsubstituted or substituted with one or more substituents selected from the group consisting of hydrogen; deuterium; a halogen group; a cyano group; a nitro group; a hydroxyl group; an alkyl group; an alkoxy group; an alkenyl group; an alkynyl group; an aryl group; and a heterocyclic group, or being unsubstituted or substituted with a substituent to which two or more substituents among the substituents exemplified above are linked. For example, "the substituent to which two or more substituents are linked" may be a biphenyl group. That is, the biphenyl group may also be an aryl group, and may be interpreted as a substituent to which two phenyl groups are linked.

In the present specification, a halogen group is fluorine; chlorine; bromine; or iodine.

In the present specification, the alkyl group may be straight-chained, branched or cyclic, and the number of carbon atoms thereof is not particularly limited, but is preferably 1 to 40. According to an exemplary embodiment, the number of carbon atoms of the alkyl group is 1 to 20. Specific examples thereof include a methyl group, an ethyl group, a propyl group, an n-propyl group, an isopropyl group, a butyl group, an n-butyl group, an isobutyl group, a tert-butyl group, a sec-butyl group, a pentyl group, an n-pentyl group, an isopentyl group, a tert-pentyl group, a hexyl group, an n-hexyl group, heptyl, an n-heptyl group, a hexyl group, an n-hexyl group, and the like, but are not limited thereto.

In the present specification, a fluoroalkyl group means an alkyl group in which one or more F's are substituted.

In the present specification, the alkoxy group may be straight-chained, branched, or cyclic.

The number of carbon atoms of the alkoxy group is not particularly limited, but is preferably 1 to 20. Specific examples thereof include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, a 2-ethylbutyloxy group, an n-octyloxy group, an n-nonyloxy group, an n-decyloxy group, and the like, but are not limited thereto.

In the present specification, the alkenyl group may be straight-chained or branched, and the number of carbon atoms thereof is not particularly limited, but is preferably 2 to 40. Specific examples thereof include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, and the like, but are not limited thereto.

In the present specification, a silyl group may be represented by a formula of —SiRR'R", and R, R', and R" may be each hydrogen; a substituted or unsubstituted alkyl group; or a substituted or unsubstituted aryl group. Specific examples thereof include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 40. According to another exemplary embodiment, the number of carbon atoms of the cycloalkyl group is 3 to 20. Specific examples thereof include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group, and the like, but are not limited thereto.

In the present specification, the number of carbon atoms of an amine group is not particularly limited, but is preferably 1 to 30. In the amine group, the above-described alkyl group, aryl group, hetero-cyclic group, alkenyl group, cycloalkyl group, combination thereof, and the like may be substituted, and specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, examples of an arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include a monocyclic aryl group, a polycyclic aryl group, or both a monocyclic aryl group and a polycyclic aryl group. For example, the aryl group in the arylamine group may be selected from the above-described examples of the aryl group. Specific examples of the arylamine group include phenylamine, naphthylamine, biphenylamine, anthracenylamine, and the like, but are not limited thereto.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 40. According to an exemplary embodiment, the number of carbon atoms of the aryl group is 6 to 20. Examples of the monocyclic aryl group include a phenyl group, a biphenyl group, a terphenyl group, and the like, but are not limited thereto. Examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the substituent may be

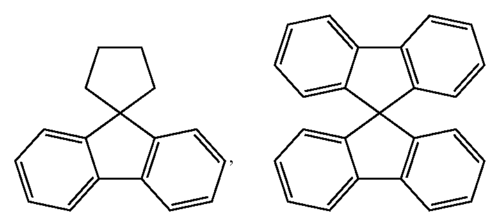

(spirobifluorene),

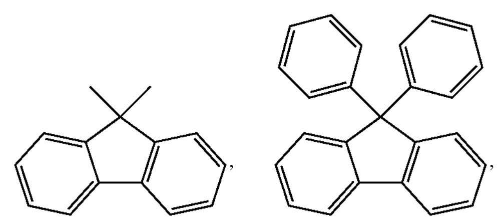

and the like. However, the substituent is not limited thereto.

In the present specification, a heterocyclic group includes one or more atoms other than carbon, that is, one or more heteroatoms, and specifically, the heteroatom may include one or more atoms selected from the group consisting of O, P, Si, N, Se, and S, and the like. The number of carbon atoms thereof is not particularly limited, but is preferably 2 to 60. According to an exemplary embodiment, the number of carbon atoms of the heterocyclic group is 2 to 40. According to an exemplary embodiment, the number of carbon atoms of the heterocyclic group is 2 to 20. The heterocyclic group may be monocyclic or polycyclic. Examples of a heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

The heterocyclic group may be monocyclic or polycyclic, and may be an aromatic ring, an aliphatic ring, or a fused ring of the aromatic ring and the aliphatic ring.

In the present specification, the above-described description on the heterocyclic group may be applied to a heteroaryl group except for an aromatic heteroaryl group.

In the present specification, the arylene group may be selected from the above-described examples of the aryl group, except for a divalent arylene group.

In the present specification, the heteroarylene group may be selected from the above-described examples of the heteroaryl group, except for a divalent heteroarylene group.

In an exemplary embodiment of the present invention, Formula 1 may be represented by the following Formula 1-1.

[Formula 1-1]

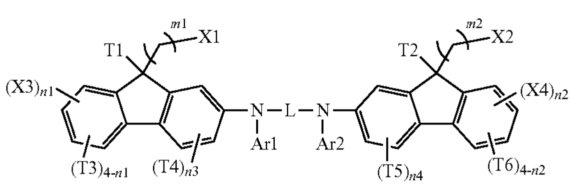

In Formula 1-1, definitions of T1 to T6, X1 to X4, L, Ar1, Ar2, n1 to n4, m1, and m2 are the same as those in Formula 1.

According to an exemplary embodiment of the present invention, T3 to T6 are the same as or different from each other, and are each independently hydrogen; deuterium; a halogen group; a substituted or unsubstituted alkyl group; a substituted or unsubstituted aryl group; or a substituted or unsubstituted heterocyclic group.

According to another exemplary embodiment, T3 to T6 are the same as or different from each other, and are each independently hydrogen; deuterium; a halogen group; a substituted or unsubstituted alkyl group having 1 to 40 carbon atoms; a substituted or unsubstituted aryl group having 6 to −60 carbon atoms; or a substituted or unsubstituted heterocyclic group having 2 to 60 carbon atoms.

In still another exemplary embodiment, T3 to T6 are the same as or different from each other, and are each independently hydrogen; deuterium; a halogen group; or a substituted or unsubstituted alkyl group having 1 to 20 carbon atoms.

In yet another exemplary embodiment, T3 to T6 are the same as or different from each other, and are each independently hydrogen; deuterium; a halogen group; a substituted or unsubstituted methyl group; a substituted or unsubstituted ethyl group; a substituted or unsubstituted propyl group; a substituted or unsubstituted butyl group; a substituted or unsubstituted isobutyl group; a substituted or unsubstituted tert-butyl group; a substituted or unsubstituted pentyl group; or a substituted or unsubstituted hexyl group.

In still yet another exemplary embodiment, T3 to T6 are the same as or different from each other, and are each independently hydrogen; deuterium; a halogen group; a methyl group which is unsubstituted or substituted with a halogen group; an ethyl group which is unsubstituted or substituted with a halogen group; a propyl group which is unsubstituted or substituted with a halogen group; a butyl group which is unsubstituted or substituted with a halogen group; an isobutyl group which is unsubstituted or substituted with a halogen group; a tert-butyl group which is unsubstituted or substituted with a halogen group; a pentyl group which is unsubstituted or substituted with a halogen group; or a hexyl group which is unsubstituted or substituted with a halogen group.

According to a further exemplary embodiment, T3 to T6 are the same as or different from each other, and are each independently hydrogen; deuterium; fluorine; a methyl group which is unsubstituted or substituted with fluorine; an ethyl group; a propyl group; a butyl group; an isobutyl group; a tert-butyl group; a pentyl group; or a hexyl group.

According to an exemplary embodiment of the present invention, T1 and T2 are the same as or different from each other, and are each independently hydrogen; deuterium; a halogen group; a substituted or unsubstituted alkyl group; a substituted or unsubstituted alkoxy group; a substituted or unsubstituted cycloalkyl group; a substituted or unsubstituted aryl group; or a substituted or unsubstituted heterocyclic group.

In another exemplary embodiment, T1 and T2 are the same as or different from each other, and are each independently a substituted or unsubstituted aryl group having 6 to 60 carbon atoms.

According to still another exemplary embodiment, T1 and T2 are the same as or different from each other, and are each independently a substituted or unsubstituted aryl group having 6 to 30 carbon atoms.

In yet another exemplary embodiment, T1 and T2 are the same as or different from each other, and each independently a substituted or unsubstituted phenyl group; or a substituted or unsubstituted naphthyl group.

According to still yet another exemplary embodiment, T1 and T2 are the same as or different from each other, and are each independently a phenyl group which is unsubstituted or substituted with deuterium, fluorine, a methyl group unsubstituted or substituted with fluorine, an ethyl group, a propyl group, a butyl group, a pentyl group, a hexyl group, a phenyl group, a biphenyl group, or a naphthyl group; or a naphthyl group which is unsubstituted or substituted with deuterium, fluorine, a methyl group unsubstituted or substituted with fluorine, an ethyl group, a propyl group, a butyl group, a pentyl group, a hexyl group, a phenyl group, a biphenyl group, or a naphthyl group.

According to a further exemplary embodiment, T1 and T2 are each deuterium; a an aryl group which is unsubstituted or substituted with methyl group or a halogen group.

According to another further exemplary embodiment, T1 and T2 are each a phenyl group; a phenyl group which is disubstituted with a methyl group; a phenyl group which is pentasubstituted with deuterium; or a phenyl group which is pentasubstituted with fluorine.

According to an exemplary embodiment of the present invention, T3 to T6 are each hydrogen.

According to an exemplary embodiment of the present invention, L is a substituted or unsubstituted arylene group; or a substituted or unsubstituted heteroarylene group.

In an exemplary embodiment of the present specification, L is a substituted or unsubstituted arylene group having 6 to 30 carbon atoms; or a substituted or unsubstituted heteroarylene group having 2 to 30 carbon atoms.

In another exemplary embodiment, L is an arylene group having 6 to 30 carbon atoms, which is unsubstituted or substituted with one or more selected from the group consisting of an aryl group having 6 to 30 carbon atoms and an alkyl group having 1 to 20 carbon atoms; or a heteroarylene group having 2 to 30 carbon atoms, which is unsubstituted or substituted with one or more selected from the group consisting of an aryl group having 6 to 30 carbon atoms and an alkyl group having 1 to 20 carbon atoms.

According to still another exemplary embodiment, L may be a substituted or unsubstituted phenylene group; a substituted or unsubstituted divalent biphenyl group; a substituted or unsubstituted terphenylene group; a substituted or unsubstituted fluorenylene group; a substituted or unsubstituted phenanthrenylene group; a substituted or unsubstituted binaphthylene group; or a substituted or unsubstituted naphthylene group, or a group to which two or more among the substituents are linked.

According to yet another exemplary embodiment, L is a divalent biphenyl group; or a spirobifluorenylene group.

According to still yet another exemplary embodiment, L is a polycyclic arylene group.

In an exemplary embodiment of the present specification, Ar1 and Ar2 are the same as or different from each other, and are each independently a substituted or unsubstituted aryl group having 6 to 60 carbon atoms; or a substituted or unsubstituted heterocyclic group having 2 to 60 carbon atoms.

In another exemplary embodiment, Ar1 and Ar2 are the same as or different from each other, and are each independently a substituted or unsubstituted aryl group having 6 to 30 carbon atoms; or a substituted or unsubstituted heterocyclic group having 2 to 30 carbon atoms.

According to an exemplary embodiment of the present specification, Ar1 and Ar2 are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted phenanthrenyl group; or a substituted or unsubstituted fluorenyl group.

In another exemplary embodiment, Ar1 and Ar2 are the same as each other, and are each independently a phenyl group which is unsubstituted or substituted with one or more selected from the group consisting of deuterium, a halogen group and a methyl group; a biphenyl group which is unsubstituted or substituted with one or more selected from the group consisting of deuterium, a halogen group and a methyl group; a terphenyl group which is unsubstituted or substituted with one or more selected from the group consisting of deuterium, a halogen group and a methyl group; a napththyl group which is unsubstituted or substituted with one or more selected from the group consisting of deuterium, a halogen group and a methyl group; a phenanthrenyl group which is unsubstituted or substituted with one or more selected from the group consisting of deuterium, a halogen group and a methyl group; or a fluorenyl group which is unsubstituted or substituted with one or more selected from the group consisting of deuterium, a halogen group, a methyl group, and a phenyl group which is substituted with a tert-butyl group.

In still another exemplary embodiment, Ar1 and Ar2 are each an aryl group having 6 to 10 carbon atoms.

In yet another exemplary embodiment, Ar1 and Ar2 are each an unsubstituted aryl group having 6 to 10 carbon atoms.

In still yet another exemplary embodiment, Ar1 and Ar2 are each a phenyl group; or a naphthyl group.

According to an exemplary embodiment of the present invention, X1 and X2 are each a vinylphenyl group, a vinylphenoxy group, a benzocyclobutenyl group, or an alkyl phenoxy methyl oxetanyl group.

According to an exemplary embodiment of the present invention, m1 and m2 are each an integer from 0 to 12.

According to another exemplary embodiment, m1 and m2 are each an integer from 0 to 6.

According to still another exemplary embodiment, m1 and m2 are each 0 or 6.

According to yet another exemplary embodiment, m1 and m2 are each 0.

According to an exemplary embodiment, n3 and n4 are each an integer from 0 to 2.

In another exemplary embodiment, n3 and n4 are each 0 or 1.

According to an exemplary embodiment of the present invention, n1 and n2 are each 0 or 1.

According to another exemplary embodiment, n1 and n2 are each 0.

According to an exemplary embodiment of the present invention, the compound represented by Formula 1 may be represented by any one of the following compounds.

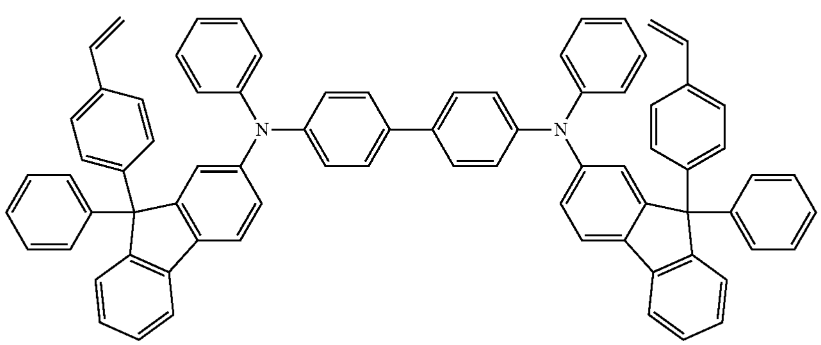

-continued
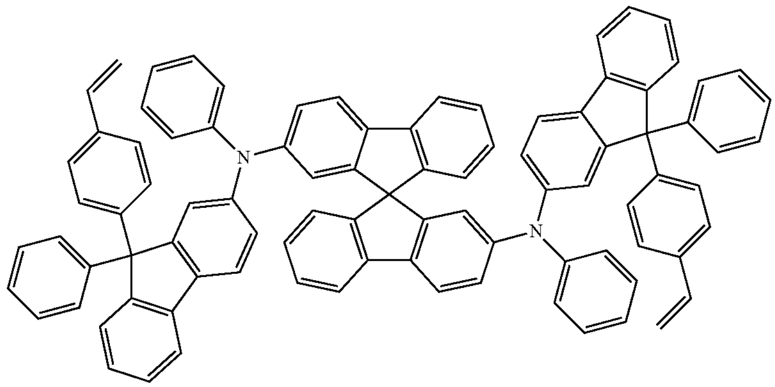
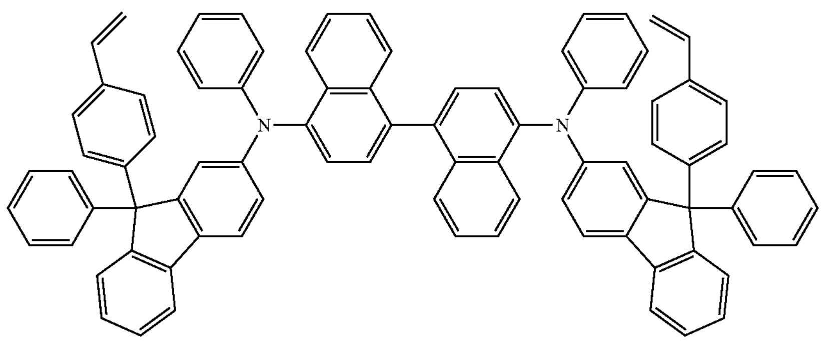
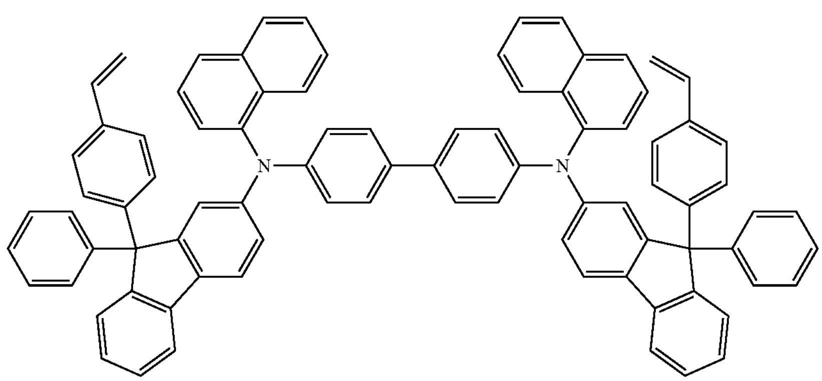
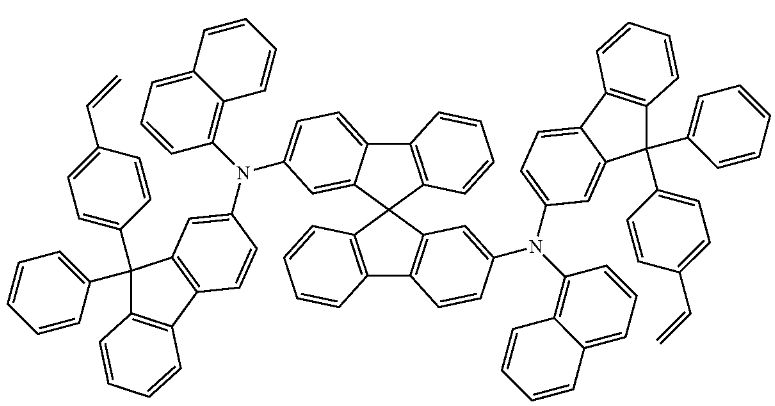

-continued
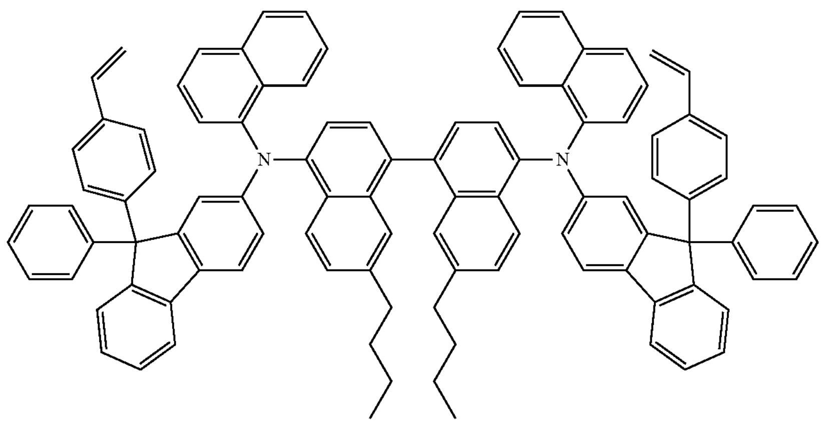
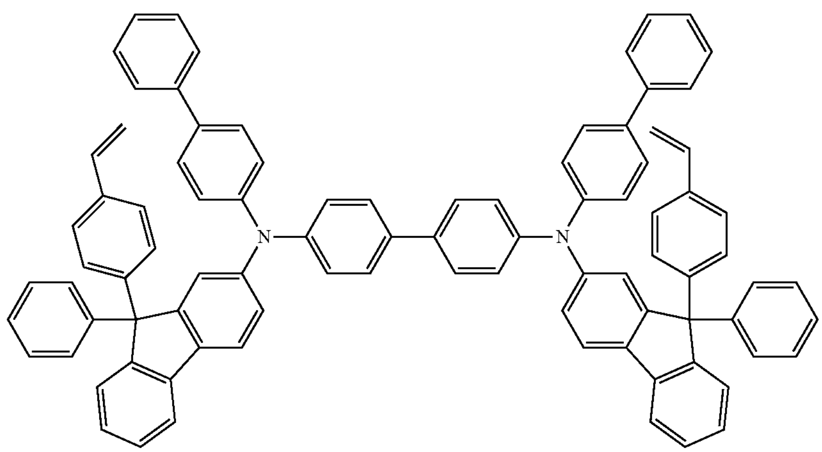
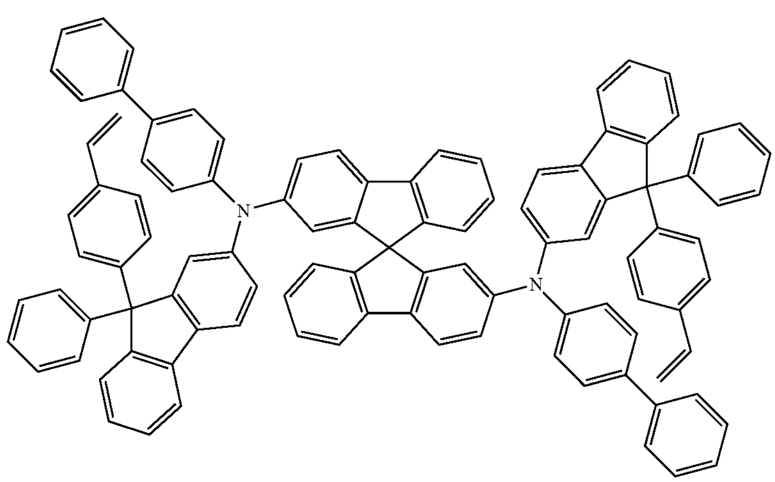

-continued
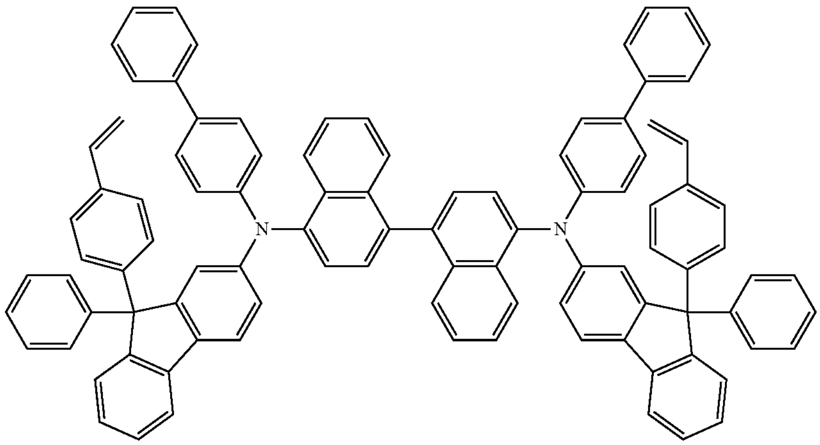
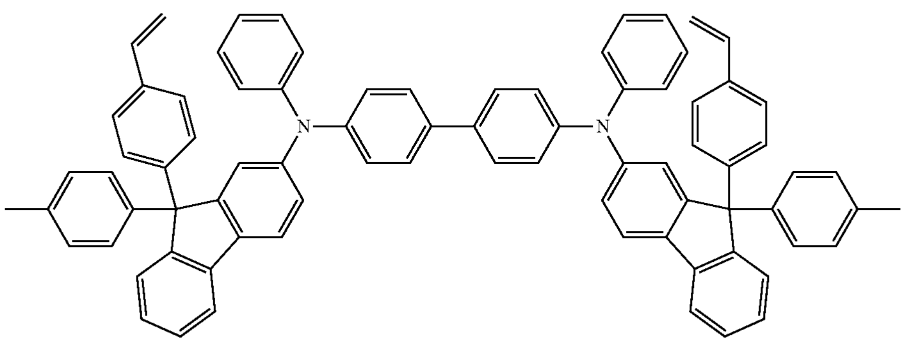
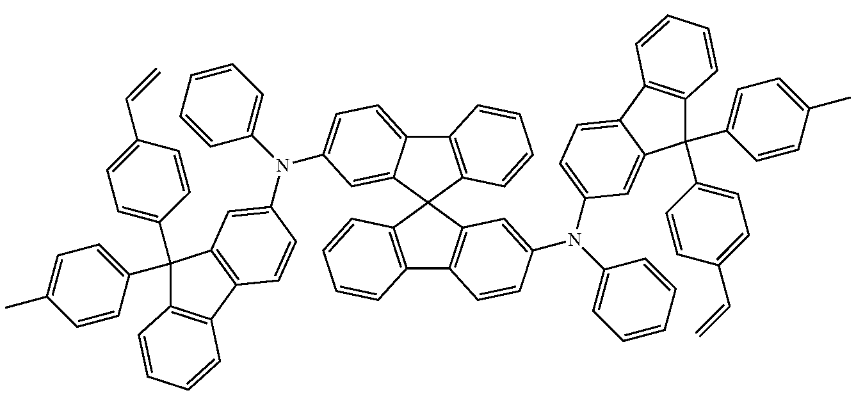
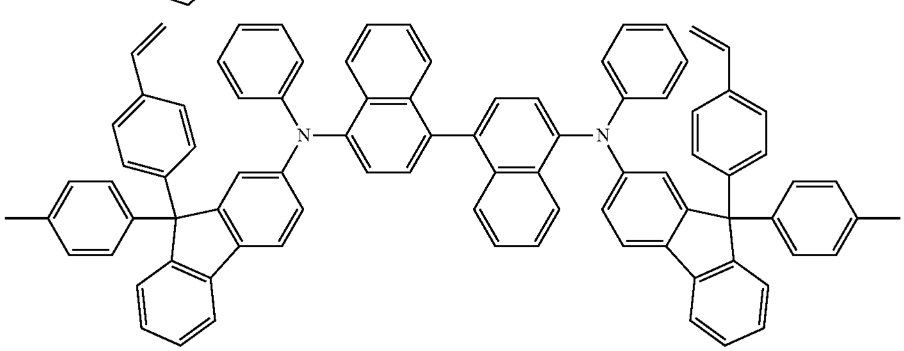

-continued
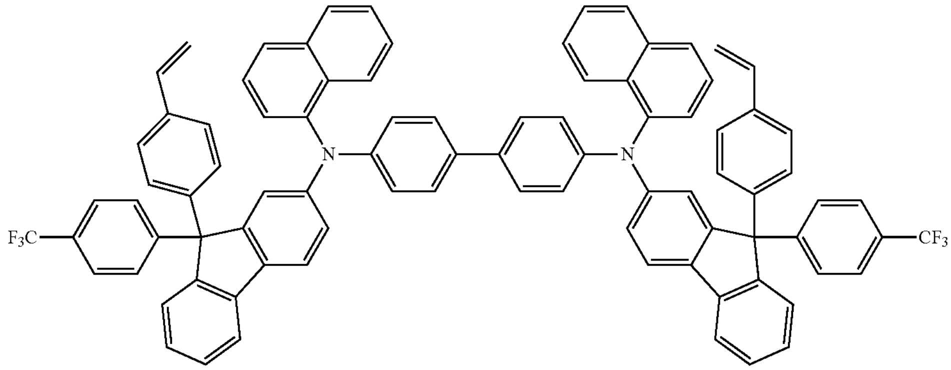
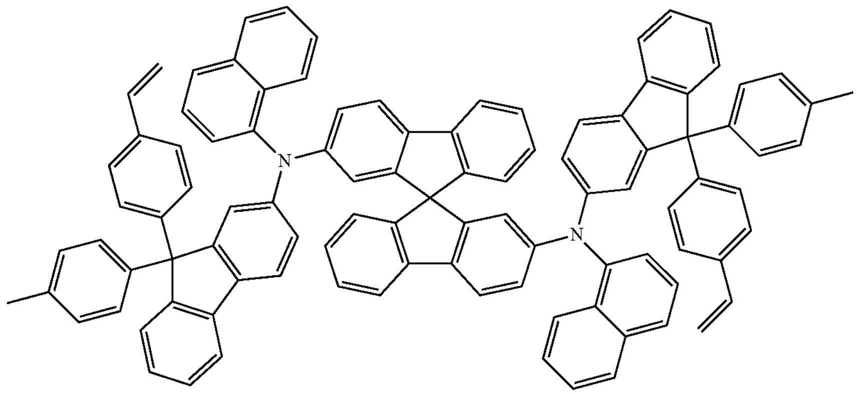
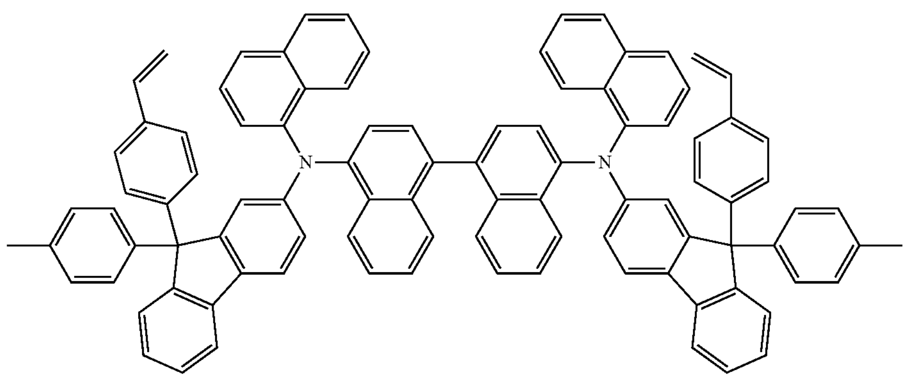
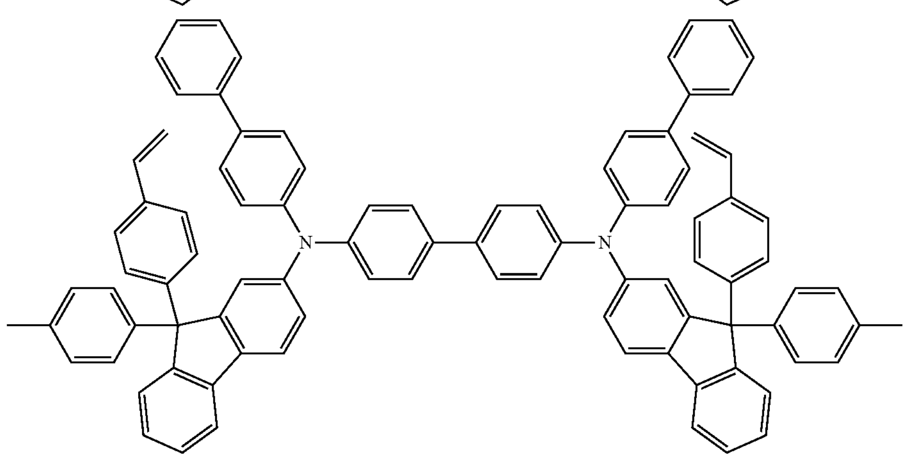

-continued
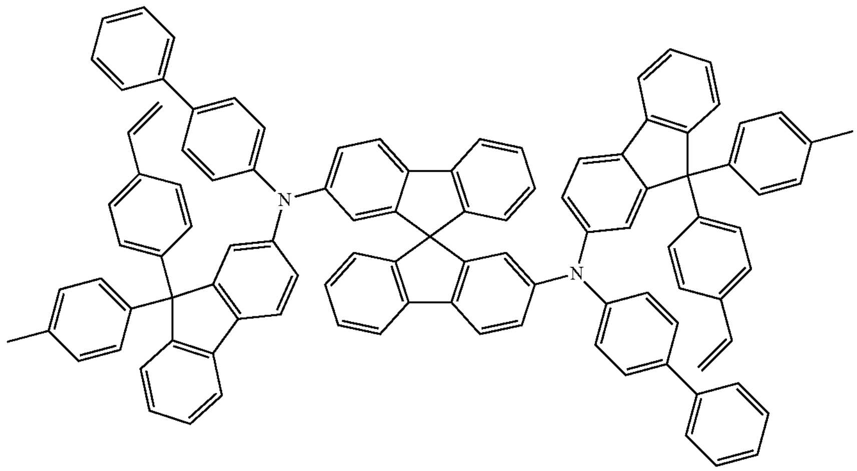
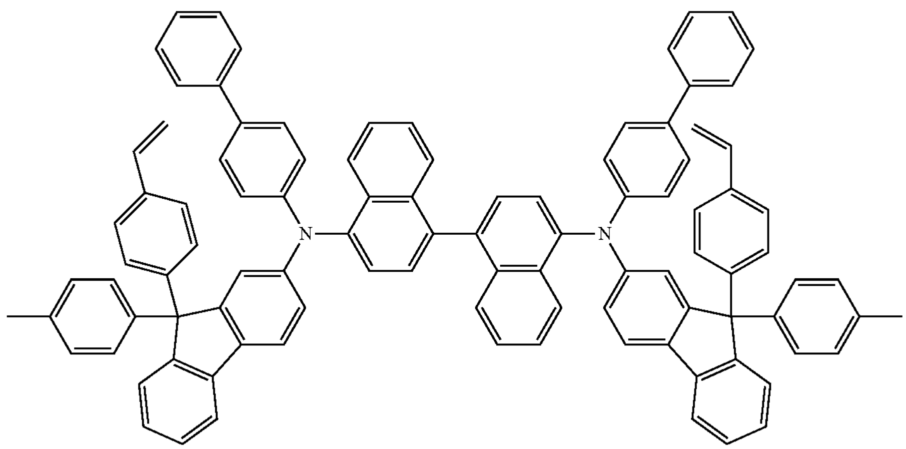
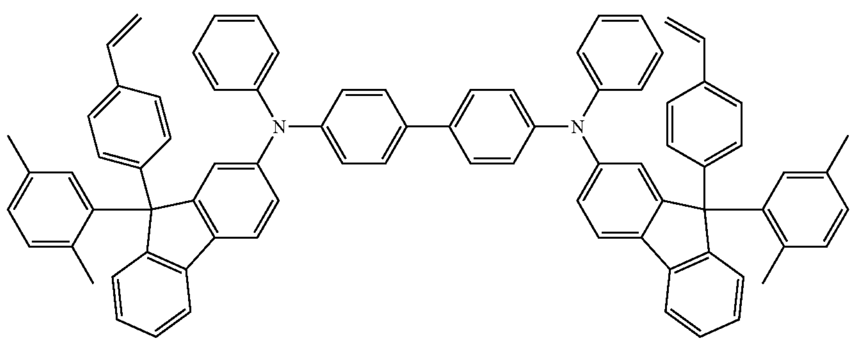
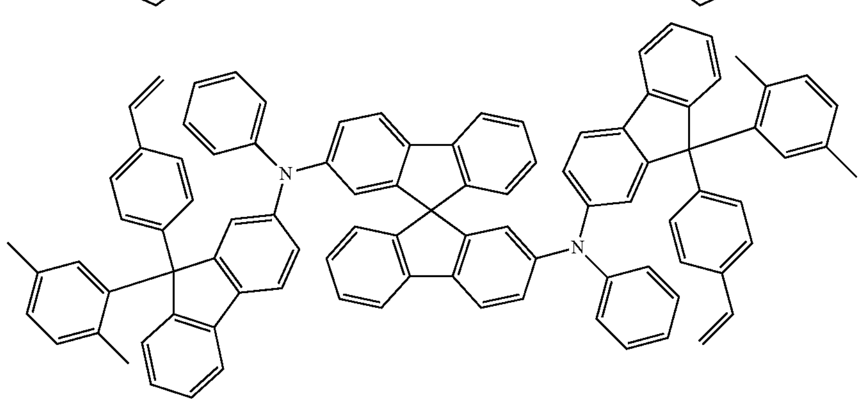

-continued
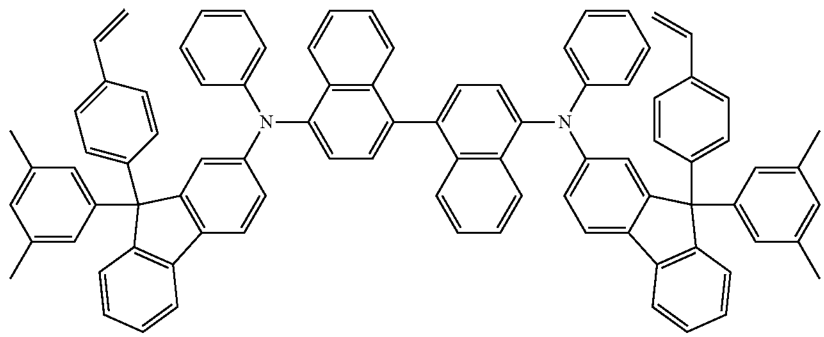
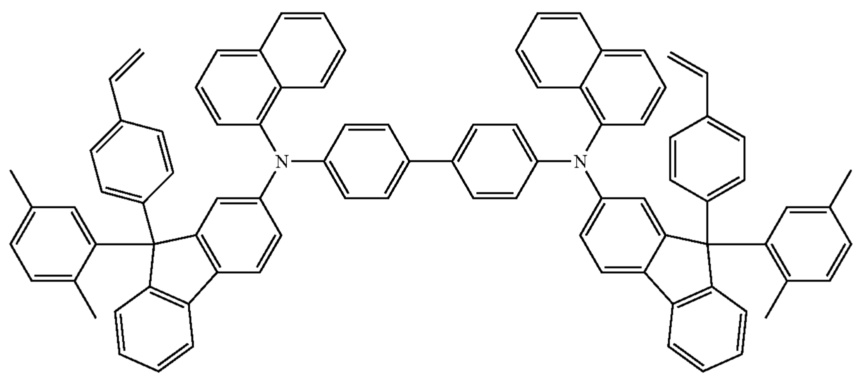
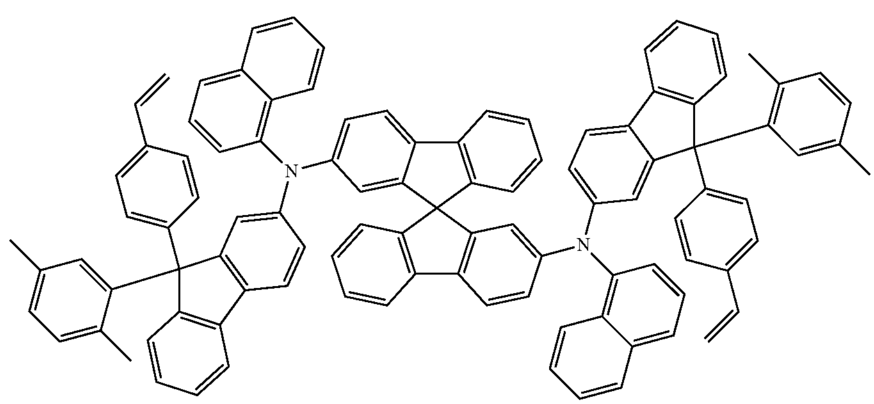
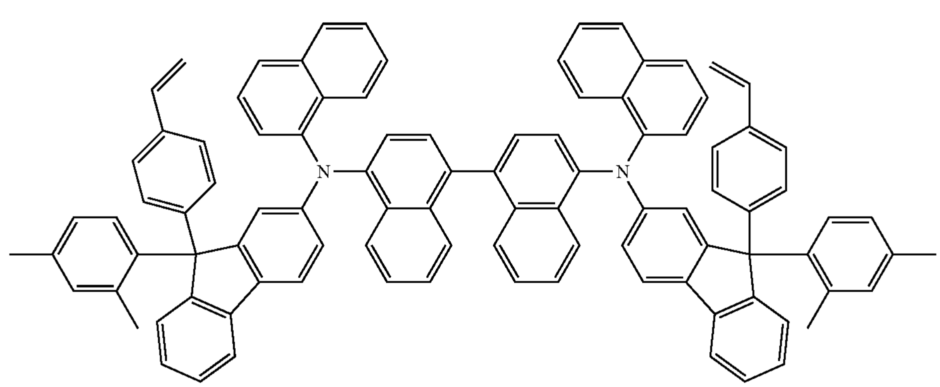

-continued
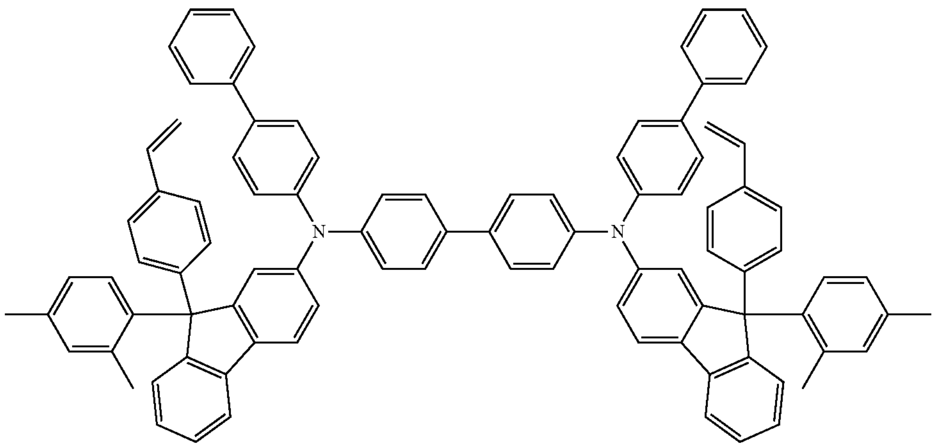
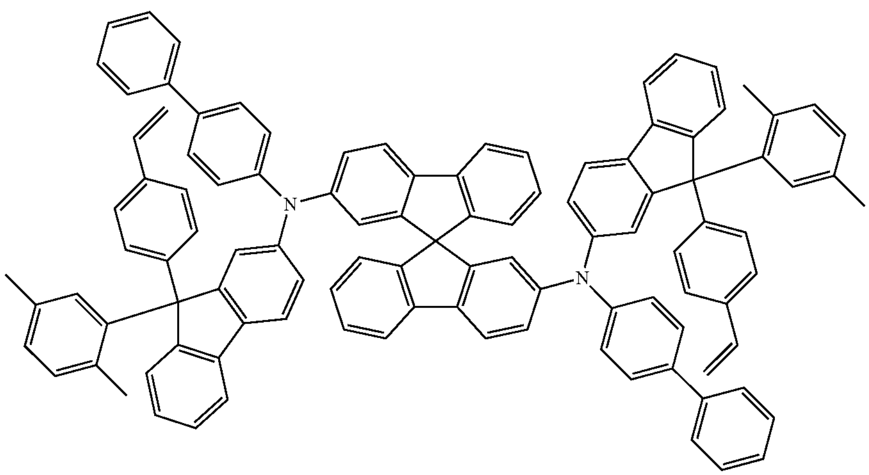
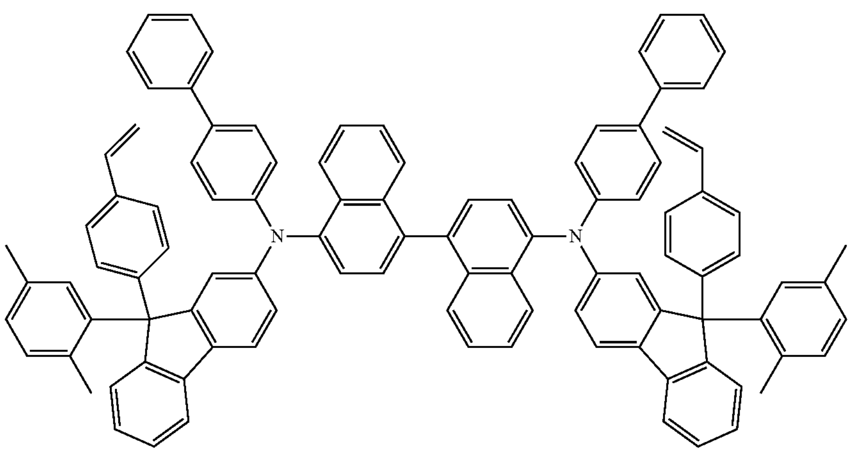
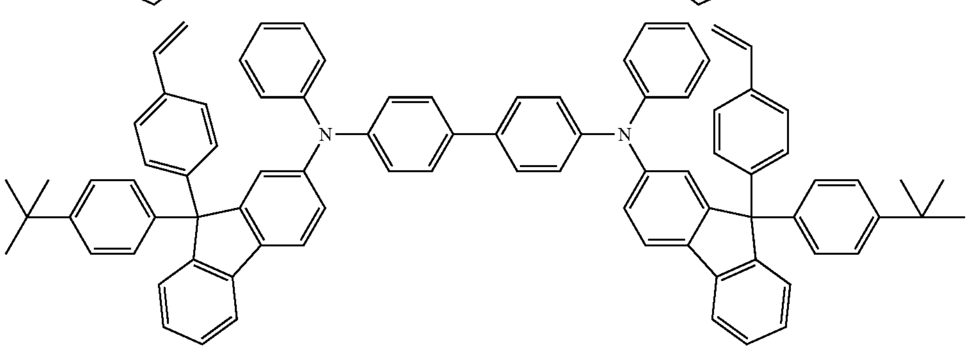

-continued
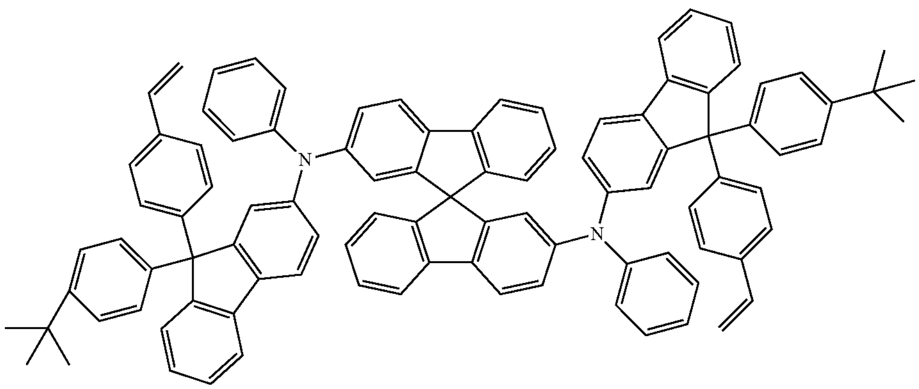
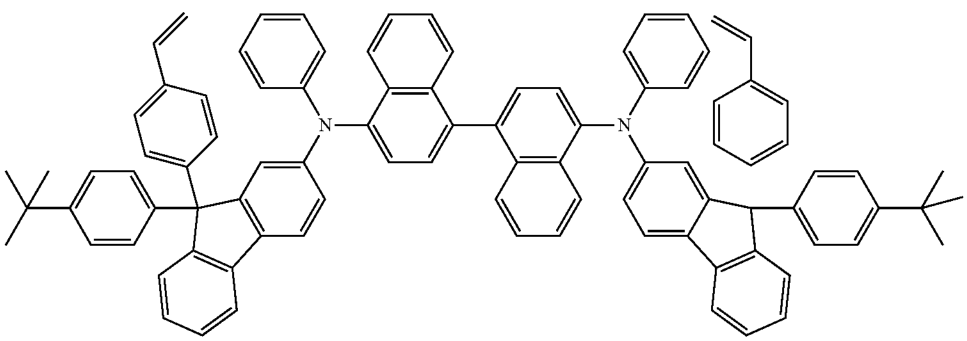
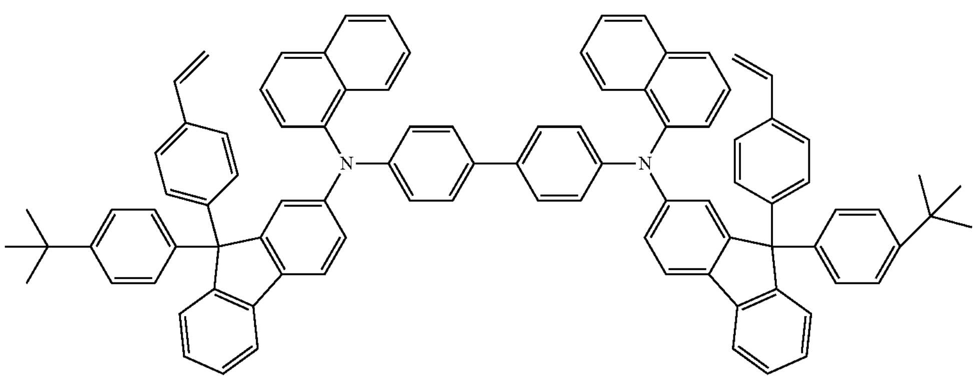
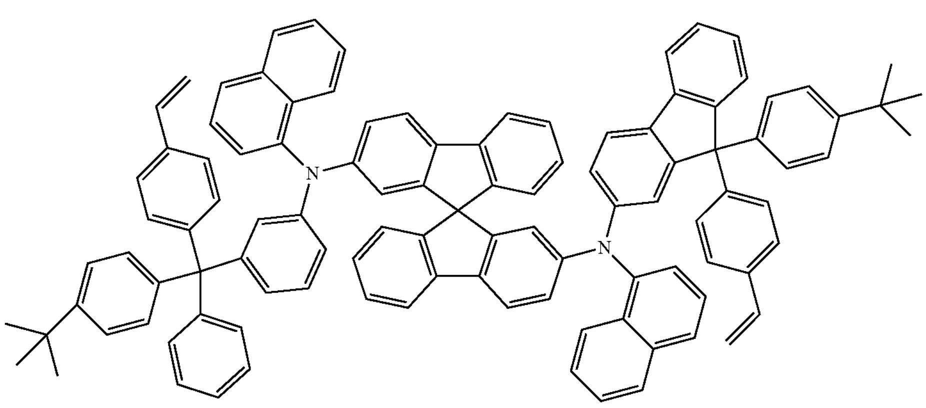

-continued
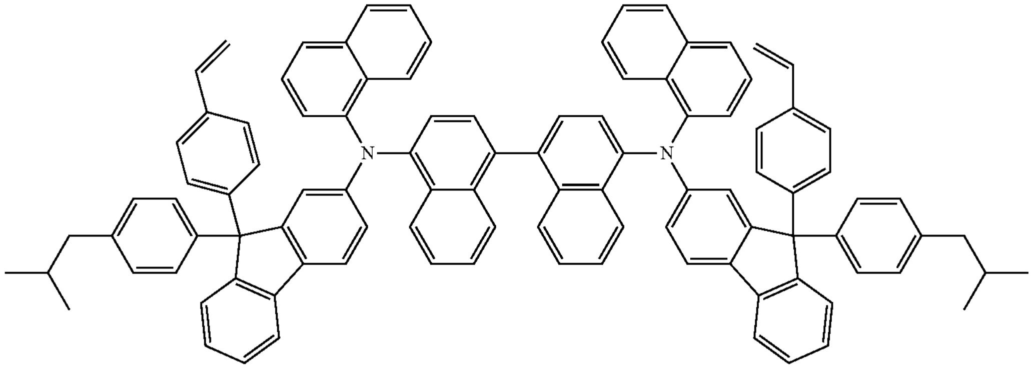
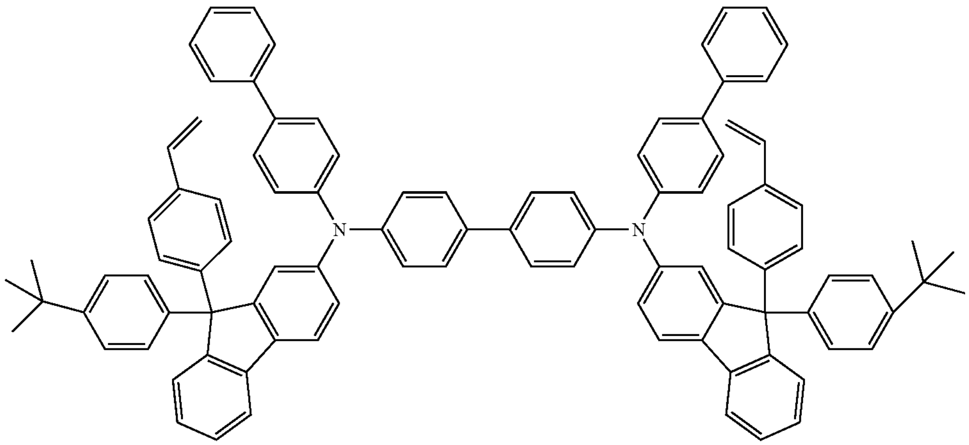
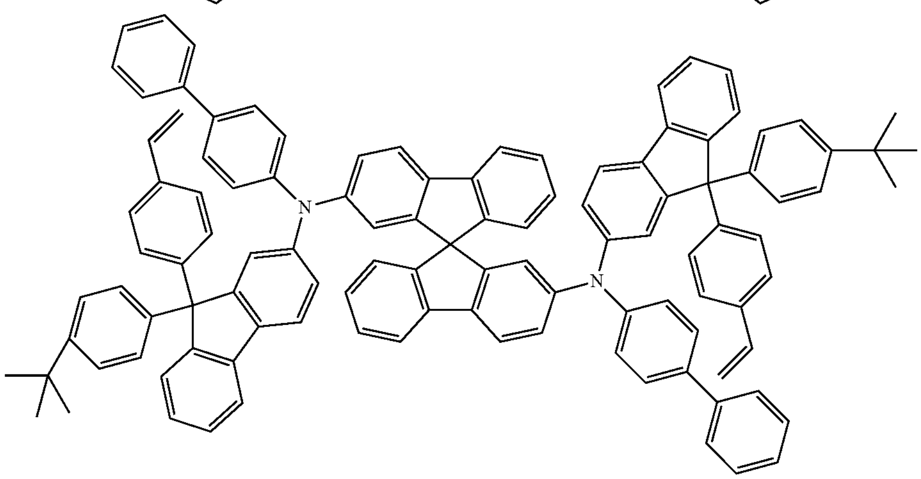
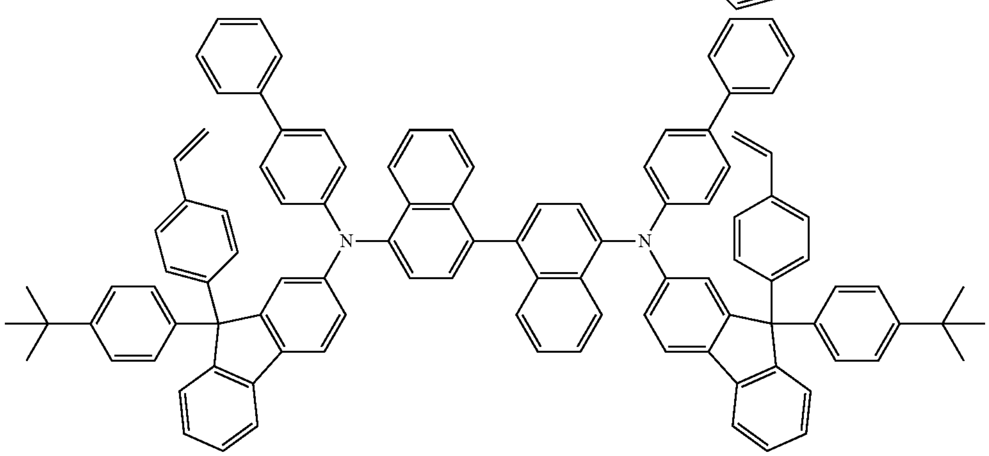

-continued
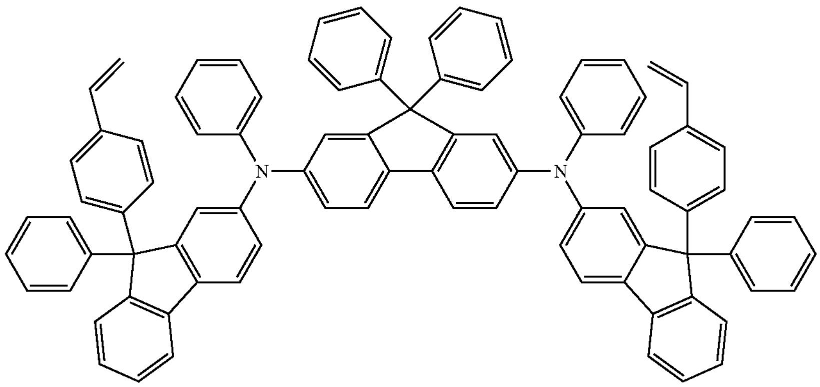
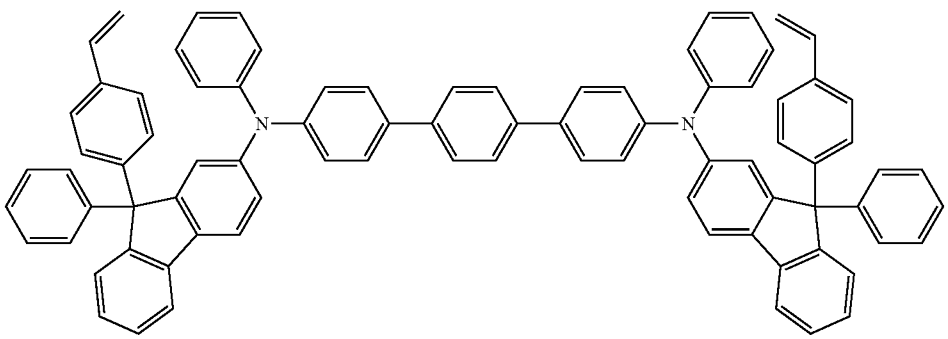
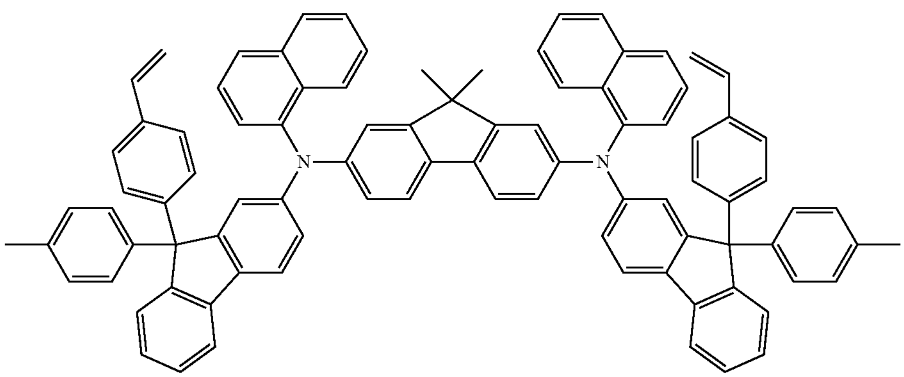
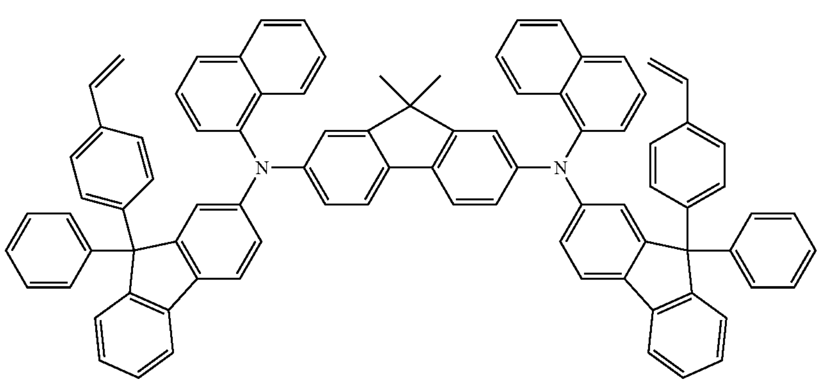

-continued
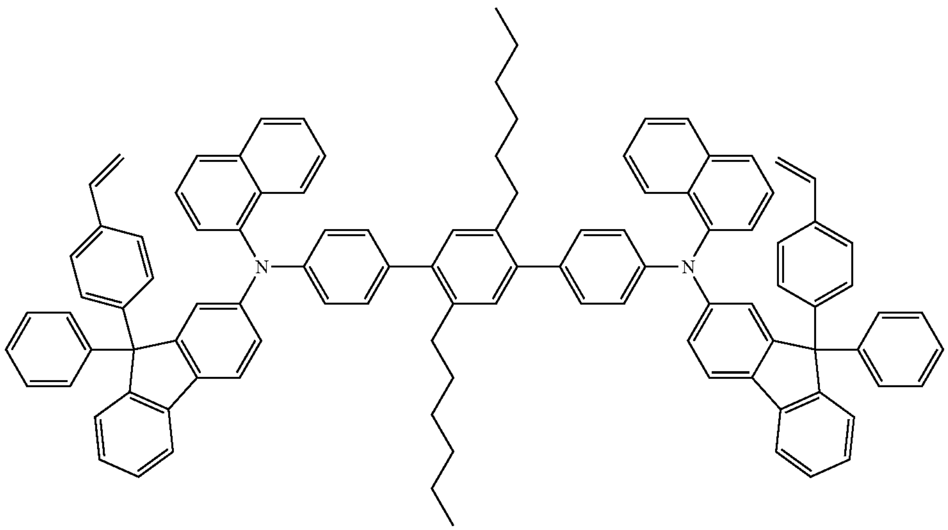
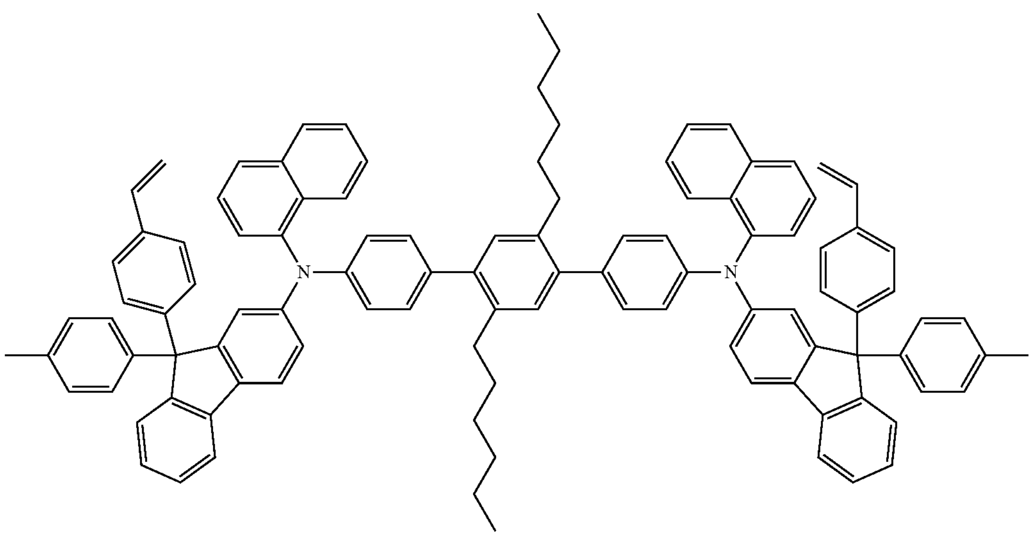
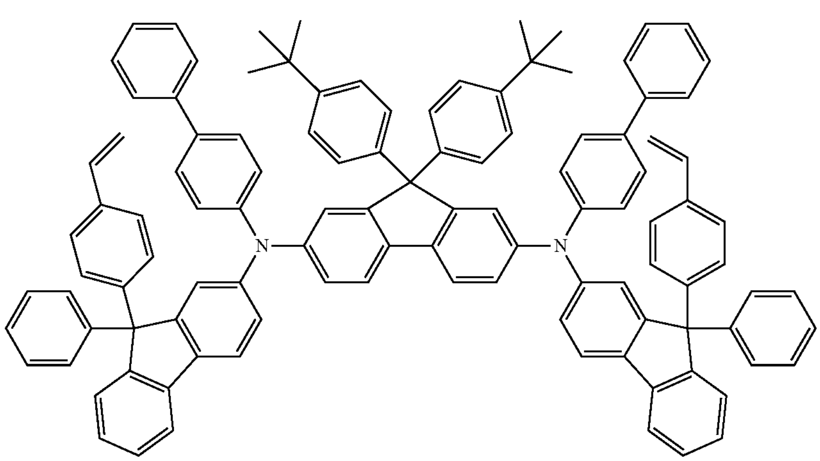

-continued
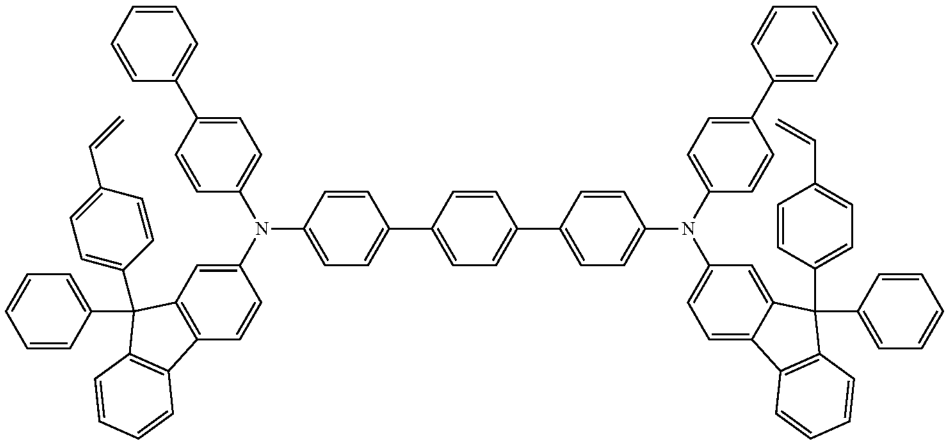
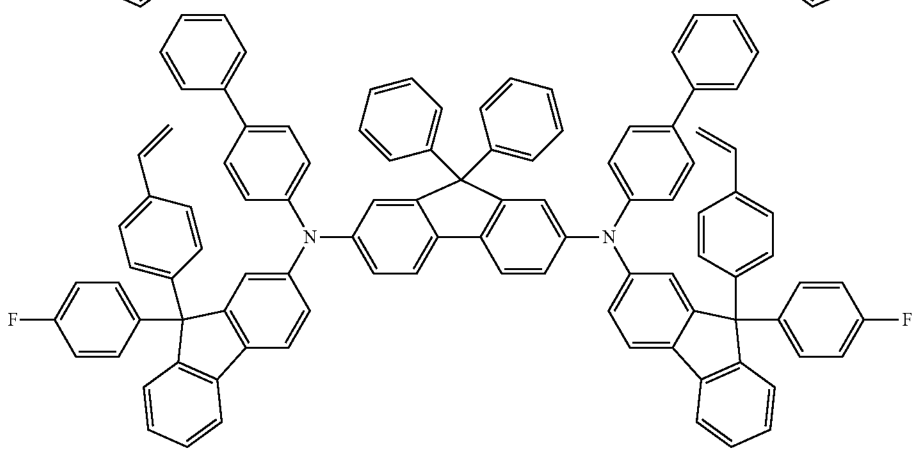
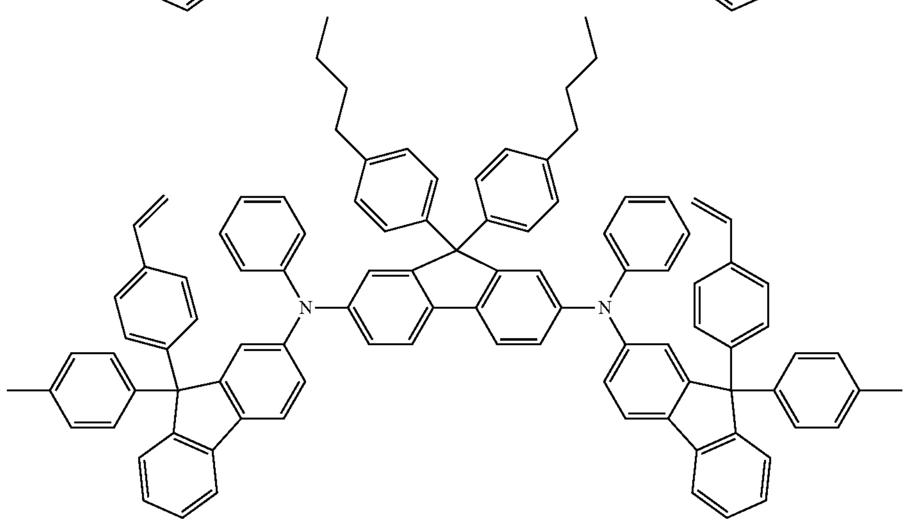
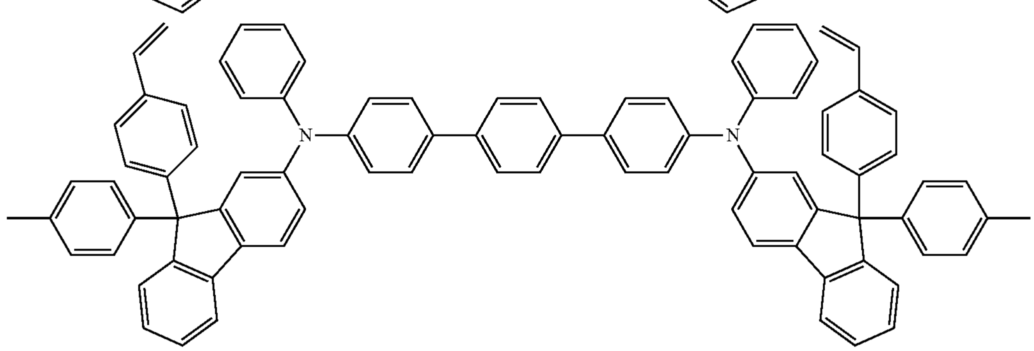

-continued
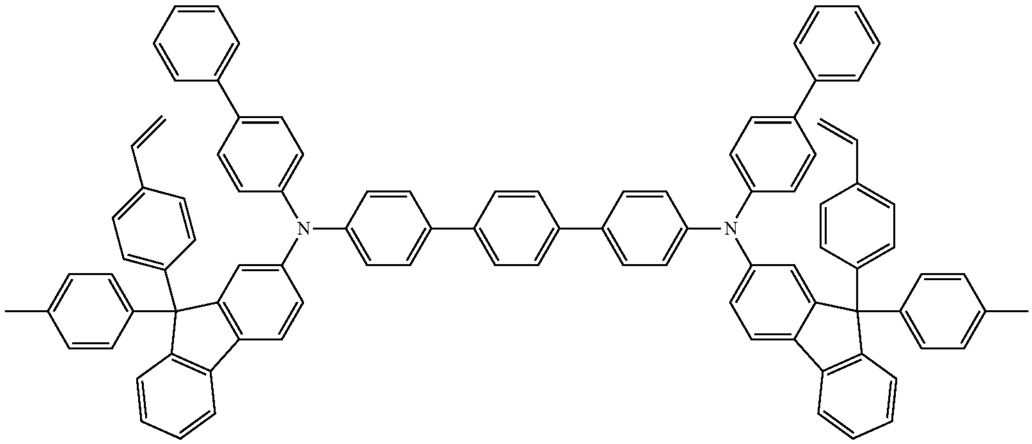
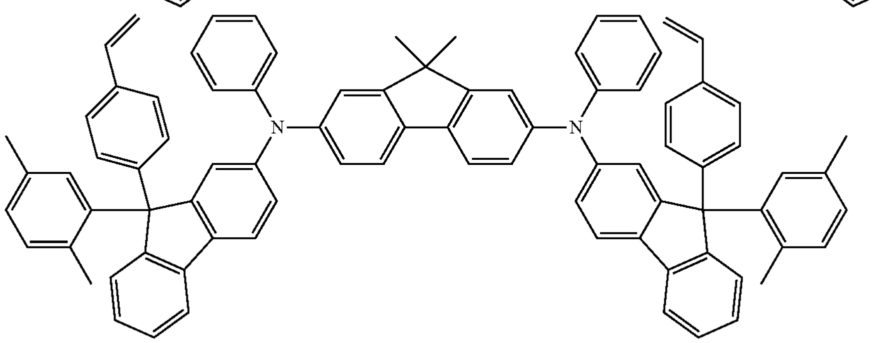
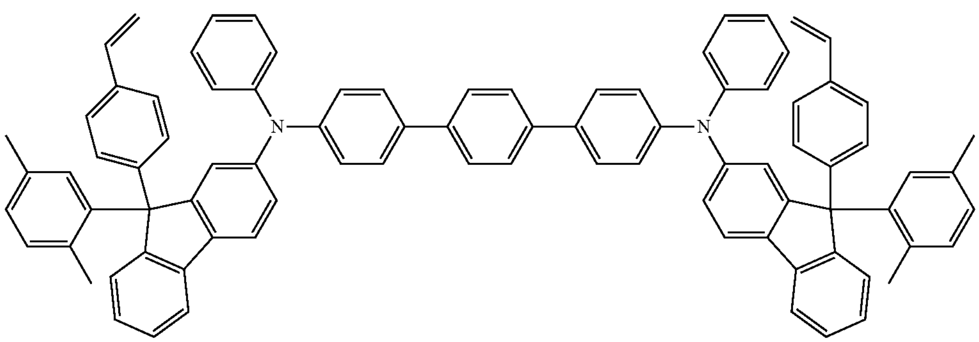
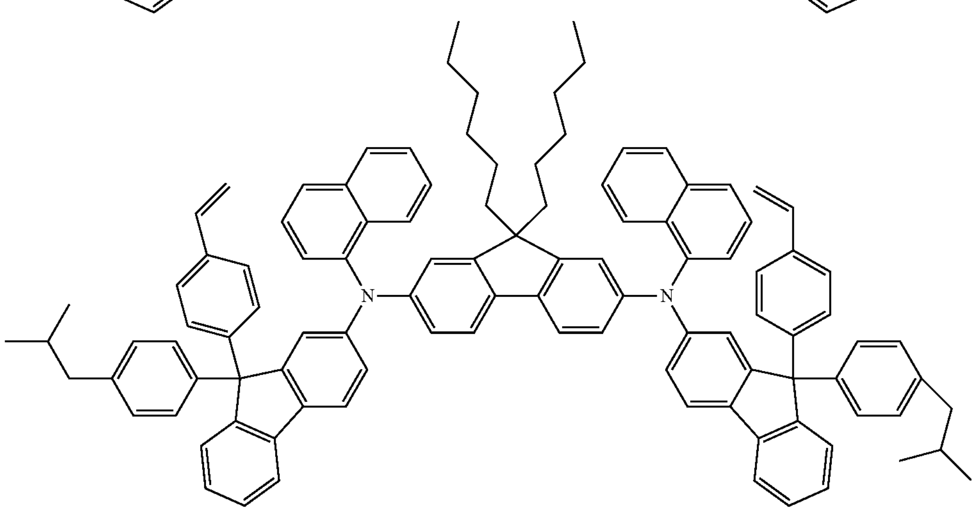

-continued
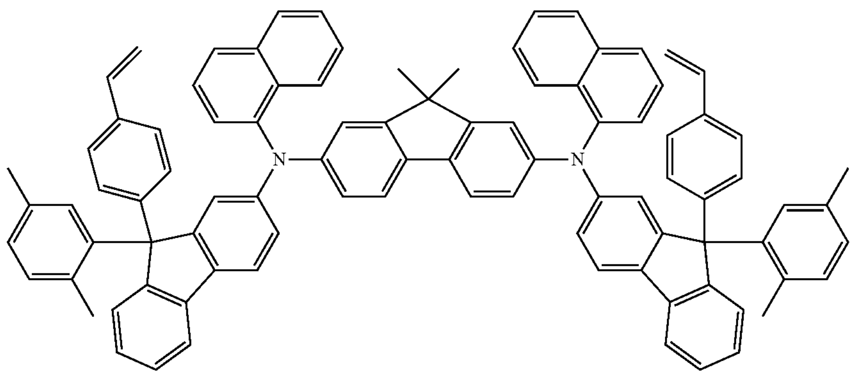
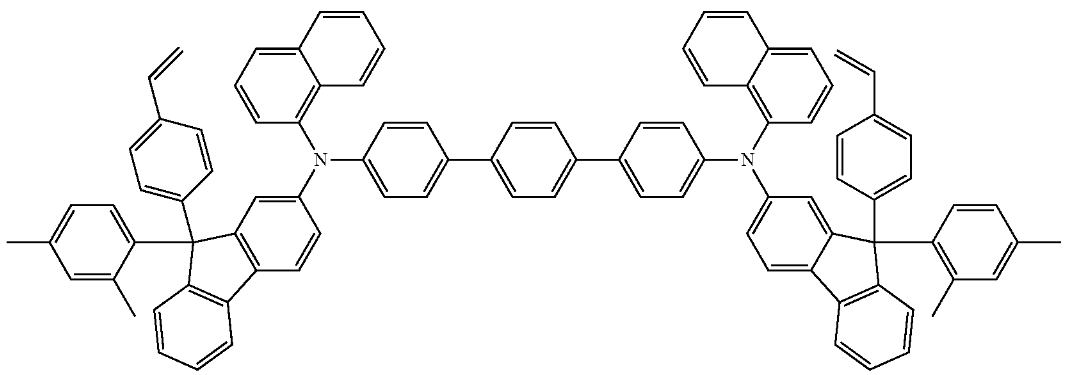
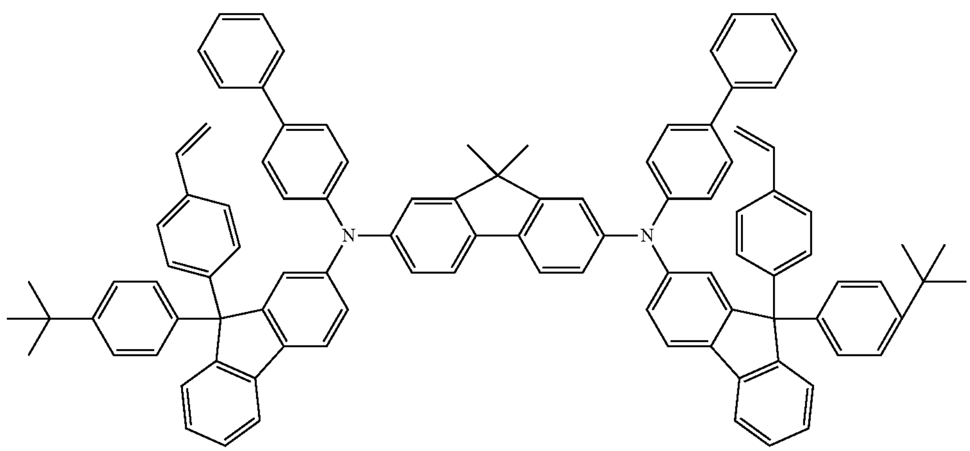
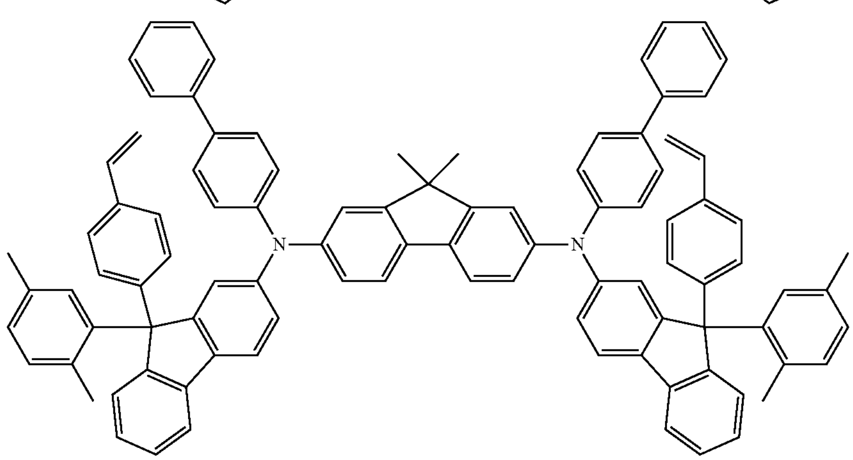

-continued
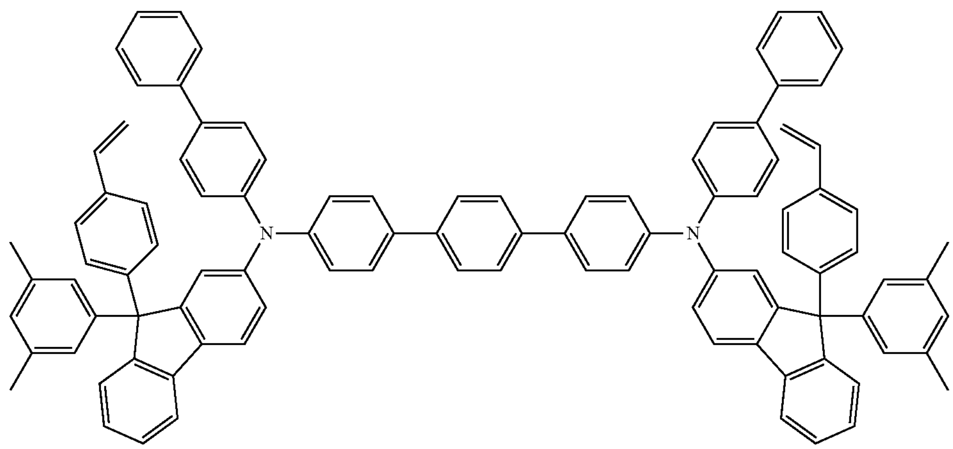
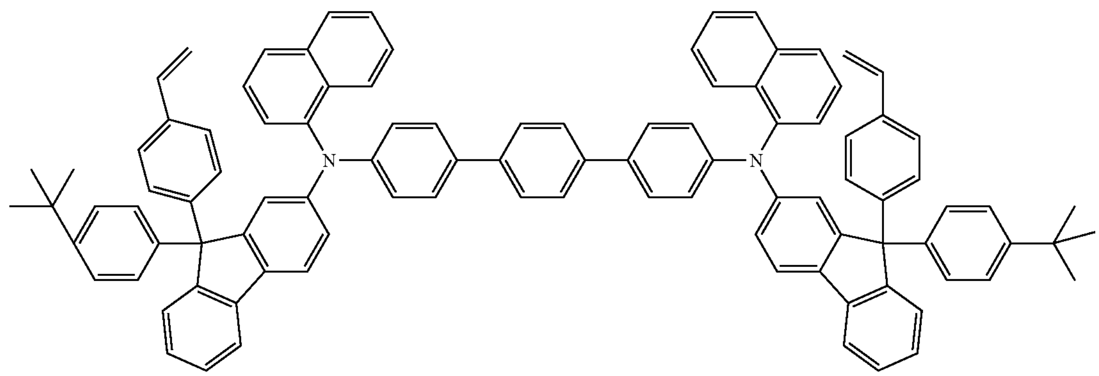
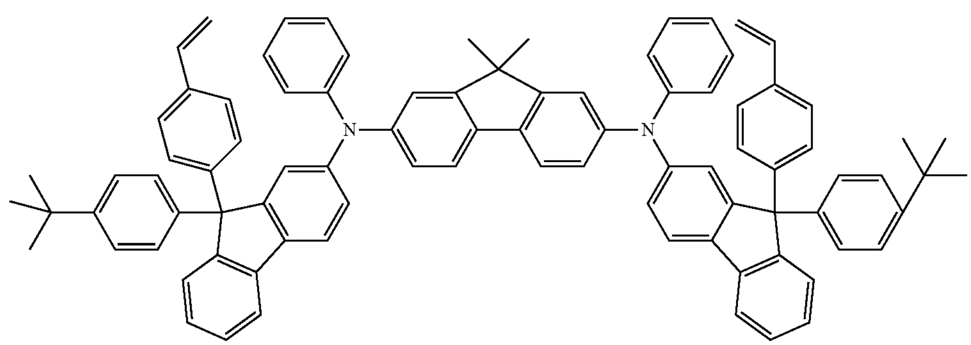
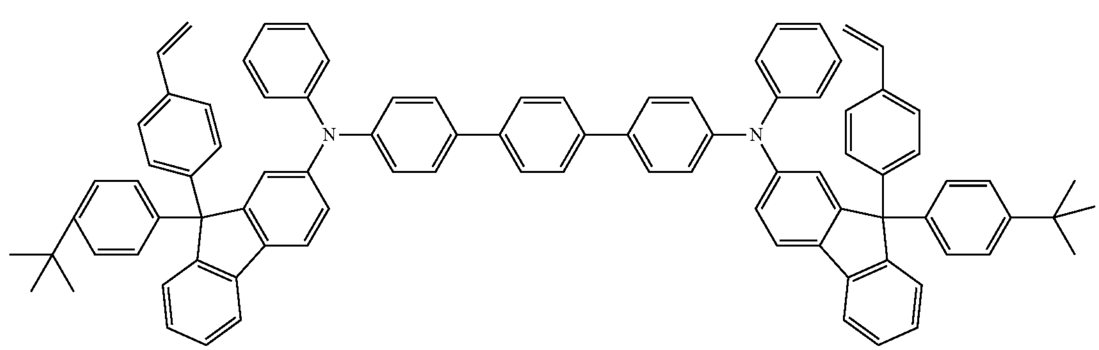

-continued
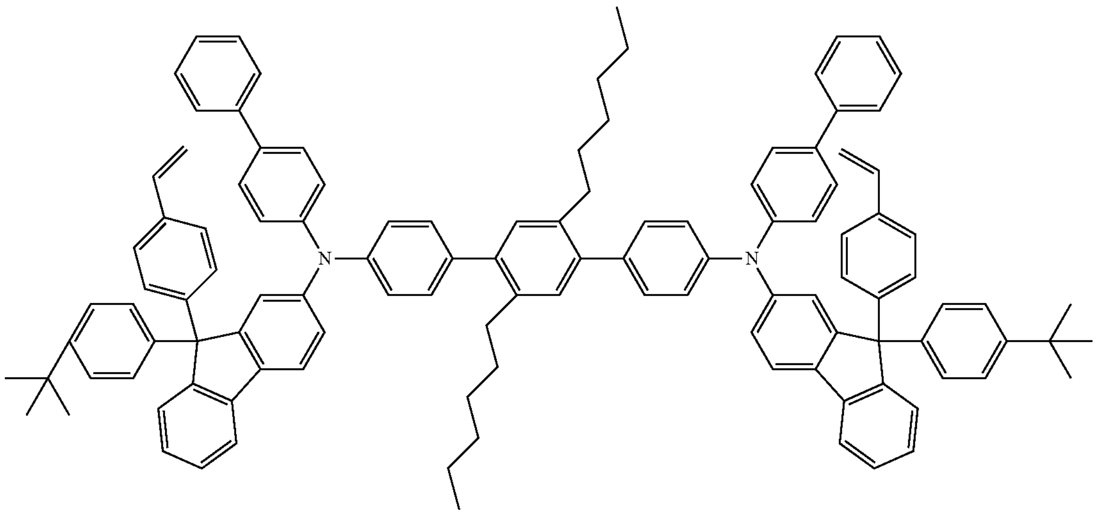
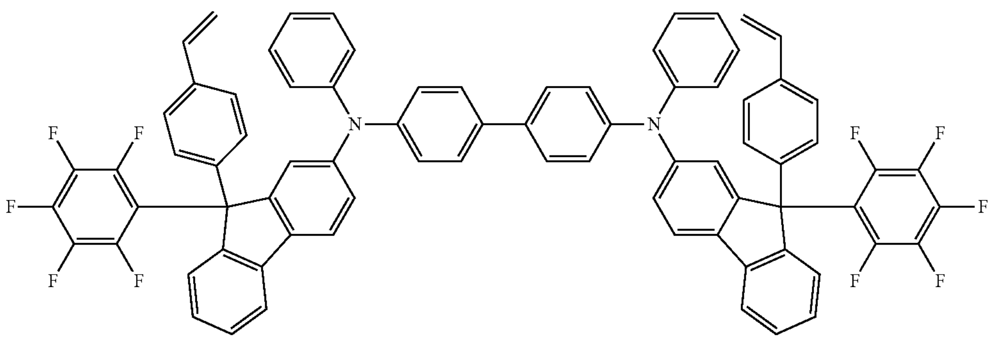
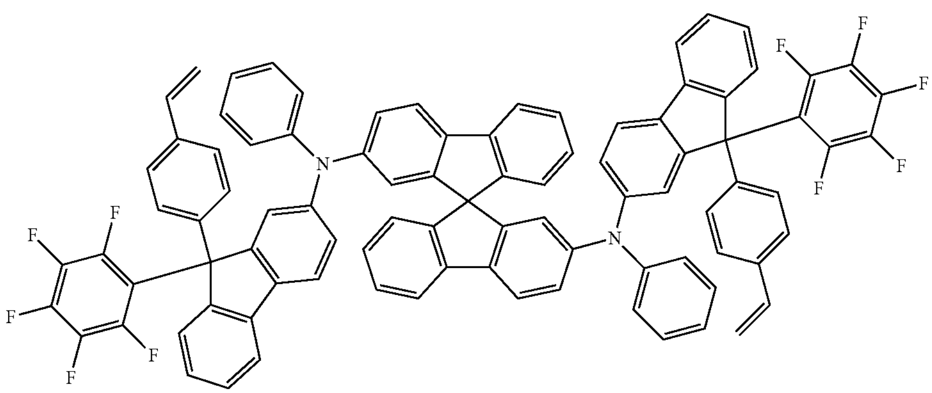
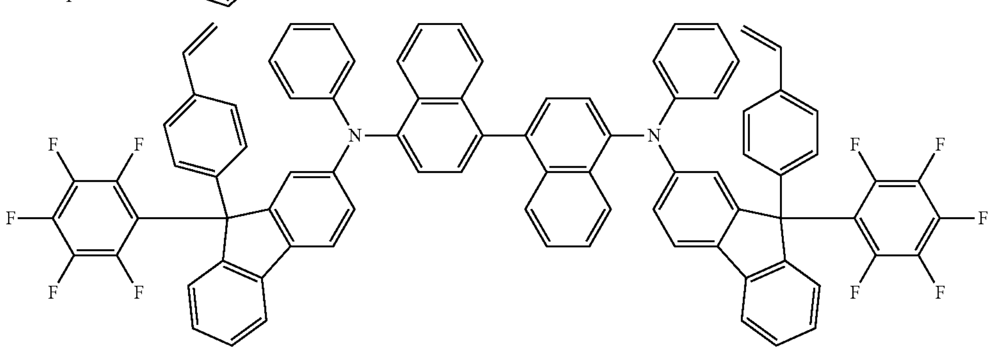

-continued
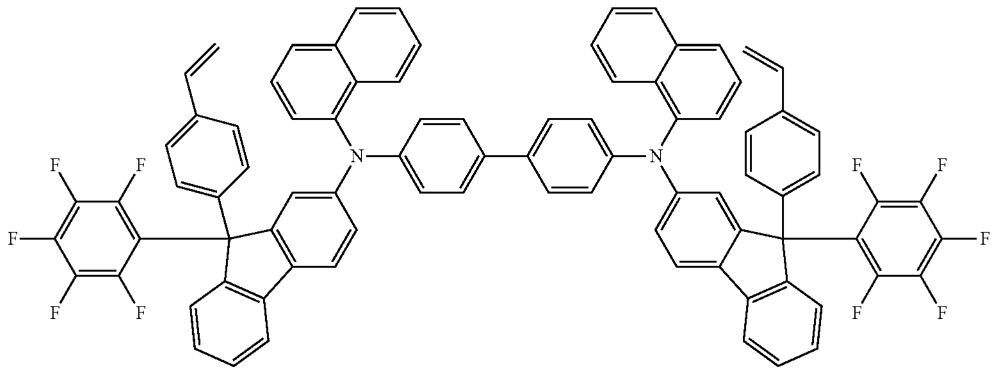
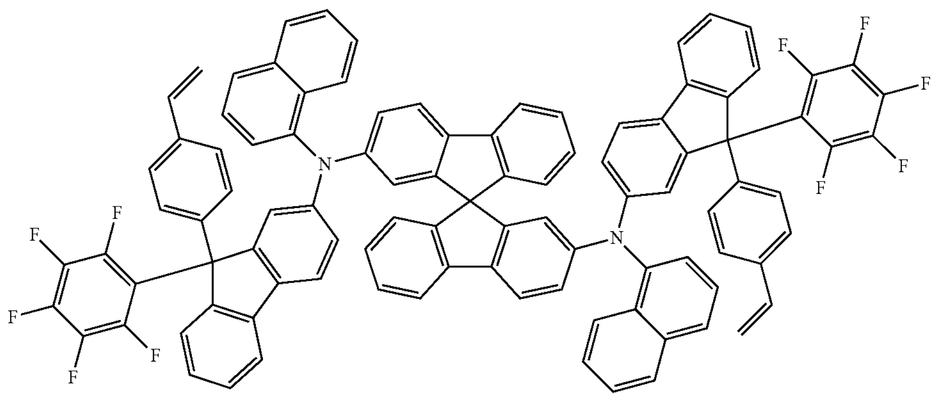
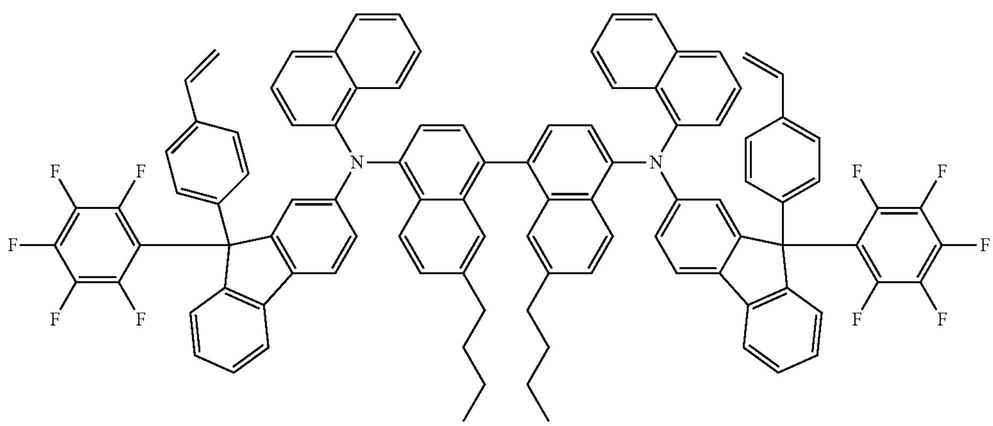
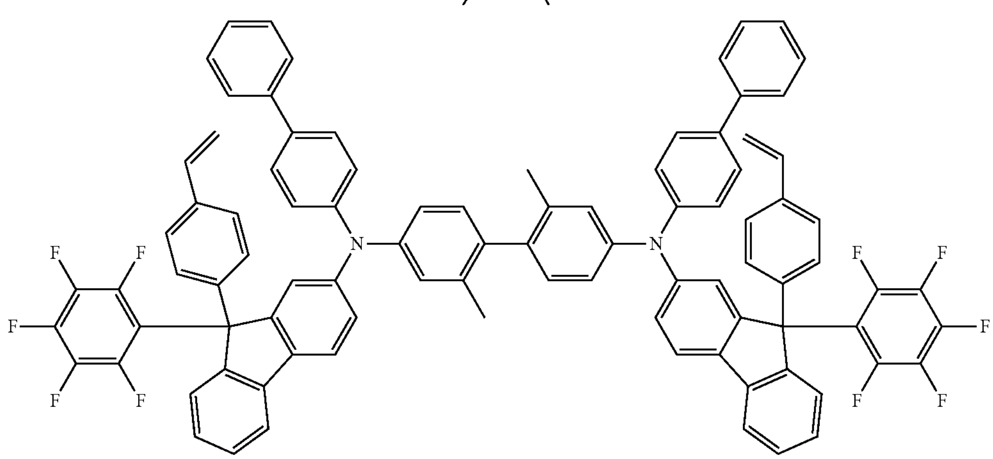

-continued
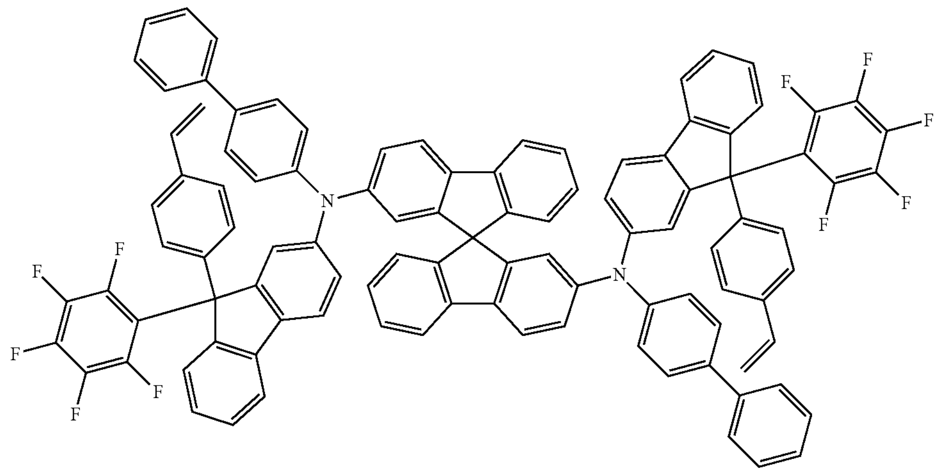
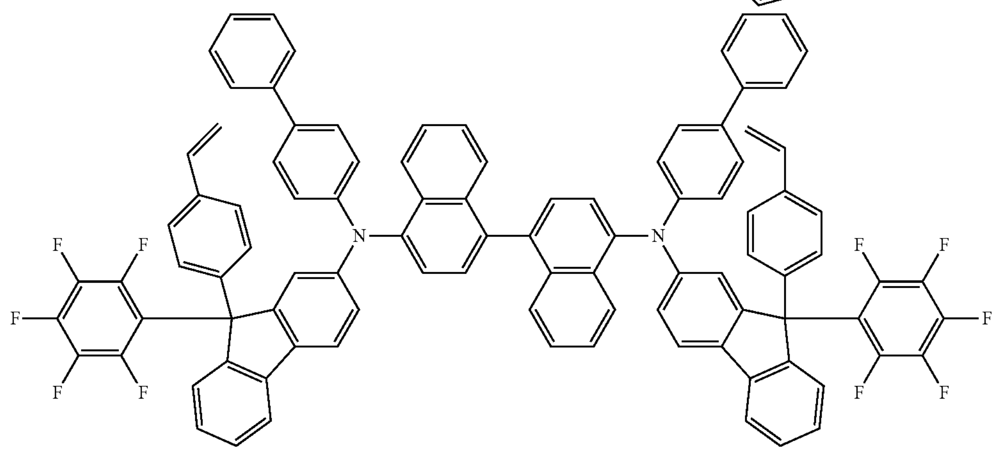
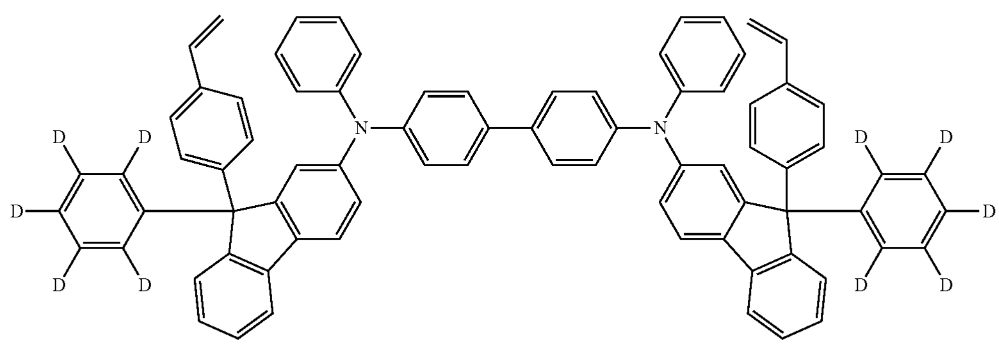
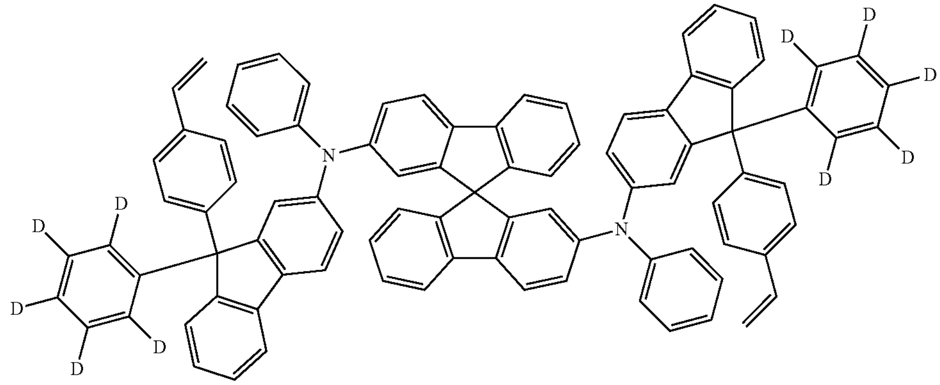

-continued
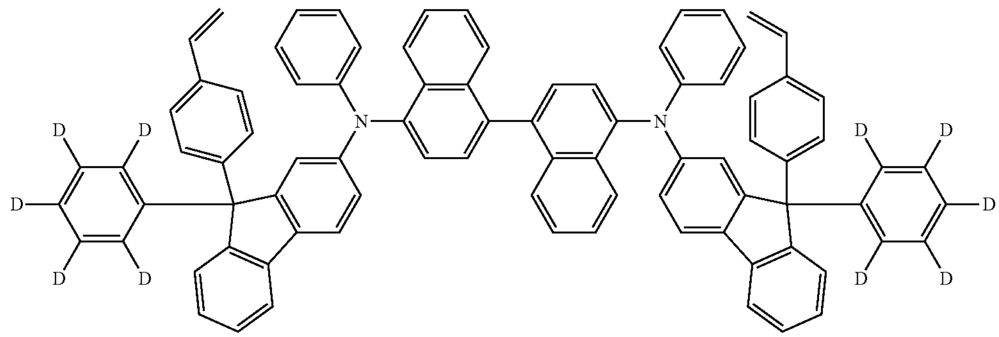
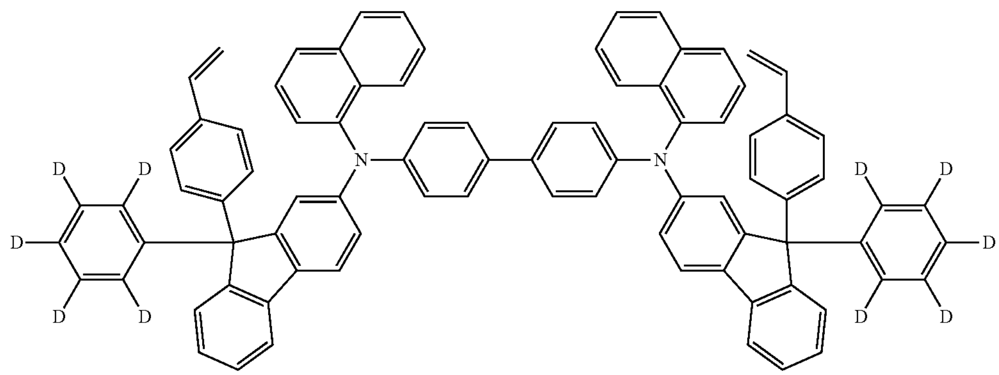
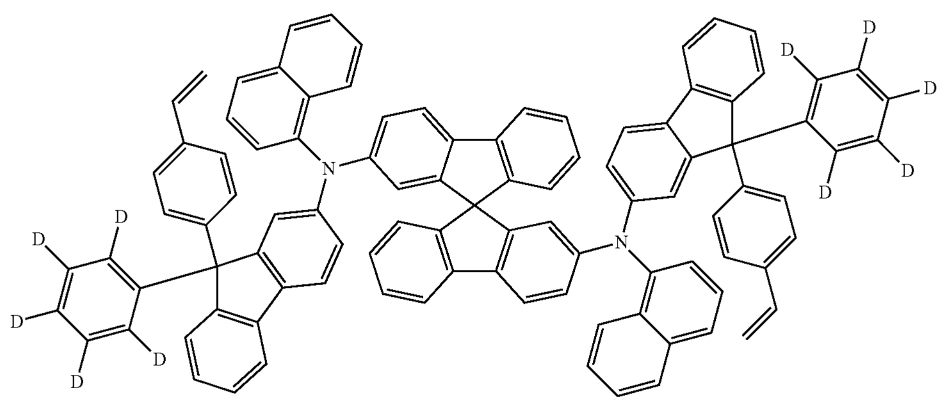
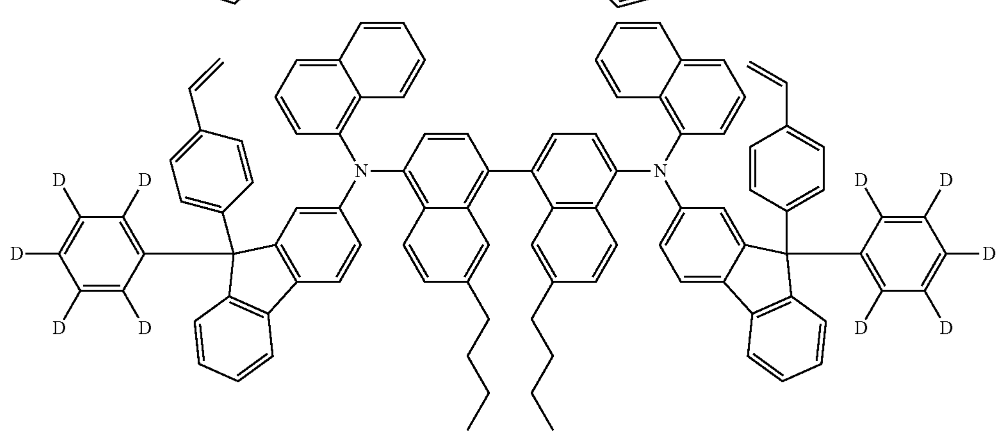

-continued
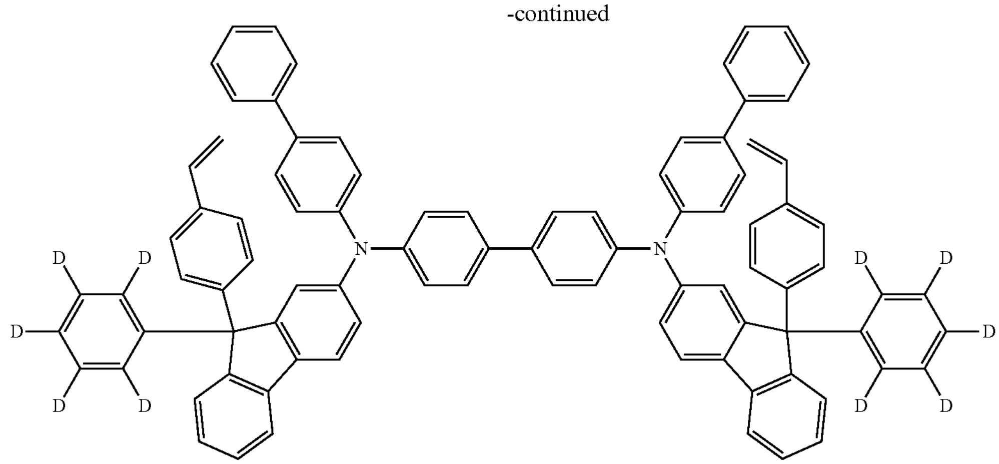
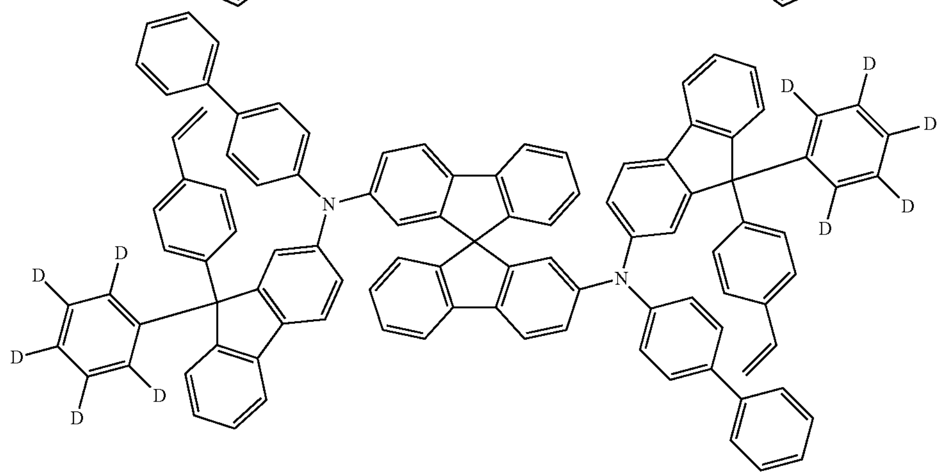
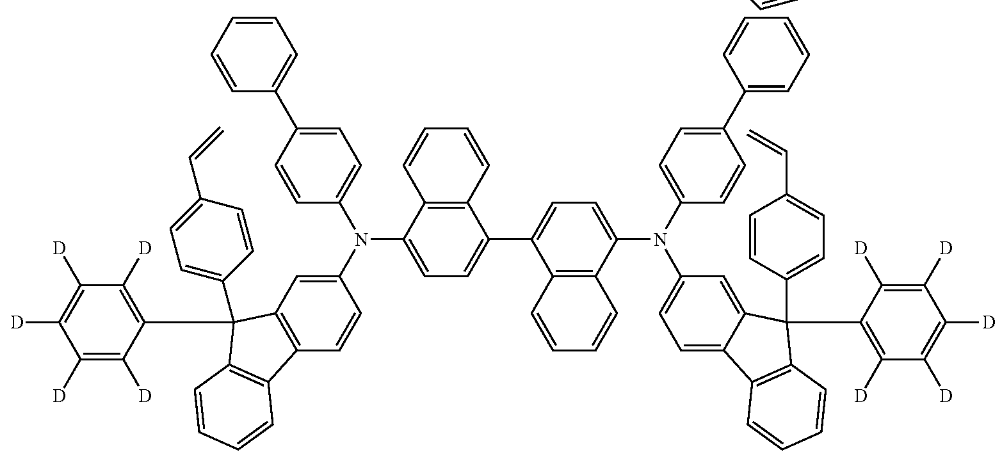
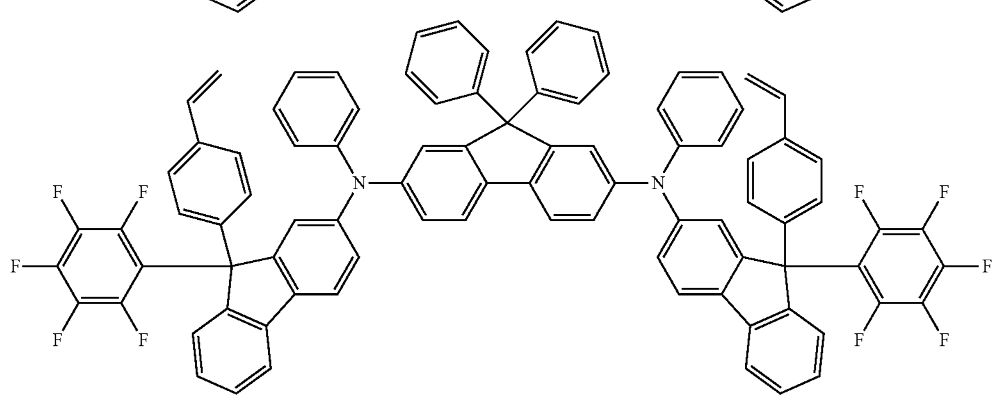

-continued
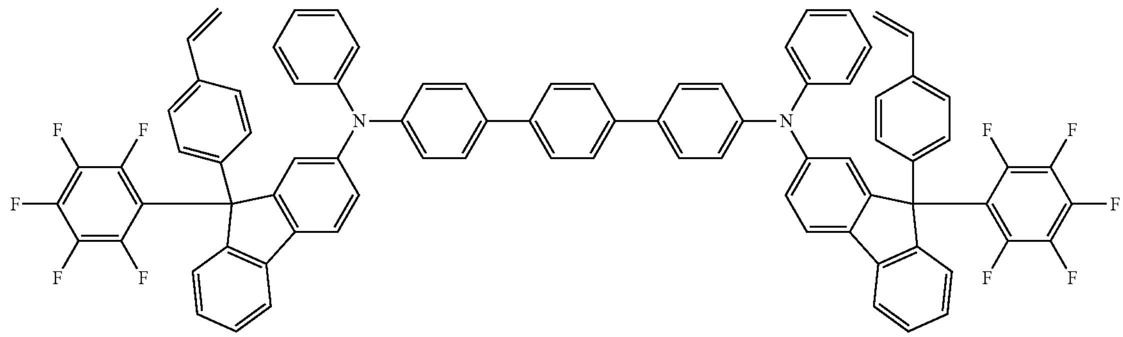
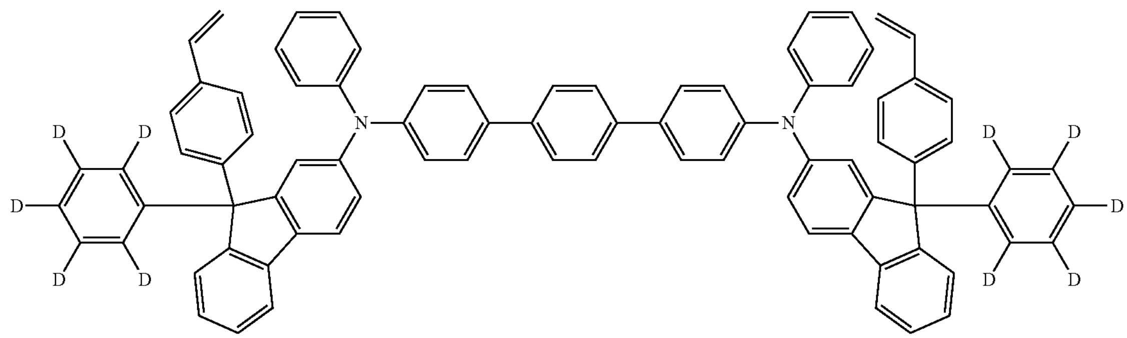
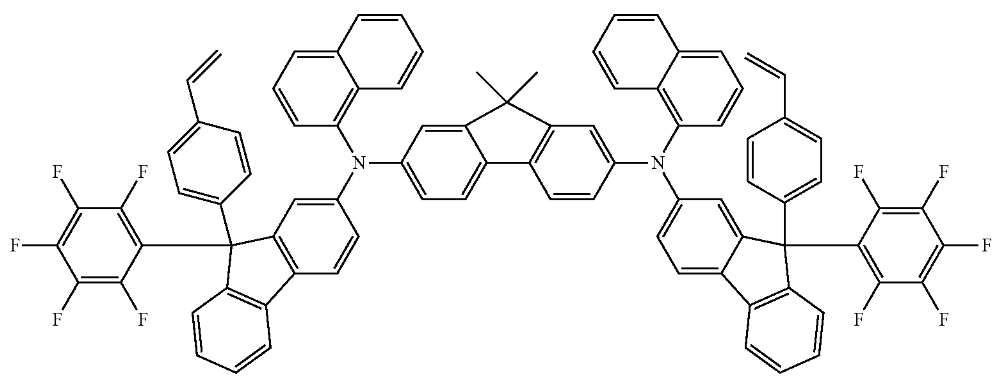
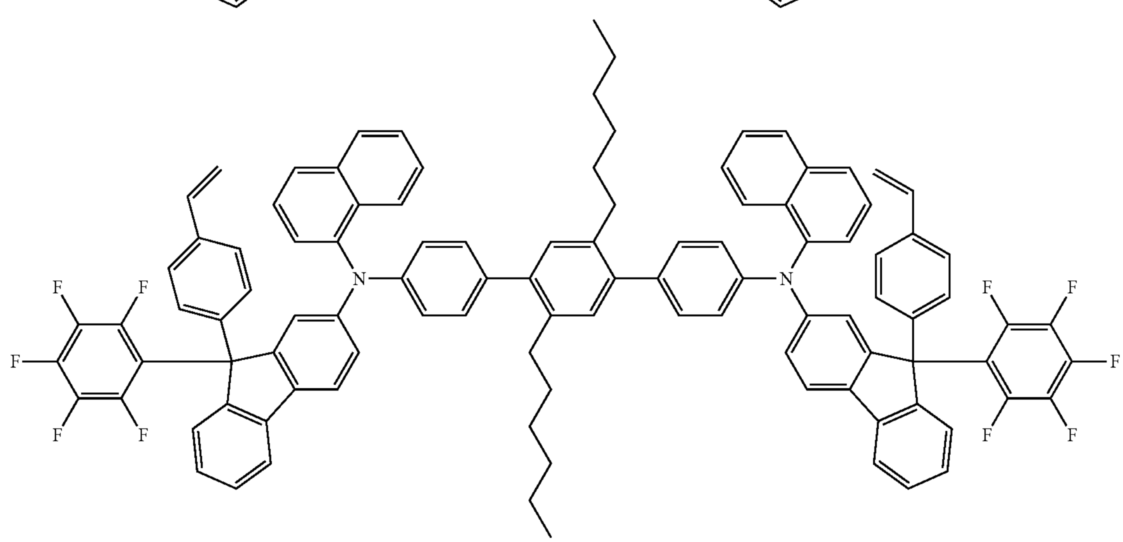

-continued
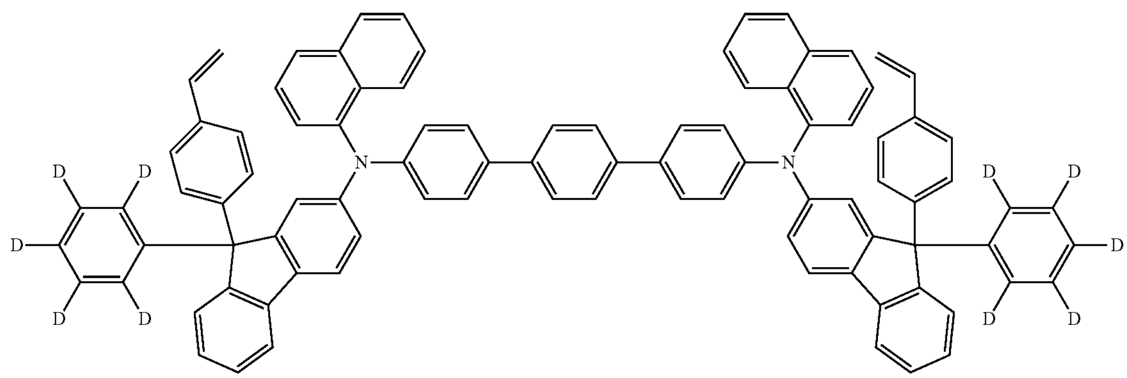
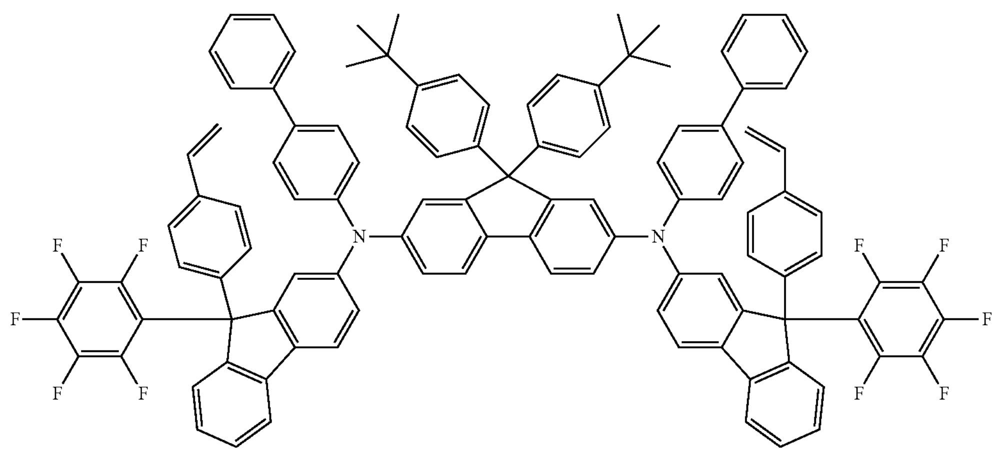
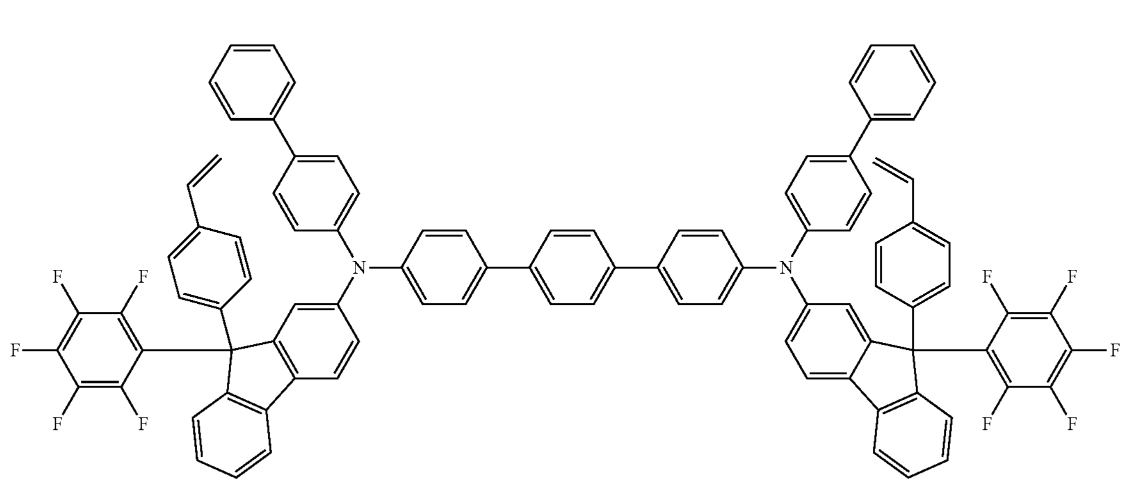

-continued
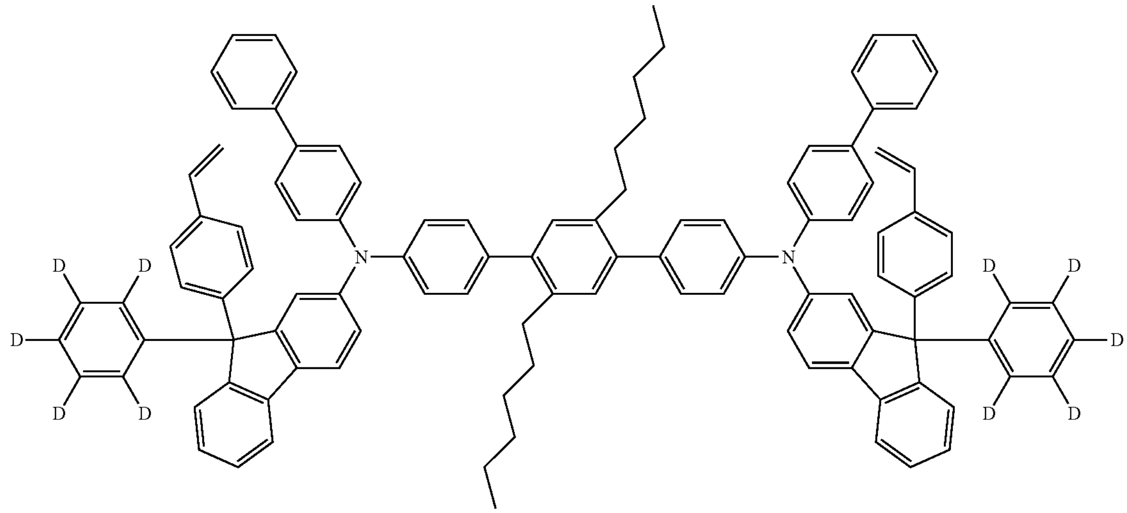
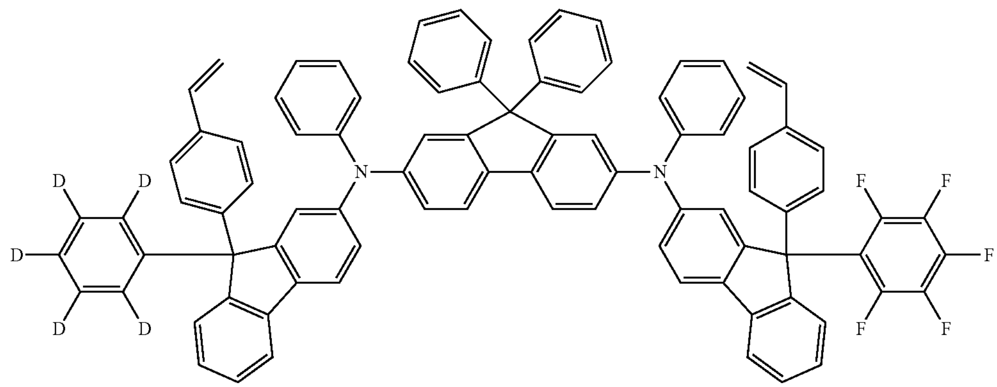
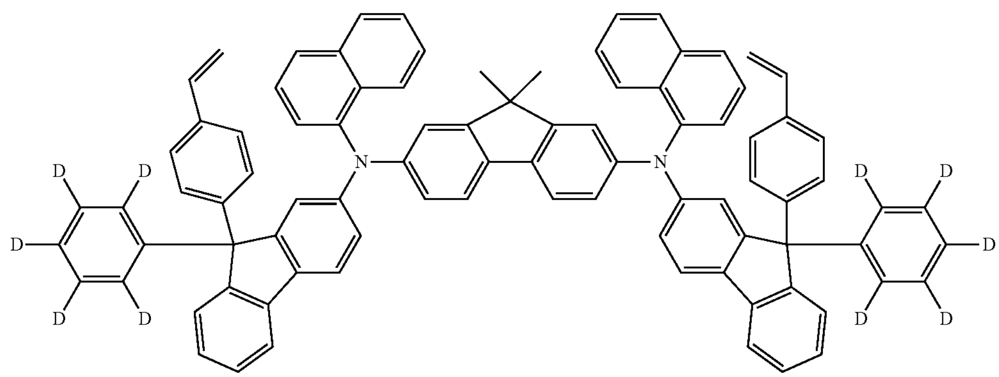
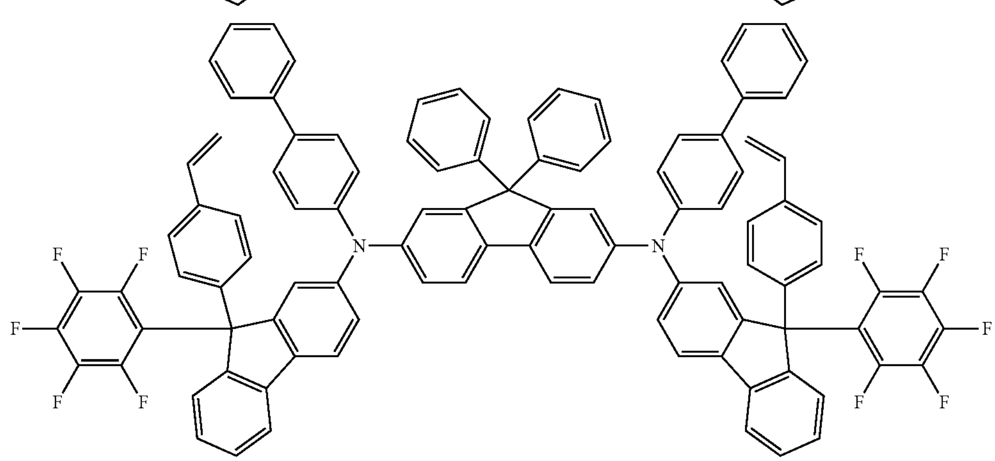

-continued
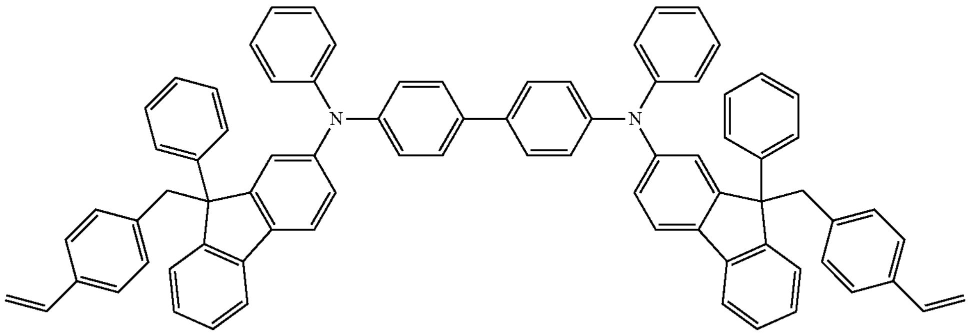
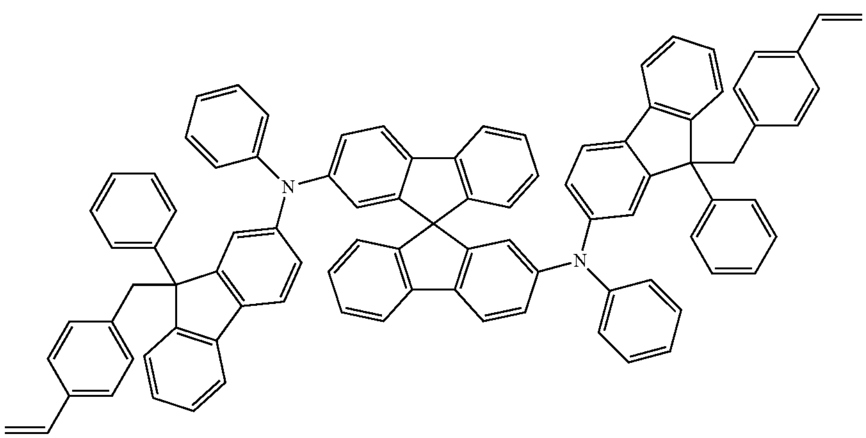
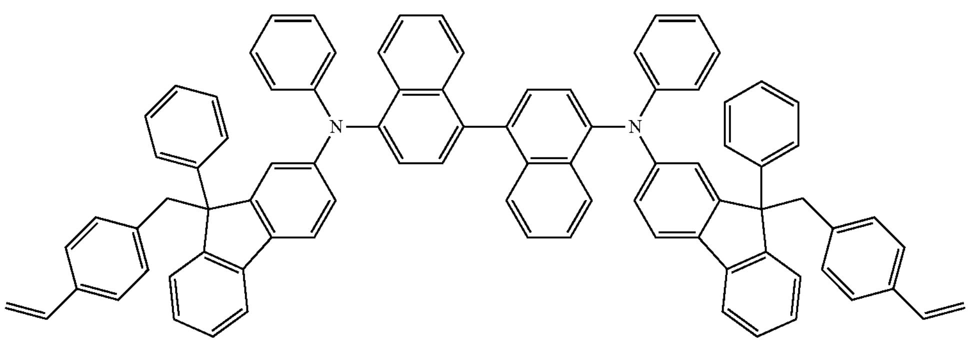
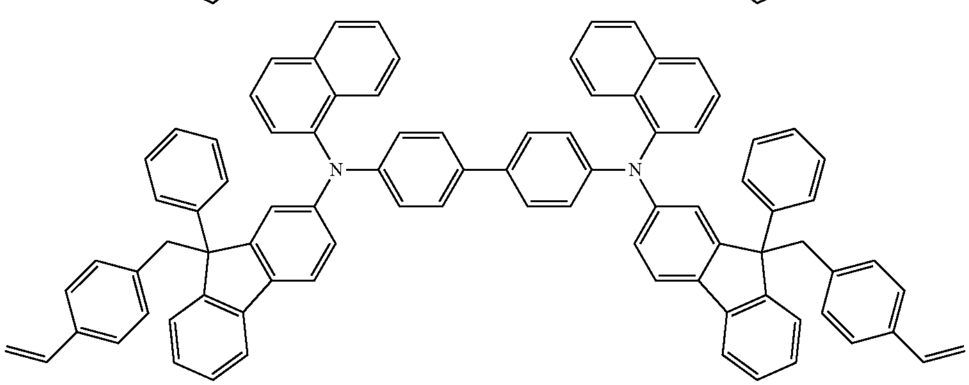

-continued
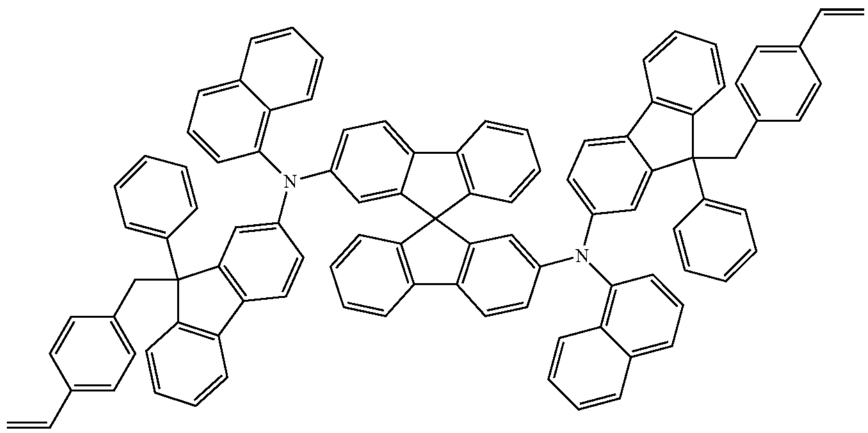
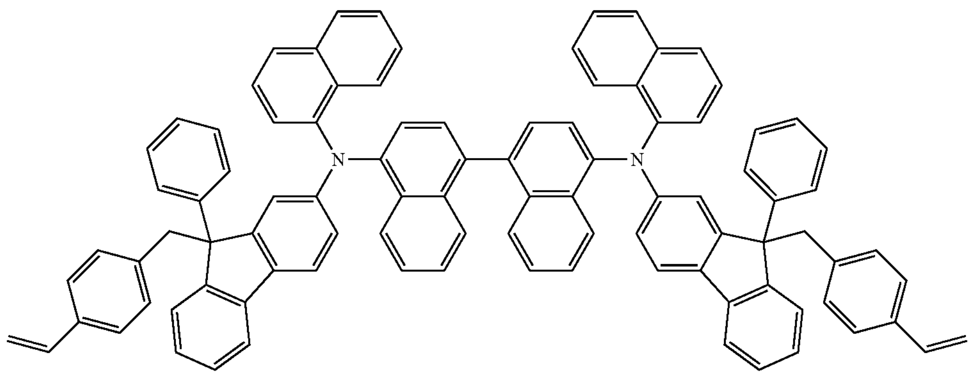
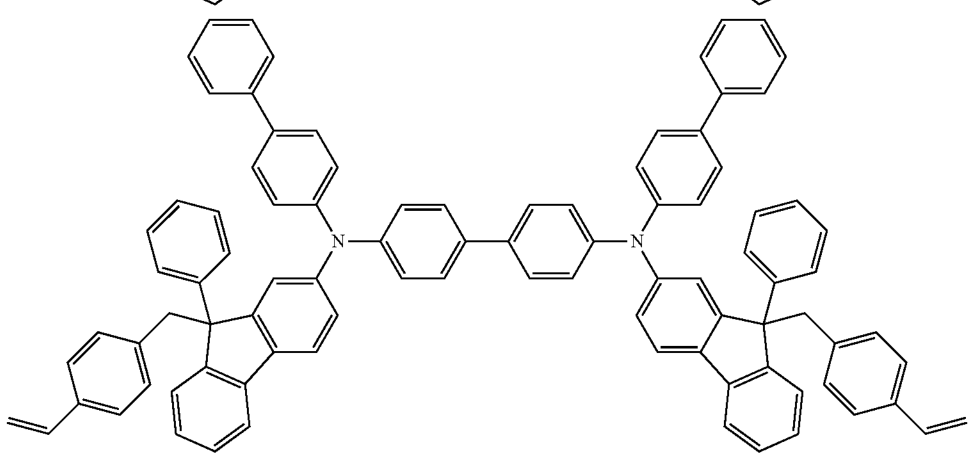
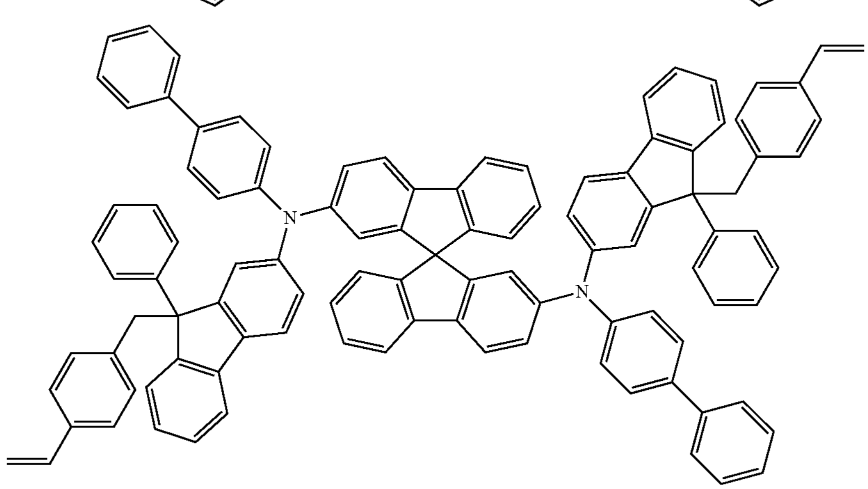

-continued
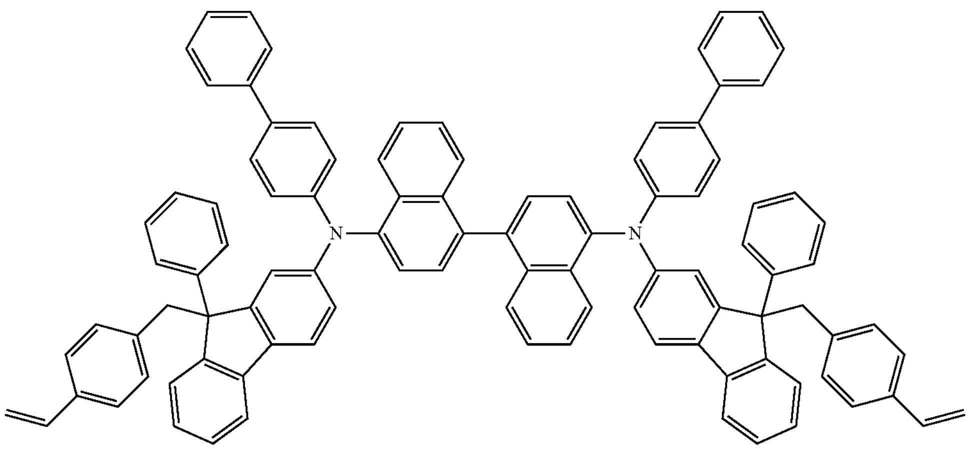
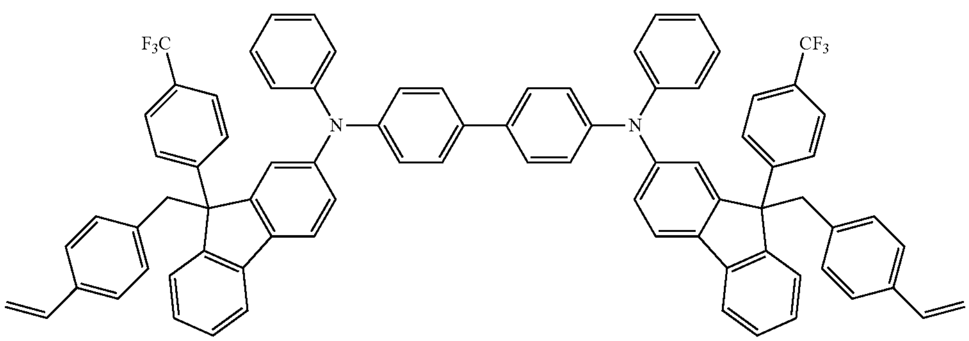
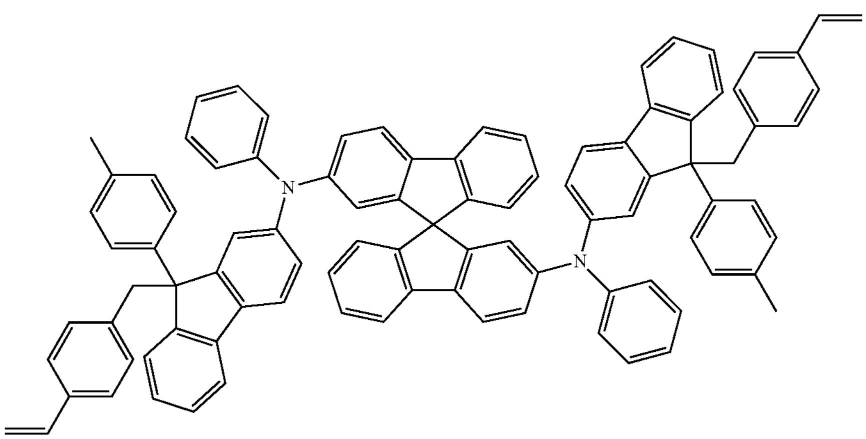
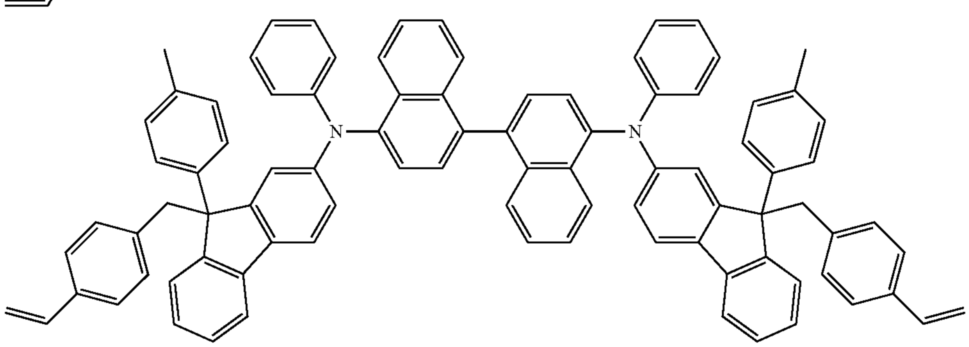

-continued
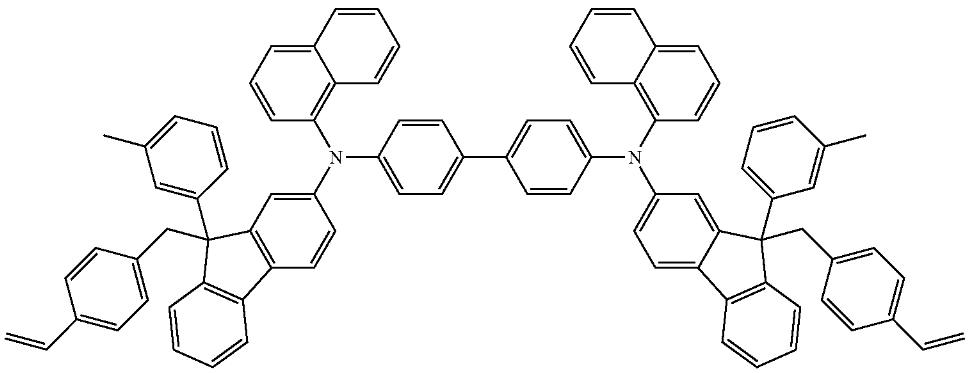
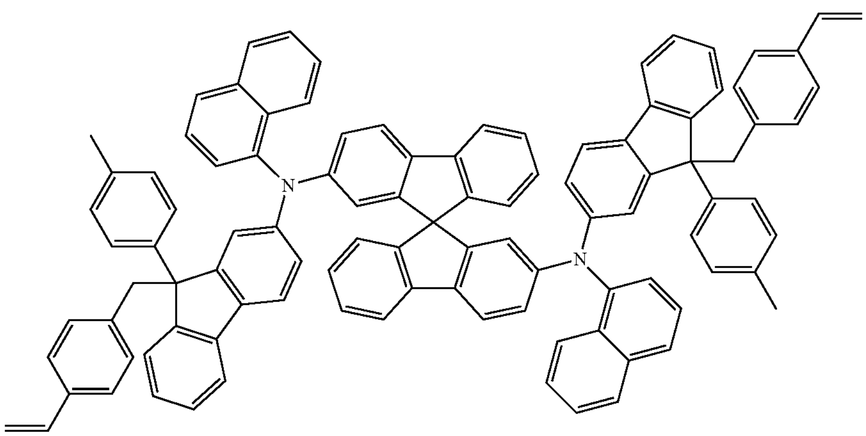
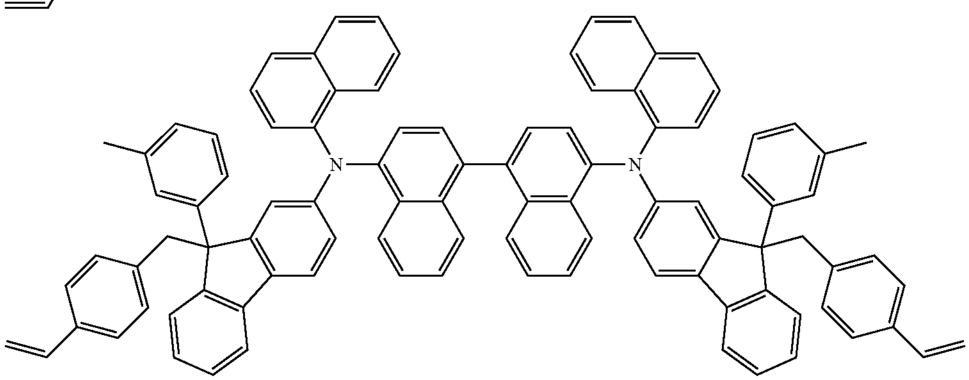
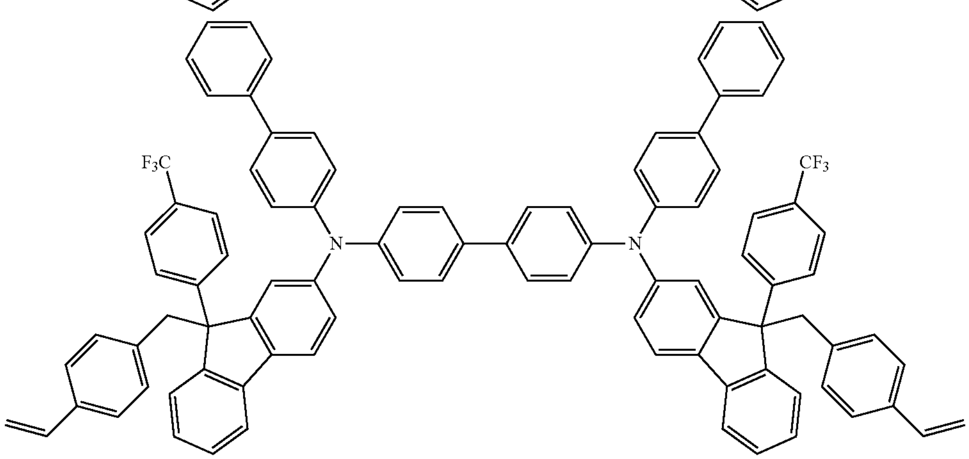

-continued
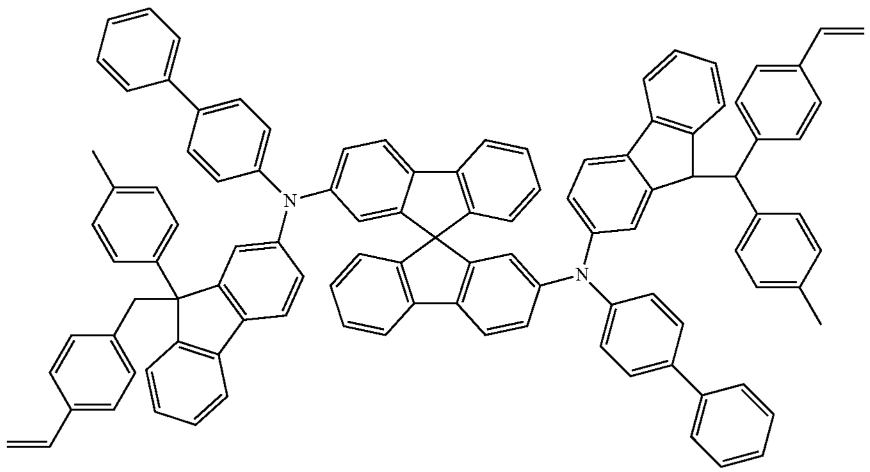
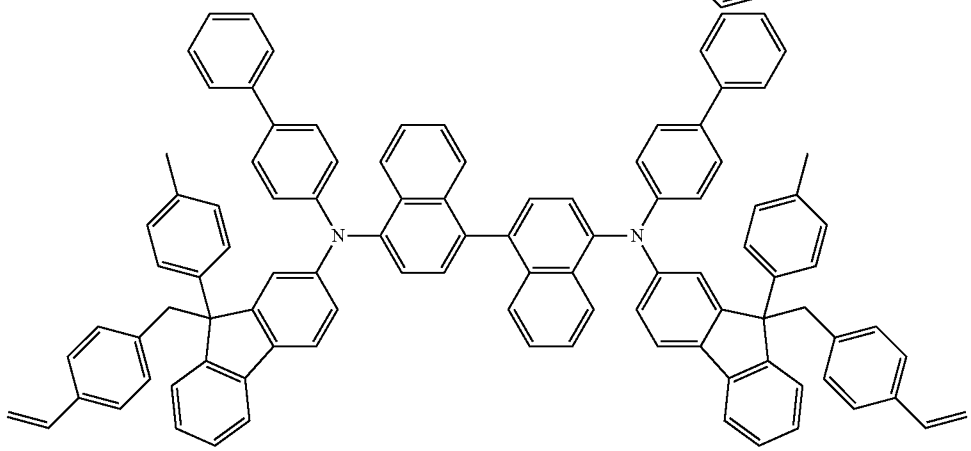
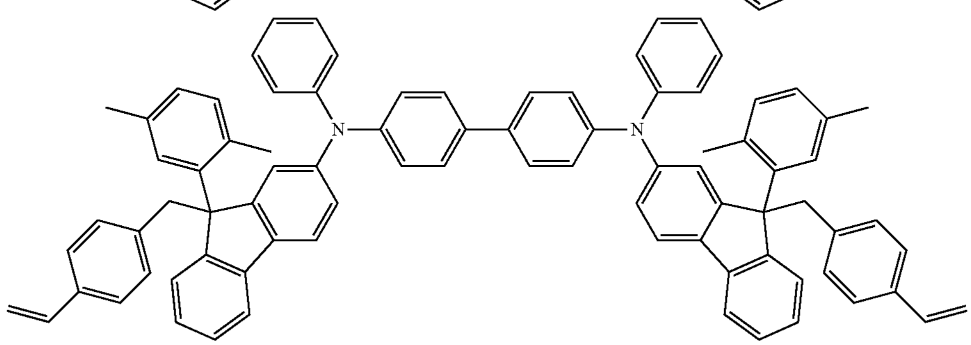
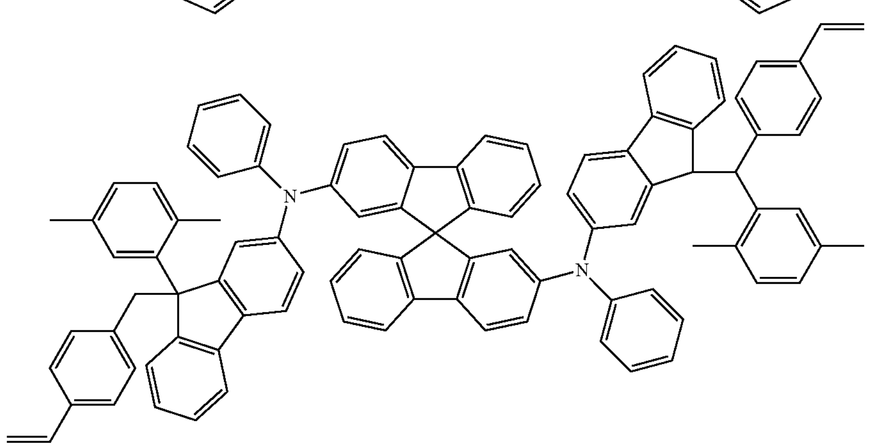

-continued
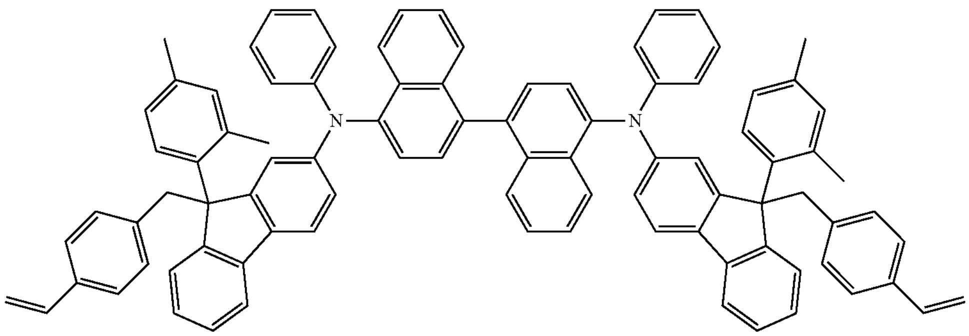
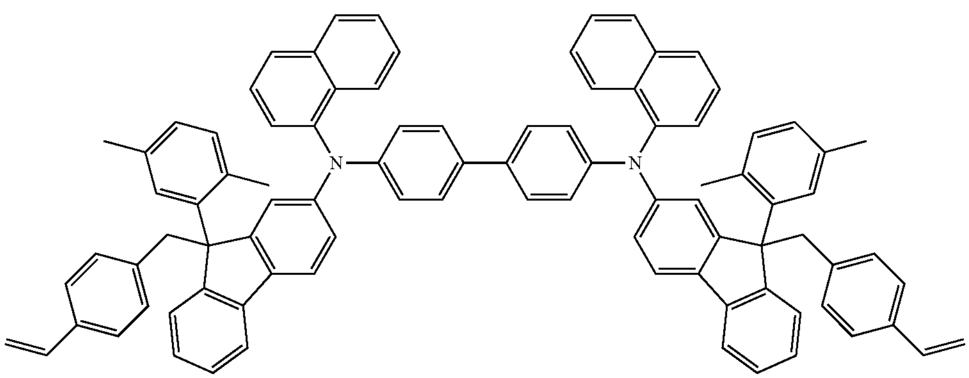
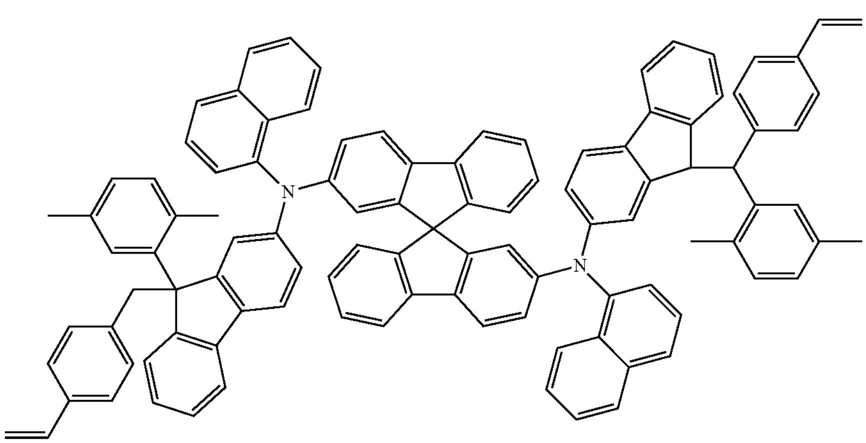
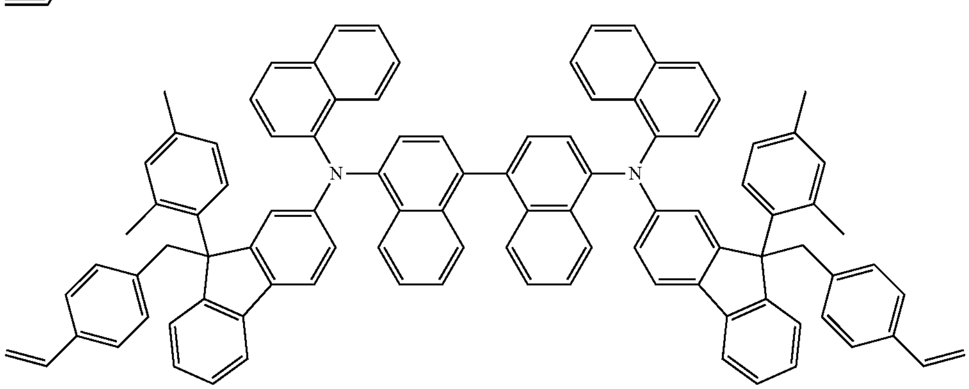

-continued
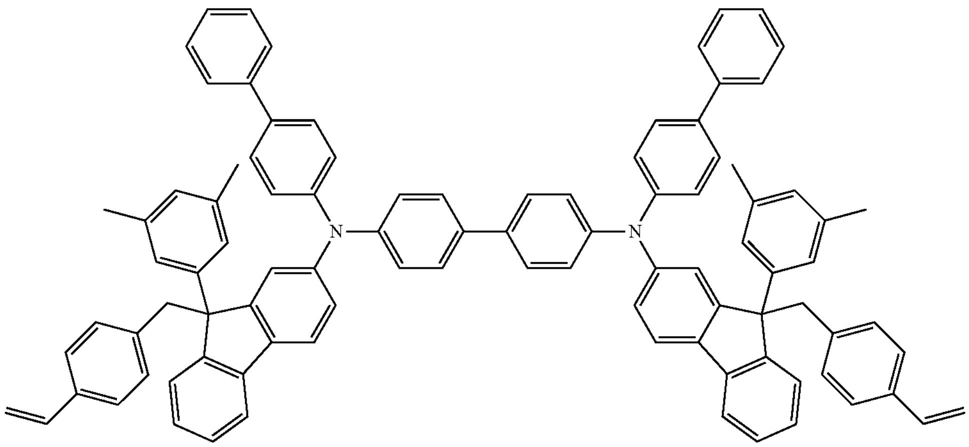
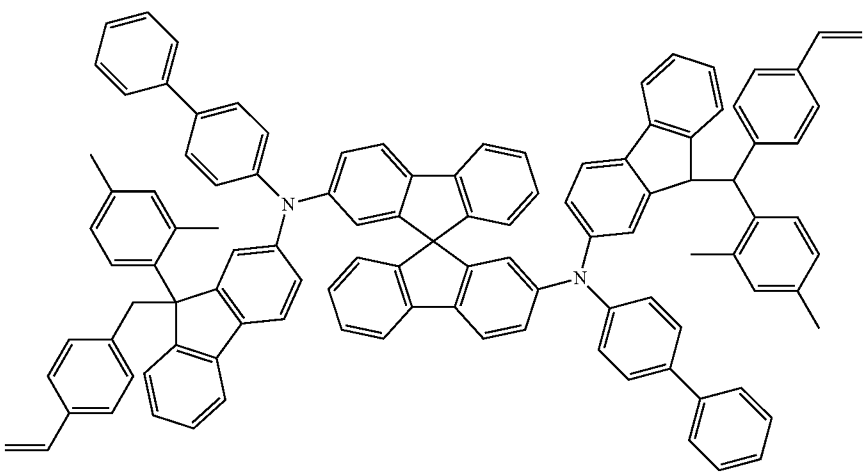
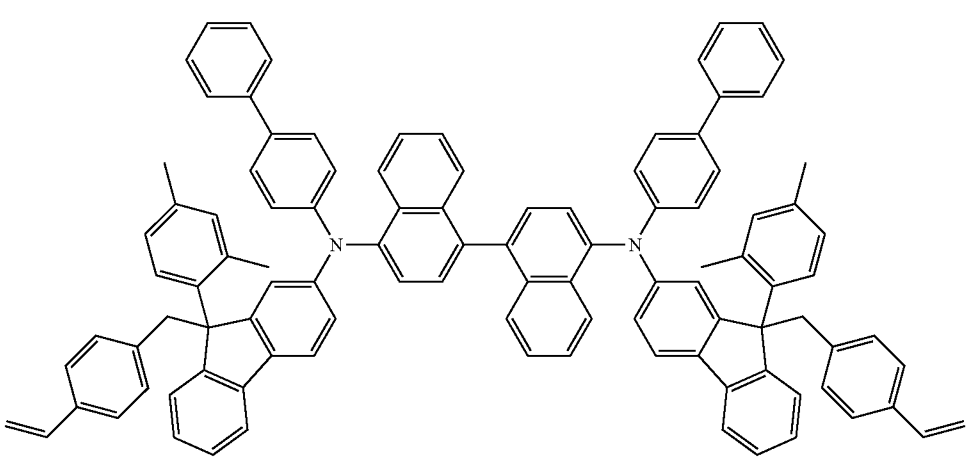

-continued
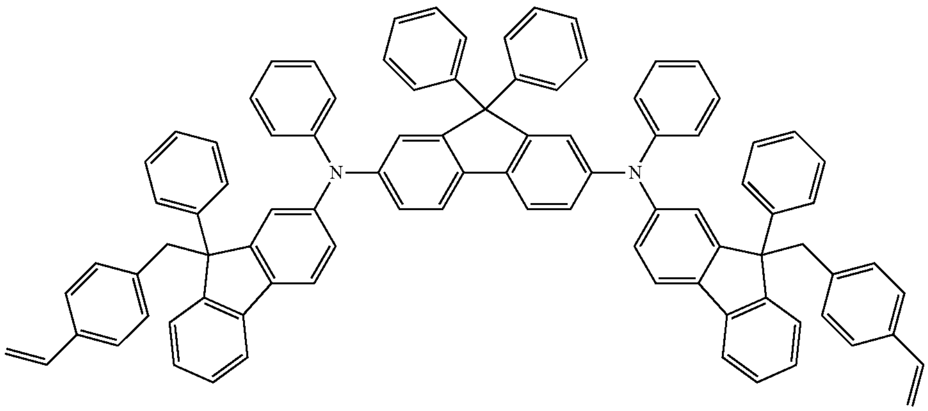
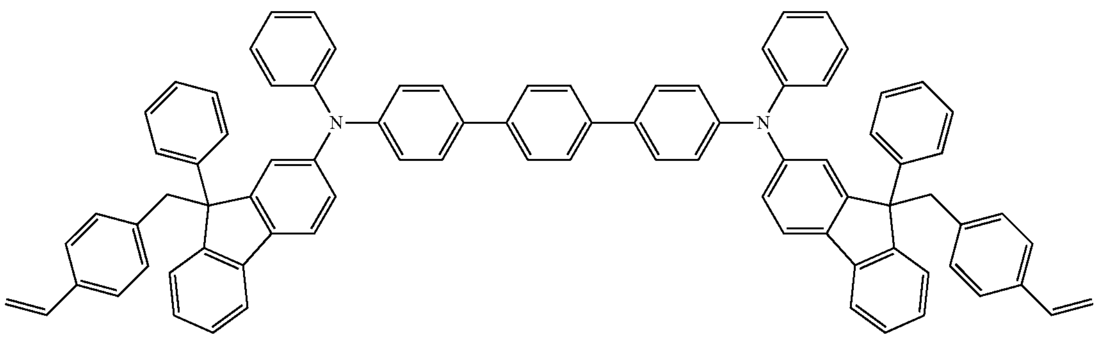
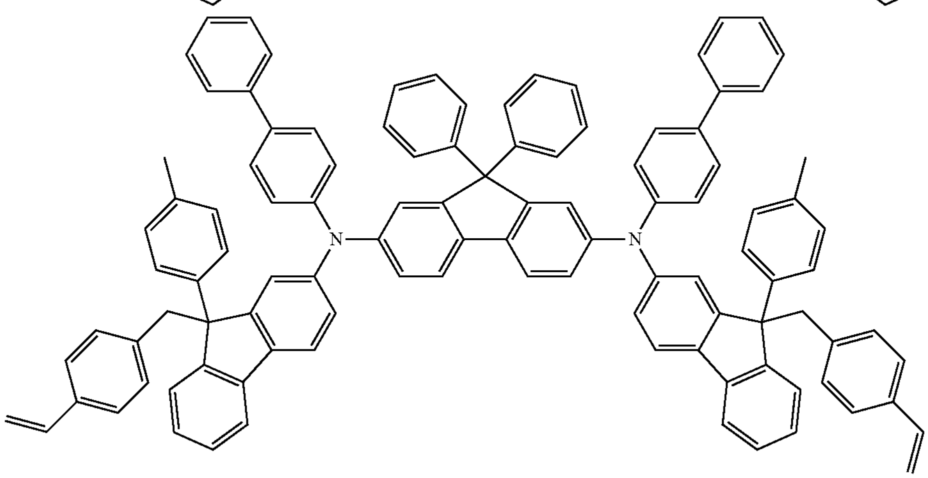
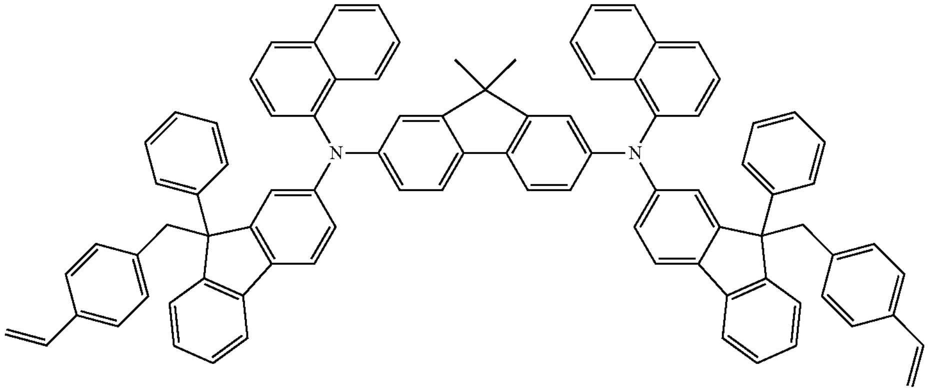

-continued
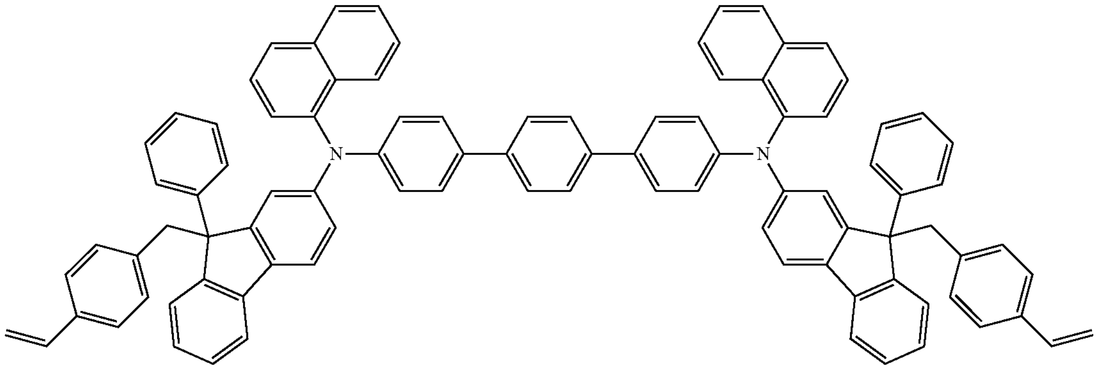
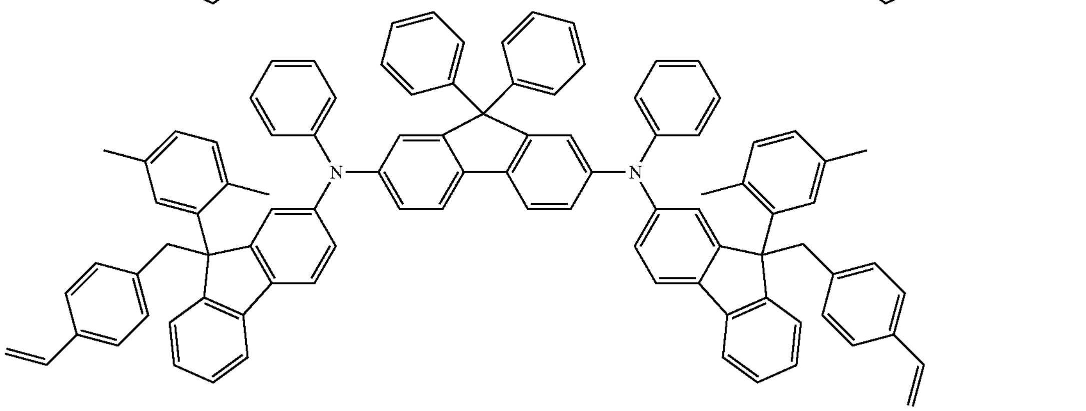
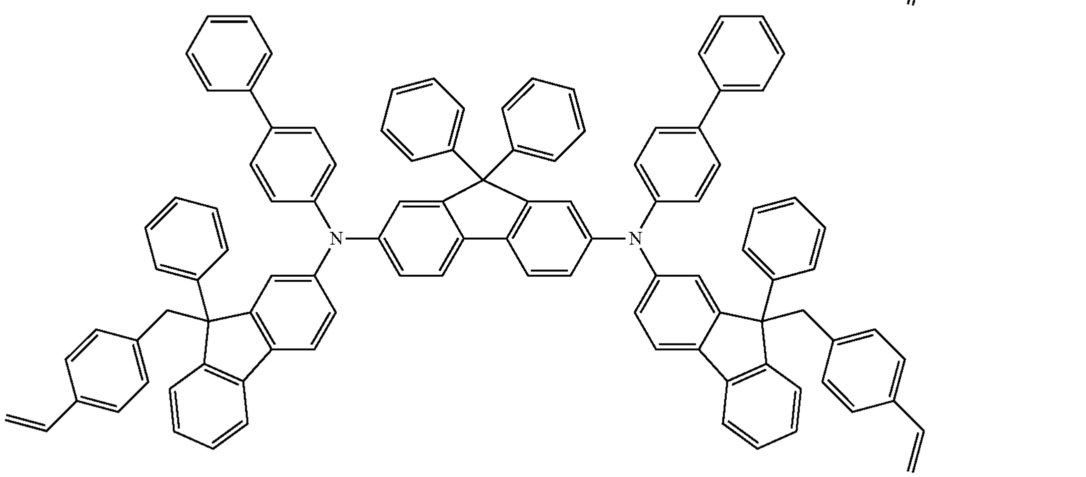
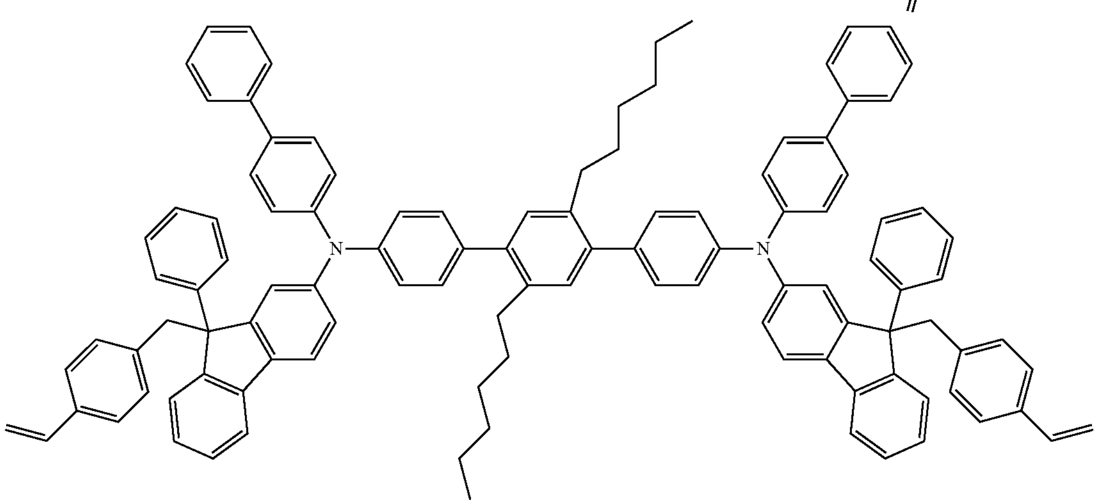

-continued
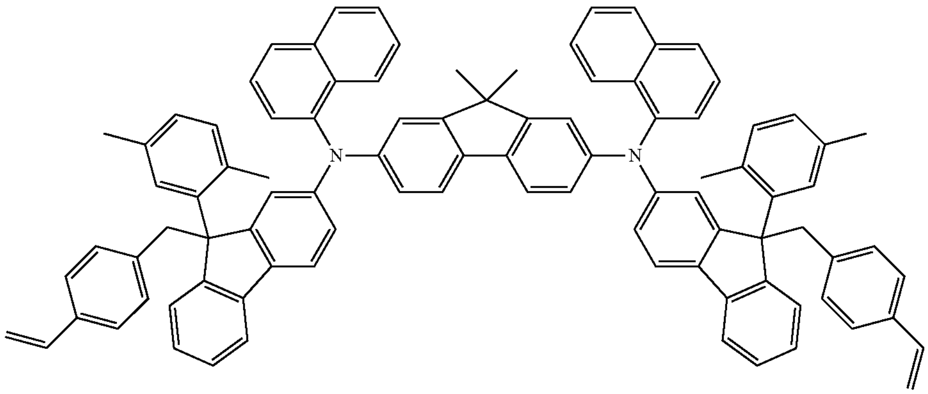
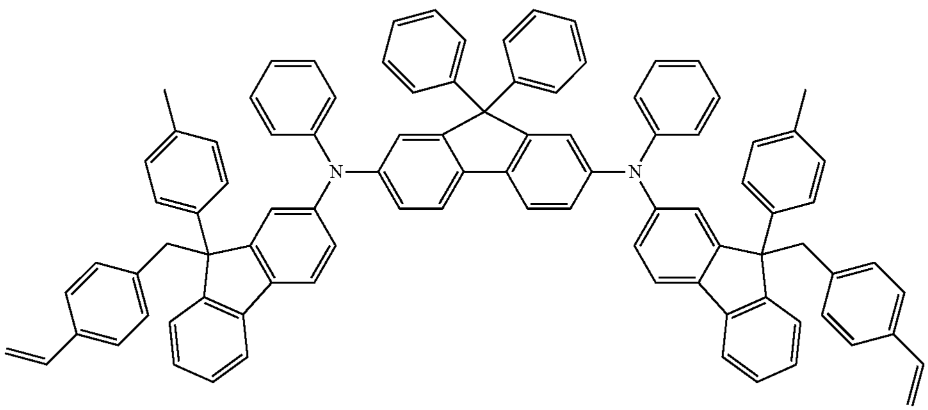
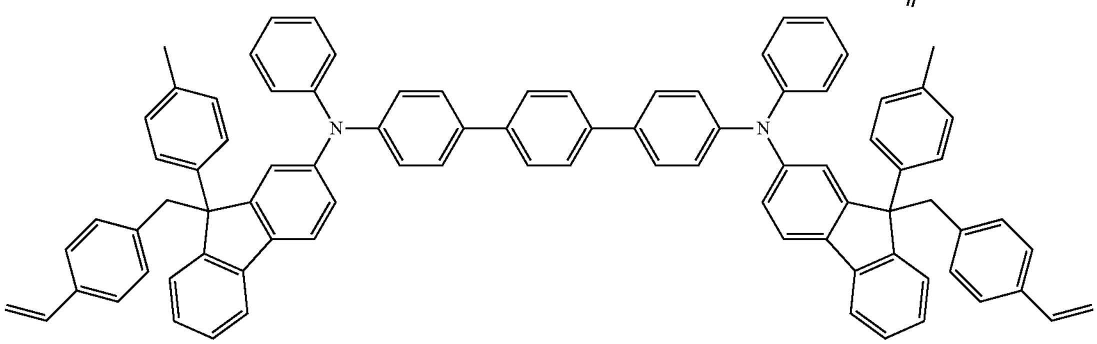
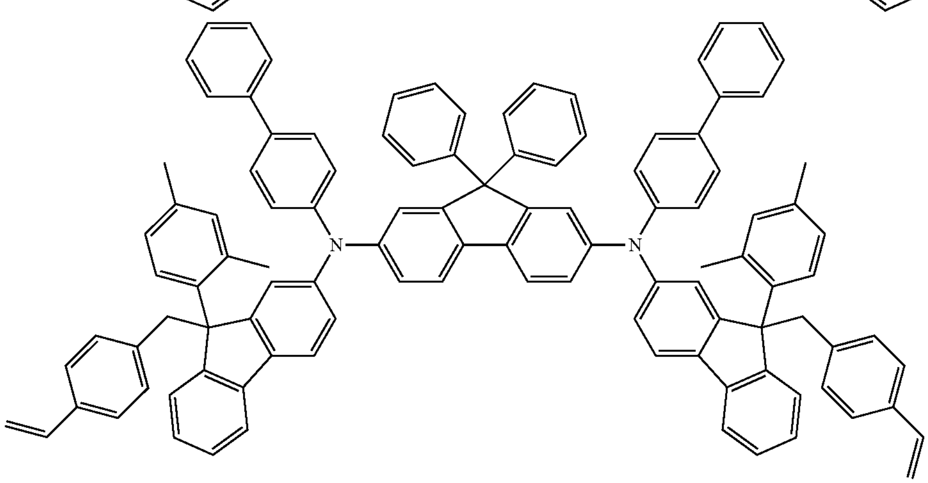

-continued
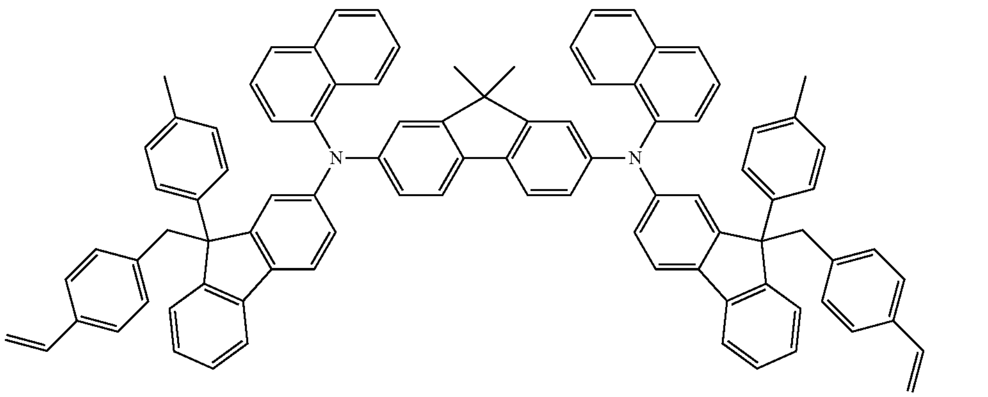
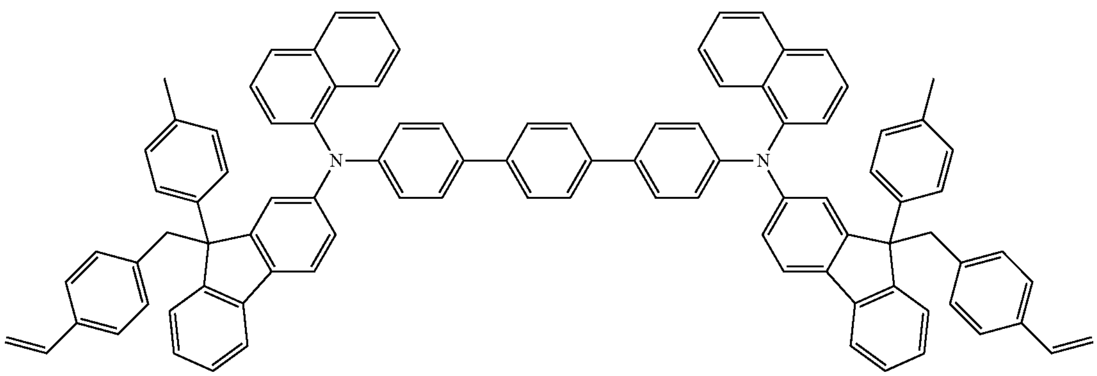
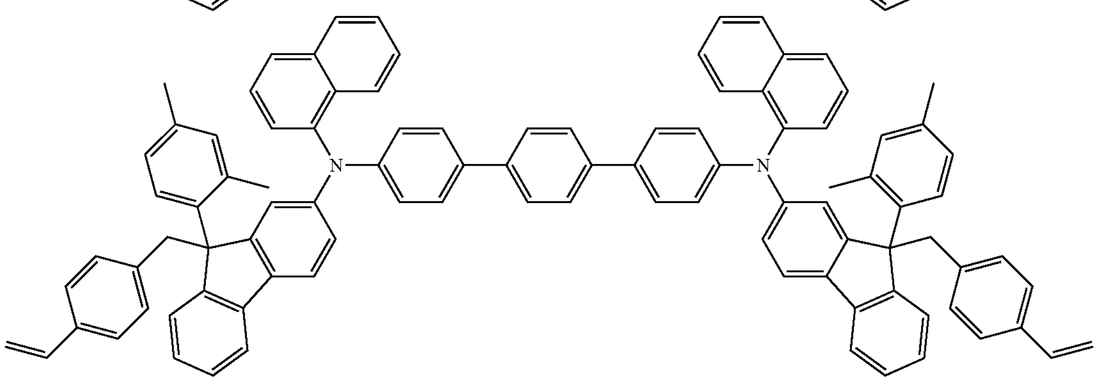
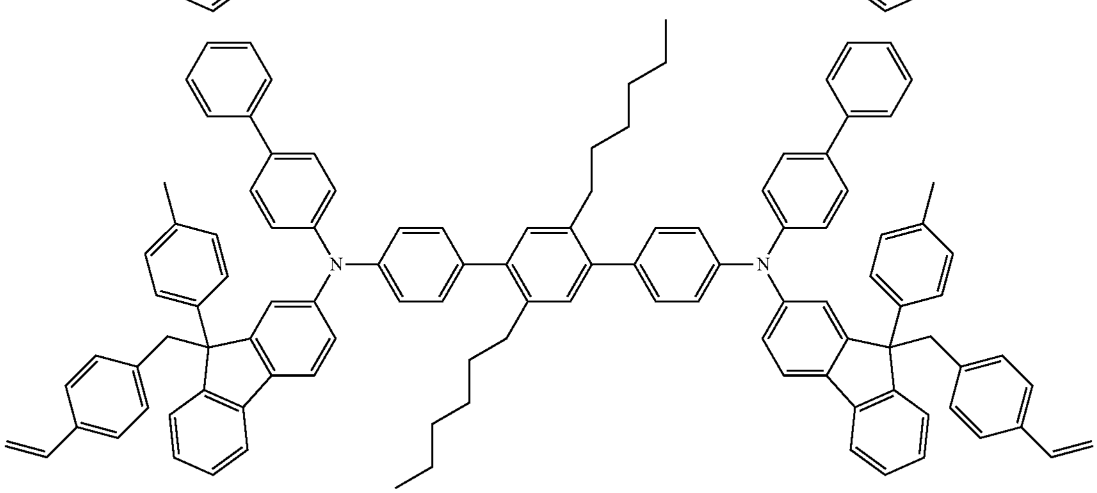

-continued
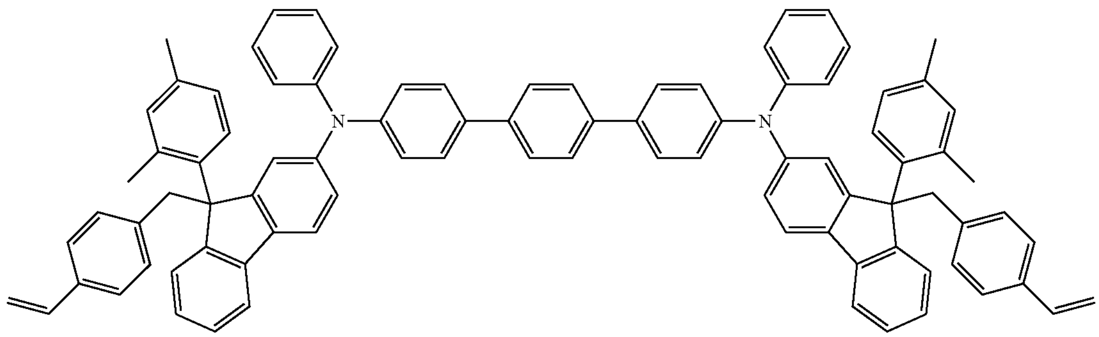
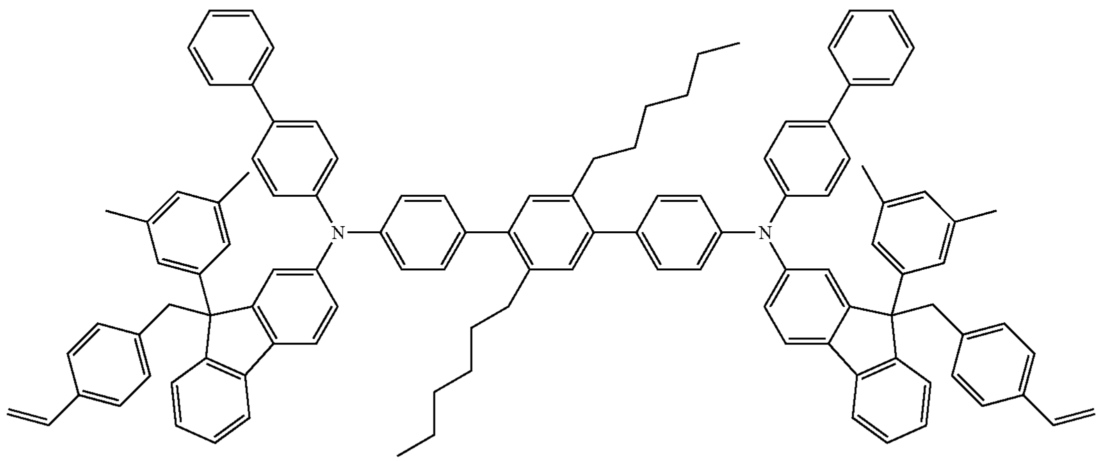
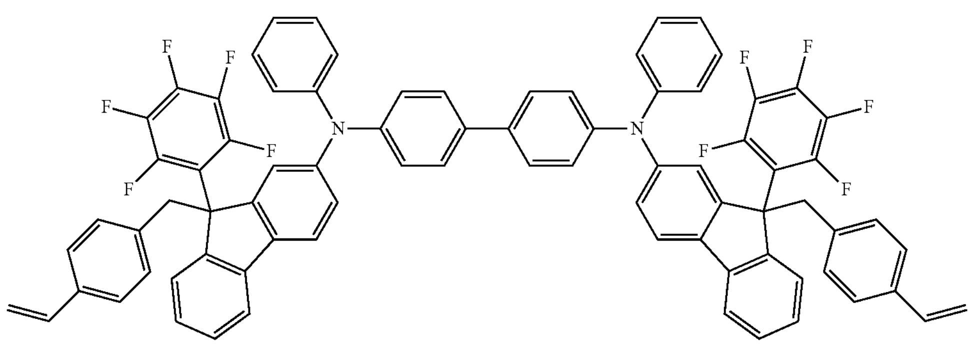
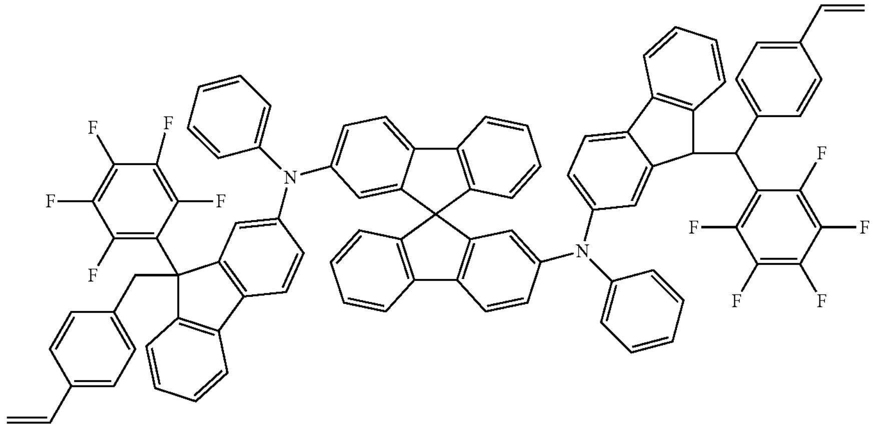

-continued
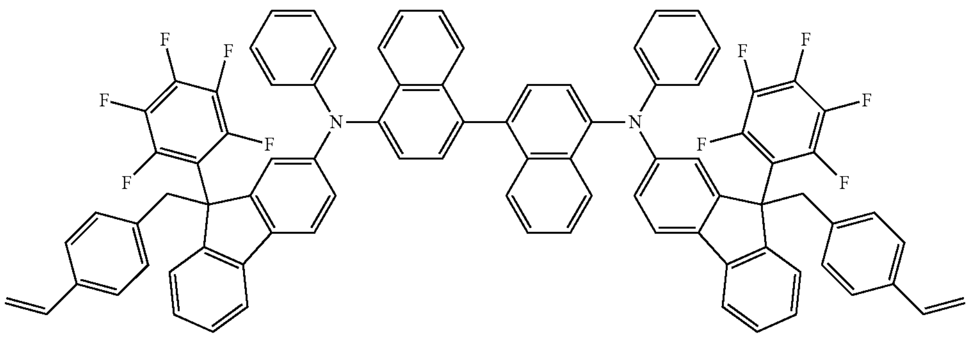
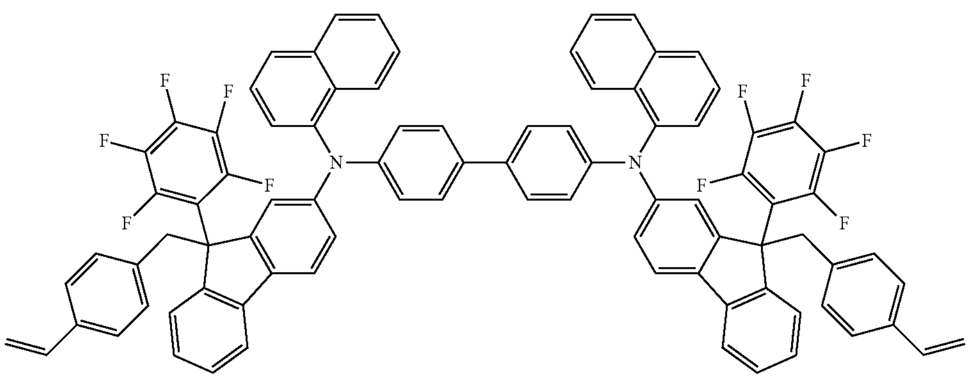
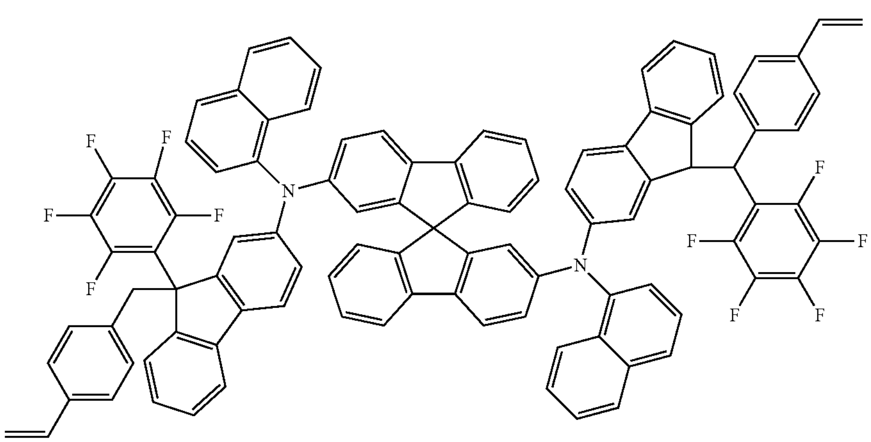
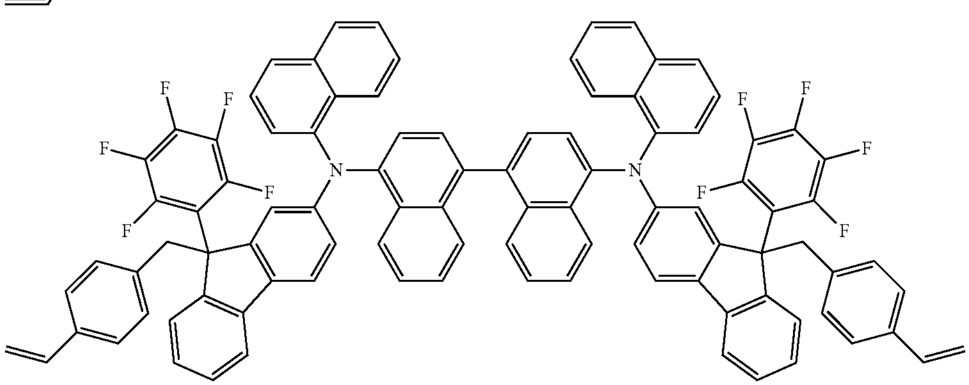

-continued
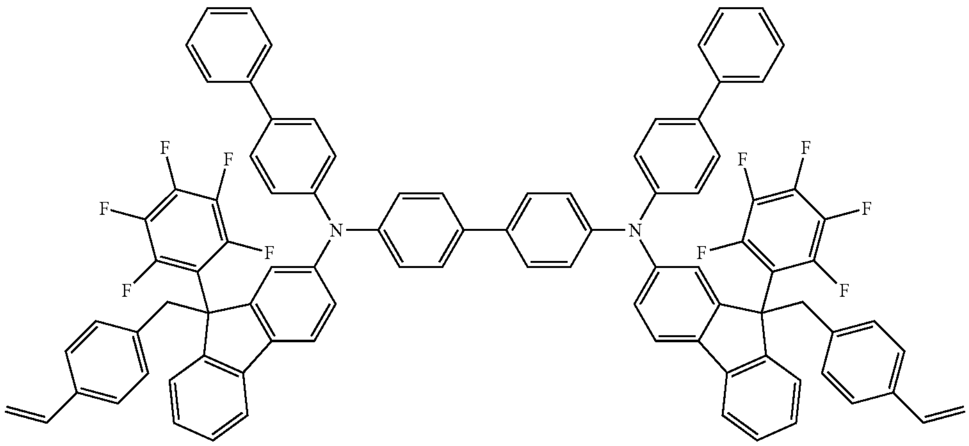
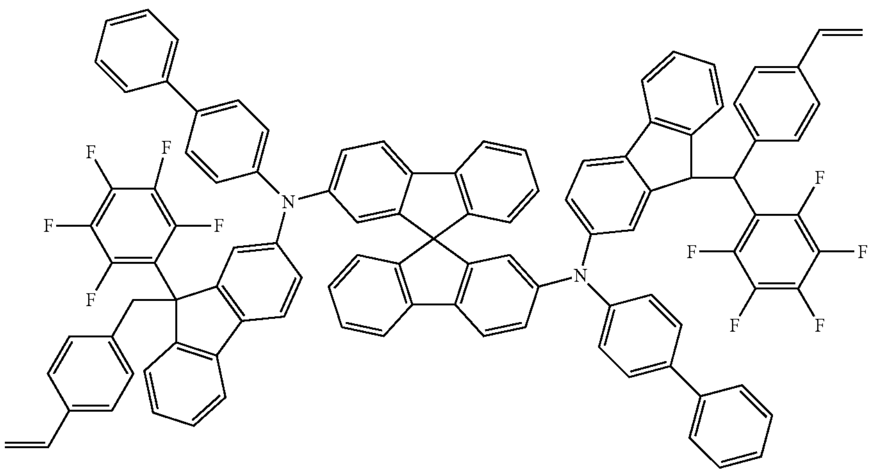
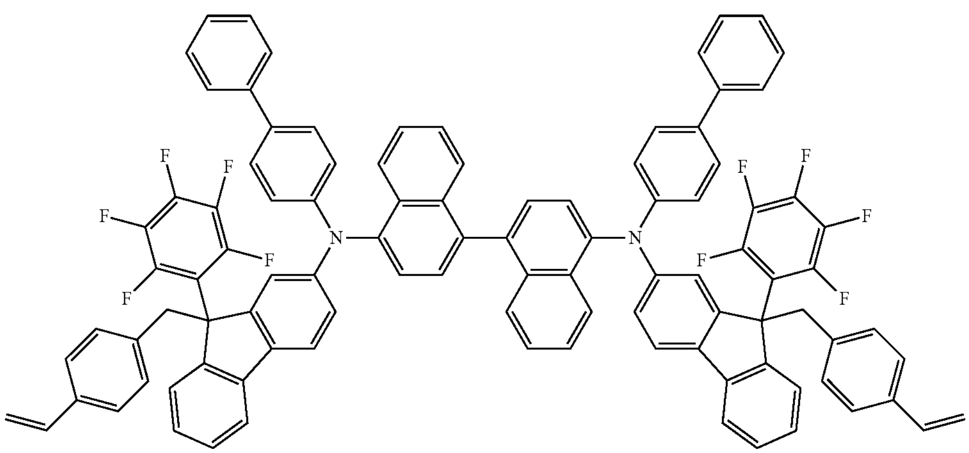
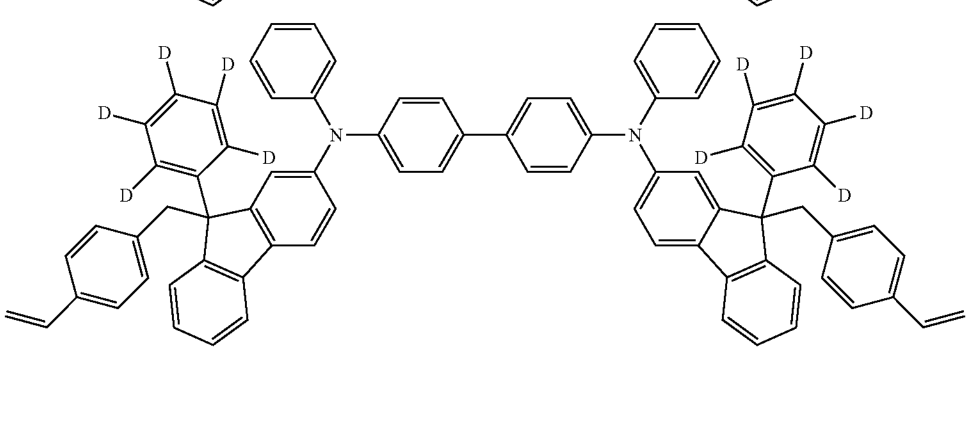

-continued
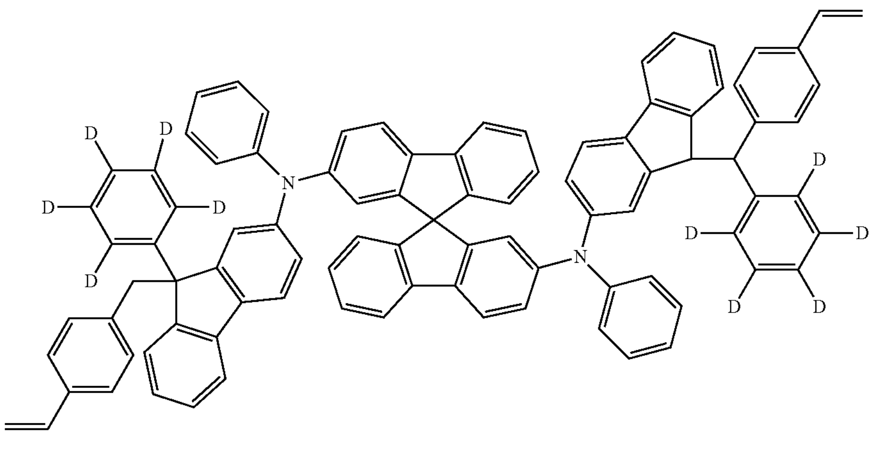
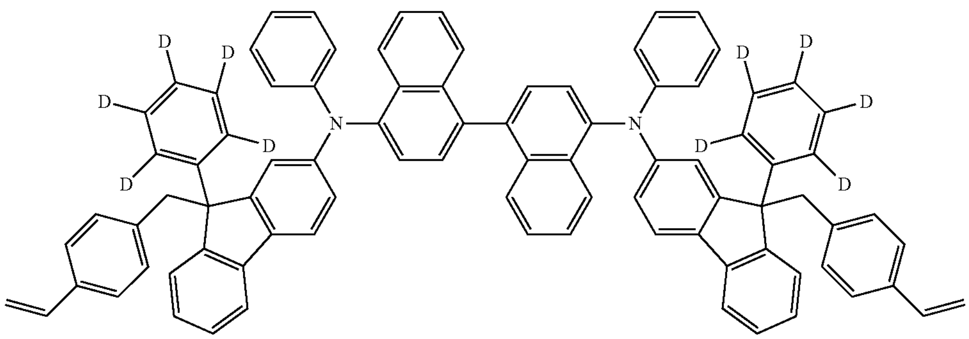
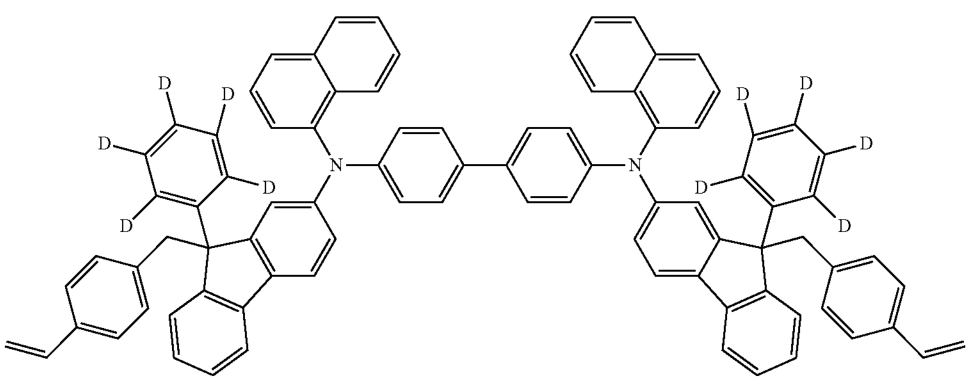
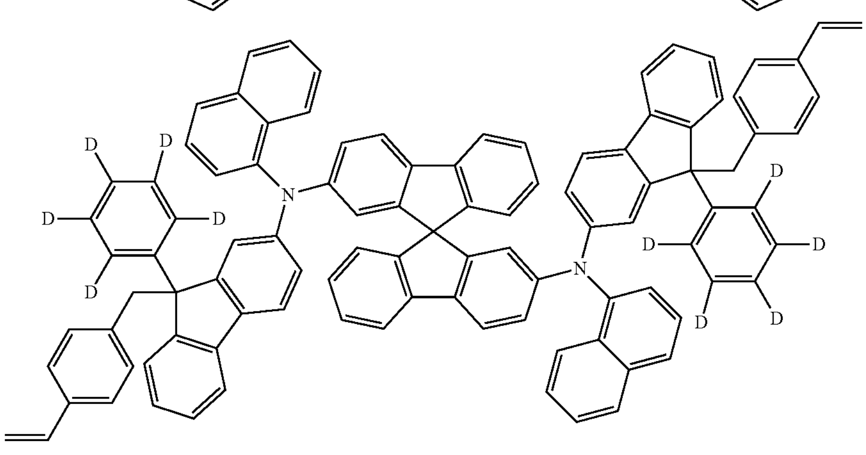

-continued
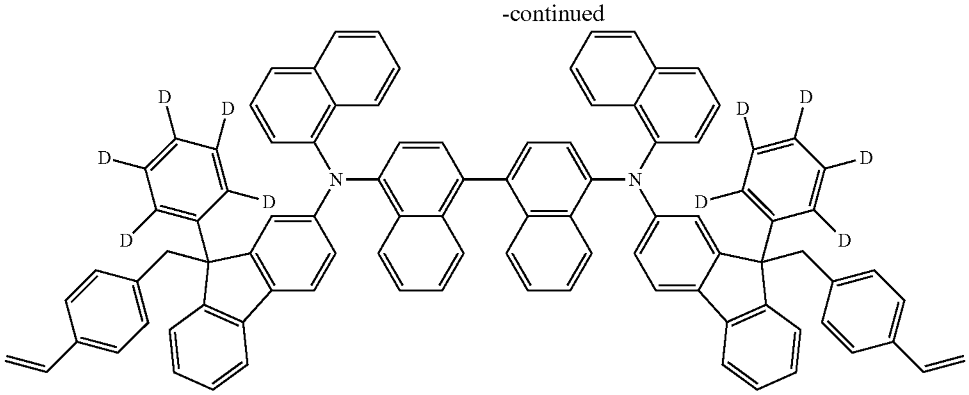
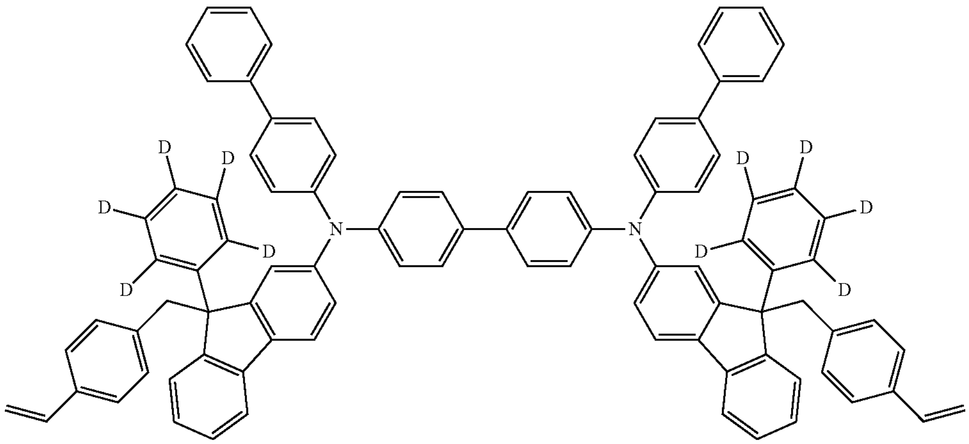
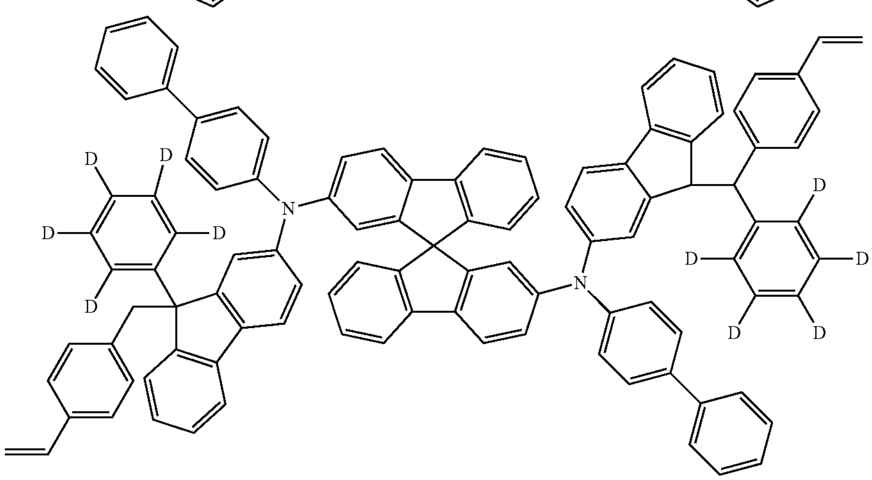
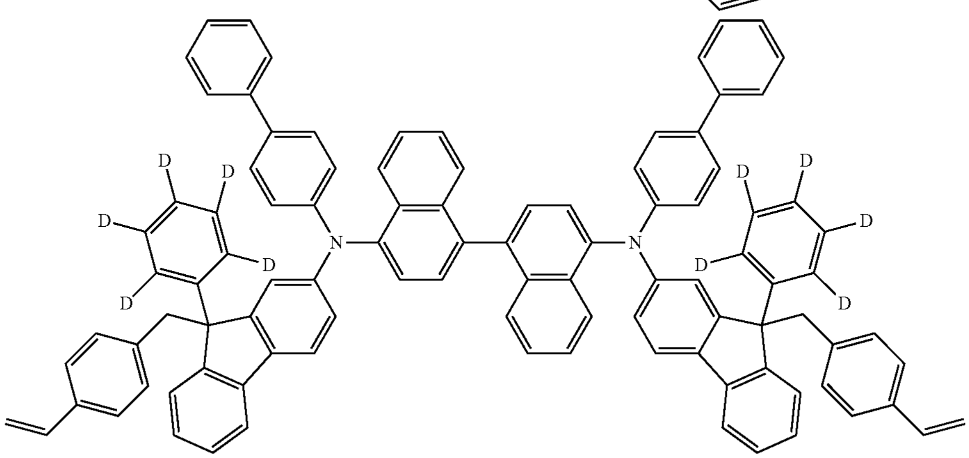

-continued
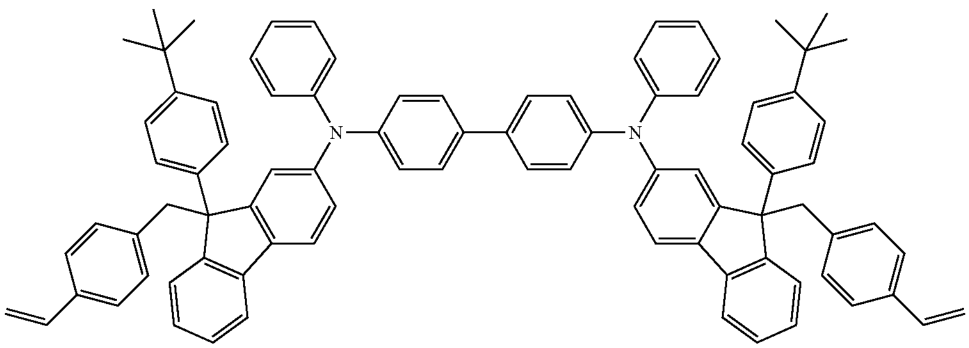
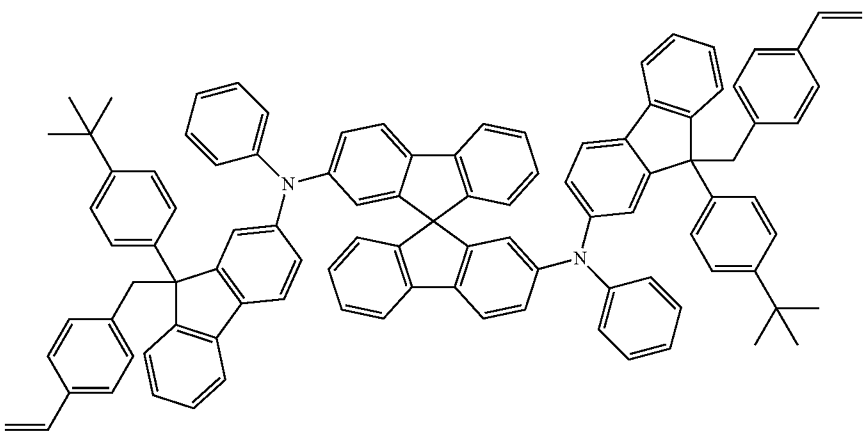
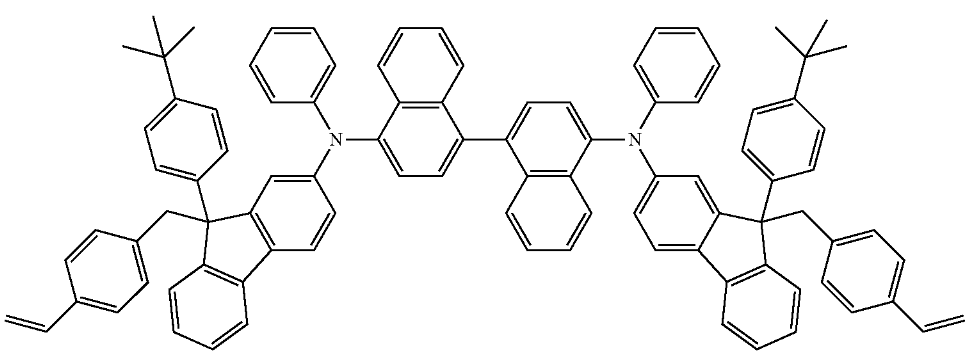
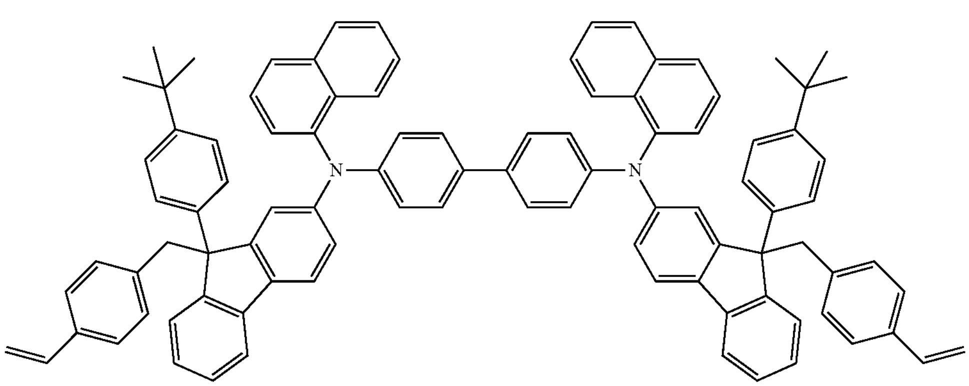

-continued
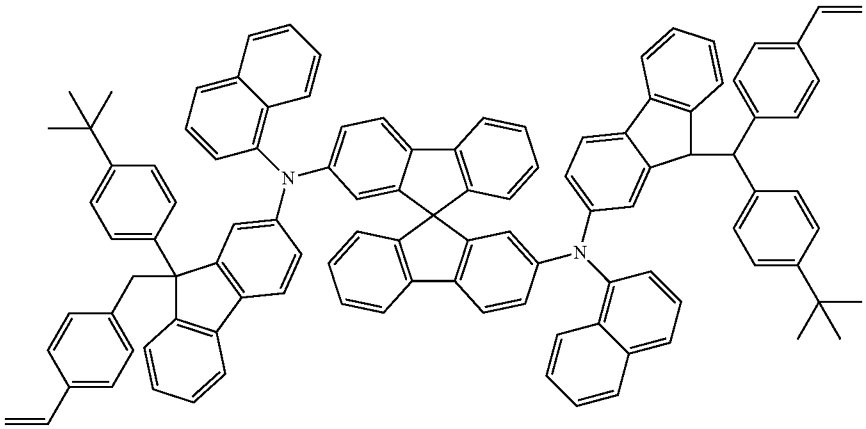
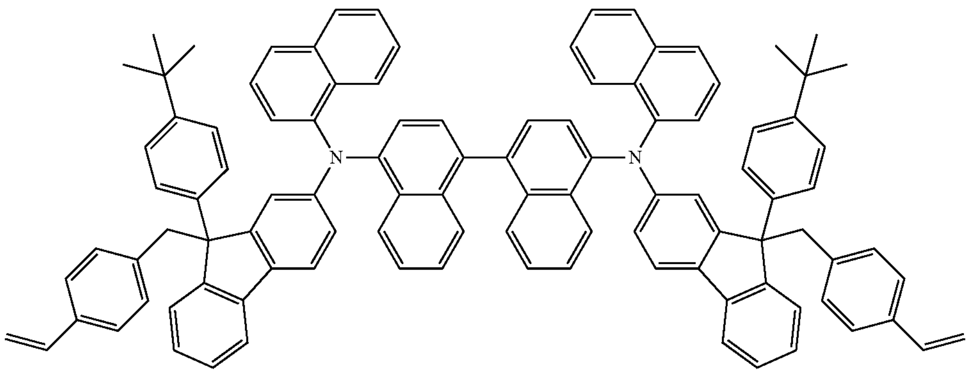
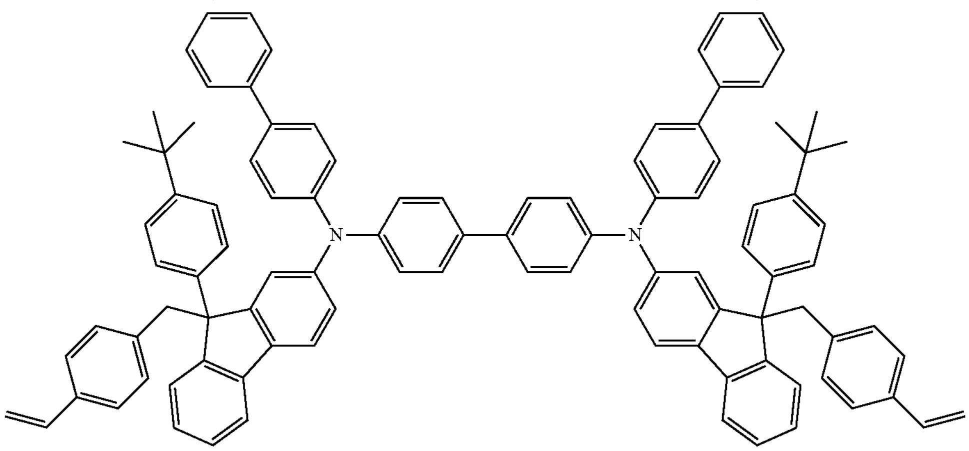
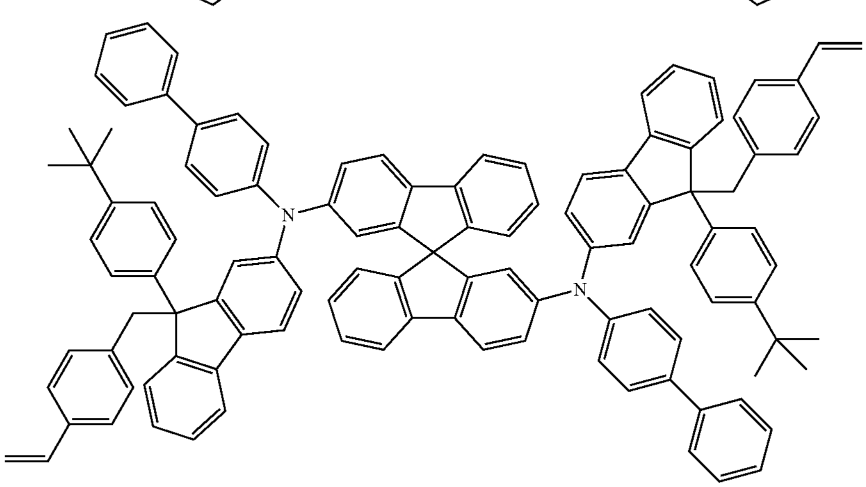

-continued
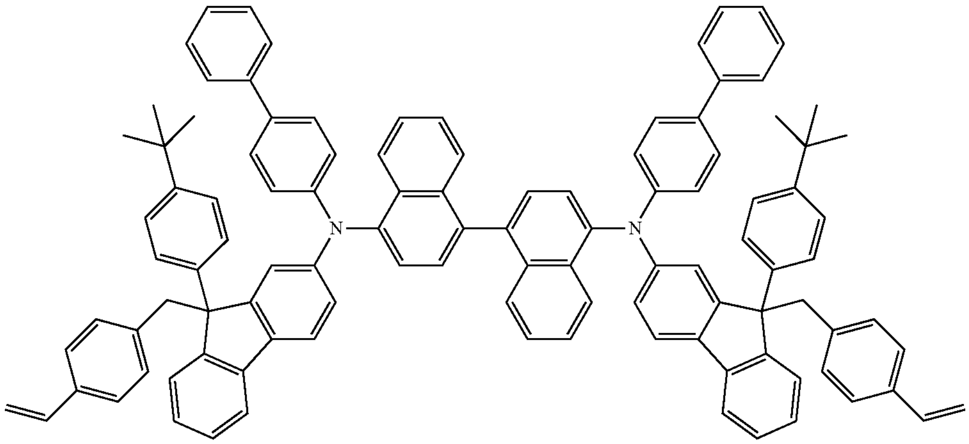
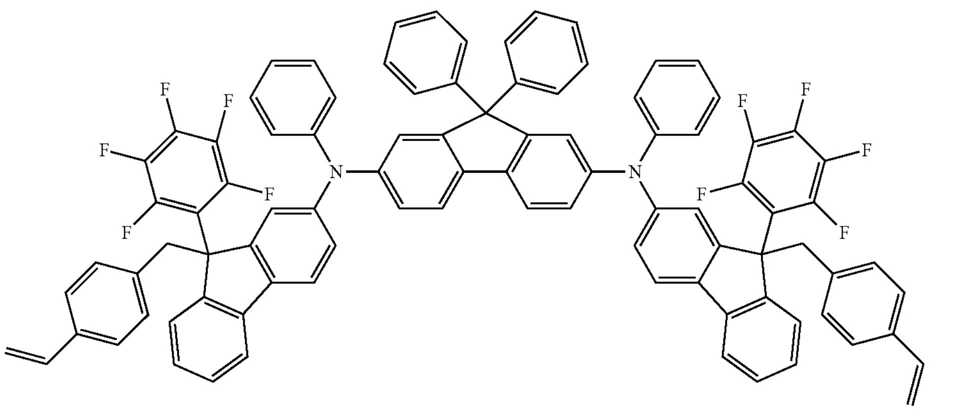
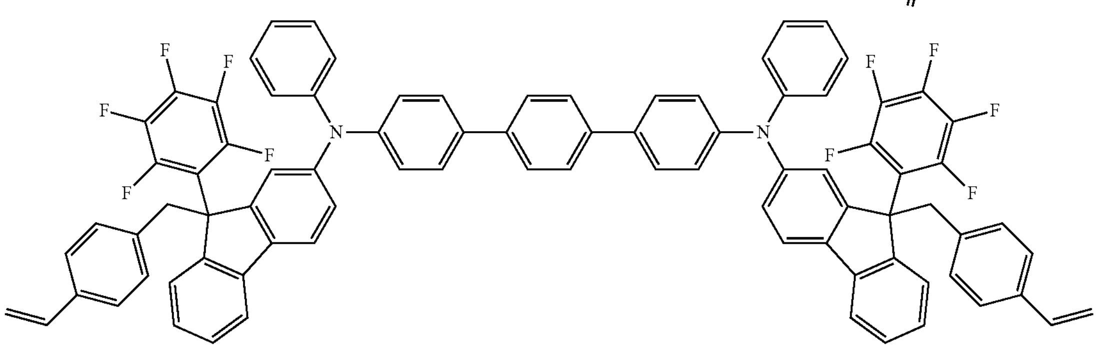
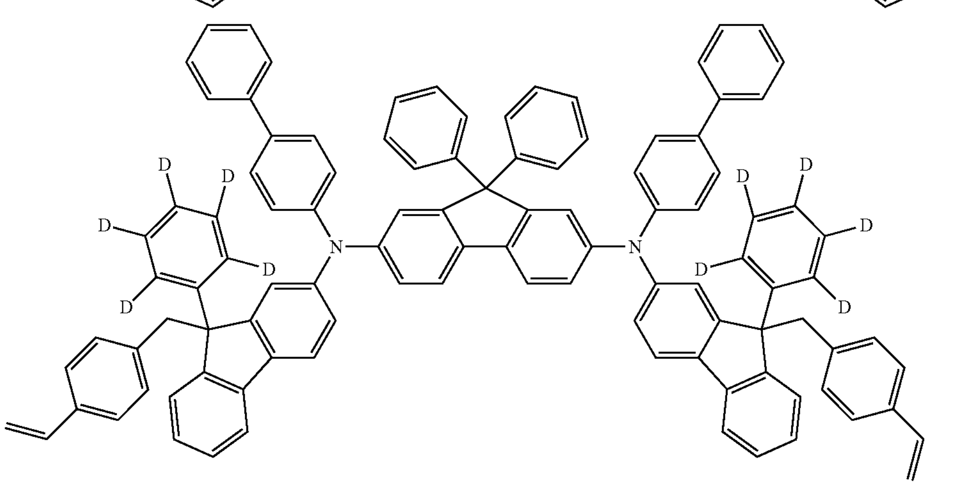

-continued
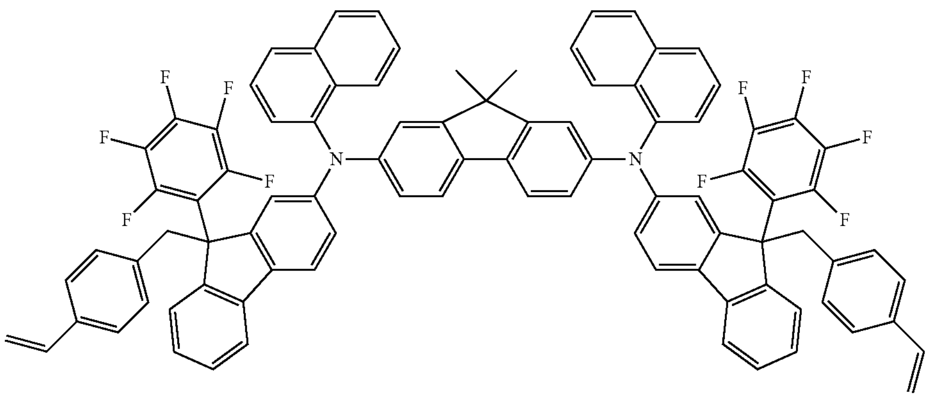
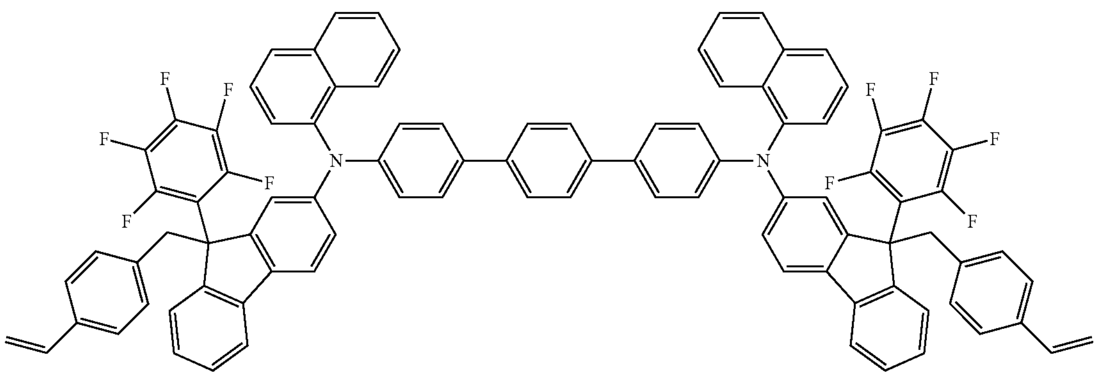
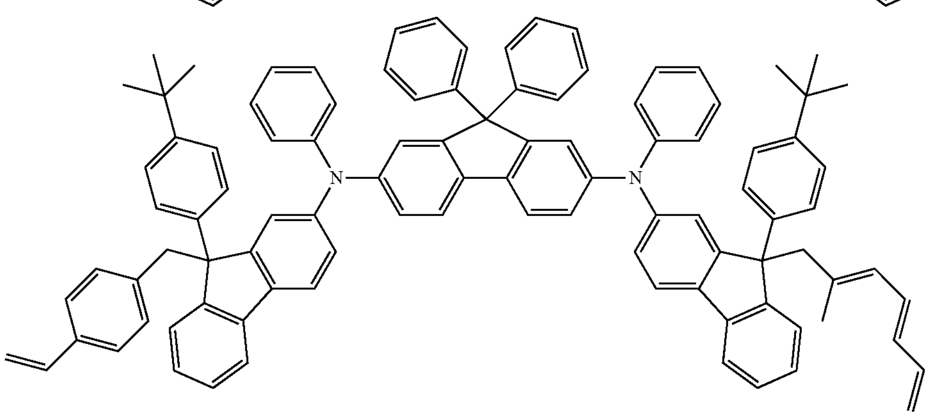
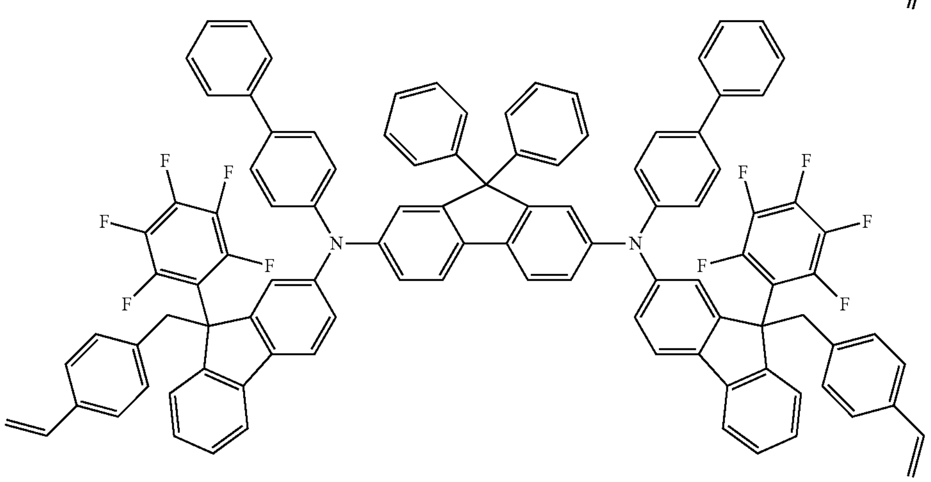

-continued
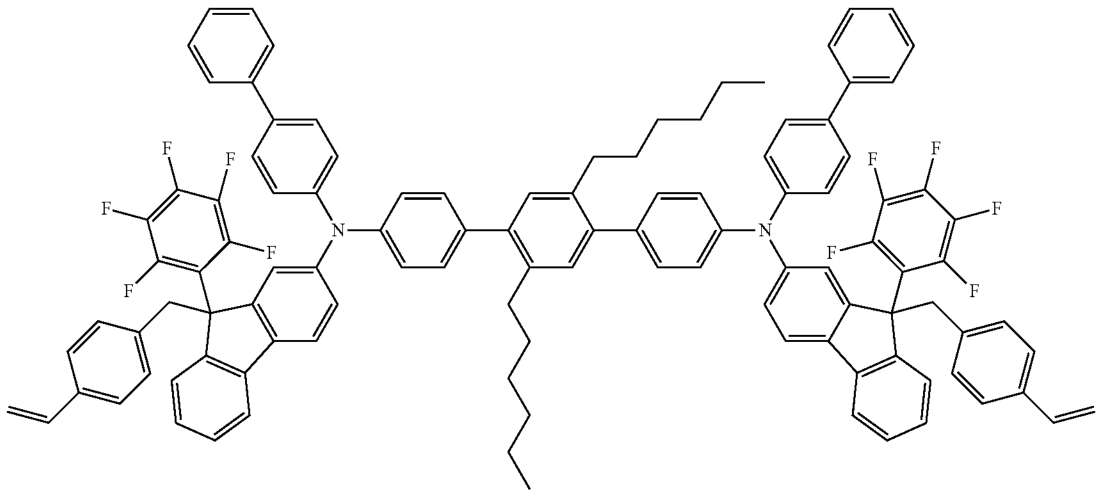
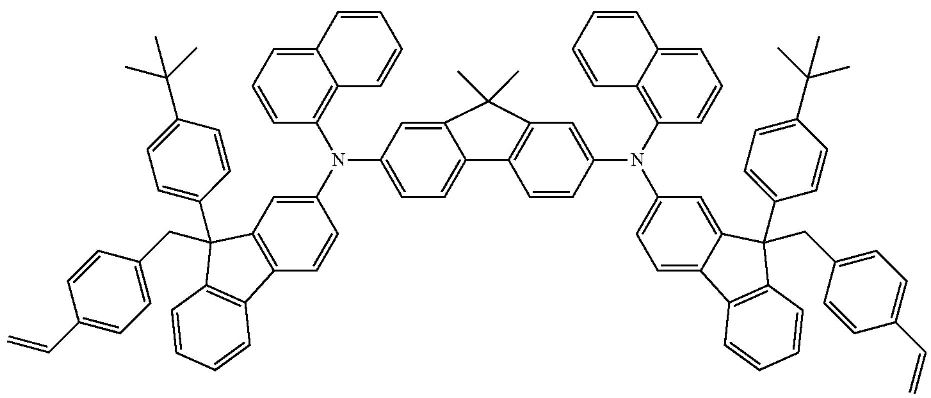
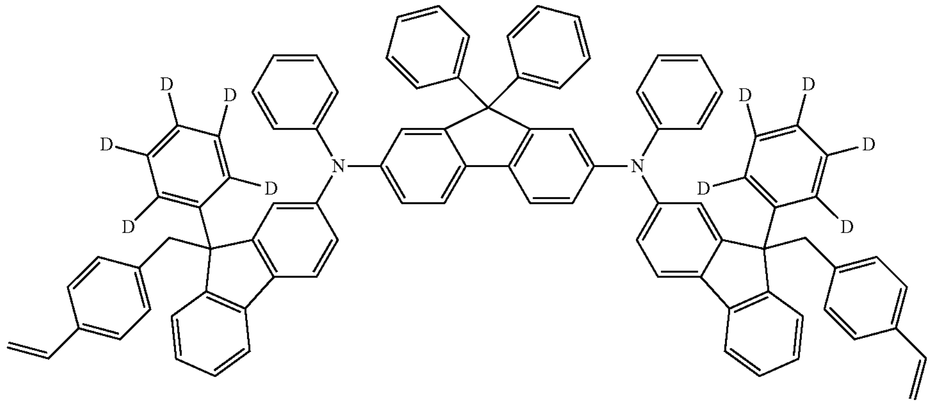
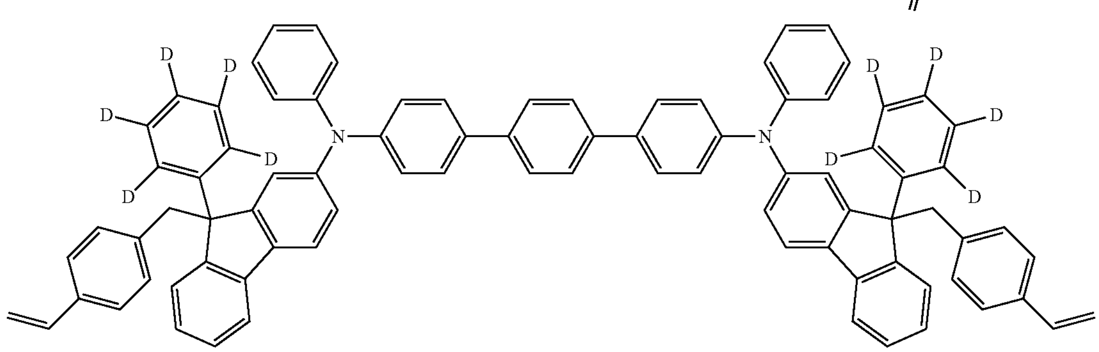

-continued
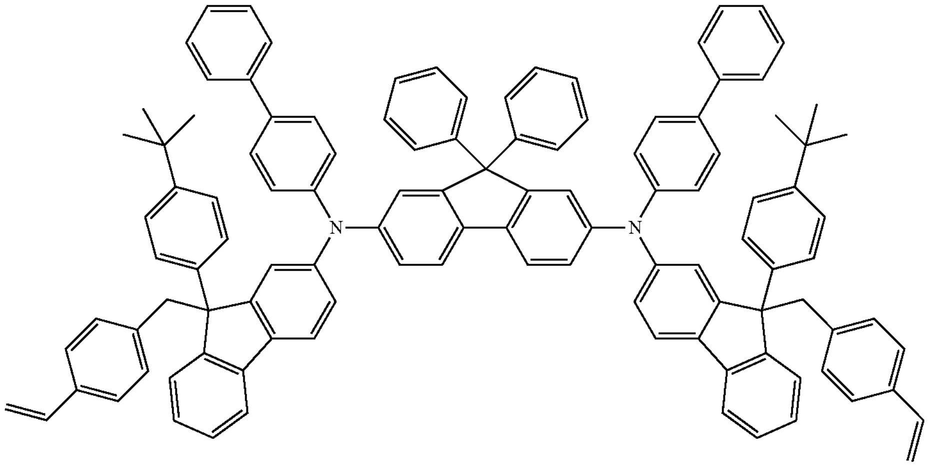
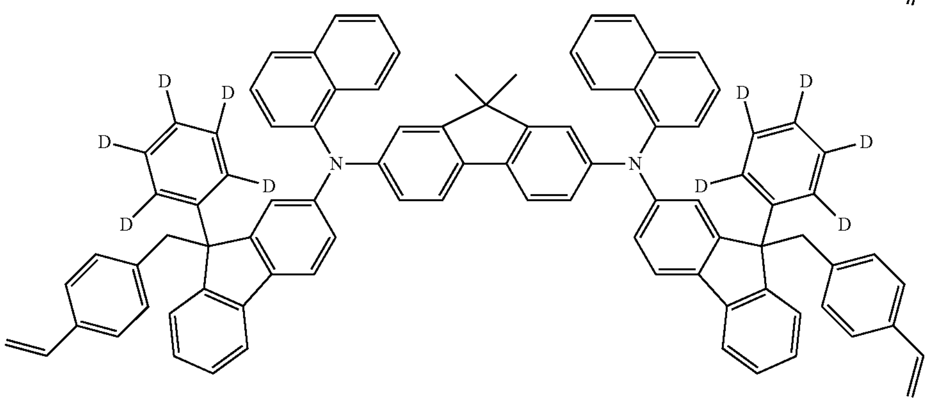
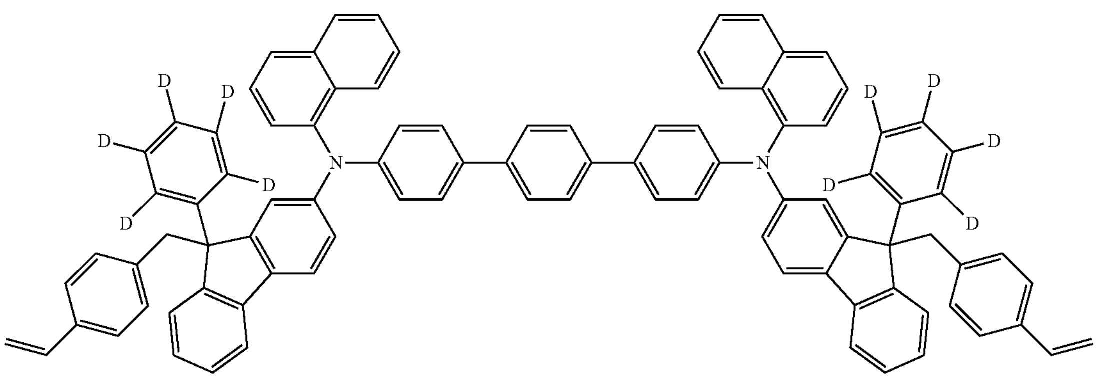
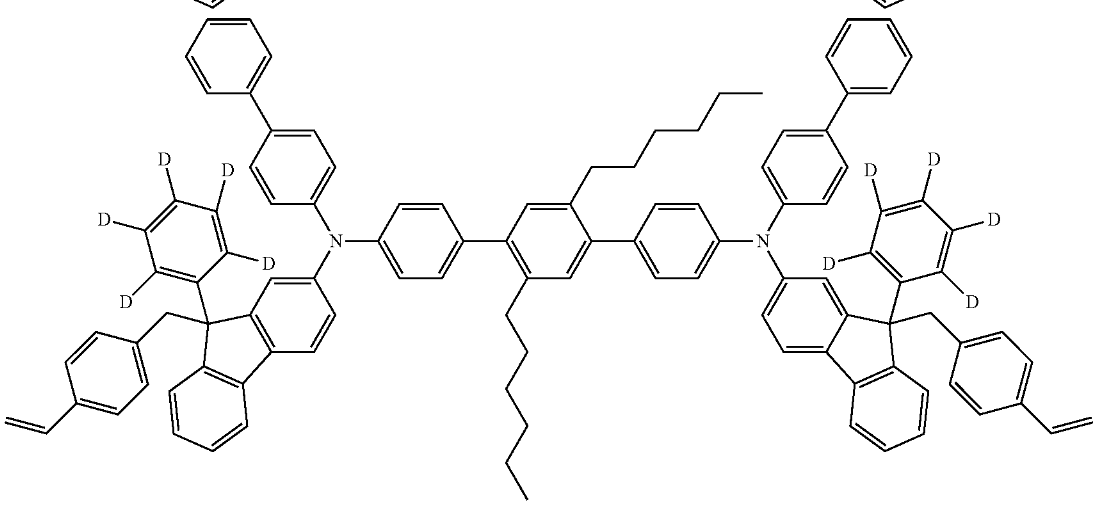

-continued
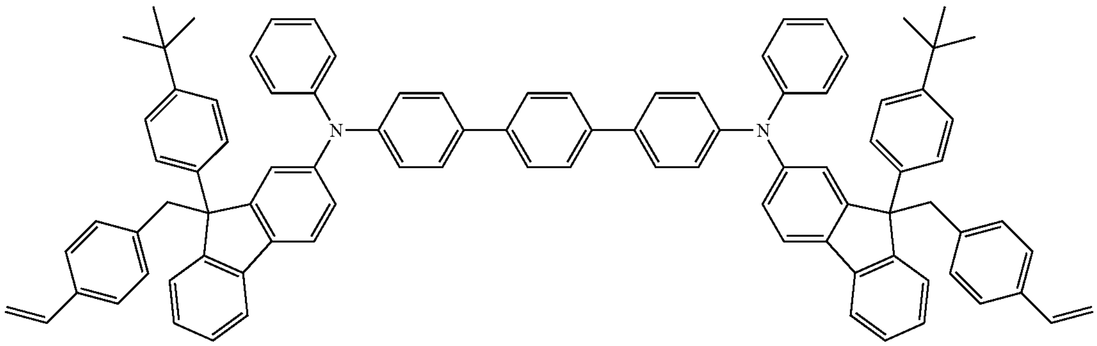
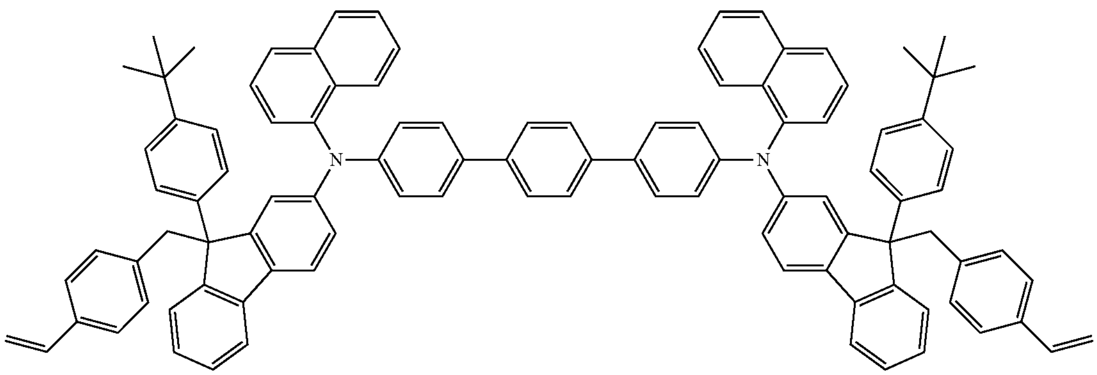
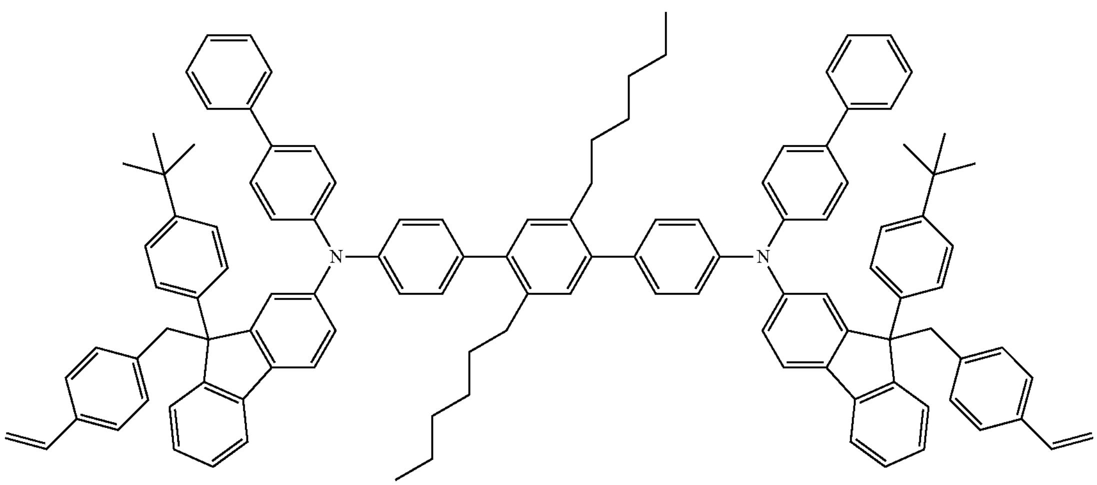
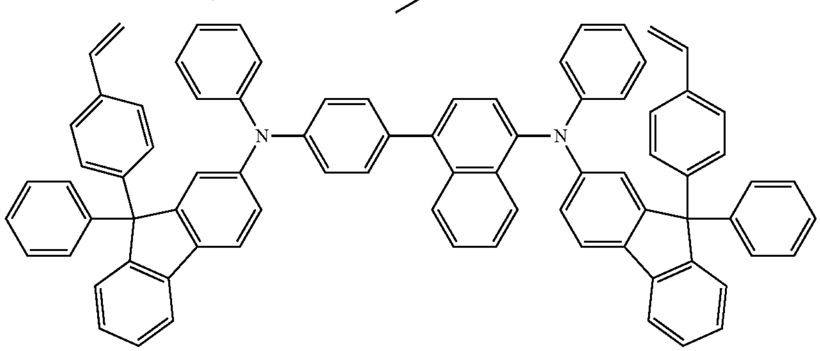

-continued
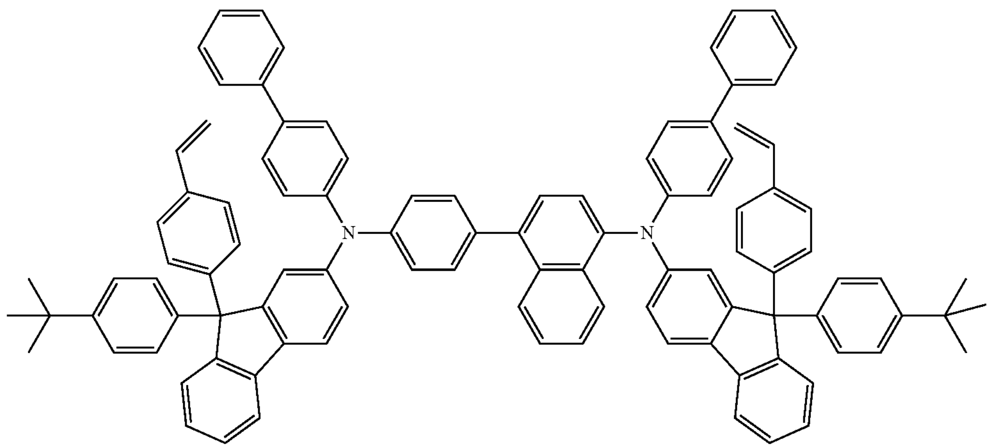
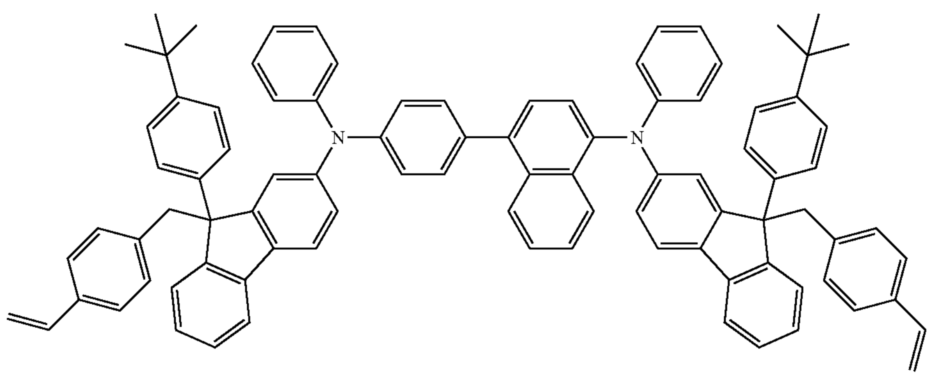
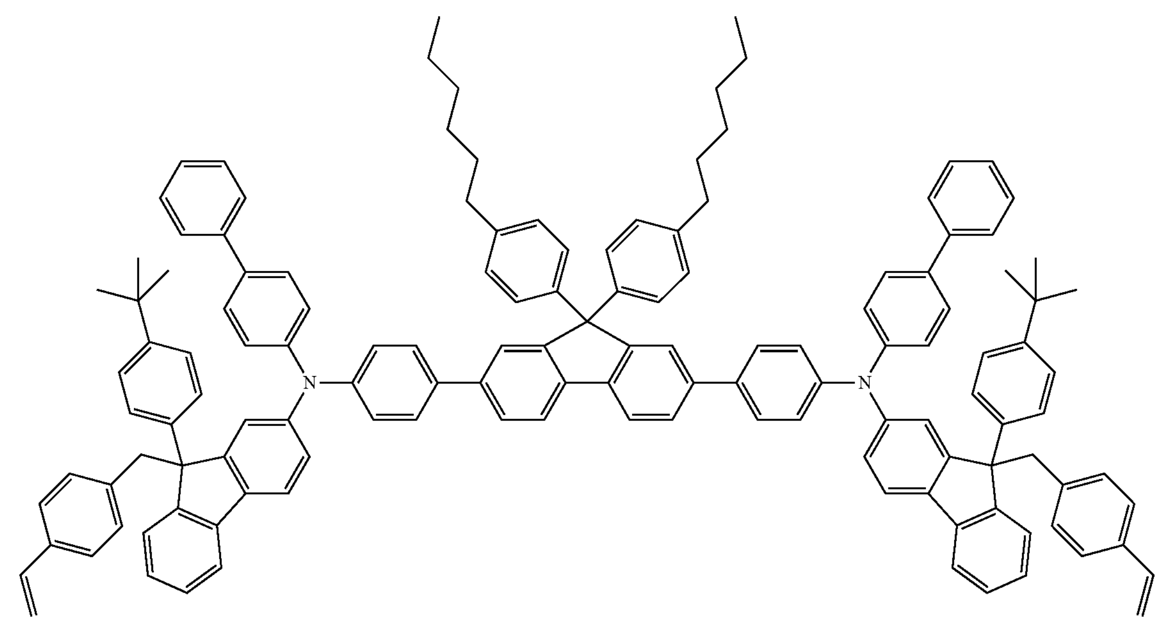

-continued
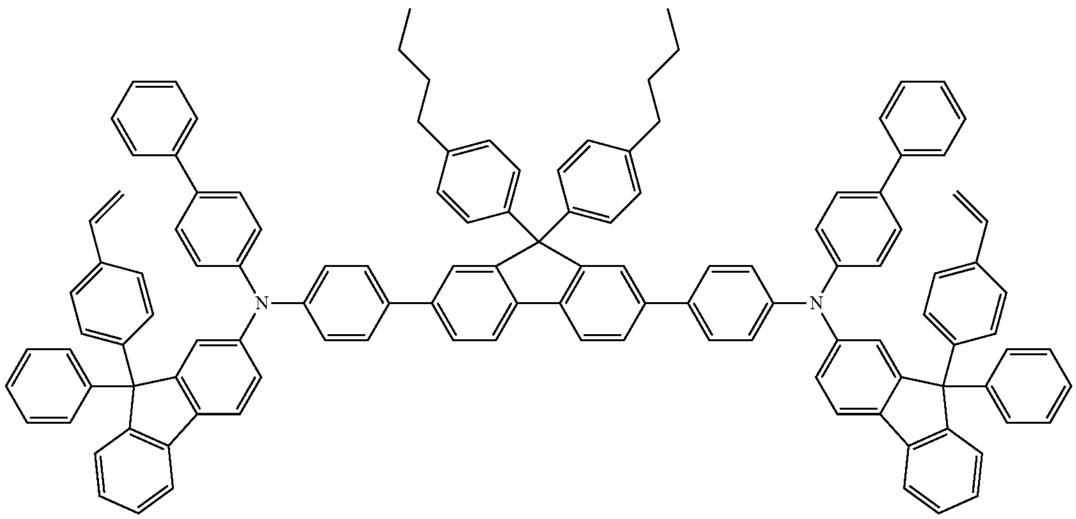
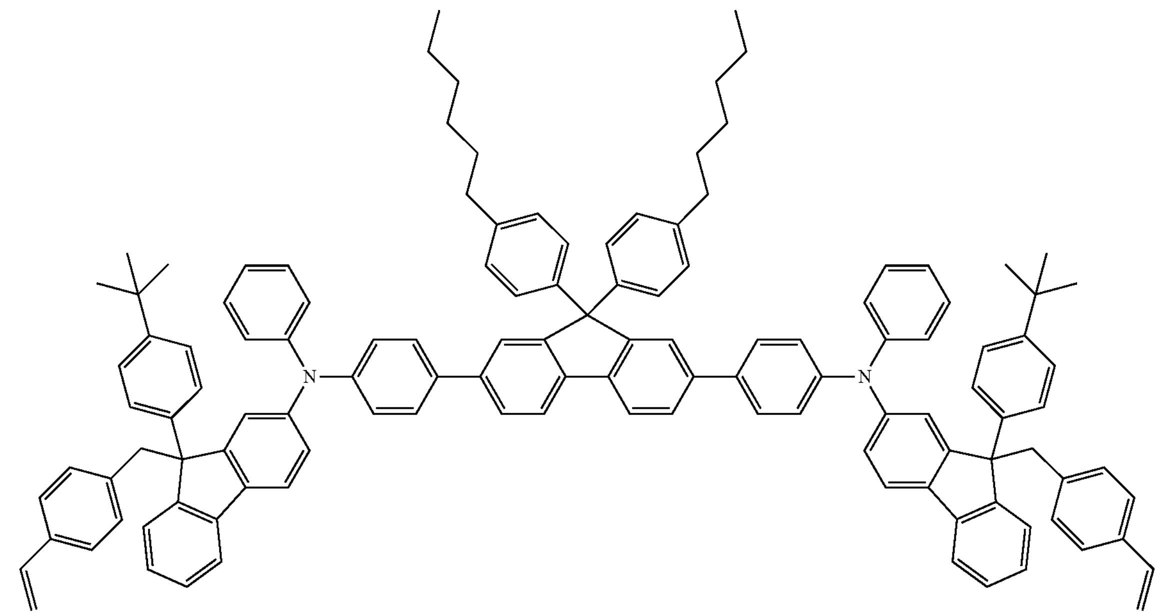
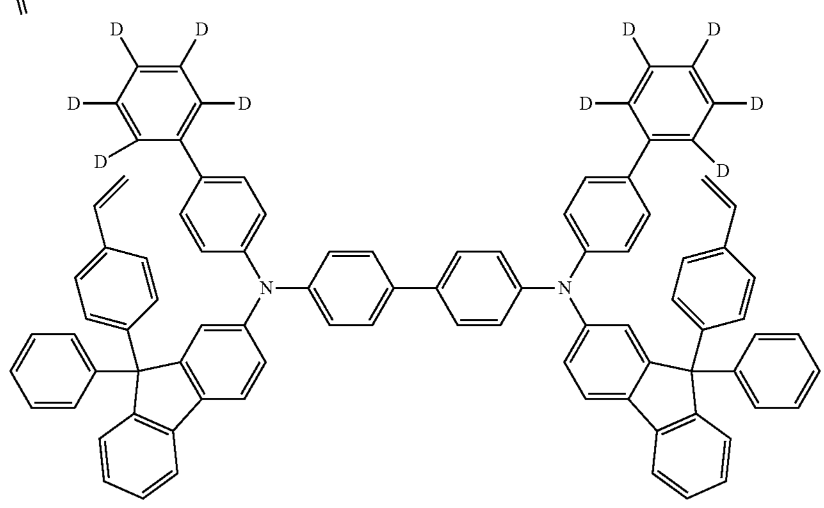

-continued
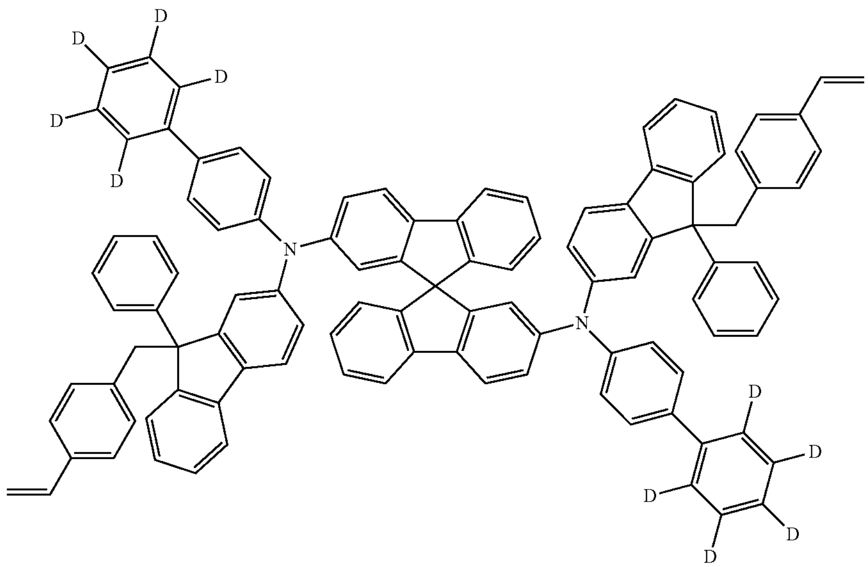
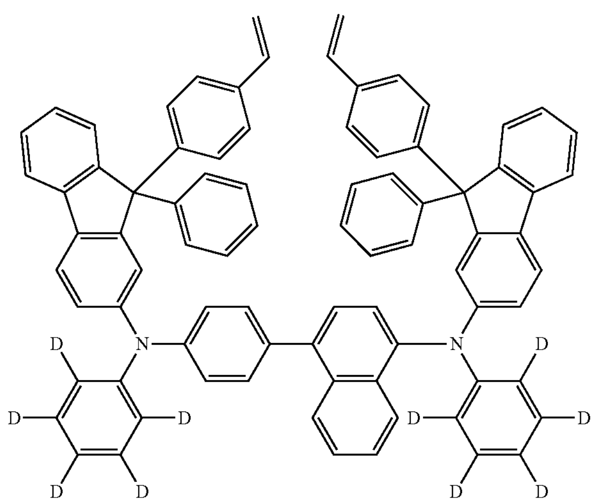
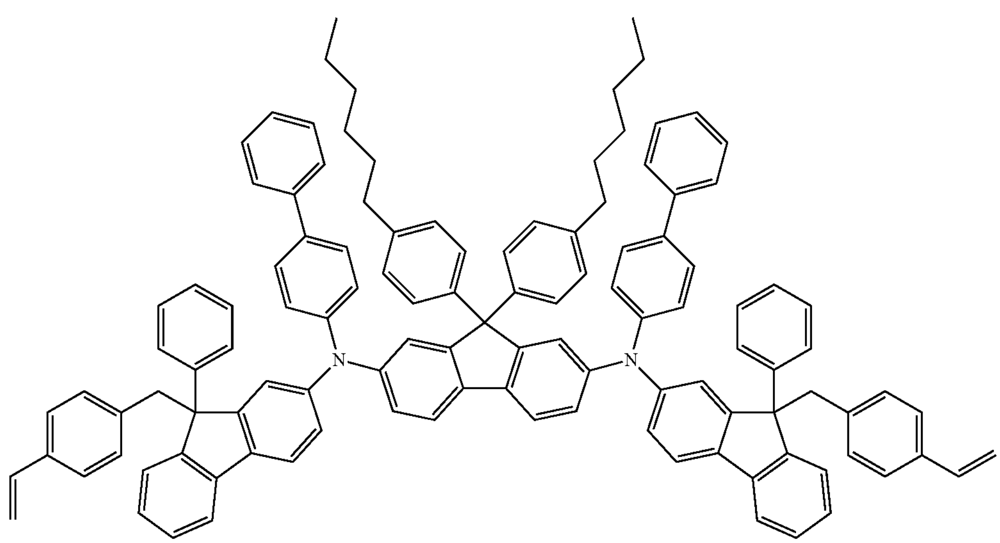

-continued
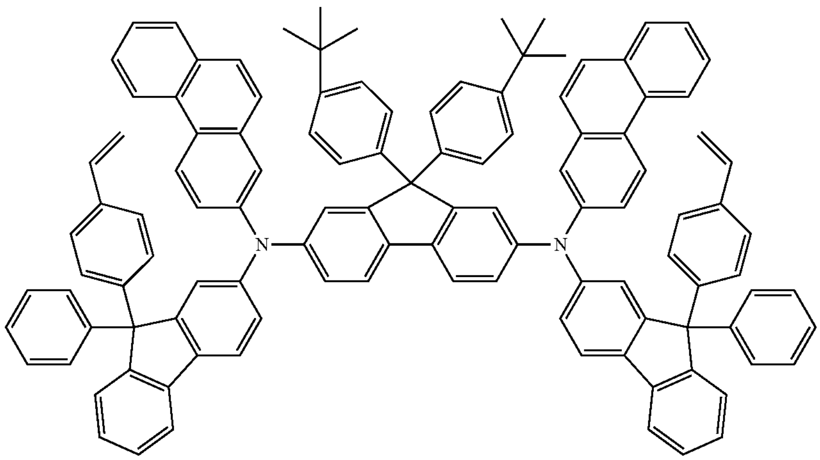
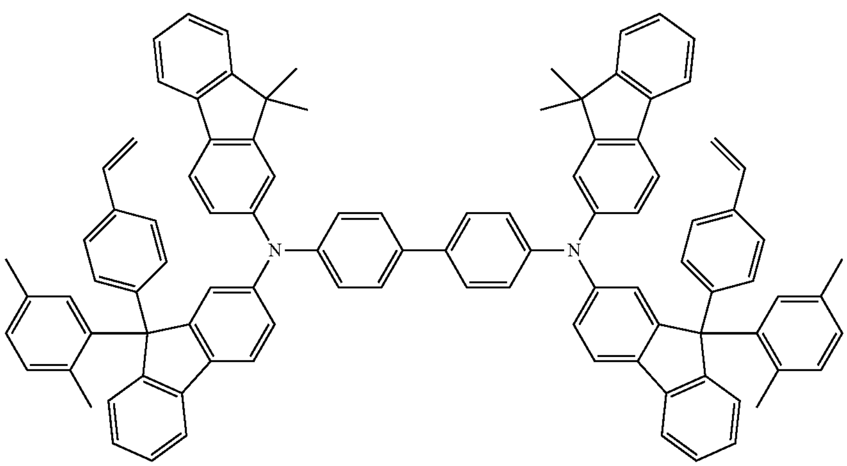
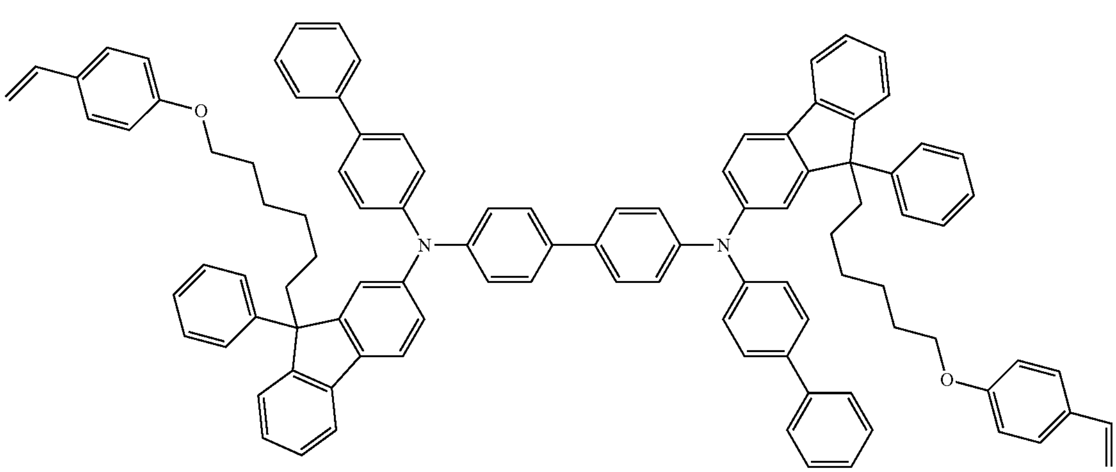

-continued
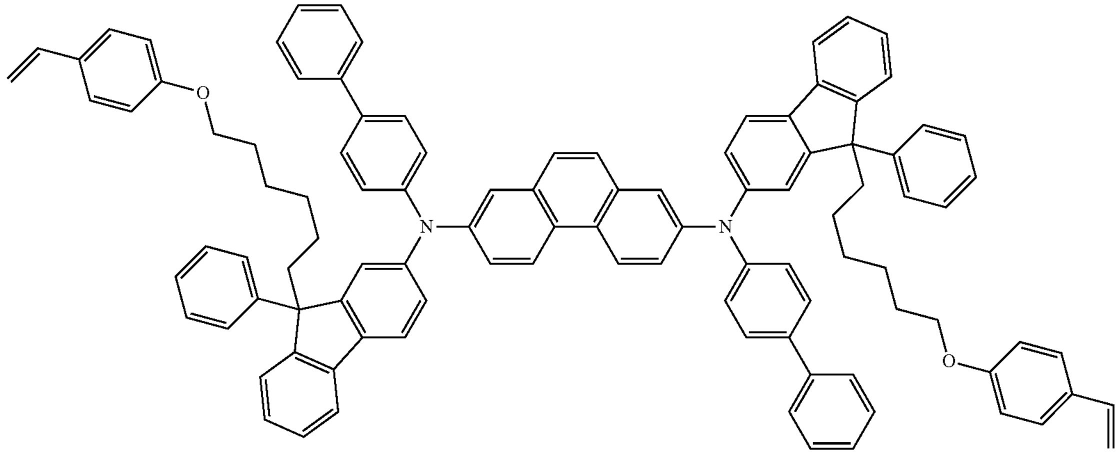
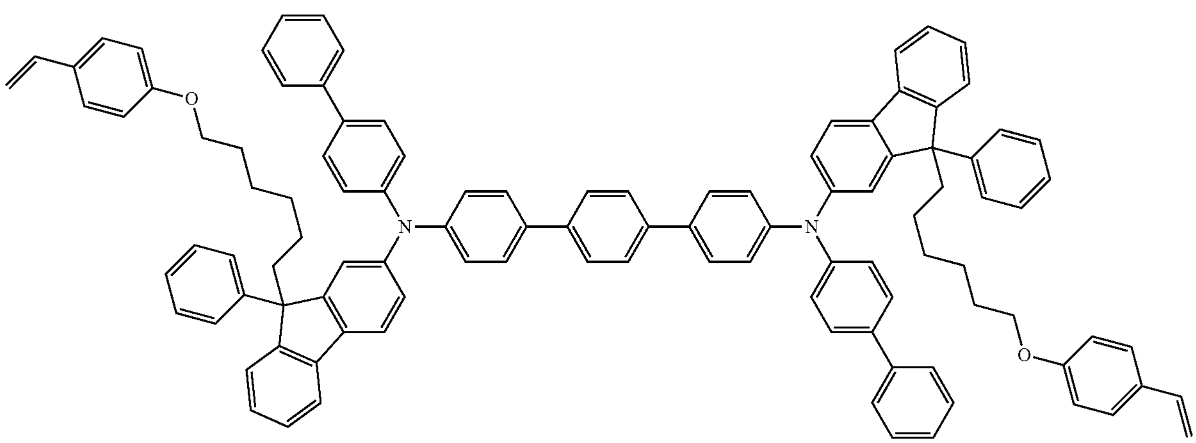
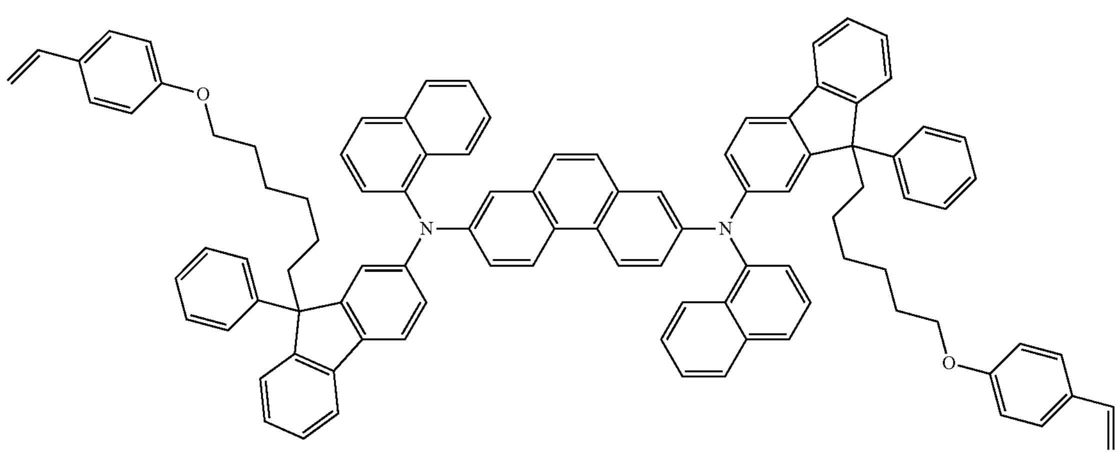

-continued
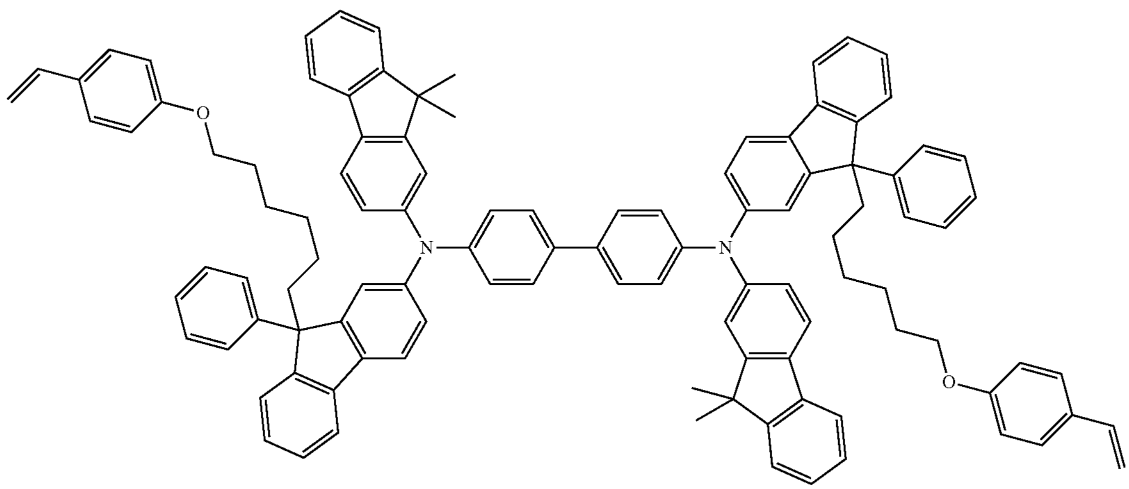
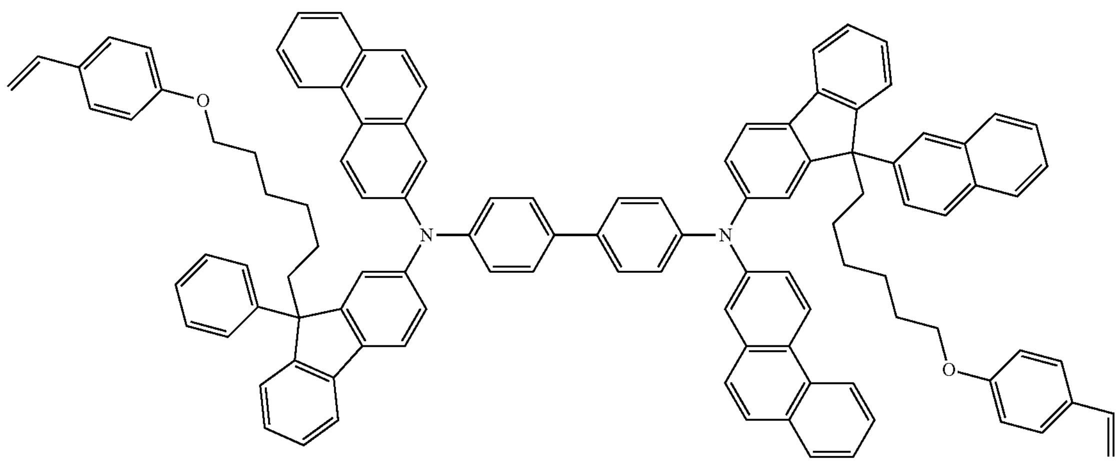
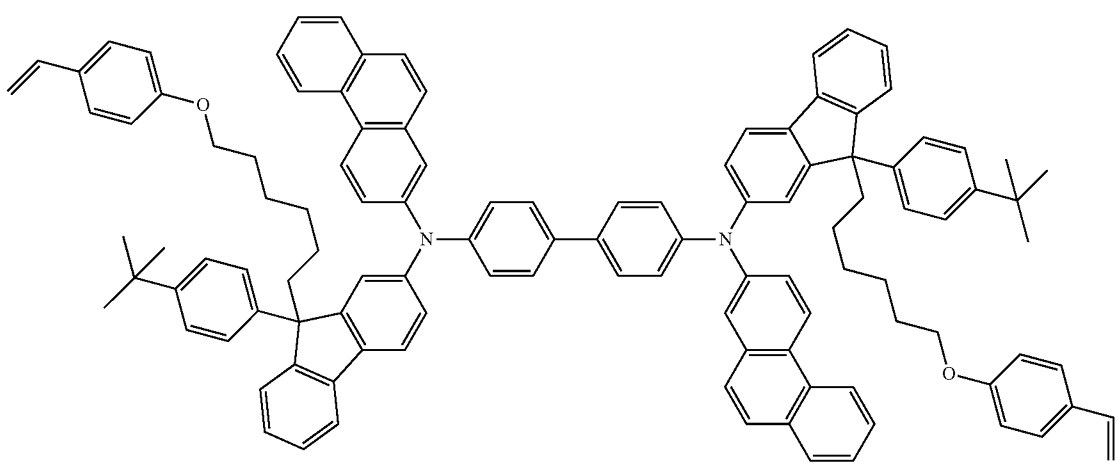

-continued
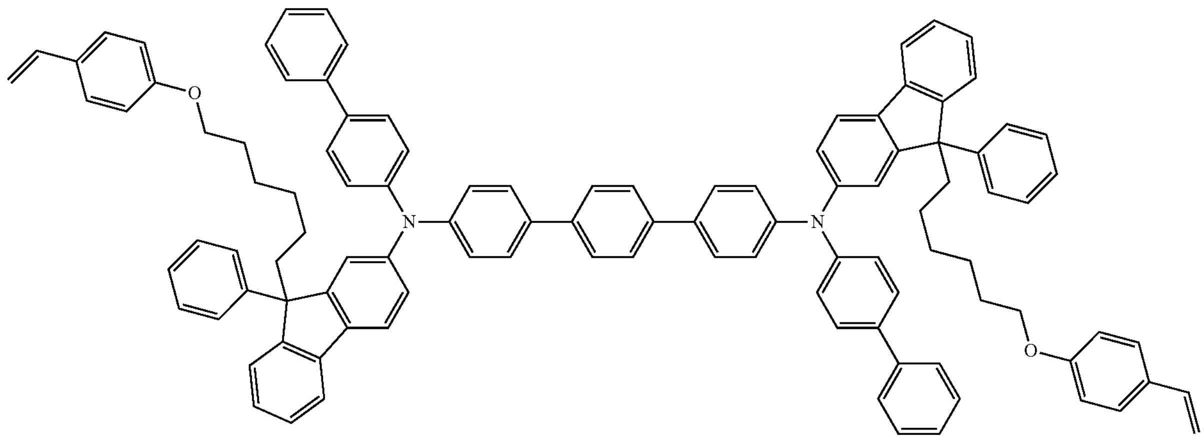
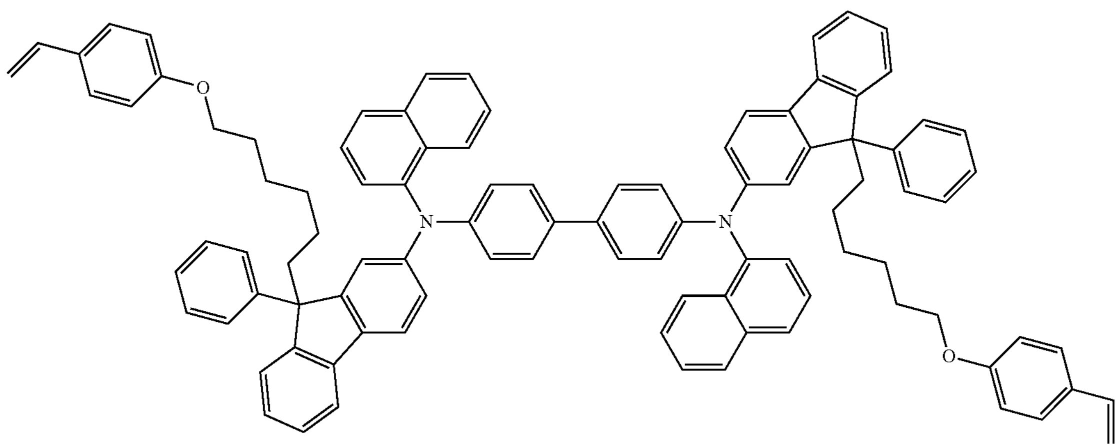
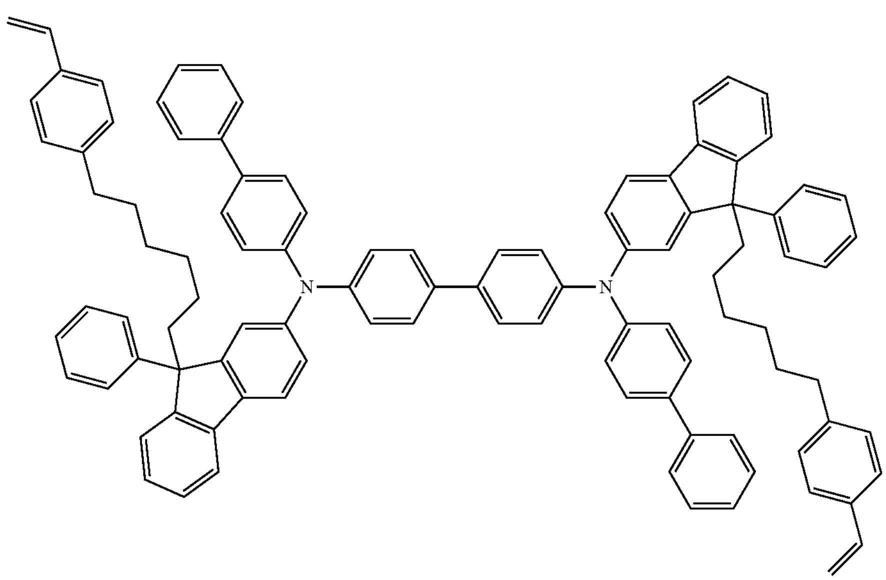

-continued
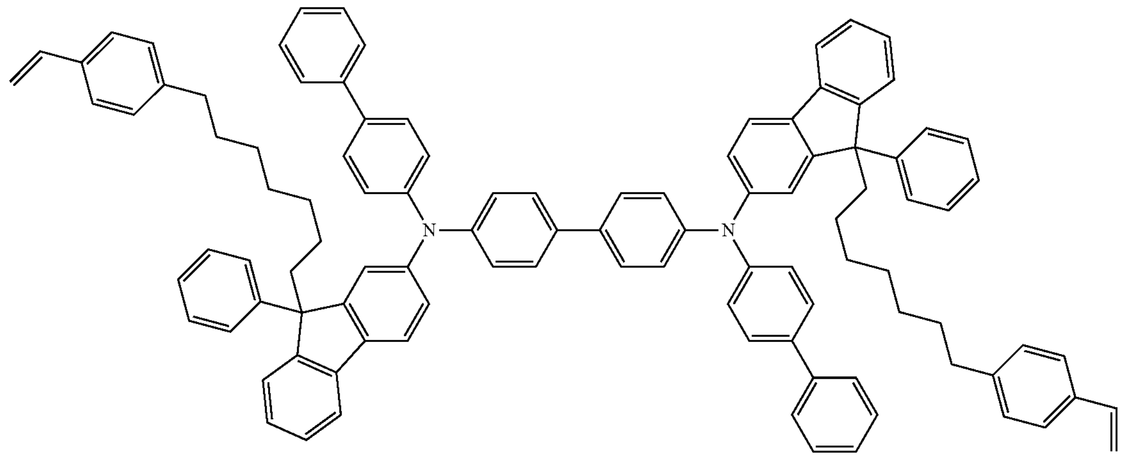
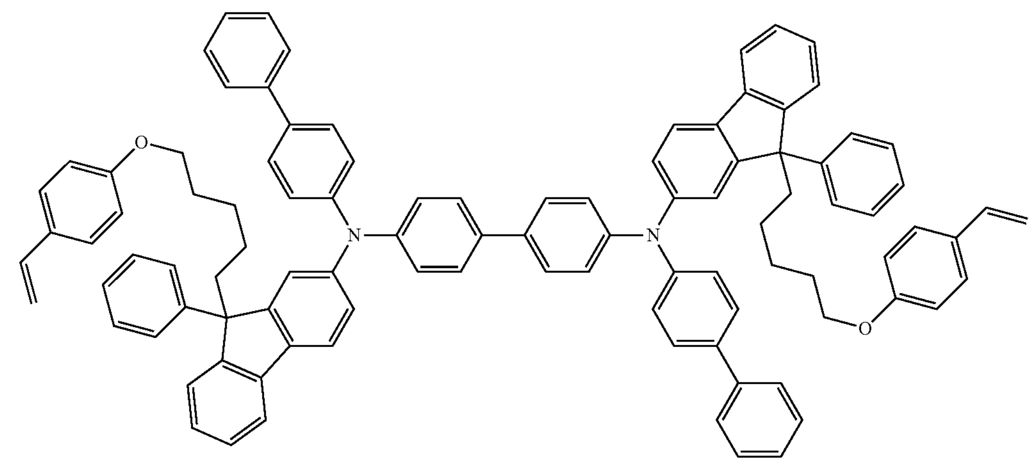
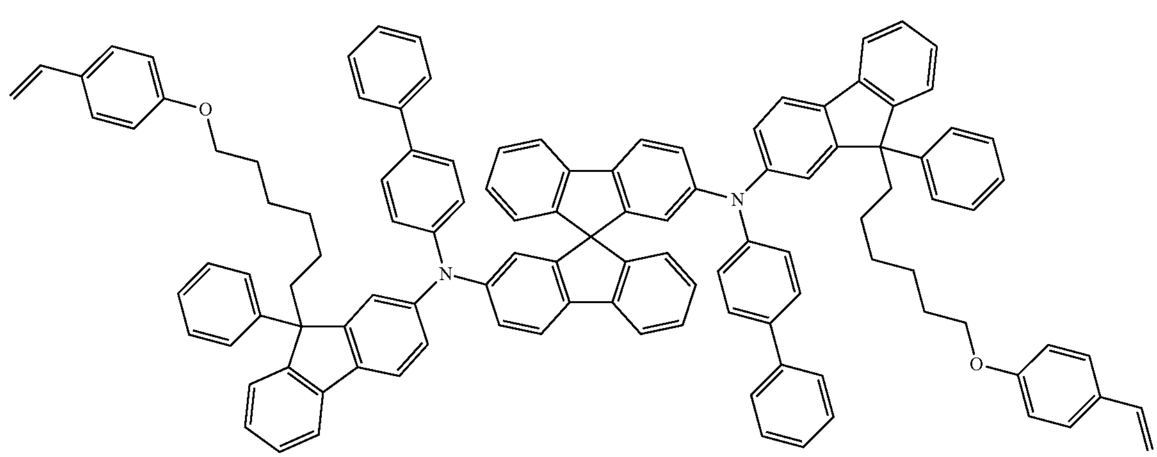

-continued
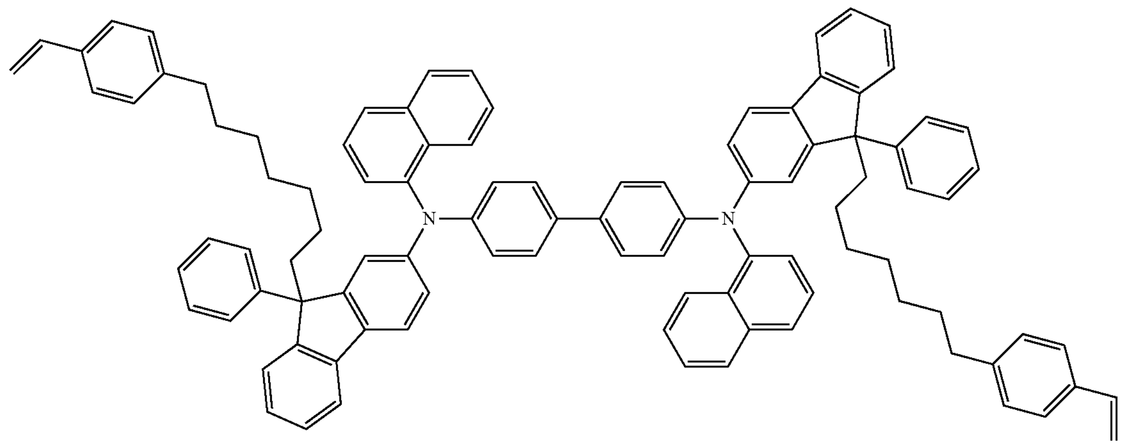
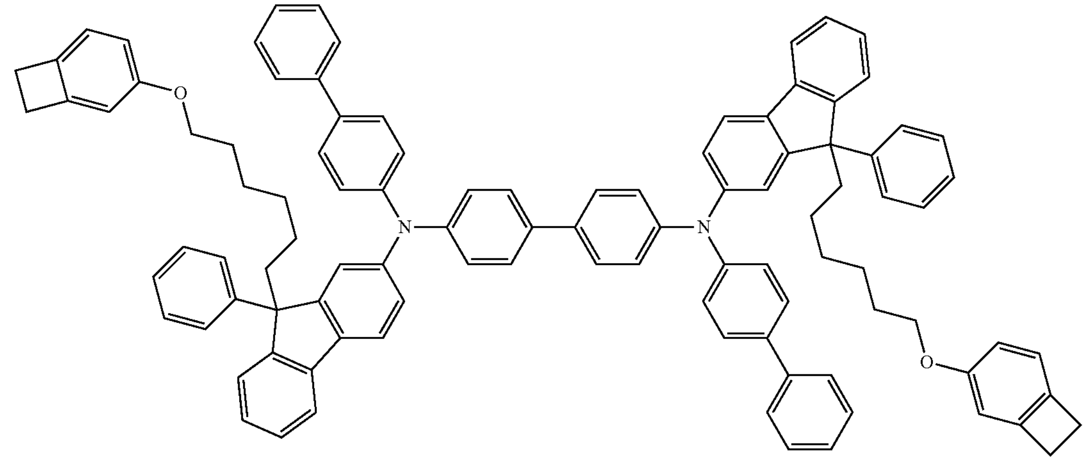
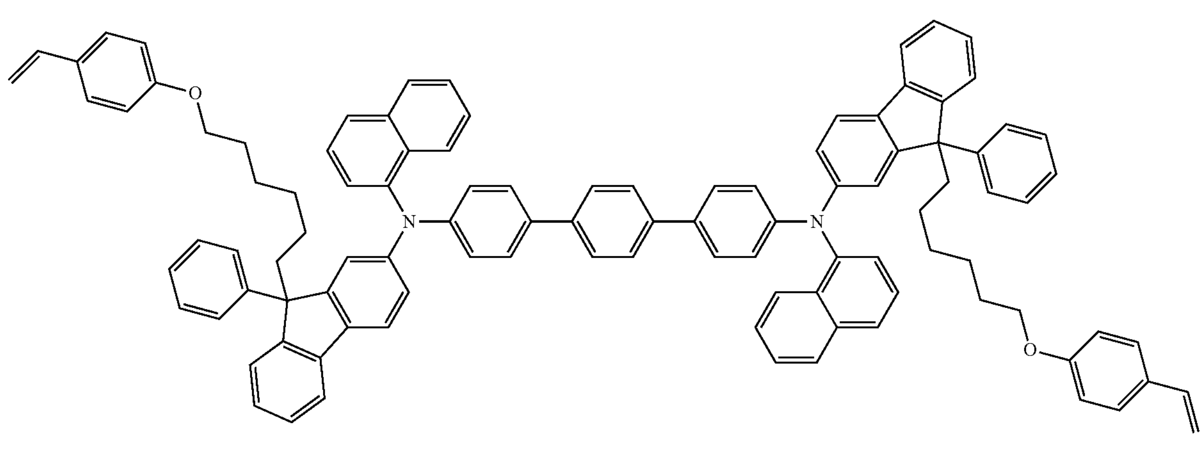

-continued
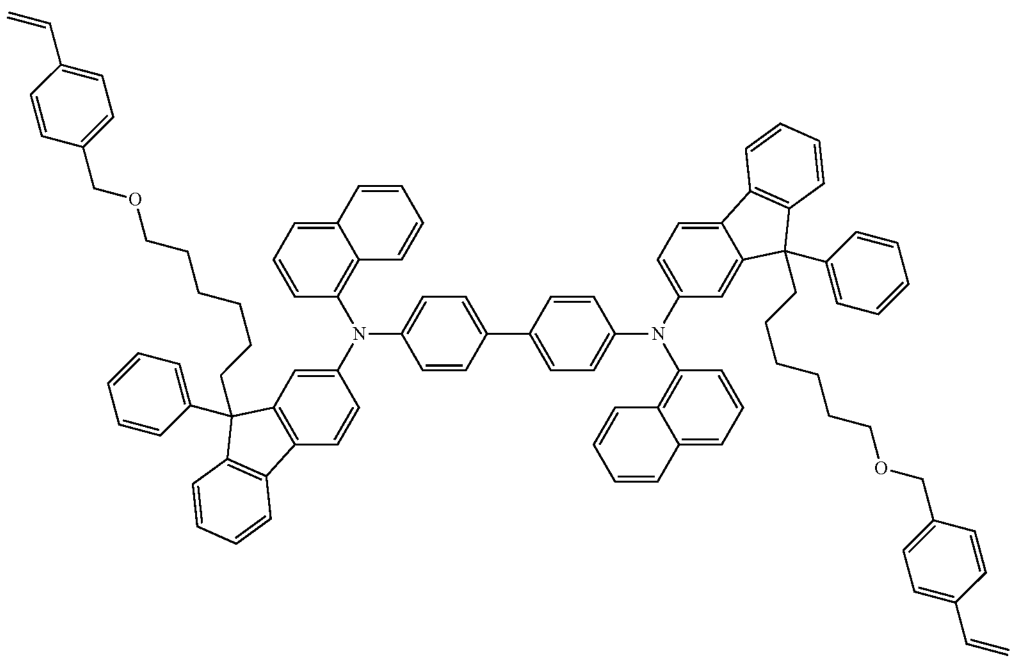
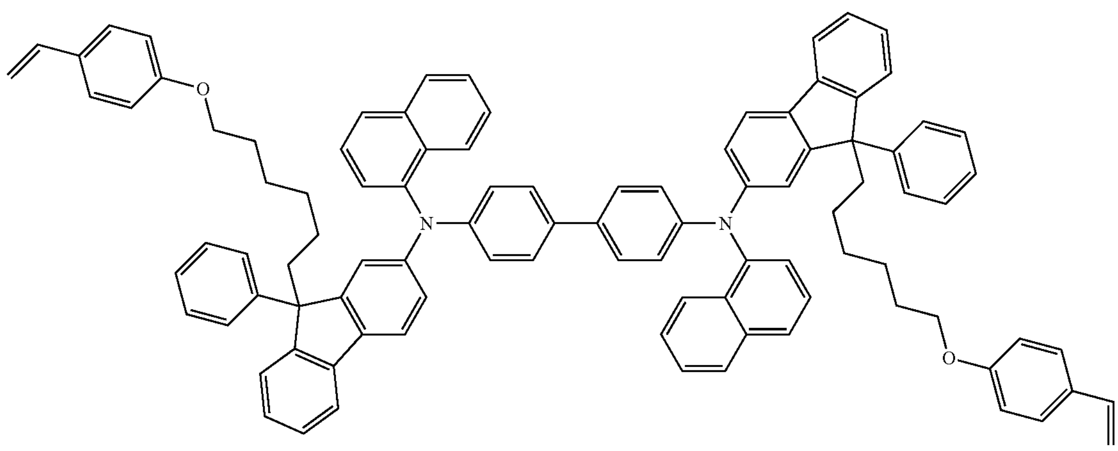
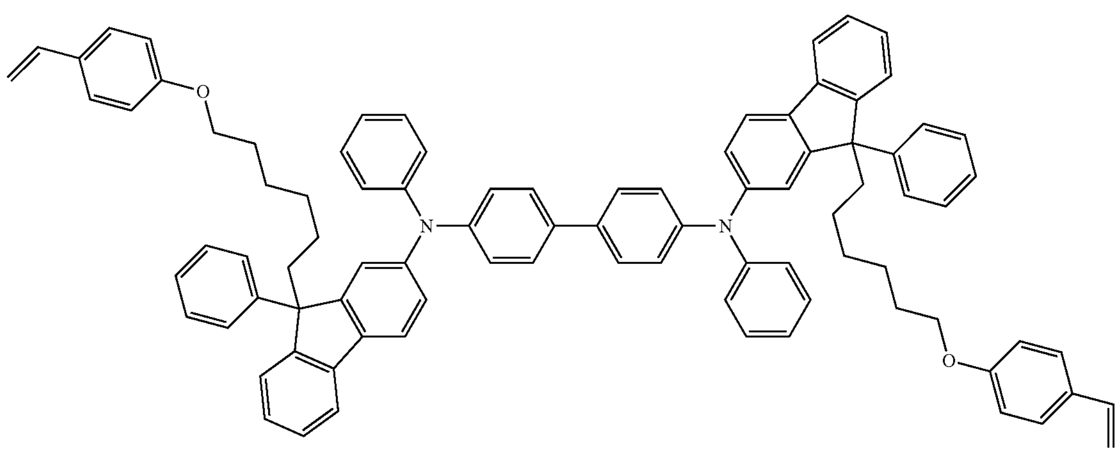

-continued
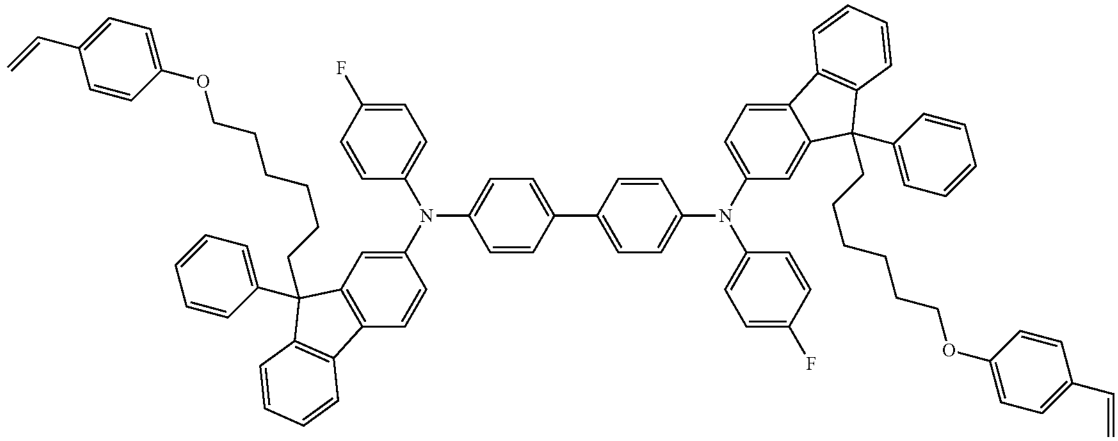
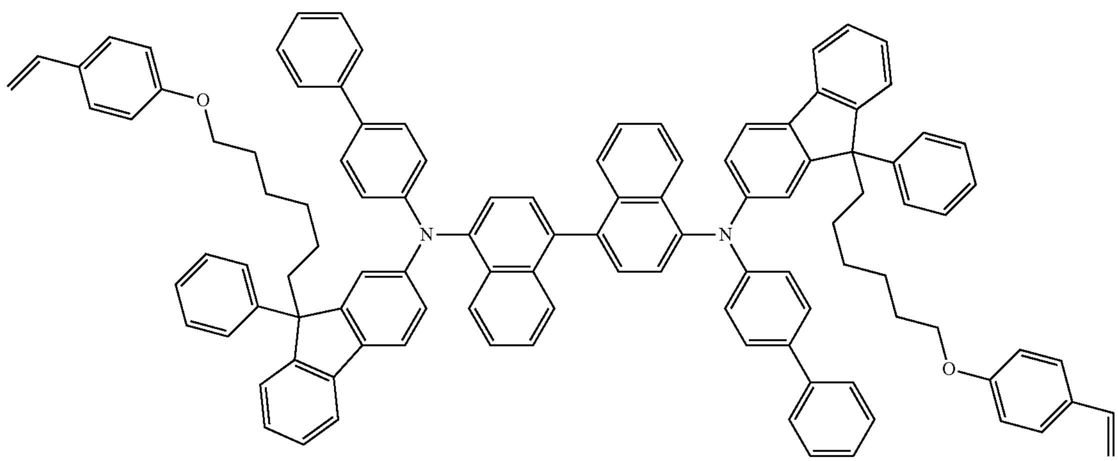
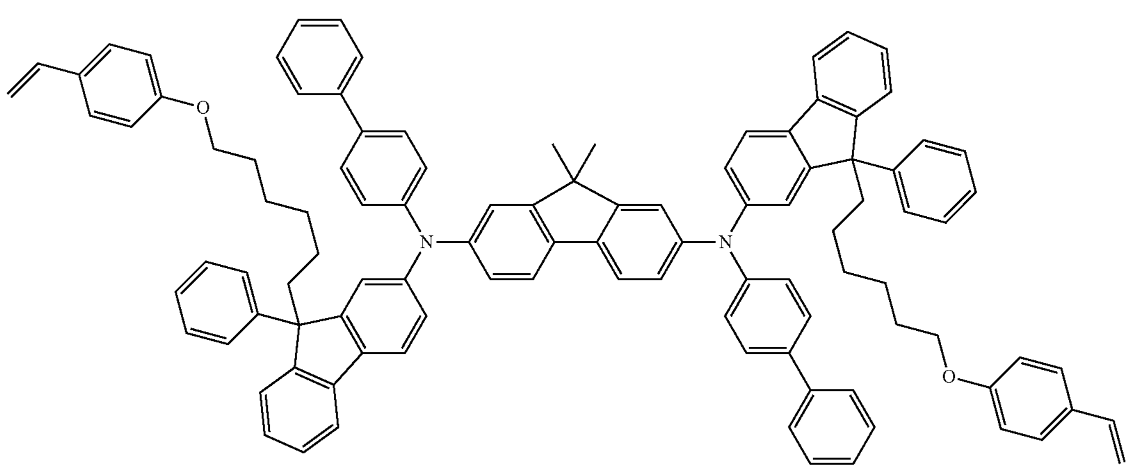

-continued
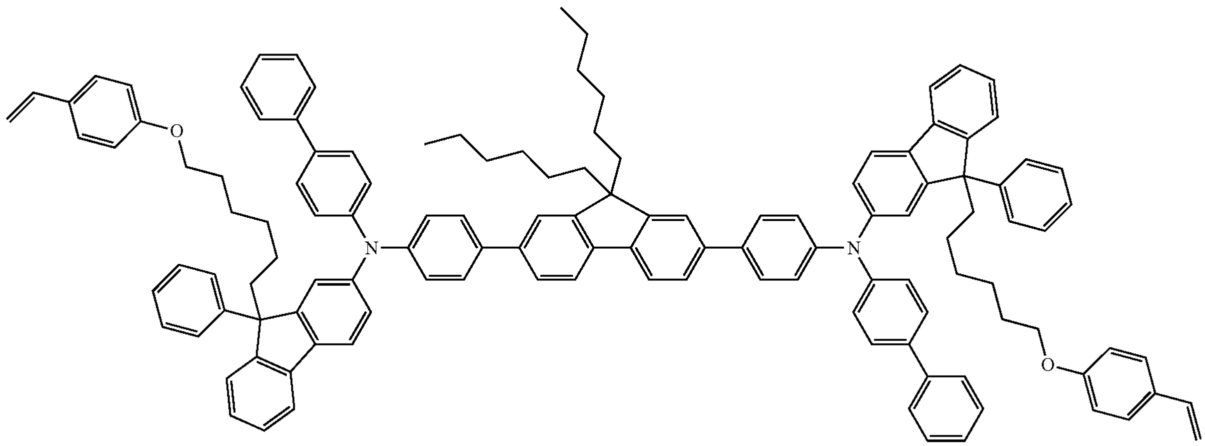
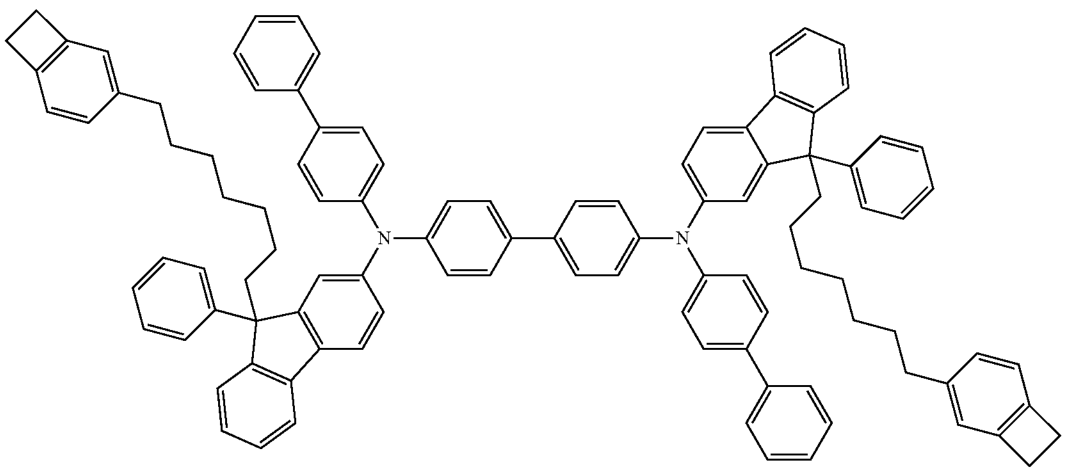
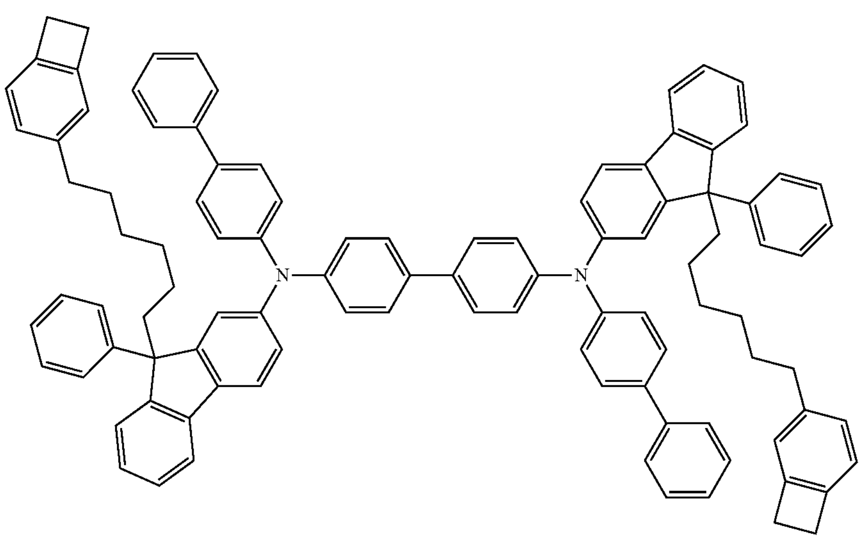

-continued
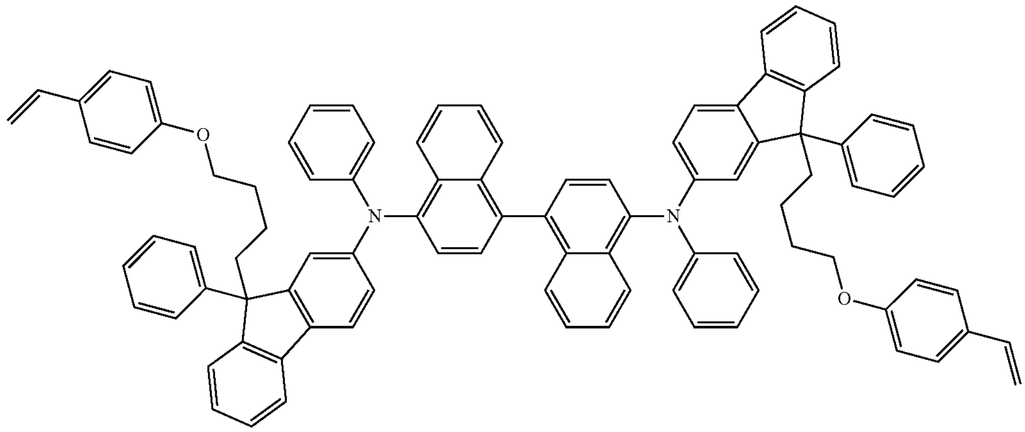
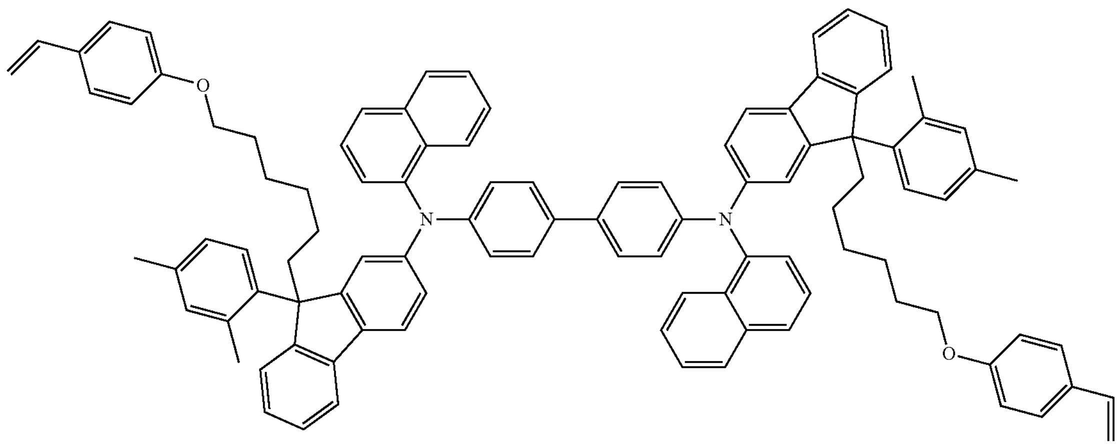
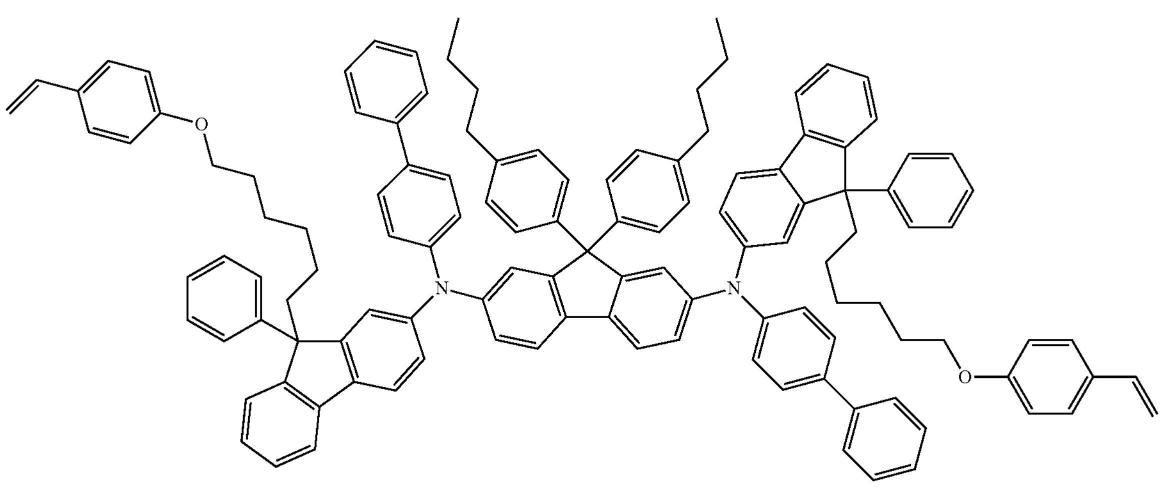

-continued
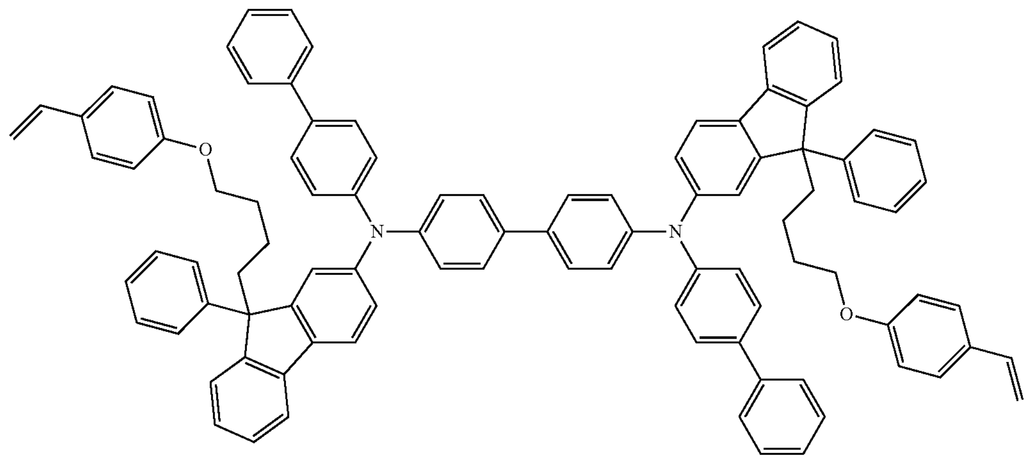
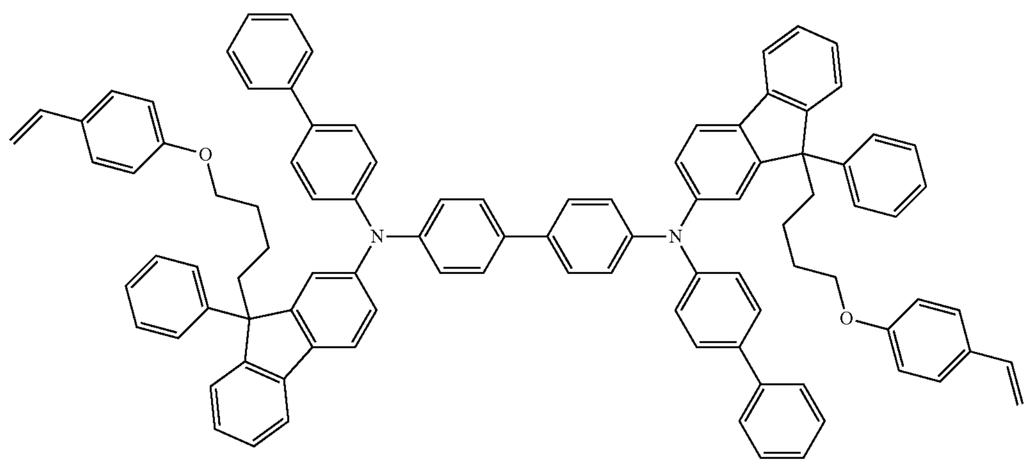
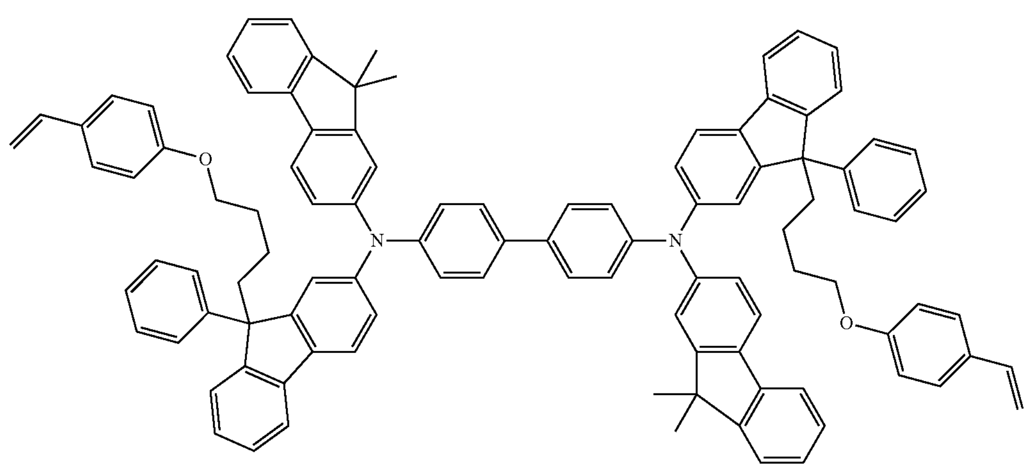

-continued
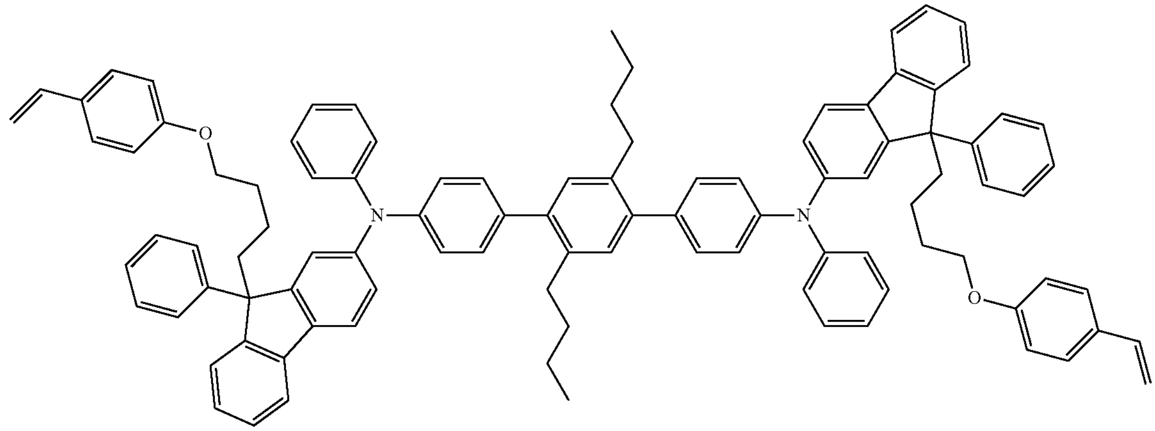
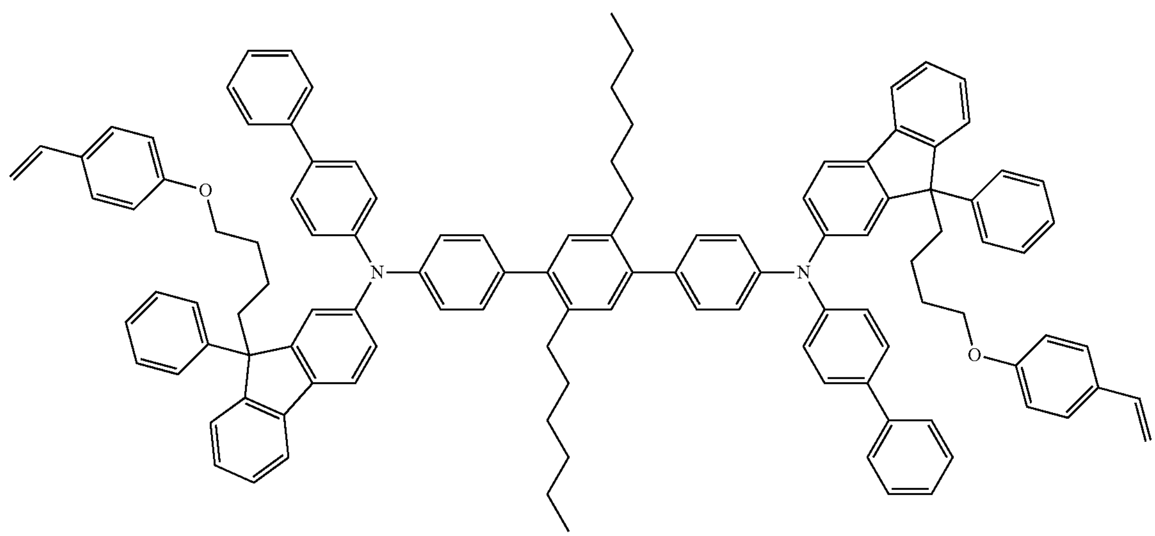
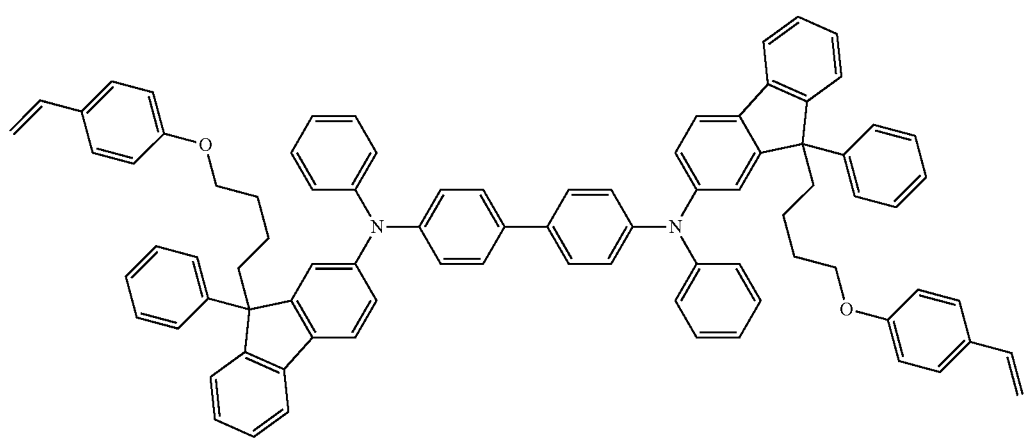

-continued
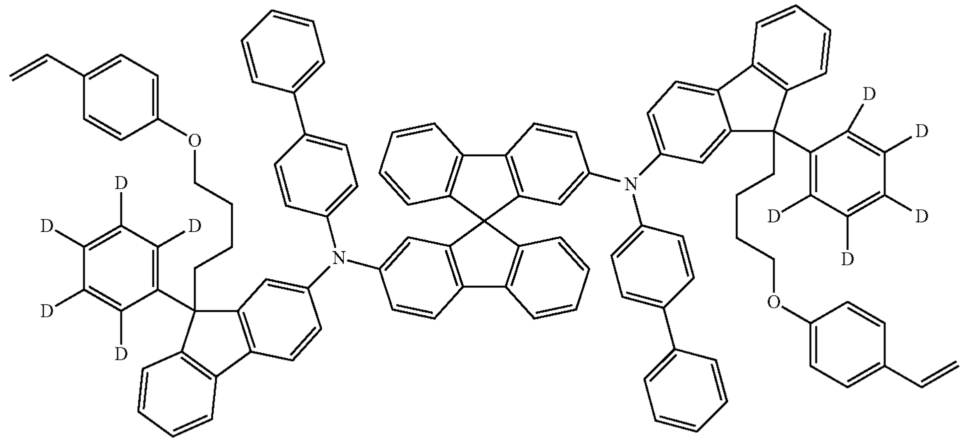
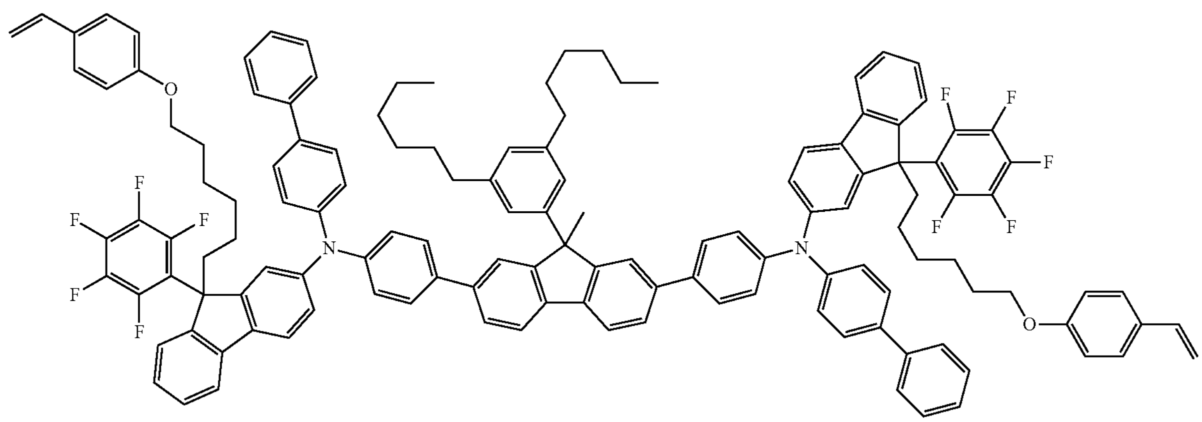
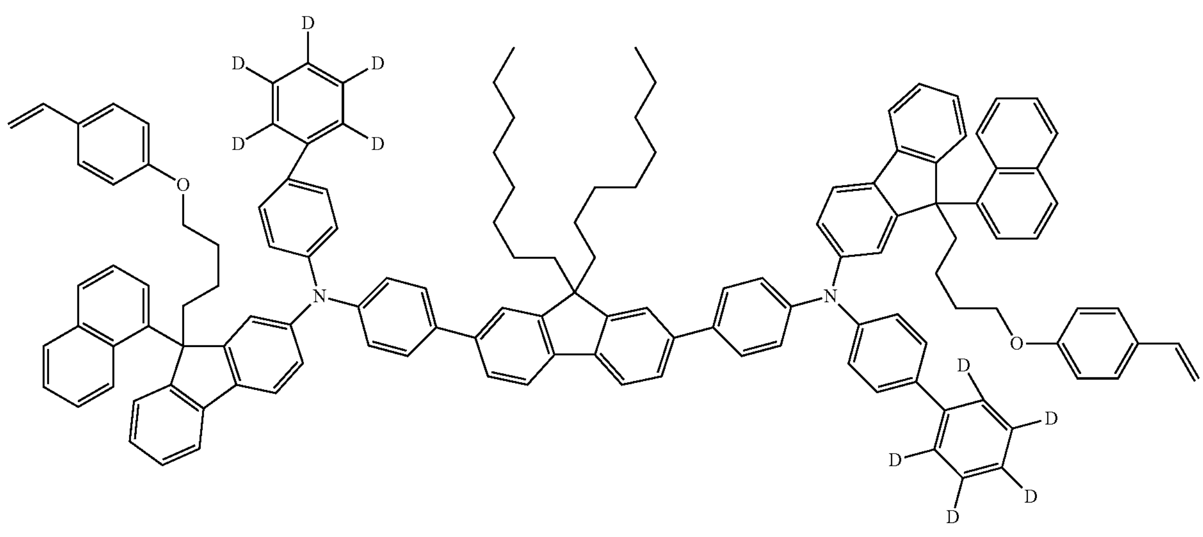

-continued
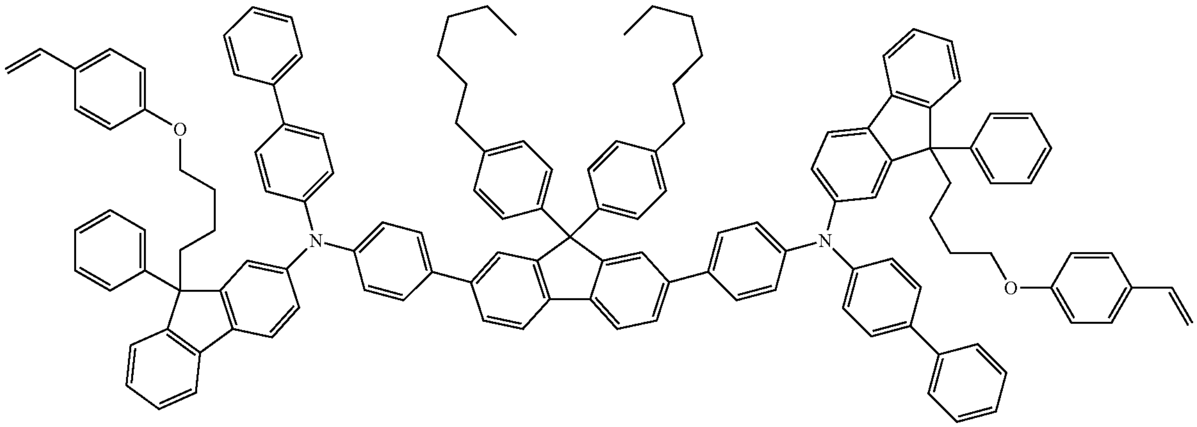
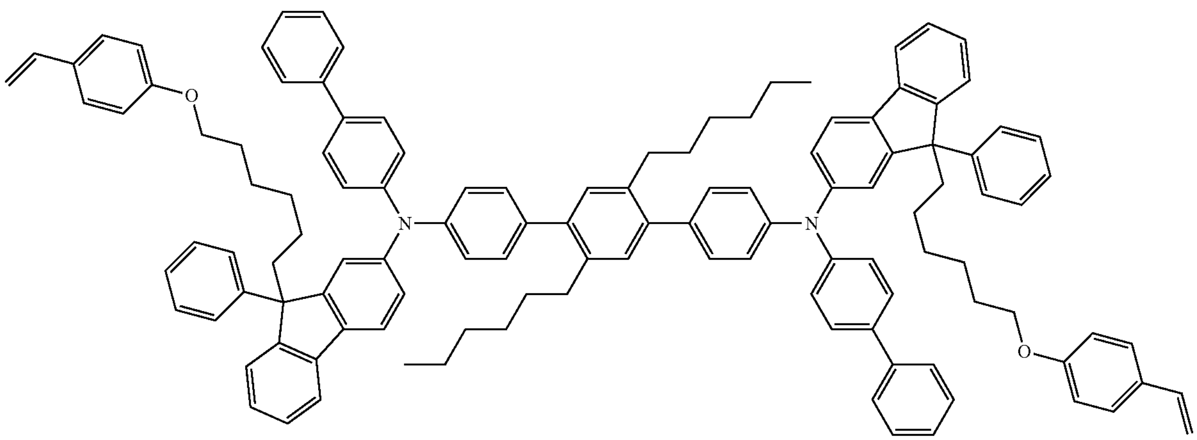
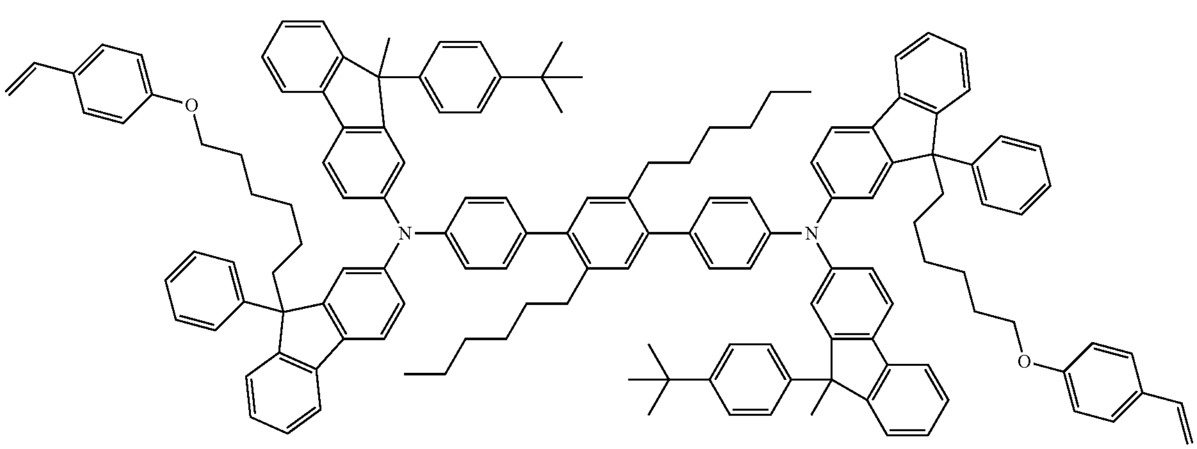

-continued
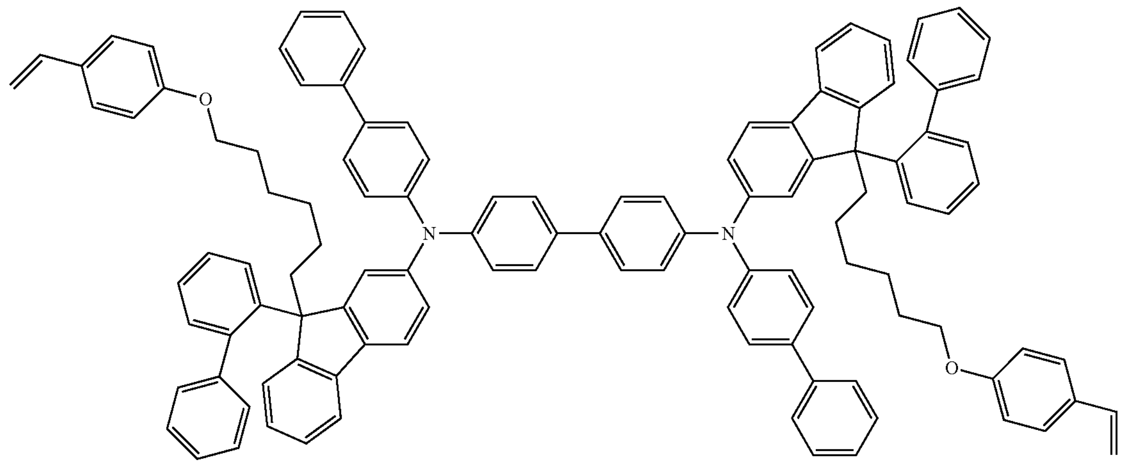
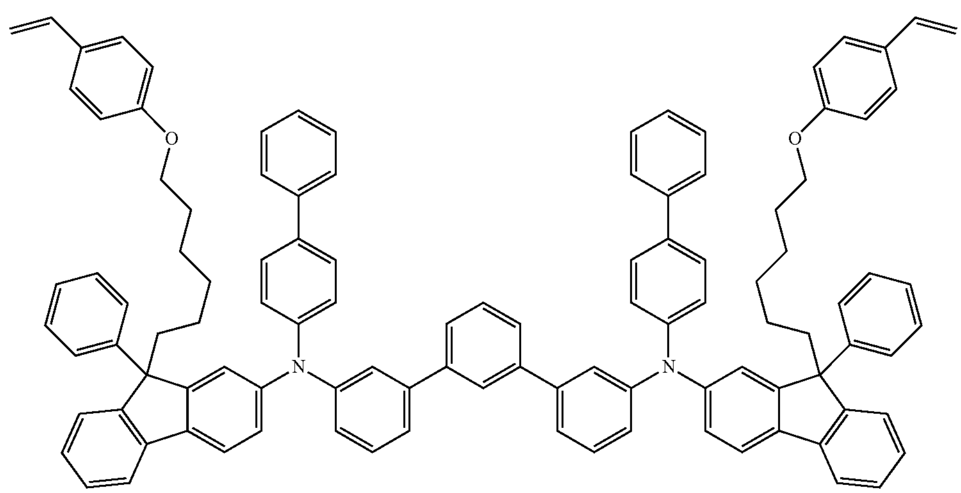
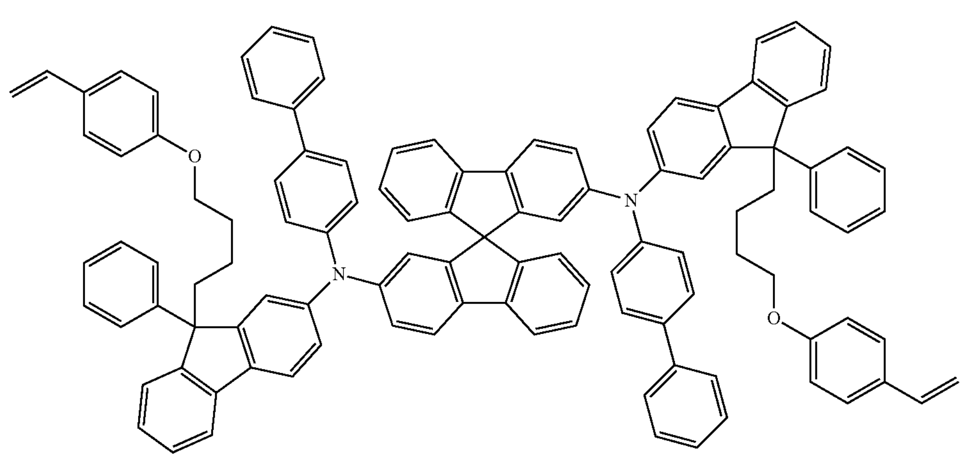

-continued
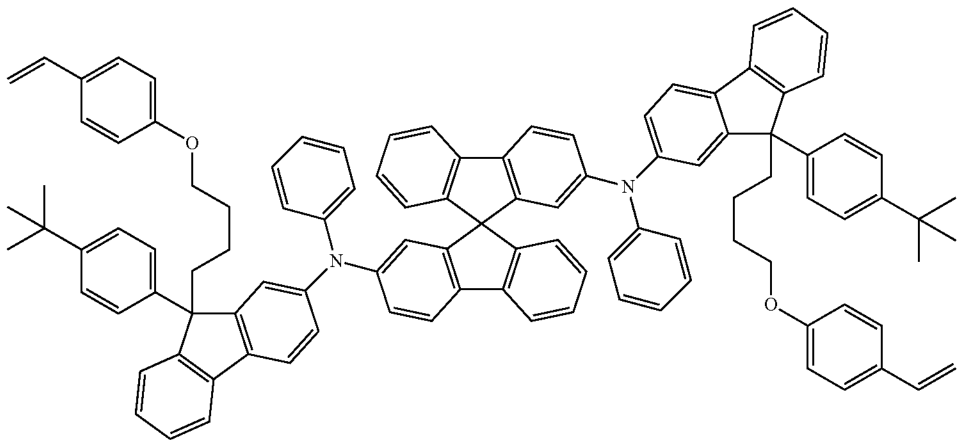
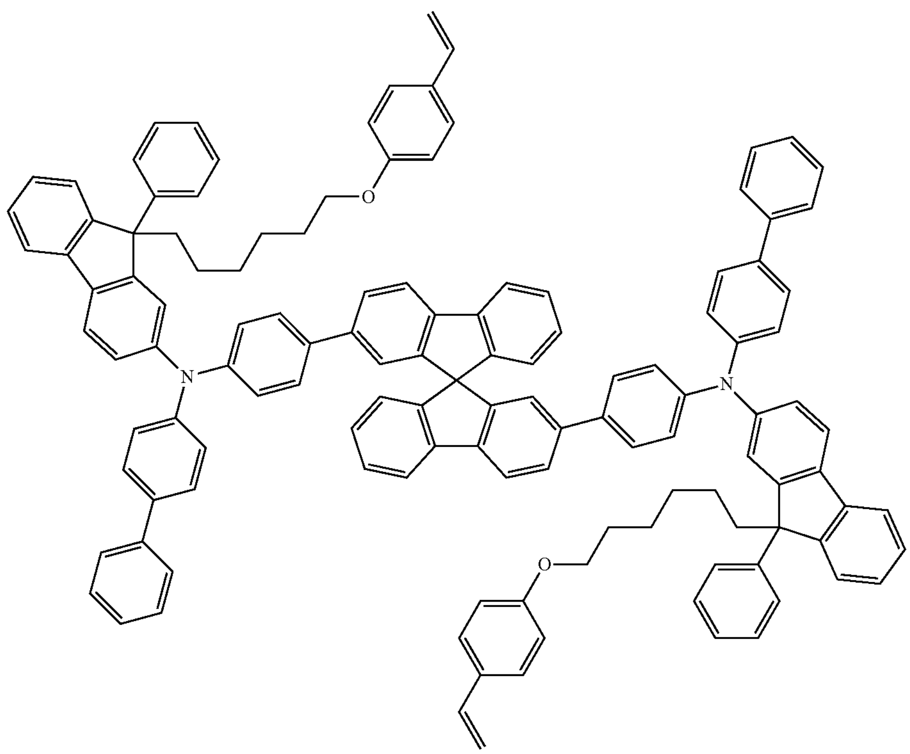
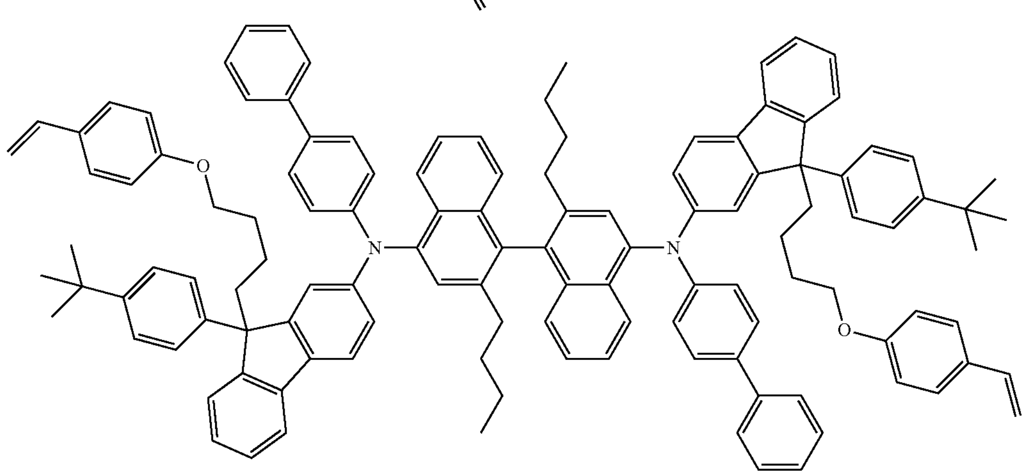

-continued

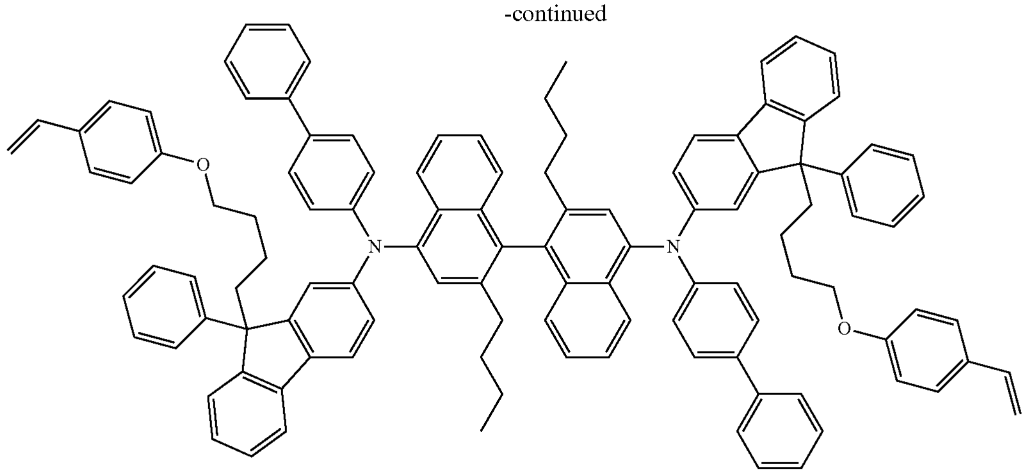

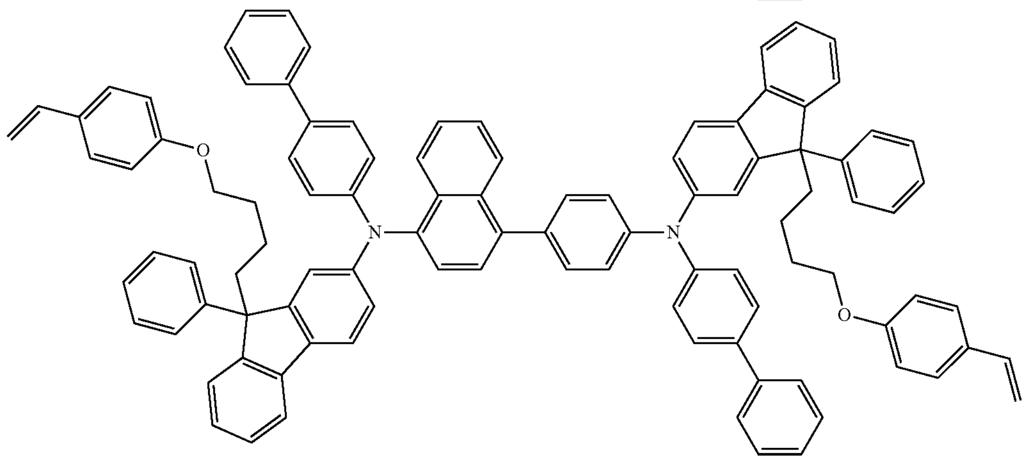

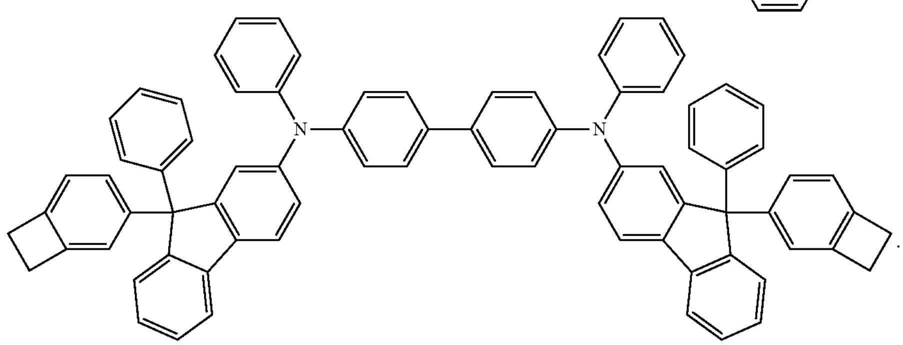

According to an exemplary embodiment of the present invention, at least one of R1 to R20 is F, a cyano group, or a substituted or unsubstituted fluoroalkyl group, at least another of R1 to R20 is a photocurable group or a thermosetting group, and the remaining R1 to R20 are the same as or different from each other, and are each independently hydrogen; deuterium; a halogen group; a nitro group; —C(O)$R_{100}$; —$OR_{101}$; —$SR_{102}$; —$SO_3R_{103}$; —$COOR_{104}$; —OC(O)$R_{105}$; —C(O)$NR_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group.

In an exemplary embodiment of the present invention, $R_{100}$ to $R_{107}$ are the same as or different from each other, and are each independently hydrogen; deuterium; or a substituted or unsubstituted alkyl group.

According to another exemplary embodiment, $R_{100}$ to $R_{107}$ are the same as or different from each other, and are each independently hydrogen; deuterium; or a substituted or unsubstituted alkyl group having 1 to 20 carbon atoms.

According to an exemplary embodiment of the present invention, any one of R1 to R20 of Formula 2 is a photocurable group or a thermosetting group, and the others are each F.

According to another exemplary embodiment, any one of R1 to R20 of Formula 2 is a vinyl group, and the others are each F.

According to still another exemplary embodiment, R3 of Formula 2 is a vinyl group, and R1, R2, and R4 to R20 are each F.

According to an exemplary embodiment of the present invention, four of R1 to R20 of Formula 2 are each a photocurable group or a thermosetting group, and the others are each F.

According to another exemplary embodiment, four of R1 to R20 of Formula 2 are each a vinyl group, and the others are each F.

According to still another exemplary embodiment, R3, R8, R13, and R18 of Formula 2 are each a vinyl group, and R1, R2, R4 to R7, R9 to R12, R14 to R17, R19, and R20 are each F.

According to an exemplary embodiment of the present invention, four of R1 to R20 of Formula 2 are each an alkyloxetanyl group, and the others are each F.

According to an exemplary embodiment of the present invention, four of R1 to R20 of Formula 2 are each a methyloxetanyl group, and the others are each F.

According to another exemplary embodiment, R3, R8, R13, and R18 of Formula 2 are each a methyloxetanyl group, and R1, R2, R4 to R7, R9 to R12, R14 to R17, R19, and R20 are each F.

According to an exemplary embodiment of the present invention, the compound represented by Formula 2 is any one of the following compounds.

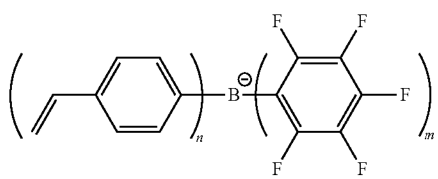

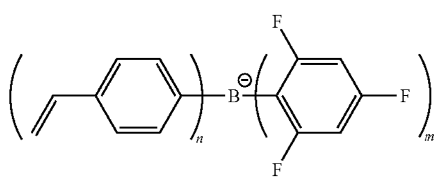

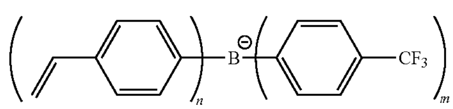

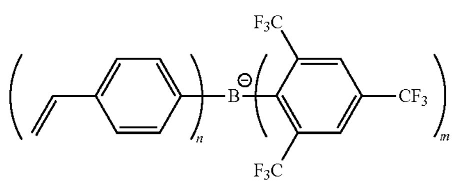

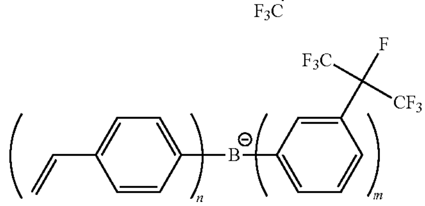

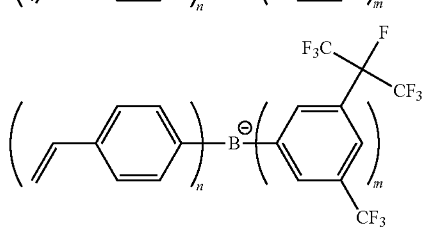

-continued

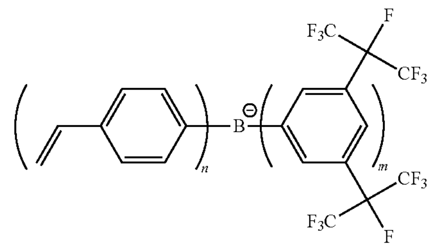

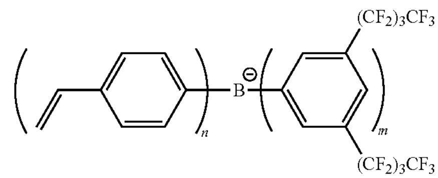

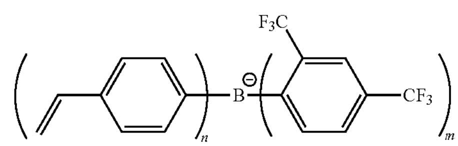

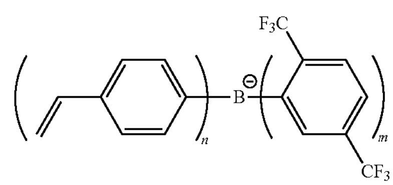

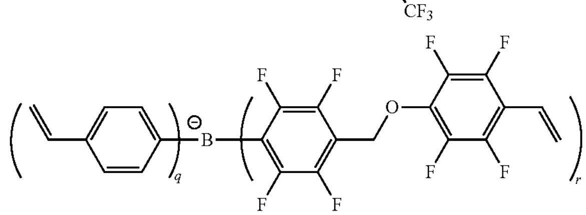

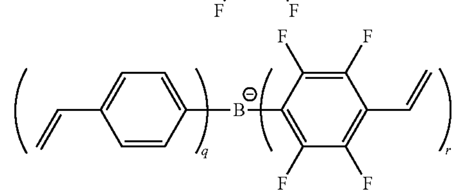

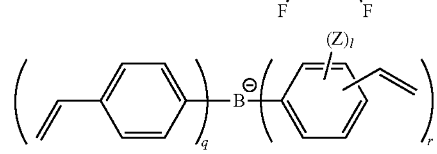

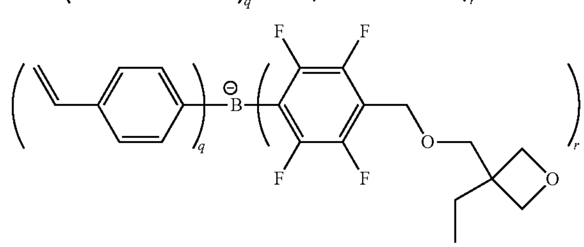

-continued
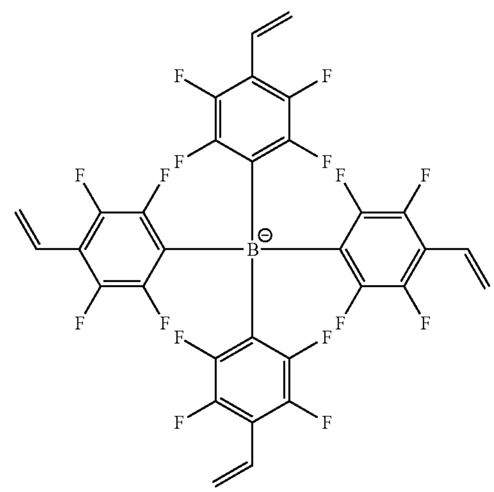
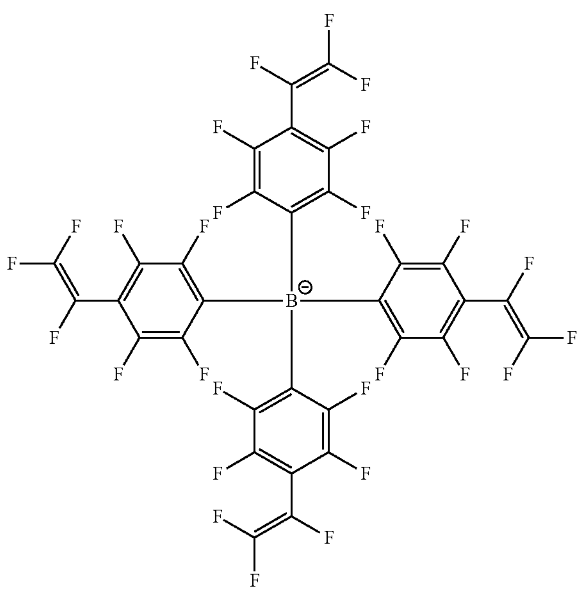
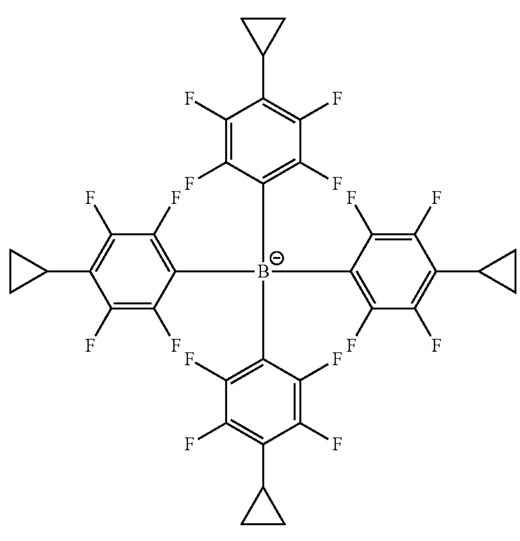
-continued
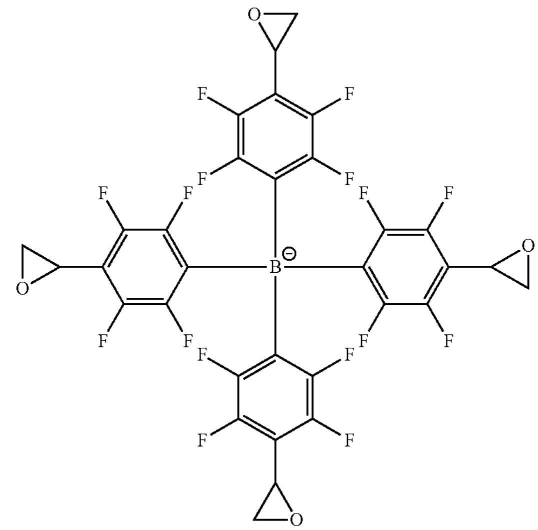
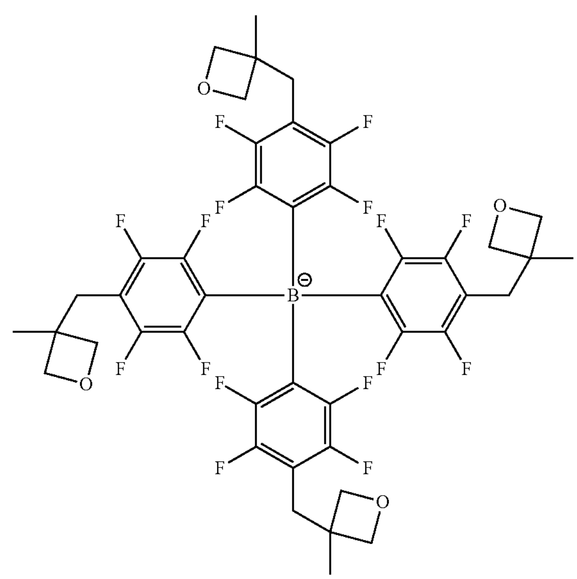
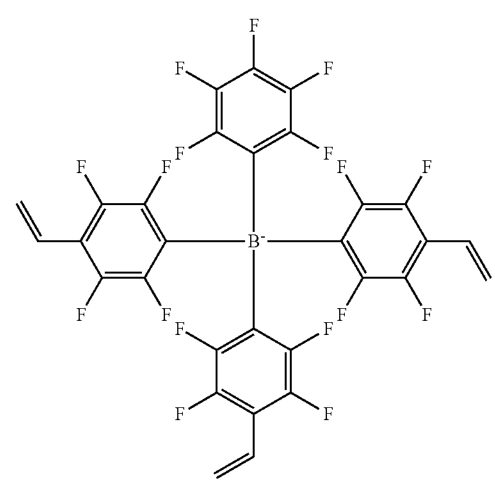

-continued

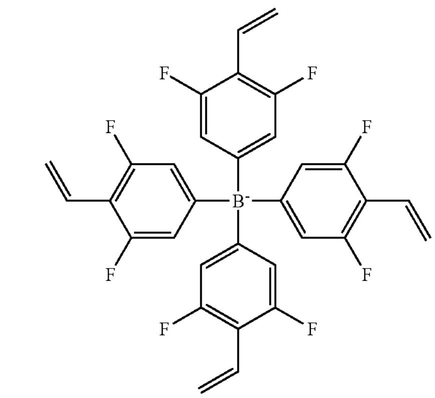

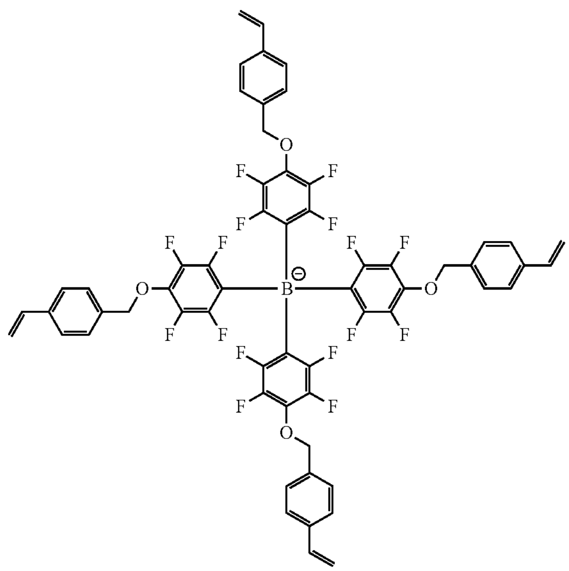

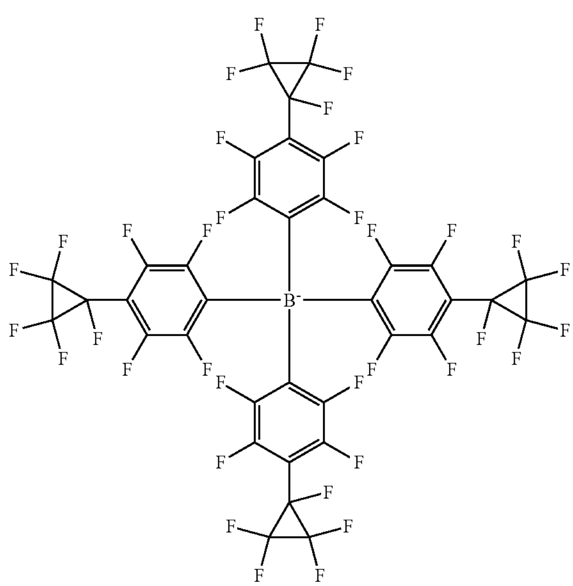

-continued

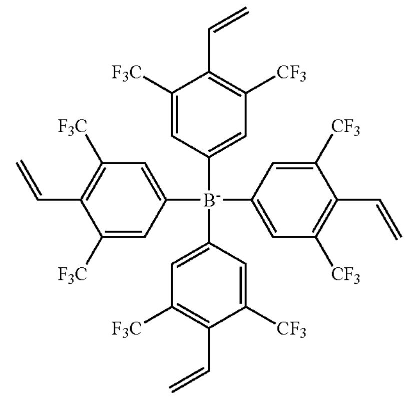

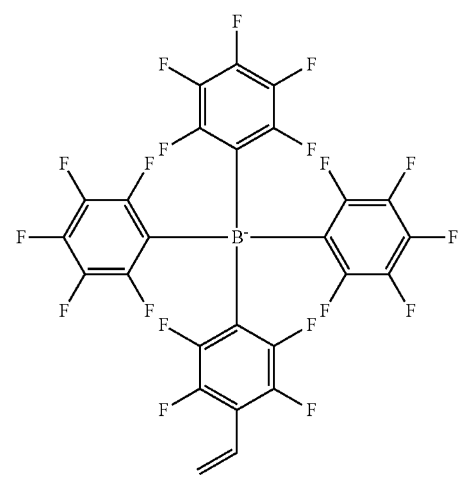

In the structural formulae, n is an integer from 1 to 3, m is an integer from 1 to 3, m+n=4, r is an integer from 1 to 4, q is an integer from 0 to 3, and q+r=4, Z is deuterium; a halogen group; a nitro group; a cyano group; an amino group; —C(O) $R_{100}$; —$OR_{101}$; —$SR_{102}$; —$SO_3R_{103}$; —$COOR_{104}$; —OC(O)$R_{103}$; —C(O) $NR_{106}R_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, l is an integer from 1 to 4, and when l is 2 or more, each Z are the same as or different from each other, and $R_{100}$ to $R_{107}$ are the same as or different from each other, and are each independently hydrogen; deuterium; or a substituted or unsubstituted alkyl group.

According to an exemplary embodiment of the present invention, $R_{100}$ to $R_{107}$ are the same as or different from each other, and are each independently hydrogen; deuterium; or a substituted or unsubstituted alkyl group having 1 to 20 carbon atoms.

According to an exemplary embodiment of the present specification, the coating composition further includes a cationic group, and the cationic group is selected from a monovalent cationic group, an onium compound, or the following structural formulae.

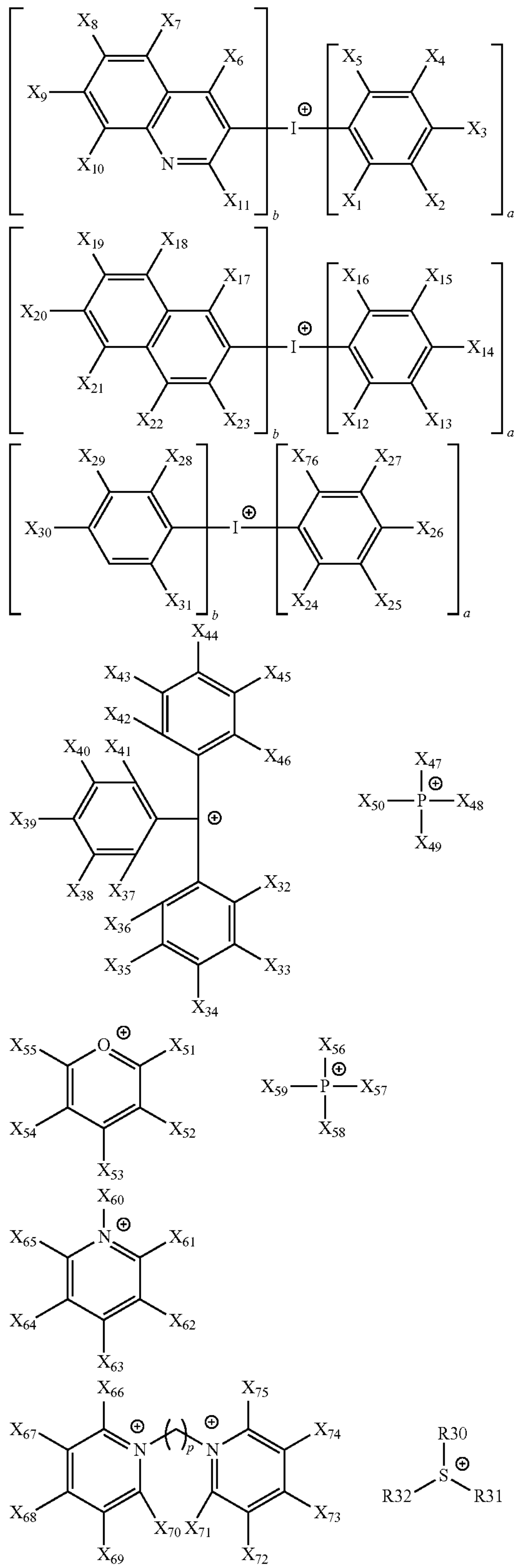

In the structural formulae, $X_1$ to $X_{76}$ are the same as or different from each other, and are each independently hydrogen; a cyano group; a nitro group; a hydroxyl group; a halogen group; —$COOR_{201}$; a substituted or unsubstituted alkyl group; a substituted or unsubstituted alkenyl group; a substituted or unsubstituted alkoxy group; a substituted or unsubstituted aryloxy group; a substituted or unsubstituted amine group; a substituted or unsubstituted cycloalkyl group; a substituted or unsubstituted fluoroalkyl group; or a substituted or unsubstituted aryl group, or a photocurable group or a thermosetting group, $R_{201}$ is hydrogen; deuterium; or a substituted or unsubstituted alkyl group, R30 to R32 are the same as or different from each other, and are each independently a substituted or unsubstituted alkyl group; a substituted or unsubstituted alkenyl group; a substituted or unsubstituted alkynyl group; a substituted or unsubstituted cycloalkyl group; a substituted or unsubstituted aryl group; or a substituted or unsubstituted heterocyclic group, or adjacent groups are bonded to each other to form a ring, p is an integer from 0 to 10, and a is 1 or 2, b is 0 or 1, and a+b=2.

In an exemplary embodiment of the present specification, the monovalent cationic group may be an alkali metal cation, and examples of the alkali metal cation include $Na^+$, $Li^+$, $K^+$, and the like, but are not limited thereto.

According to an exemplary embodiment of the present specification, the cationic group is represented by any one of the following Formulae 10 to 16.

[Formula 10]

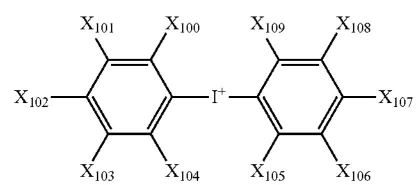

[Formula 11]

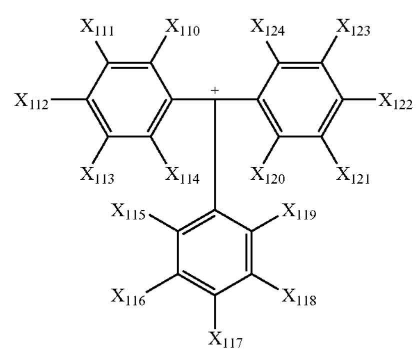

[Formula 12]

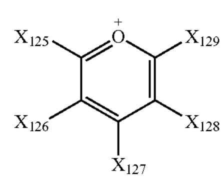

[Formula 13]

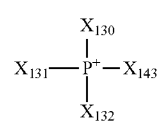

[Formula 14]

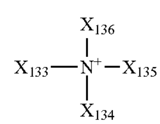

-continued

[Formula 15]

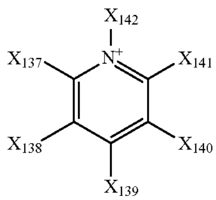

[Formula 16]

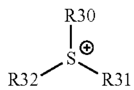

In Formulae 10 to 16, $X_{100}$ to $X_{143}$ are the same as or different from each other, and are each independently hydrogen; a cyano group; a nitro group; a hydroxyl group; a halogen group; —$COOR_{201}$; a substituted or unsubstituted alkyl group; a substituted or unsubstituted alkenyl group; a substituted or unsubstituted alkoxy group; a substituted or unsubstituted aryloxy group; a substituted or unsubstituted amine group; a substituted or unsubstituted cycloalkyl group; a substituted or unsubstituted fluoroalkyl group; or a substituted or unsubstituted aryl group, or a photocurable group or a thermosetting group, $R_{201}$ is a substituted or unsubstituted alkyl group, and R30 to R32 are the same as or different from each other, and are each independently a substituted or unsubstituted alkyl group; a substituted or unsubstituted alkenyl group; a substituted or unsubstituted alkynyl group; a substituted or unsubstituted cycloalkyl group; a substituted or unsubstituted aryl group; or a substituted or unsubstituted heterocyclic group, or adjacent groups are bonded to each other to form a ring.

According to an exemplary embodiment of the present specification, Formula 16 is represented by any one of the following Formulae 16-1 to 16-4.

[Formula 16-1]

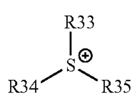

[Formula 16-2]

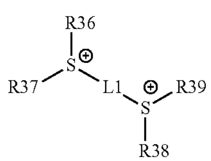

[Formula 16-3]

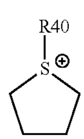

[Formula 16-4]

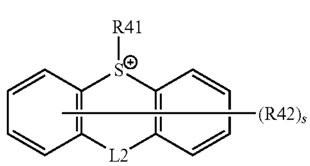

In Formulae 16-1 to 16-4,

R33 to R41 are the same as or different from each other, and are each independently a substituted or unsubstituted alkyl group; a substituted or unsubstituted alkenyl group; a substituted or unsubstituted cycloalkyl group; or a substituted or unsubstituted aryl group, L1 is a substituted or unsubstituted arylene group, L2 is a direct bond; O; S; or C═O, and R42 is a substituted or unsubstituted carbonyl group, and s is 0 or 1.

In an exemplary embodiment of the present specification, R30 to R32 are the same as or different from each other, and are each independently a substituted or unsubstituted phenyl group; a substituted or unsubstituted cyclopropyl group; a substituted or unsubstituted ethyl group; a substituted or unsubstituted methyl group; or a substituted or unsubstituted fluorenyl group.

In an exemplary embodiment of the present specification, R30 to R32 are the same as or different from each other, and are each independently a phenyl group which is unsubstituted or substituted with one or more substituents selected from the group consisting of a methyl group, a vinyl group, a butenyl group, an ester group, a phenyl group, a butyl group, an ethyl group, a methoxy group, and a hydroxyl group; a cyclopropyl group which is unsubstituted or substituted with one or more substituents selected from the group consisting of a methyl group, a vinyl group, a butenyl group, an ester group, a phenyl group, a butyl group, an ethyl group, a methoxy group, and a hydroxyl group; an ethyl group which is unsubstituted or substituted with one or more substituents selected from the group consisting of a methyl group, a vinyl group, a butenyl group, an ester group, a phenyl group, a butyl group, an ethyl group, a methoxy group, and a hydroxyl group; a methyl group which is unsubstituted or substituted with one or more substituents selected from the group consisting of a methyl group, a vinyl group, a butenyl group, an ester group, a phenyl group, a butyl group, an ethyl group, a methoxy group, and a hydroxyl group; or a fluorenyl group which is unsubstituted or substituted with one or more substituents selected from the group consisting of a methyl group, a vinyl group, a butenyl group, an ester group, a phenyl group, a butyl group, an ethyl group, a methoxy group, and a hydroxyl group.

According to an exemplary embodiment of the present invention, the cationic group is selected from the following structures.

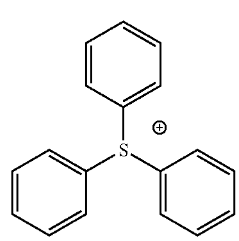

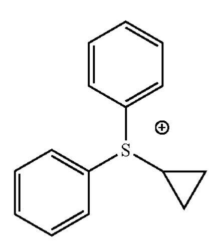

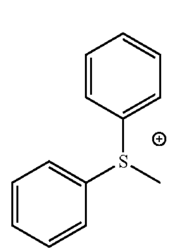

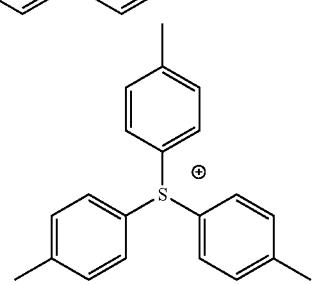

-continued
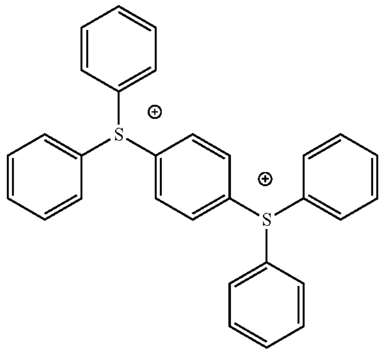
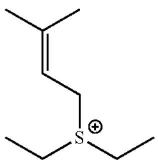
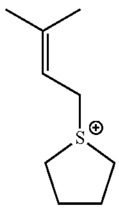
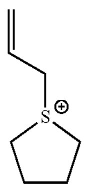
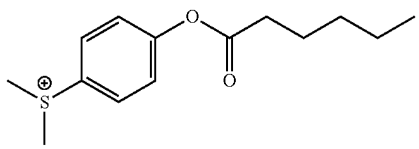
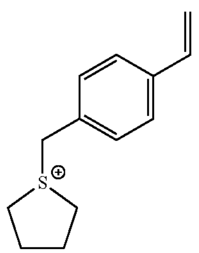
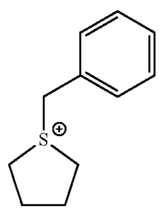
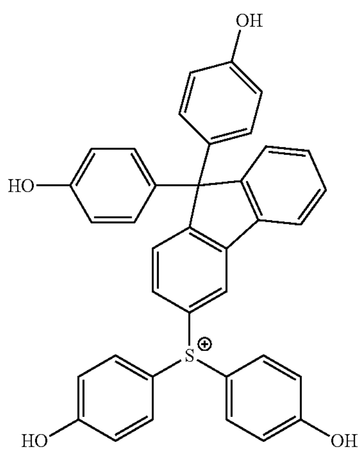
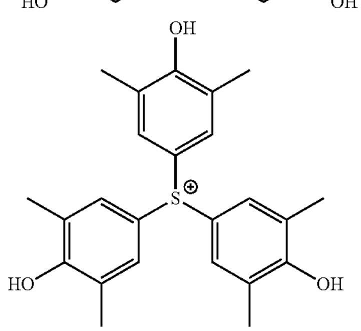
-continued
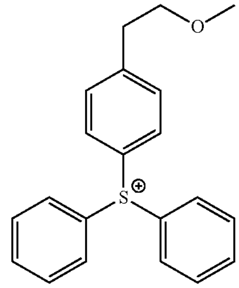
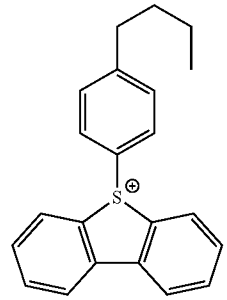
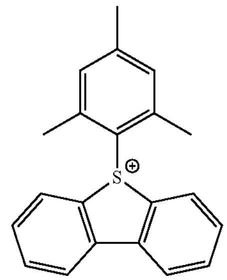
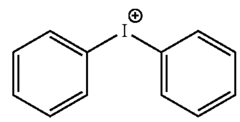
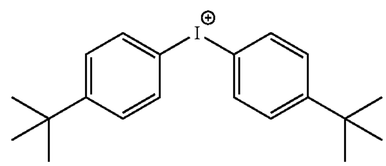
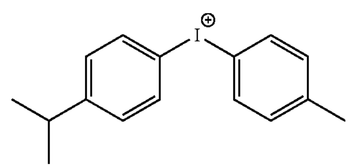
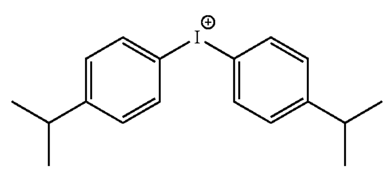
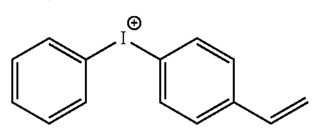
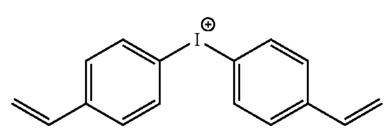
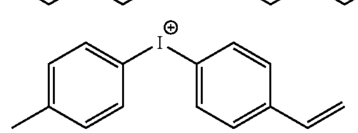
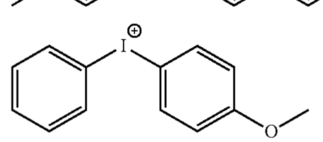
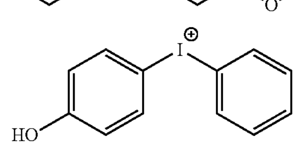

-continued
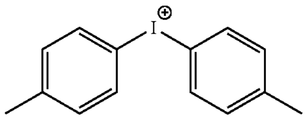
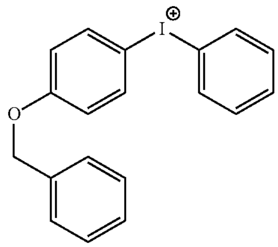
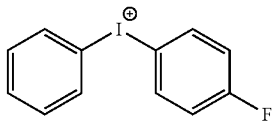
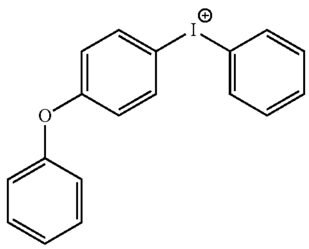
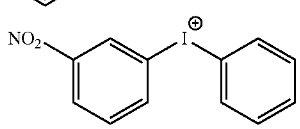
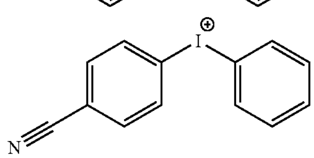
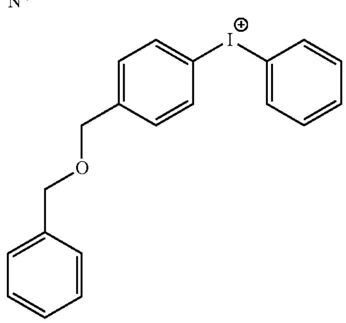
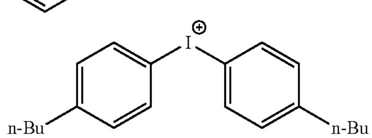
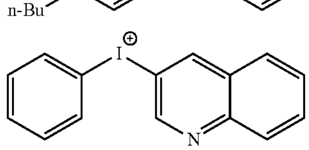
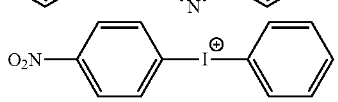
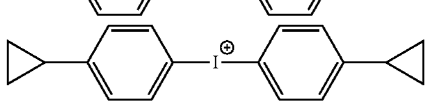
-continued
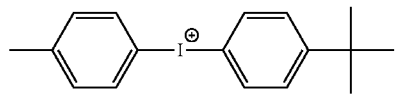
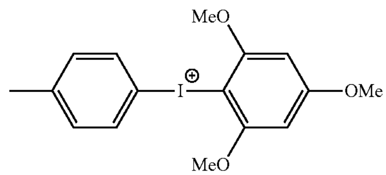
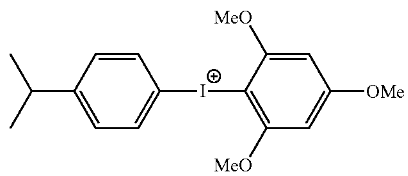
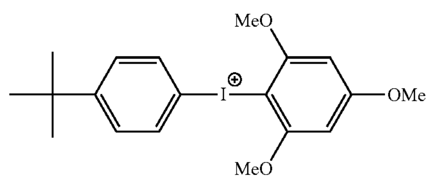
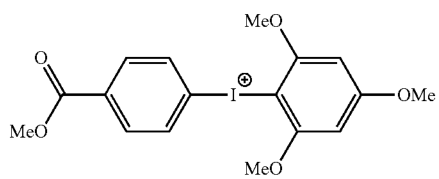
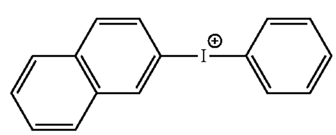
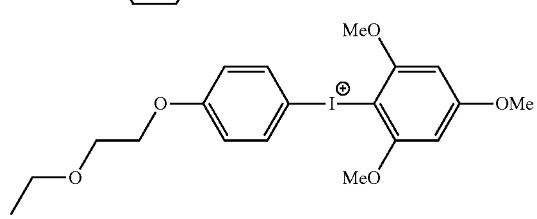
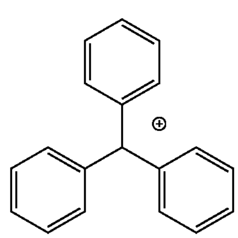
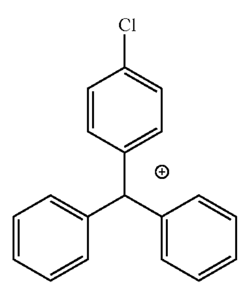
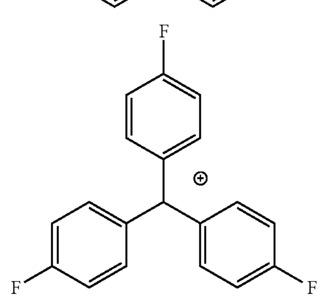

-continued
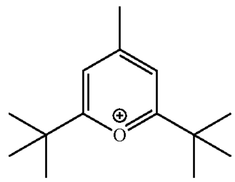
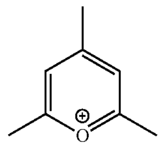
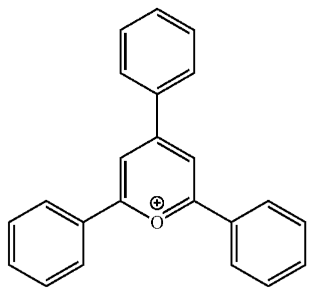
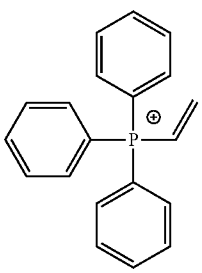
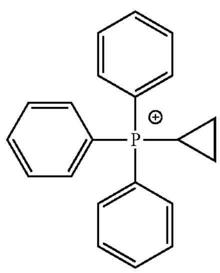
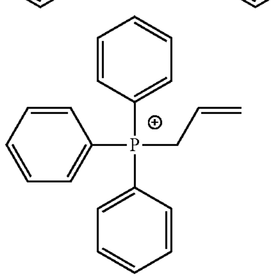
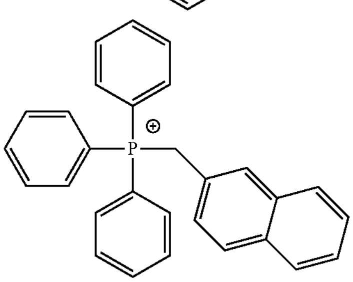
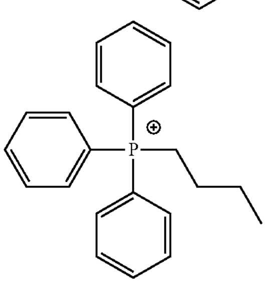
-continued
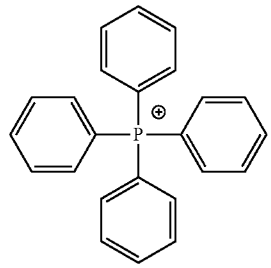
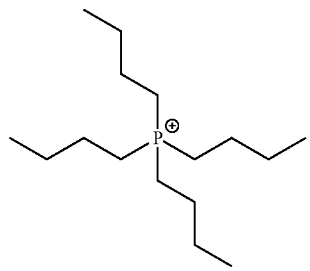
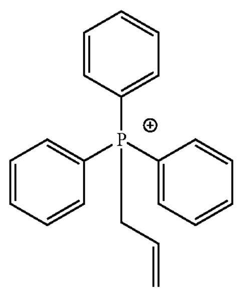
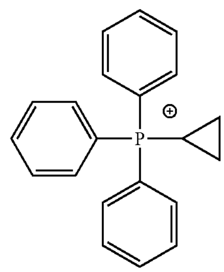
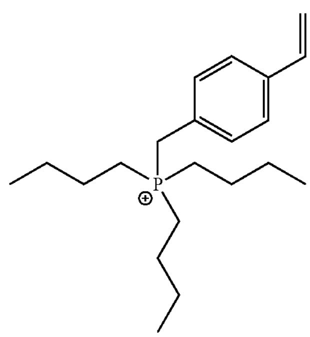
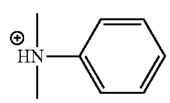
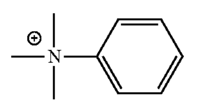
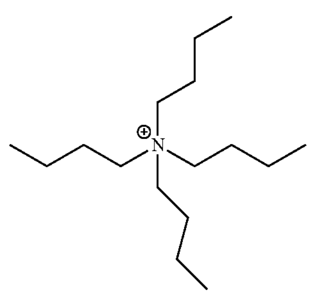
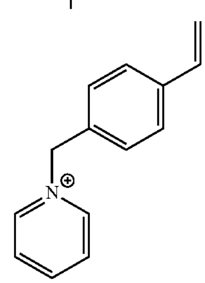

-continued

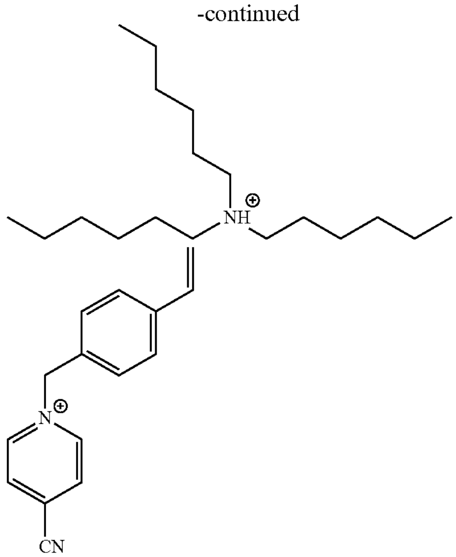

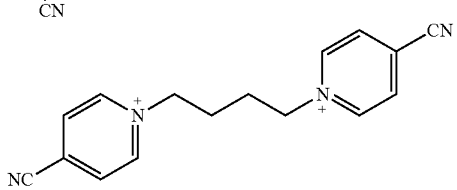

According to an exemplary embodiment of the present specification, the coating composition includes the by Formula 2, and a cationic group.

In an exemplary embodiment of the present specification, the coating composition may be used in a hole injection layer of an organic light emitting device, and when the coating composition is used in the hole injection layer, the compound represented by Formula 2 and the cationic group may be used as a dopant of the hole injection layer. In this case, when the content of F of the compound represented by Formula 2 is increased, the force of attracting electrons from another compound (host compound) is increased, and holes are more proficiently produced in the host, so that the performance in the hole injection layer is improved.

In an exemplary embodiment of the present specification, the content of F of the compound represented by Formula 2 may be analyzed using COSA AQF-100 combustion furnace coupled to a Dionex ICS 2000 ion-chromatograph, or may be confirmed through 19F NMR which is a method generally used in the F analysis.

In an exemplary embodiment of the present specification, the coating composition includes the compound represented by Formula 1, the compound represented by Formula 2, and a solvent.

According to an exemplary embodiment of the present invention, the coating composition may include the compound represented by Formula 2 in an amount of 3 parts by weight to 150 parts by weight, preferably 5 parts by weight to 100 parts by weight, based on 100 parts by weight of the compound represented by Formula 1, but the content thereof is not limited thereto.

According to an exemplary embodiment of the present invention, the coating composition includes the compound represented by Formula 1, the compound represented by Formula 2, and a cationic group, and may include the compound represented by Formula 2 and the cationic group in an amount of 3 parts by weight to 150 parts by weight, preferably 5 parts by weight to 100 parts by weight, based on 100 parts by weight of the compound represented by Formula 1, but the content thereof is not limited thereto.

According to an exemplary embodiment of the present invention, the compound represented by Formula 2 and the cationic group are included at an equivalence ratio of 1:5 to 5:1 in the coating composition.

According to an exemplary embodiment of the present invention, the compound represented by Formula 2 and the cationic group are included at an equivalence ratio of 1:1 in the coating composition.

In an exemplary embodiment of the present specification, the coating composition may further include one or two compounds selected from the group consisting of a compound in which a thermosetting group or a photocurable group is introduced into the molecule and a polymer compound.

In an exemplary embodiment of the present specification, the coating composition may further include a compound in which a thermosetting group or a photocurable group is introduced into the molecule. When the coating composition further includes a compound in which a thermosetting group or a photocurable group is introduced into the molecule, a cure degree of the coating composition may be further increased.

In an exemplary embodiment of the present specification, the compound in which a thermosetting group or a photocurable group is introduced into the molecule has a molecular weight of 1,000 g/mol to 3,000 g/mol.

In an exemplary embodiment of the present specification, the coating composition may further include a polymer compound. When the coating composition further includes a polymer compound, the ink characteristic of the coating composition may be enhanced. That is, a coating composition further including the polymer compound may provide a viscosity suitable for coating or inkjet printing.

In an exemplary embodiment of the present specification, the coating composition may be in a liquid phase. The "liquid phase" means that the composition is in a liquid state at room temperature under atmospheric pressure.

In an exemplary embodiment of the present specification, the solvent is exemplified as, for example, a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; an aliphatic hydrocarbon-based solvent such as cyclohexane, methylcyclohexane, n-pentane, n-hexane, n-heptane, n-octane, n-nonane, and n-decane; a ketone-based solvent such as acetone, methyl ethyl ketone, cyclohexanone, isophorone, tetralone, decalone, and acetylacetone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol, and derivatives thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; and a solvent such as tetralin, but the solvent is sufficient as long as the solvent may dissolve or disperse the fluorene derivative according to an exemplary embodiment of the present invention, and is not limited thereto.

In another exemplary embodiment, the solvents may be used either alone or in a mixture of two or more solvents.

A boiling point of the solvent is preferably 40° C. to 250° C., and more preferably 60° C. to 230° C., but is not limited thereto.

According to another exemplary embodiment, the viscosity of the single or mixed solvent may be preferably 1 cP to 10 cP, but is not limited thereto.

In still another exemplary embodiment, a concentration of the coating composition is preferably 0.1 wt/v % to 20 wt/v %, and more preferably 0.5 wt/v % to 5 wt/v %, but is not limited thereto.

In an exemplary embodiment of the present specification, the coating composition may further include one or two or more additives selected from the group consisting of a thermal polymerization initiator and a photopolymerization initiator.

Examples of the thermal polymerization initiator include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, p-kroll benzoyl peroxide, dicumyl peroxide, 2,5-dimethyl-2,5-(t-butyl oxy)-hexane, 1,3-bis(t-butyl peroxy-isopropyl) benzene, t-butyl cumyl peroxide, di-t-butyl peroxide, 2,5-dimethyl-2,5-(di-t-butyl peroxy) hexane-3, tris-(t-butyl peroxy) triazine, 1,1-di-t-butyl peroxy-3,3,5-trimethyl cyclohexane, 1,1-di-t-butylperoxy cyclohexane, 2,2-di(t-butyl peroxy) butane, 4,4-di-t-butylperoxyvaleric acid, n-butyl ester, 2,2-bis(4,4-t-butyl peroxy cyclohexyl) propane, t-butylperoxyisobutylate, di-t-butyl peroxy hexahydro terephthalate, t-butyl peroxy-3,5,5-trimethylhexate, t-butyl peroxybenzoate, and di-t-butyl peroxy trimethyl adipate; or an azo-based thermal polymerization initiator such as azobisisobutyronitrile, azobisdimethylvaleronitrile, and azobiscyclohexyl nitrile, but the examples are not limited thereto.

Examples of the photopolymerization initiator include acetophenone-based or ketal-based photopolymerization initiators such as diethoxyacetophenone, 2,2-dimethoxy-1, 2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl) butanon-1,2-hydroxy-2-methyl-1-phenylpropan-1-one, 2-methyl-2-morpholino(4-methylthiophenyl)propan-1-one, and 1-phenyl-1,2-propanedion-2-(o-ethoxycarbonyl)oxime; benzoin ether-based photopolymerization initiators such as benzoin, benzoin methyl ether, benzoin ethyl ether, benzoin isobutyl ether, and benzoin isopropyl ether; benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone, and 1,4-benzoylbenzene; thioxanthone-based photopolymerization initiators such as 2-isopropylthioxanthone, 2-chlorothioxanthone, 2,4-dimethylthioxanthone, 2,4-diethylthioxanthone, and 2,4-dichlorothioxanthone; and other photopolymerization initiators such as ethylanthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methyl phenyl glyoxy ester, 9,10-phenanthrene, acridine-based compounds, triazine-based compounds, and imidazole-based compounds. Further, compounds having photopolymerization promoting effects may be used either alone or in combination with the photopolymerization initiators. Examples thereof include triethanolamine, methyldiethanolamine, ethyl 4-dimethylaminobenzoate, isoamyl 4-dimethylaminobenzoate, (2-dimethylamino)ethyl benzoate, 4,4'-dimethylamino benzophenone, and the like, but are not limited thereto.

In another exemplary embodiment, the coating composition has a viscosity of 2 cP to 15 cP.

The present specification also provides an organic light emitting device formed using the coating composition.

An exemplary embodiment of the present specification includes: a first electrode; a second electrode; and an organic material layer having one or more layers provided between the first electrode and the second electrode, and one or more layers of the organic material layer include the coating composition or a cured product thereof. The cured product of the coating composition means a state where the coating composition is cured by a heat treatment or a light treatment.

In an exemplary embodiment of the present specification, the organic material layer including the coating composition or the cured product thereof is a hole transport layer, a hole injection layer, or a layer which simultaneously transports and injects holes.

According to an exemplary embodiment of the present specification, the compound represented by Formula 1 is included as a host of the hole injection layer, and the compound represented by Formula 2 and the cationic group are included as a dopant of the hole injection layer.

In another exemplary embodiment, the organic material layer including the coating composition or the cured product thereof is a light emitting layer.

In an exemplary embodiment of the present specification, the organic light emitting device further includes one or two or more layers selected from the group consisting of a hole injection layer, a hole transport layer, a layer which simultaneously injects and transports holes, an electron transport layer, an electron injection layer, a layer which simultaneously injects and transports electrons, an electron blocking layer, and a hole blocking layer.

In an exemplary embodiment of the present specification, the first electrode is an anode (positive electrode), and the second electrode is a cathode (negative electrode).

According to another exemplary embodiment, the first electrode is a cathode (negative electrode), and the second electrode is an anode (positive electrode).

In another exemplary embodiment, the organic light emitting device may be a normal type organic light emitting device in which an anode (positive electrode), an organic material layer having one or more layers, and a cathode (negative electrode) are sequentially stacked on a substrate.

In still another exemplary embodiment, the organic light emitting device may be an inverted type organic light emitting device in which a cathode (negative electrode), an organic material layer having one or more layer, and an anode (positive electrode) are sequentially stacked on a substrate.

The organic material layer of the organic light emitting device of the present specification may also be composed of a single-layered structure, but may be composed of a multi-layered structure in which two or more organic material layers are stacked. For example, the organic light emitting device of the present invention may have a structure including a hole injection layer, a hole transport layer, a layer which simultaneously injects and transports holes, a light emitting layer, an electron transport layer, an electron injection layer, a layer which simultaneously injects and transport electrons, and the like, as an organic material layer. However, the structure of the organic light emitting device is not limited thereto, and may include a fewer or greater number of organic material layers.

The organic light emitting device of the present specification may be stacked in order of [a substrate/an anode/a hole injection layer/a hole transport layer/a light emitting layer/an electron injection layer/an electron transport layer/a cathode].

The organic light emitting device of the present specification according to another exemplary embodiment may be stacked in order of [a substrate/an anode/a hole injection layer/a hole transport layer/a light emitting layer/a layer which simultaneously injects and transport electrons/a cathode].

For example, the structure of the organic light emitting device according to an exemplary embodiment of the present specification is exemplified in FIG. 1.

FIG. 1 exemplifies the structure of an organic light emitting device in which an anode 201, a hole injection layer 301, a hole transport layer 401, a light emitting layer 501, a layer 601 which simultaneously injects and transport electrons, and a cathode 701 are sequentially stacked on a substrate 101.

FIG. 1 exemplifies an organic light emitting device, and the organic light emitting device is not limited thereto.

When the organic light emitting device includes a plurality of organic material layers, the organic material layers may be formed of the same material or different materials.

The organic light emitting device of the present specification may be manufactured by the materials and methods known in the art, except that one or more layers of the organic material layer are formed using a coating composition including the fluorene-based compound.

For example, the organic light emitting device of the present specification may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode, forming an organic material layer including a hole injection layer, a hole transport layer, a light emitting layer, and a layer which simultaneously injects and transports electrons thereon through a deposition or solution process, and then depositing a material, which may be used as a cathode, thereon, by using a physical vapor deposition (PVD) method such as sputtering or e-beam evaporation. In addition to the method described above, an organic light emitting device may be made by sequentially depositing a cathode material, an organic material layer, and an anode material on a substrate.

The present specification also provides a method for manufacturing an organic light emitting device formed by using the coating composition.

Specifically, in an exemplary embodiment of the present specification, the method includes: preparing a substrate; forming a first electrode on the substrate; forming an organic material layer having one or more layers on the first electrode; and forming a second electrode on the organic material layer, and one or more layers of the organic material layer are formed by using the coating composition.

According to an exemplary embodiment of the present specification, the organic material layer formed by using the coating composition is formed by using a solution process.

In an exemplary embodiment of the present specification, the organic material layer formed by using the coating composition is formed by using spin coating.

In another exemplary embodiment, the organic material layer formed by using the coating composition is formed by a printing method.

In still another exemplary embodiment of the present specification, examples of the printing method include inkjet printing, nozzle printing, offset printing, transfer printing or screen printing, and the like, but are not limited thereto.

The coating composition according to an exemplary embodiment of the present specification is suitable for a solution process due to the structural characteristic thereof, so that the organic material layer may be formed by a printing method, and as a result, there is an economic effect in terms of time and costs when a device is manufactured.

In an exemplary embodiment of the present specification, the forming of the organic material layer formed by using the coating composition includes: coating the cathode or the anode with the coating composition; and heat-treating or light-treating the coating composition.

In an exemplary embodiment of the present specification, a heat treatment temperature in the heat-treating of the coating composition is 85° C. to 250° C.

In another exemplary embodiment, a heat treatment time in the heat-treating of the coating composition may be 1 minute to 1 hour.

In an exemplary embodiment of the present specification, when the coating composition does not include an additive, it is preferred that a cross-linkage proceeds by performing a heat treatment at a temperature of 100° C. to 250° C., and it is more preferred that a cross-linkage proceeds at a temperature of 120° C. to 200° C.

When the forming of the organic material layer formed by using the coating composition includes the heat-treating or light-treating of the coating composition, a plurality of fluorene-based compounds included in the coating composition may form a cross-linkage, thereby providing an organic material layer including a thin-filmed structure. In this case, it is possible to prevent the organic material layer from being dissolved, morphologically affected or decomposed by a solvent when another layer is stacked on the surface of the organic material layer formed by using the coating composition.

Therefore, when the organic material layer formed by using the coating composition is formed by a method including the heat-treating or light-treating of the coating composition, resistance to a solvent is increased, so that a plurality of layers may be formed by repeatedly performing solution deposition and cross-linking methods, and stability is increased, so that the service life characteristic of the device may be increased.

In an exemplary embodiment of the present specification, as the coating composition, a coating composition dispersed by being mixed with a polymer binding agent may be used.

In an exemplary embodiment of the present specification, as the polymer binding agent, those which do not extremely suppress charge transport are preferred, and those which are not strong in absorption to visible light are preferably used. As the polymer binding agent, poly(N-vinylcarbazole), polyaniline, and derivatives thereof, polythiophene and derivatives thereof, poly(p-phenylene vinylene) and derivatives thereof, poly(2,5-thienylene vinylene) and derivatives thereof, polycarbonate, polyacrylate, polymethyl acrylate, polymethyl methacrylate, polystyrene, polyvinyl chloride, polysiloxane, and the like are exemplified.

As the first electrode material, materials having a high work function are usually preferred so as to facilitate the injection of holes into an organic material layer. Specific examples of the first electrode material which may be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly [3,4-(ethylene-1,2-dioxy)thiophene](PEDOT), polypyrrole, and polyaniline; and the like, but are not limited thereto.

As the second electrode material, materials having a low work function are usually preferred so as to facilitate the injection of electrons into an organic material layer. Specific examples of the second electrode material include: a metal such as barium, magnesium, calcium, sodium, potassium, titanium, indium, yttrium, lithium, gadolinium, aluminum, silver, tin, and lead, or an alloy thereof; a multi-layer structured material such as LiF/Al or $LiO_2$/Al; and the like, but are not limited thereto.

The hole injection layer is a layer which injects holes from an electrode, and a hole injection material is preferably a compound which has a capability of transporting holes, and thus has an effect of injecting holes at an anode and an excellent effect of injecting holes into a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer is a layer which accepts holes from a hole injection layer and transports the holes to a light emitting layer, and a hole transport material is suitably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The light emitting material is a material which may receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, lubrene, and the like, but are not limited thereto.

The light emitting layer may include a host material and a dopant material. Examples of the host material include fused aromatic ring derivatives, or hetero ring-containing compounds, and the like. Specifically, examples of the fused aromatic ring derivatives include anthracene derivatives, pyrene derivatives, naphthalene derivatives, pentacene derivatives, phenanthrene compounds, fluoranthene compounds, and the like, and examples of the hetero ring-containing compounds include carbazole derivatives, dibenzofuran derivatives, ladder-type furan compounds, pyrimidine derivatives, and the like, but the examples thereof are not limited thereto.

Examples of the dopant material include aromatic amine derivatives, styrylamine compounds, boron complexes, fluoranthene compounds, metal complexes, and the like. Specifically, the aromatic amine derivative is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complexes include an iridium complex, a platinum complex, and the like, but are not limited thereto.

The electron transport layer is a layer which accepts electrons from an electron injection layer and transports the electrons to a light emitting layer, and an electron transport material is suitably a material having high electron mobility which may proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present specification may be a top emission type, a bottom emission type, or a dual emission type according to the materials to be used.

Hereinafter, the present specification will be described in detail with reference to Examples for specifically describing the present specification. However, the Examples according to the present specification may be modified in various forms, and it is not interpreted that the scope of the present specification is limited to the Examples described below. The Examples of the present specification are provided to more completely explain the present specification to a person with ordinary skill in the art.

MODE FOR INVENTION

Preparation Examples

Preparation Example. Preparation of Coating Composition

Coating Composition 1 was prepared by dissolving 16 mg of the following H1 and 4 mg of the following D1 in 980 mg of toluene, and Coating Compositions 2 to 9 and Comparative Coating Compositions 1 to 5 were prepared by using the compounds described in the following Table 1.

TABLE 1

| Preparation Examples | Preparation of Coating Composition |
|---|---|
| Coating Composition 1 | 2 wt % toluene solution having a weight ratio of H1 and D1 of 8:2 |
| Coating Composition 2 | 2 wt % toluene solution having a weight ratio of H2 and D1 of 8:2 |
| Coating Composition 3 | 2 wt % toluene solution having a weight ratio of H3 and D1 of 8:2 |
| Coating Composition 4 | 2 wt % toluene solution having a weight ratio of H1 and D2 of 8:2 |
| Coating Composition 5 | 2 wt % toluene solution having a weight ratio of H4 and D1 of 8:2 |
| Coating Composition 6 | 2 wt % toluene solution having a weight ratio of H5 and D1 of 8:2 |
| Coating Composition 7 | 2 wt % toluene solution having a weight ratio of H6 and D1 of 8:2 |
| Coating Composition 8 | 2 wt % toluene solution having a weight ratio of H7 and D3 of 8:2 |
| Coating Composition 9 | 2 wt % toluene solution having a weight ratio of H8 and D2 of 8:2 |
| Comparative Coating Composition 1 | 2 wt % toluene solution having a weight ratio of VNPB and D4 of 8:2 |
| Comparative Coating Composition 2 | 2 wt % toluene solution having a weight ratio of H1 and D4 of 8:2 |
| Comparative Coating Composition 3 | 2 wt % toluene solution having a weight ratio of H9 and D1 of 8:2 |
| Comparative Coating Composition 4 | 2 wt % toluene solution having a weight ratio of VNPB and D2 of 8:2 |
| Comparative Coating Composition 5 | 2 wt % toluene solution having a weight ratio of H10 and D1 of 8:2 |

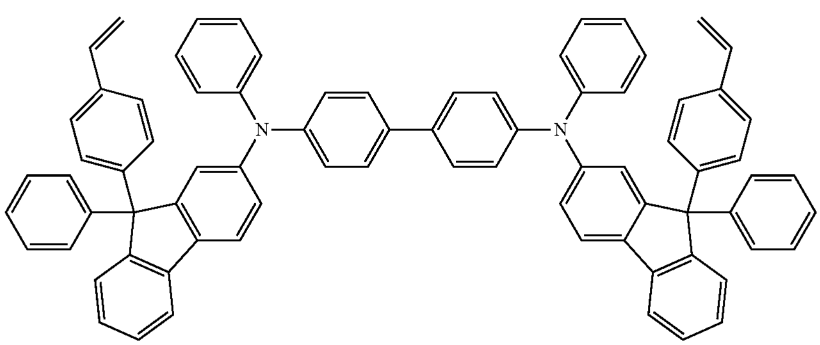

H1

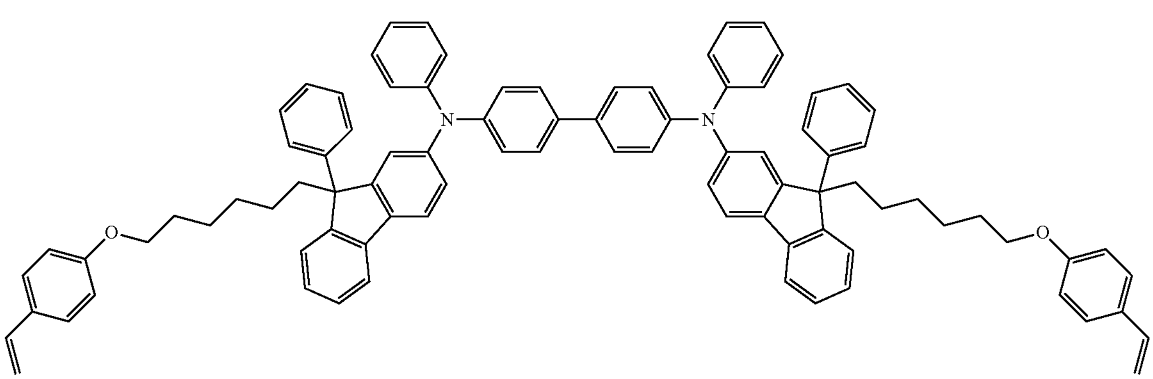

H2

-continued
H3
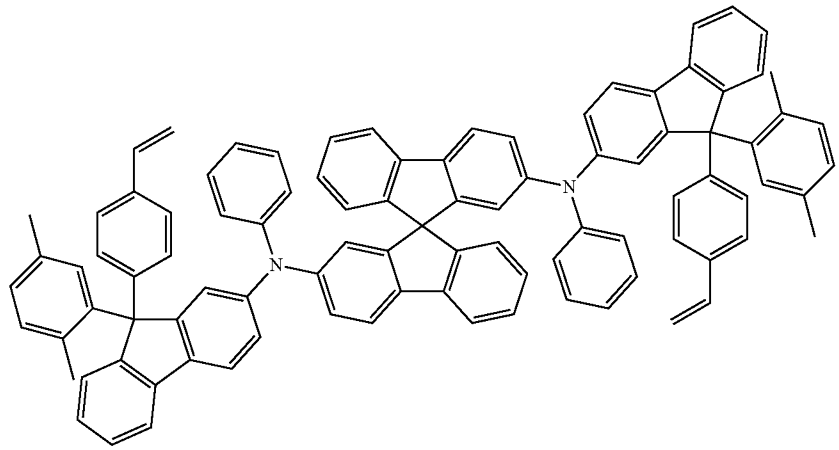
H4
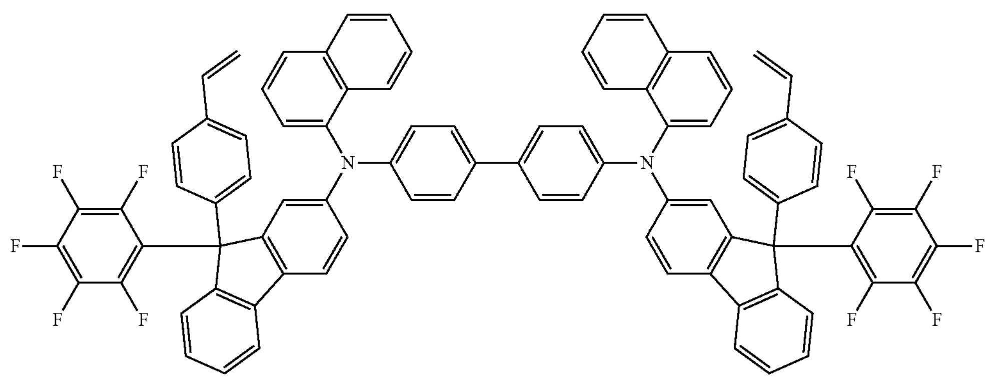
H5
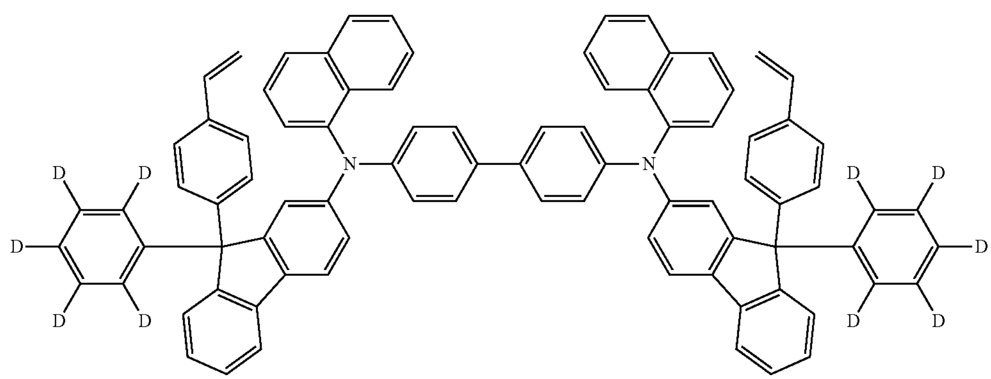
H6
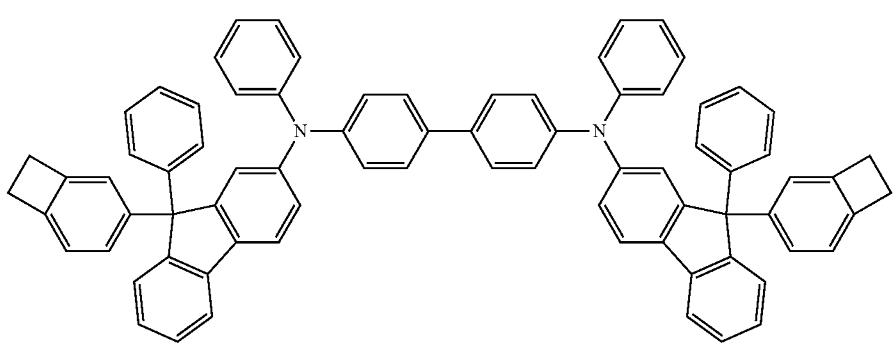

-continued
H7
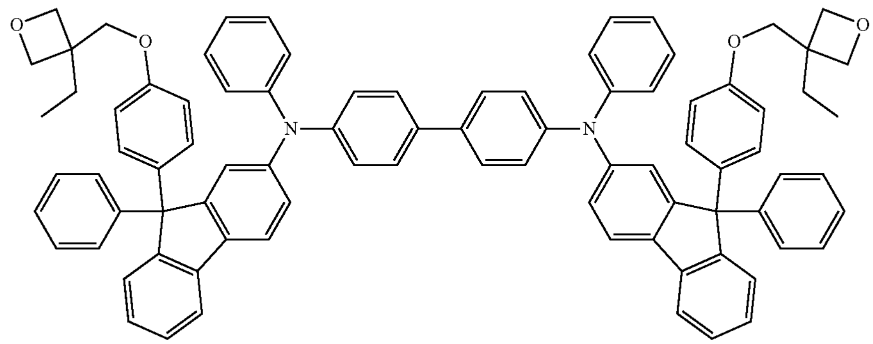
H8
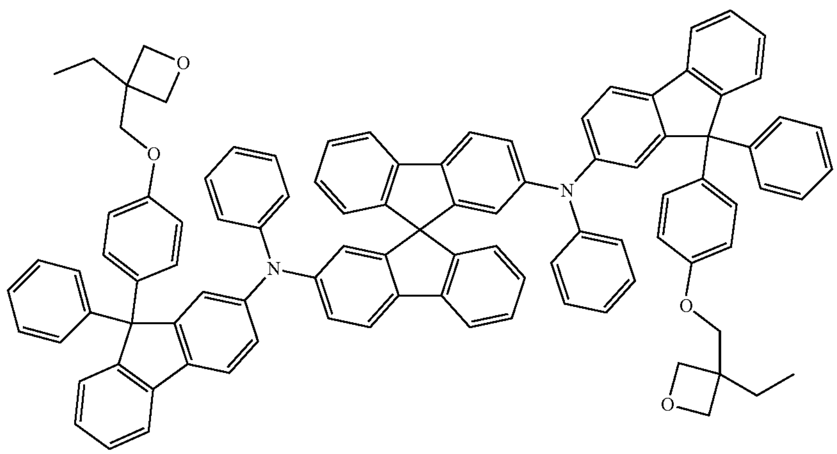
H9
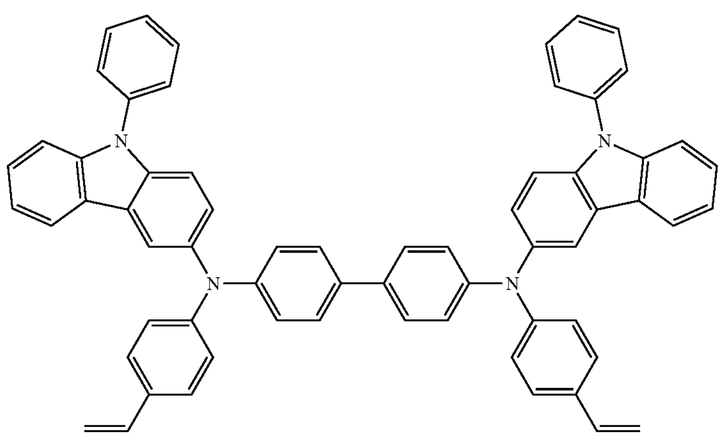

-continued

H10

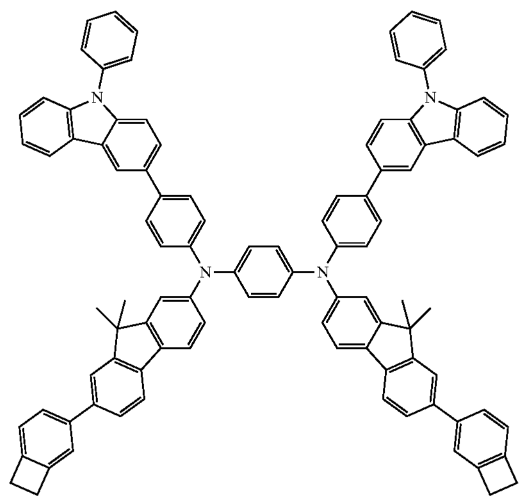

VNPB

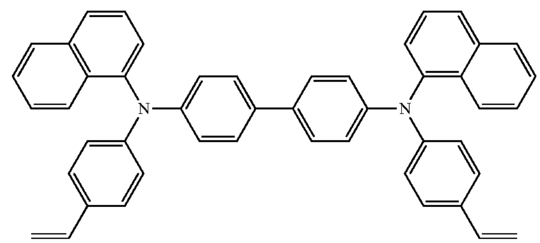

D1

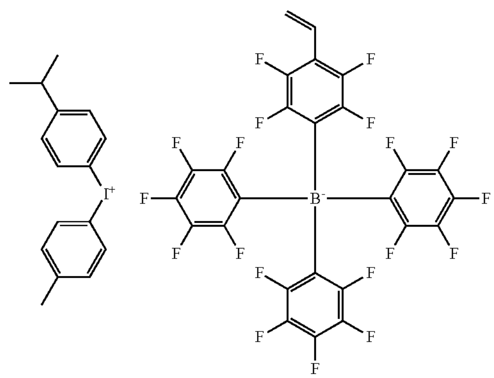

D2

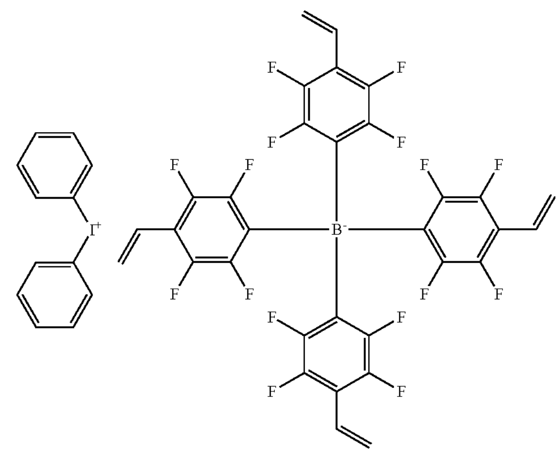

D3

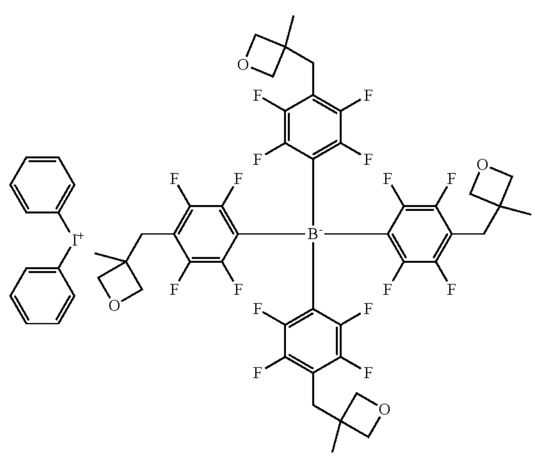

D4

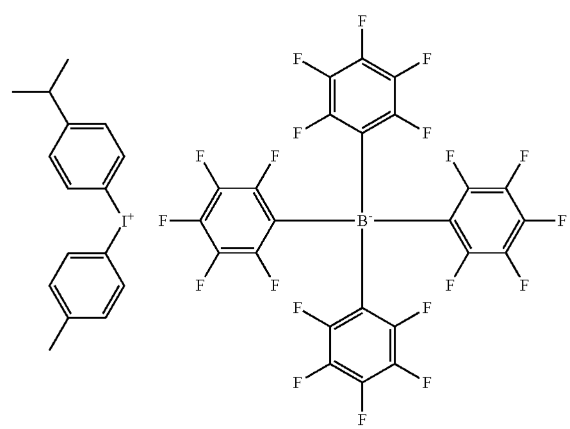

Examples/Comparative Examples

Example 1. Manufacture of Organic Light Emitting Device 1

The surface of an ITO transparent electrode was spin-coated with Coating Composition 1 and a heat treatment (curing) was performed thereon at 220° C. for 30 minutes, thereby forming a hole injection layer having a thickness of 30 nm. The hole injection layer formed above was spin-coated with a toluene ink including 2 wt % of α-NPD(N, N-di(1-naphthyl)-N,N-diphenyl-(1,1'-biphenyl)-4,4'-diamine), thereby forming a hole transport layer having a thickness of 40 nm. Thereafter, the ITO transparent electrode was transferred to a vacuum deposition apparatus, and then AND and DPAVBi at a weight ratio (AND:DPAVBi) of 20:1 were vacuum-deposited to have a thickness of 20 nm onto the hole transport layer, thereby forming a light emitting layer. BCP was vacuum-deposited to have a thickness of 35 nm onto the light emitting layer, thereby forming a layer which injects and transport electrons. LiF and aluminum were sequentially deposited on the layer, which injects and transports electrons, to have a thickness of 1 nm and 100 nm, respectively, thereby forming a cathode.

In the aforementioned procedure, the deposition rate of the organic material was maintained at 0.4 to 0.7 Å/sec, the deposition rates of lithium fluoride and aluminum of the cathode were maintained at 0.3 Å/sec and at 2 Å/sec, respectively, and the degree of vacuum during the deposition was maintained at $2\times10^{-7}$ to $5\times10^{-6}$ torr.

Example 2. Manufacture of Organic Light Emitting Device 2

An organic light emitting device was manufactured in the same manner as in Example 1, except that Coating Composition 2 was used instead of Coating Composition 1.

Example 3. Manufacture of Organic Light Emitting Device 3

An organic light emitting device was manufactured in the same manner as in Example 1, except that Coating Composition 3 was used instead of Coating Composition 1.

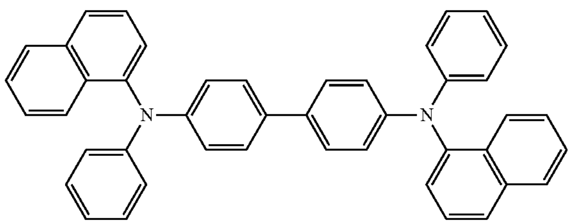

[α-NPD]

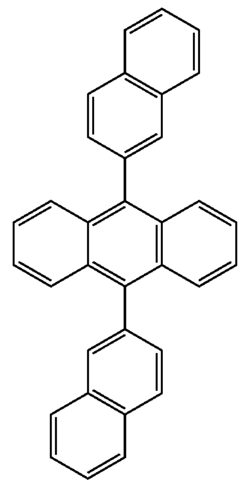

[AND (9,1-di-2-naphthalenyl-anthracene)]

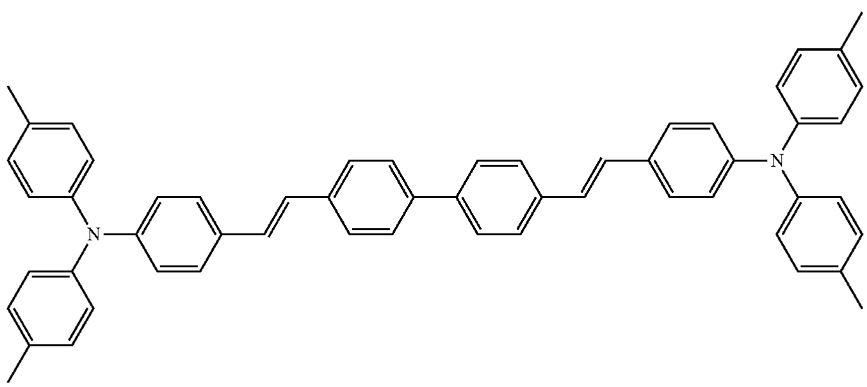

[DPAVBi (4,4′-bis[4-(di-p-tolylamino)styryl]biphenyl)]

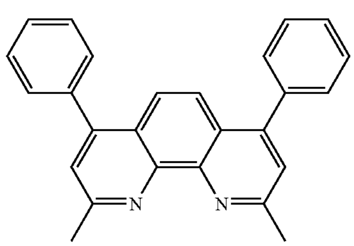

[BCP(2,9-dimethyl-4,7-diphenyl-1,10-phenanthroline)]

Example 4. Manufacture of Organic Light Emitting Device 4

An organic light emitting device was manufactured in the same manner as in Example 1, except that Coating Composition 4 was used instead of Coating Composition 1.

Example 5. Manufacture of Organic Light Emitting Device 5

An organic light emitting device was manufactured in the same manner as in Example 1, except that Coating Composition 5 was used instead of Coating Composition 1.

Example 6. Manufacture of Organic Light Emitting Device 6

An organic light emitting device was manufactured in the same manner as in Example 1, except that Coating Composition 6 was used instead of Coating Composition 1.

Example 7. Manufacture of Organic Light Emitting Device 7

An organic light emitting device was manufactured in the same manner as in Example 1, except that Coating Composition 7 was used instead of Coating Composition 1.

Example 8. Manufacture of Organic Light Emitting Device 8

An organic light emitting device was manufactured in the same manner as in Example 1, except that Coating Composition 8 was used instead of Coating Composition 1.

Example 9. Manufacture of Organic Light Emitting Device 9

An organic light emitting device was manufactured in the same manner as in Example 1, except that Coating Composition 9 was used instead of Coating Composition 1.

Comparative Example 1. Manufacture of Comparative Organic Light Emitting Device 1

An organic light emitting device was manufactured in the same manner as in Example 1, except that Comparative Coating Composition 1 was used instead of Coating Composition 1.

Comparative Example 2. Manufacture of Comparative Organic Light Emitting Device 2

An organic light emitting device was manufactured in the same manner as in Example 1, except that Comparative Coating Composition 2 was used instead of Coating Composition 1.

Comparative Example 3. Manufacture of Comparative Organic Light Emitting Device 3

An organic light emitting device was manufactured in the same manner as in Example 1, except that Comparative Coating Composition 3 was used instead of Coating Composition 1.

Comparative Example 4. Manufacture of Comparative Organic Light Emitting Device 4

An organic light emitting device was manufactured in the same manner as in Example 1, except that Comparative Coating Composition 4 was used instead of Coating Composition 1.

Comparative Example 5. Manufacture of Comparative Organic Light Emitting Device 5

An organic light emitting device was manufactured in the same manner as in Example 1, except that Comparative Coating Composition 5 was used instead of Coating Composition 1.

For the organic light emitting devices manufactured in Examples 1 to 9 and Comparative Examples 1 to 5, the results of measuring physical properties such as voltage (Volt), current efficiency (Cd/A), power efficiency (lm/W), quantum efficiency (QE), luminance ($Cd/m^2$), and color coordinate (CIEx, CIEy) at a current density of 10 $mA/cm^2$ are shown in the following Table 2. The quantum efficiency (QE) may be obtained by (number of photons emitted)/(number of charge carriers injected), and T95 is obtained by measuring time taken for luminance to be 95% as compared to the initial luminance at a current density of 10 $mA/cm^2$.

TABLE 2

| Device Example | Volt | J ($mA/cm^2$) | Cd/A | lm/W | QE (%) | $Cd/m^2$ | CIEx | CIEy | T95 (10 $mA/cm^2$) |
|---|---|---|---|---|---|---|---|---|---|
| Example 1 | 3.87 | 10.00 | 5.31 | 4.57 | 5.87 | 530.60 | 0.138 | 0.098 | 105.1 |
| Example 2 | 4.26 | 10.00 | 5.26 | 4.53 | 5.81 | 526.30 | 0.138 | 0.098 | 113.3 |
| Example 3 | 3.87 | 10.00 | 5.28 | 4.54 | 5.83 | 527.90 | 0.138 | 0.097 | 119.8 |
| Example 4 | 3.86 | 10.00 | 5.31 | 4.58 | 5.89 | 531.30 | 0.138 | 0.098 | 109.4 |
| Example 5 | 3.95 | 10.00 | 5.39 | 4.57 | 5.89 | 539.20 | 0.138 | 0.98 | 105.5 |
| Example 6 | 3.88 | 10.00 | 5.37 | 4.52 | 5.89 | 536.5 | 0.138 | 0.98 | 110.1 |
| Example 7 | 3.87 | 10.00 | 5.32 | 4.58 | 5.88 | 531.70 | 0.138 | 0.97 | 104.2 |
| Example 8 | 3.88 | 10.00 | 5.31 | 4.58 | 5.87 | 531.20 | 0.138 | 0.098 | 105.6 |
| Example 9 | 3.89 | 10.00 | 5.29 | 4.57 | 5.88 | 529.30 | 0.138 | 0.097 | 115.3 |
| Comparative Example 1 | 3.87 | 10.00 | 5.22 | 4.49 | 5.76 | 521.60 | 0.138 | 0.098 | 40.3 |
| Comparative Example 2 | 3.87 | 10.00 | 5.24 | 4.50 | 5.78 | 524.20 | 0.138 | 0.098 | 69.5 |
| Comparative Example 3 | 3.87 | 10.00 | 5.38 | 4.45 | 5.73 | 538.00 | 0.139 | 0.097 | 50.0 |

TABLE 2-continued

| Device Example | Volt | J (mA/cm$^2$) | Cd/A | lm/W | QE (%) | Cd/m$^2$ | CIEx | CIEy | T95 (10 mA/cm$^2$) |
|---|---|---|---|---|---|---|---|---|---|
| Comparative Example 4 | 3.88 | 10.00 | 5.16 | 4.43 | 5.70 | 516.10 | 0.139 | 0.097 | 81.5 |
| Comparative Example 5 | 4.17 | 10.00 | 4.63 | 3.99 | 5.20 | 463.40 | 0.139 | 0.097 | 93.7 |

From Table 2, it can be confirmed that the organic light emitting devices of Examples 1 to 9 in which a coating composition including the compound represented by Formula 1 of the present application and the compound represented by Formula 2 of the present application is used exhibit higher efficiency and a longer service life characteristic than Comparative Example 1 which does not include Formulae 1 and 2 of the present application, Comparative Example 2 which does not include Formula 2 of the present application, and Comparative Examples 3 to 5 which do not include Formula 1 of the present application.

The invention claimed is:

1. A coating composition, comprising:

a compound represented by the following Formula 1:

[Formula 1]

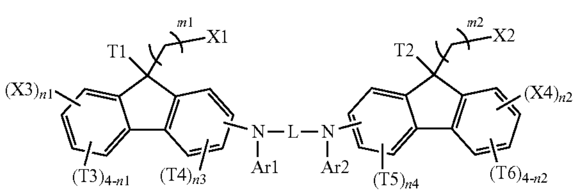

wherein,

L is a substituted or unsubstituted arylene group, or a substituted or unsubstituted heteroarylene group, T1 to T6 are the same as or different from each other, and are each independently hydrogen, deuterium, a halogen group, a substituted or unsubstituted alkyl group, a substituted or unsubstituted alkoxy group, a substituted or unsubstituted cycloalkyl group, a substituted or unsubstituted aryl group, or a substituted or unsubstituted heterocyclic group, Ar1 and Ar2 are the same as or different from each other, and are each independently a substituted or unsubstituted aryl group, or a substituted or unsubstituted heterocyclic group, X1 to X4 are the same as or different from each other, and are each independently a photocurable group or a thermosetting group, n1 and n2 are each independently an integer from 0 to 4, n3 and n4 are each independently an integer from 0 to 3, when n1 to n4 are each 2 or more, each X3, X4, T3, T4, T5, and T6 in the parenthesis of formula 1 are the same as or different from each other, and m1 and m2 are each an integer from 0 to 12; and any one of the following compounds:

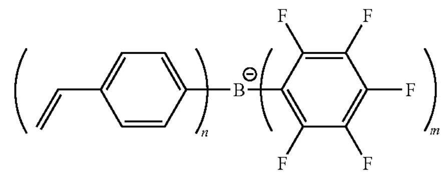

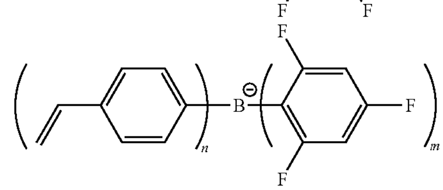

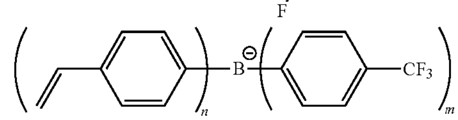

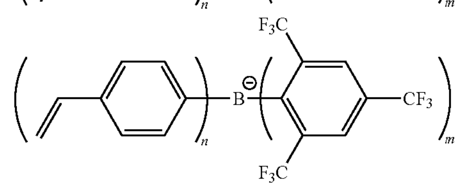

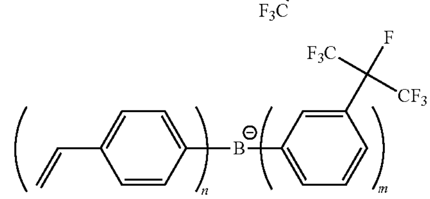

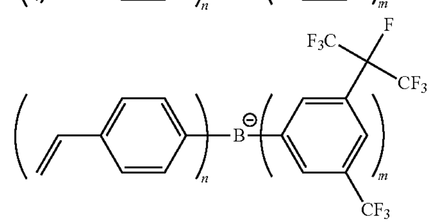

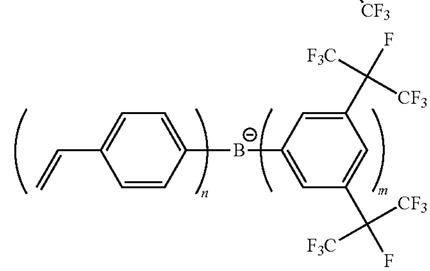

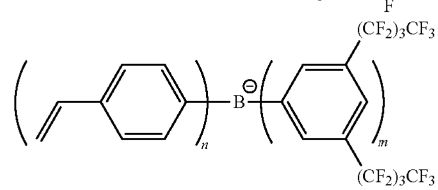

-continued
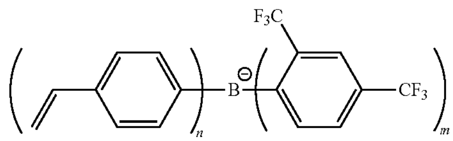
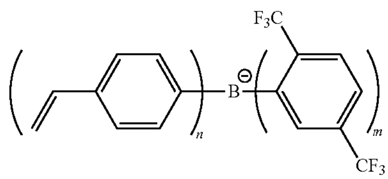
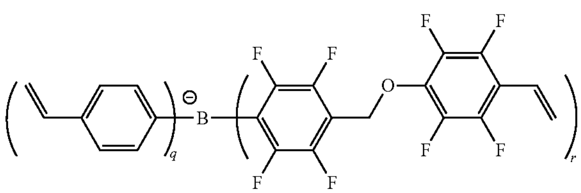
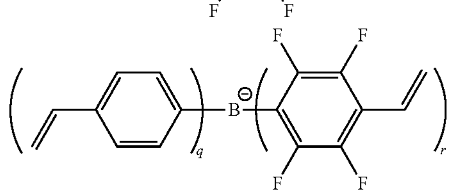
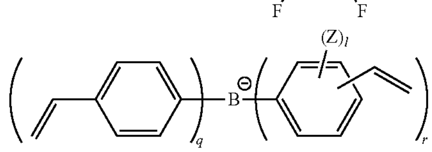
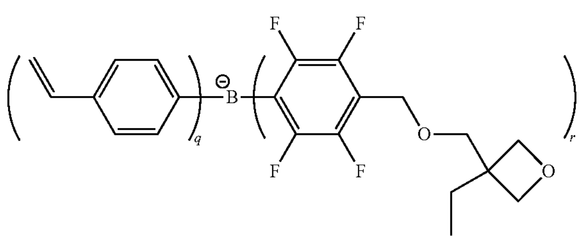
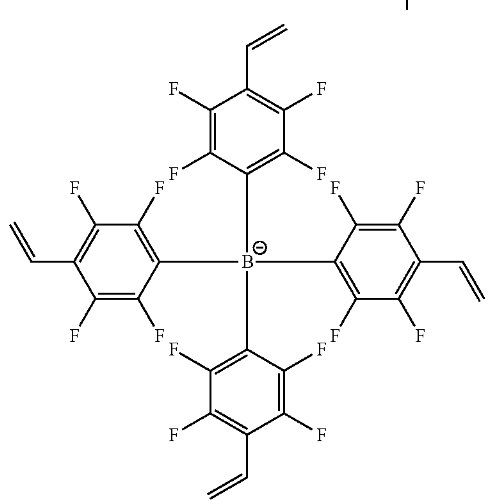
-continued
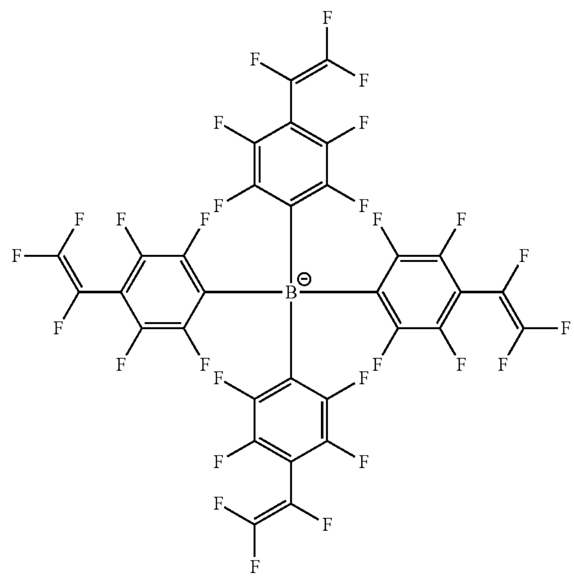
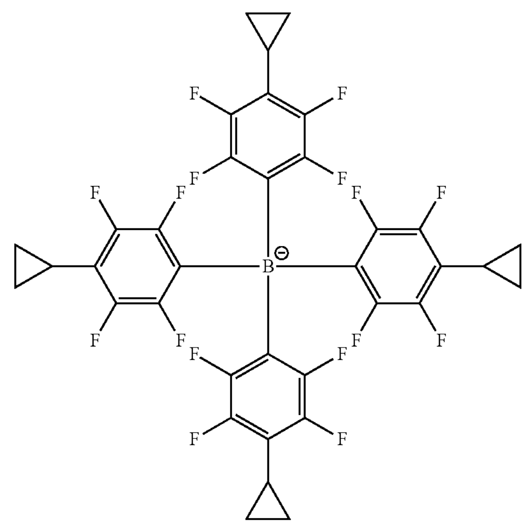
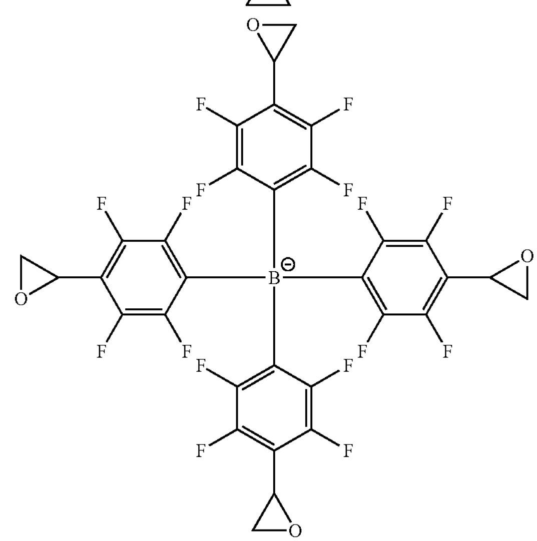

-continued
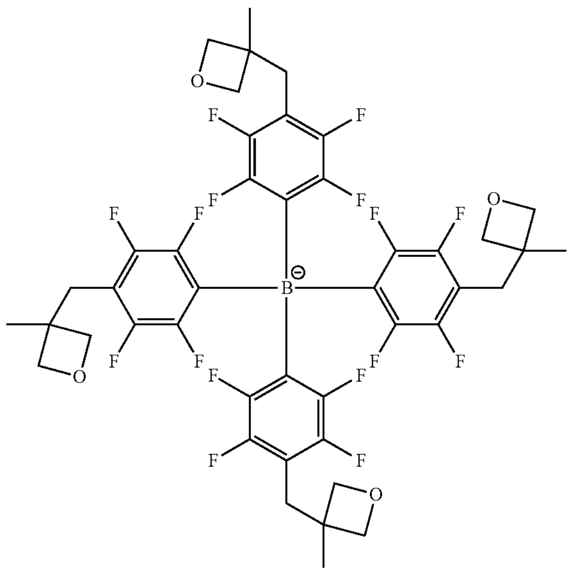
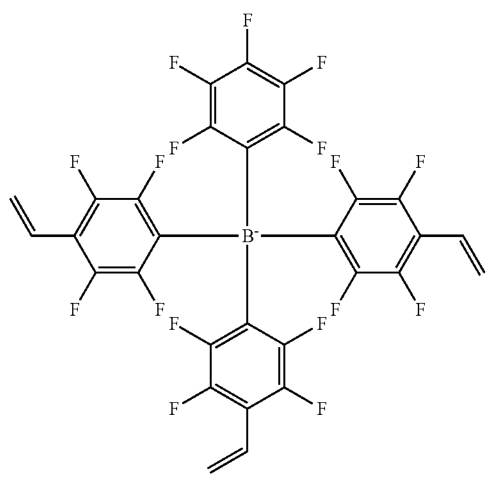
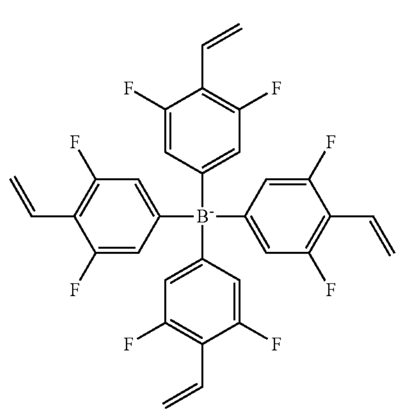
-continued
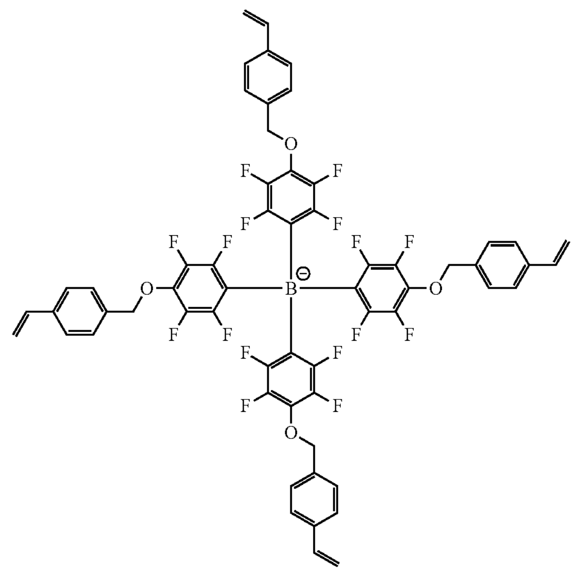
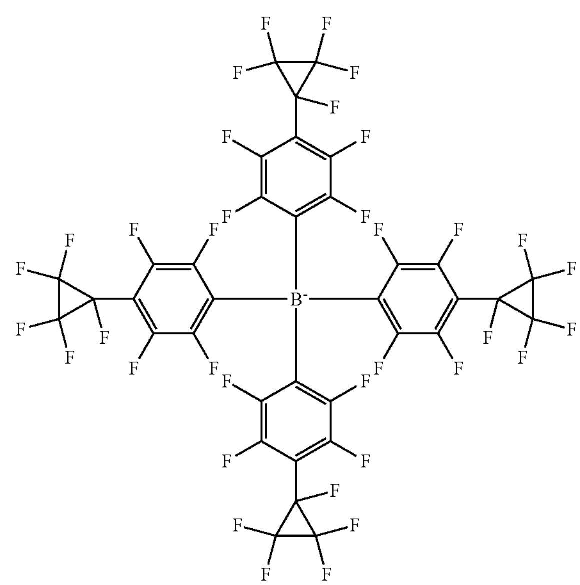
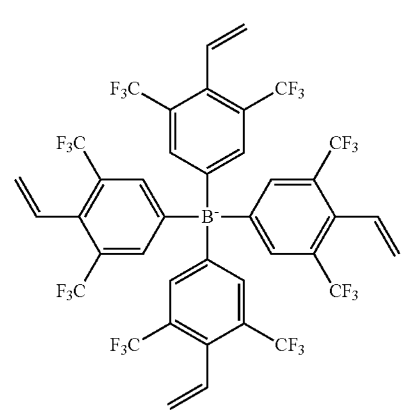

-continued

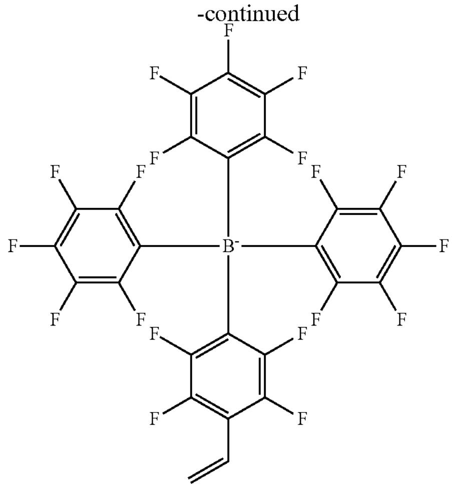

wherein, n is an integer from 1 to 3, m is an integer from 1 to 3, m+n=4, r is an integer from 1 to 4, q is an integer from 0 to 3, and q+r=4, Z is deuterium, a halogen group, a nitro group, a cyano group, an amino group, —C(O)$R_{100}$, —O$R_{101}$, —S$R_{102}$; —$SO_3R_{103}$, —COO$R_{104}$, —OC(O)$R_{105}$, —C(O)N$R_{106}R_{107}$, a substituted or unsubstituted alkyl group, a substituted or unsubstituted alkenyl group, a substituted or unsubstituted alkynyl group, a substituted or unsubstituted amine group, a substituted or unsubstituted aryl group, or a substituted or unsubstituted heterocyclic group, l is an integer from 1 to 4, and when l is 2 or more, each Z are the same as or different from each other, and $R_{100}$ to $R_{107}$ are the same as or different from each other, and are each independently hydrogen, deuterium, or a substituted or unsubstituted alkyl group.

2. The coating composition of claim 1, wherein the photocurable group or the thermosetting group is any one selected from the following:

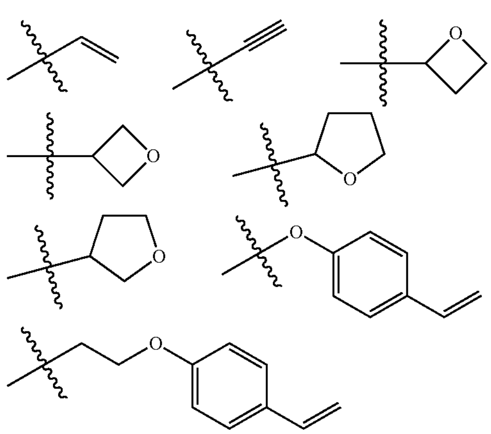

-continued

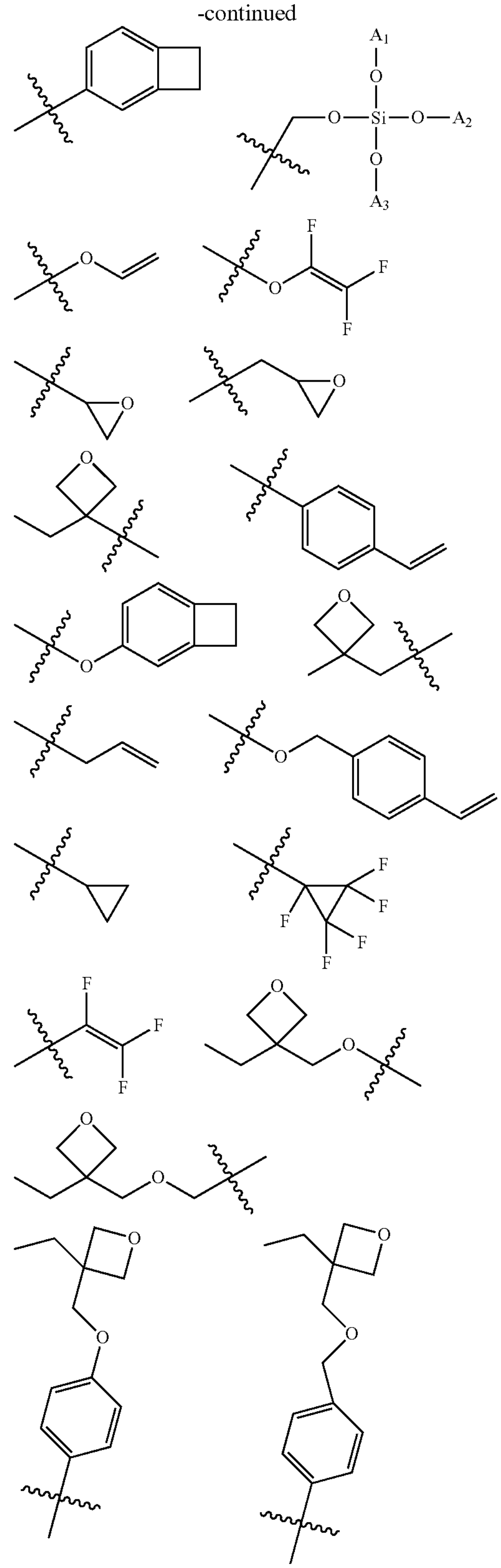

wherein, $A_1$ to $A_3$ are the same as or different from each other, and are each independently a substituted or unsubstituted alkyl group having 1 to 6 carbon atoms.

3. The coating composition of claim 1, wherein T1 and T2 are the same as or different from each other, and are each independently a substituted or unsubstituted aryl group having 6 to 60 carbon atoms.

4. The coating composition of claim 1, further comprising:

a cationic group, wherein the cationic group is selected from a monovalent cationic group, an onium compound, or the following structural formulae:

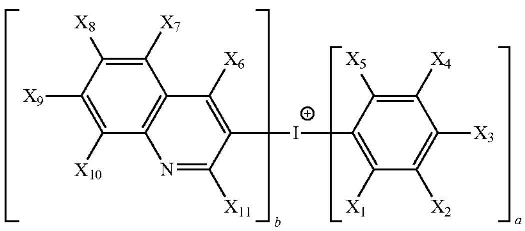

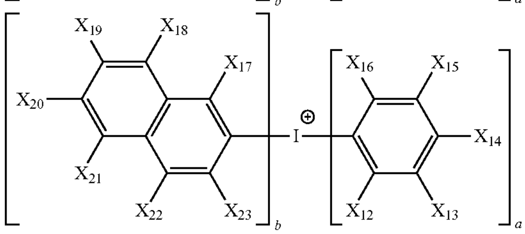

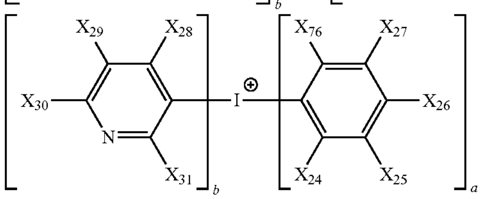

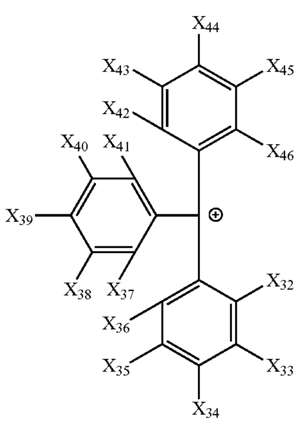

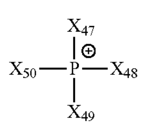

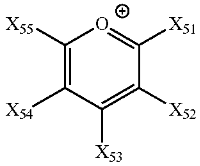

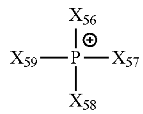

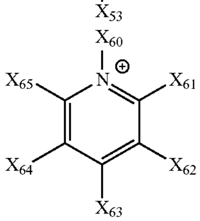

-continued

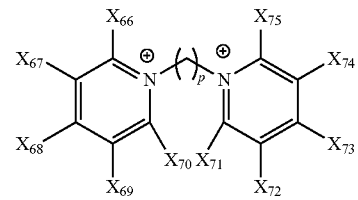

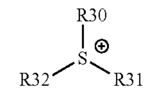

wherein, $X_1$ to $X_{76}$ are the same as or different from each other, and are each independently hydrogen, a cyano group, a nitro group, a hydroxyl group, a halogen group, —$COOR_{201}$, a substituted or unsubstituted alkyl group, a substituted or unsubstituted alkenyl group, a substituted or unsubstituted alkoxy group, a substituted or unsubstituted aryloxy group, a substituted or unsubstituted amine group, a substituted or unsubstituted cycloalkyl group, a substituted or unsubstituted fluoroalkyl group, or a substituted or unsubstituted aryl group, or a photocurable group or a thermosetting group, $R_{201}$ is hydrogen, deuterium, or a substituted or unsubstituted alkyl group, R30 to R32 are the same as or different from each other, and are each independently a substituted or unsubstituted alkyl group' a substituted or unsubstituted alkenyl group' a substituted or unsubstituted alkynyl group' a substituted or unsubstituted cycloalkyl group' a substituted or unsubstituted aryl group' or a substituted or unsubstituted heterocyclic group, or adjacent groups are bonded to each other to form a ring, p is an integer from 0 to 10, a is 1 or 2, b is 0 or 1, and a+b=2.

5. The coating composition of claim 1, wherein Formula 1 is represented by the following Formula 1-1:

[Formula 1-1]

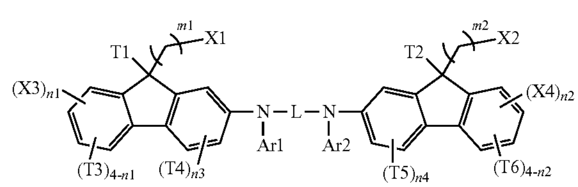

in Formula 1-1,

T1 to T6, X1 to X4, L, Ar1, Ar2, n1 to n4, m1, and m2 are the same as those in Formula 1.

6. The coating composition of claim 1, wherein Formula 1 is any one of the following compounds:

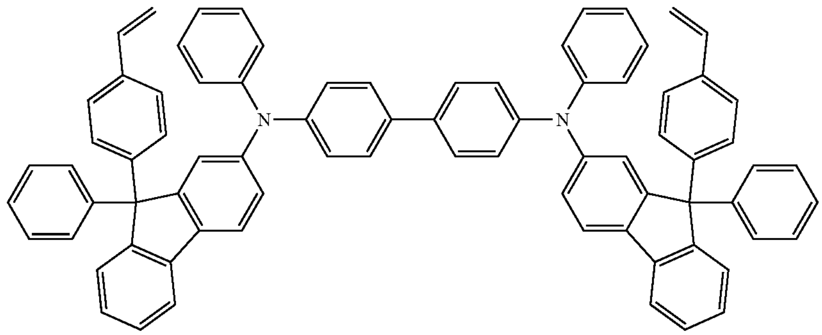
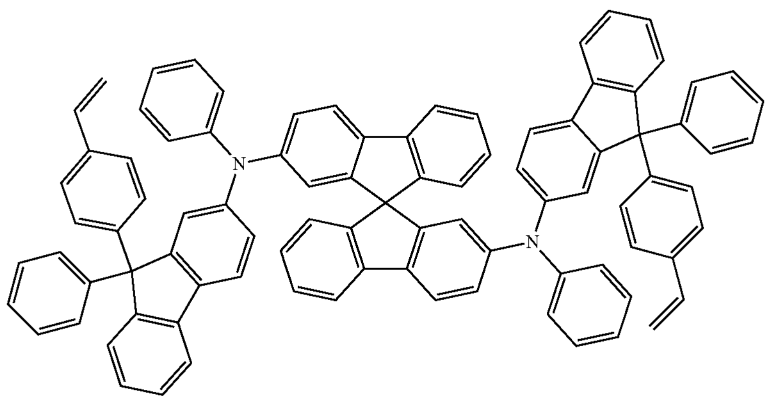
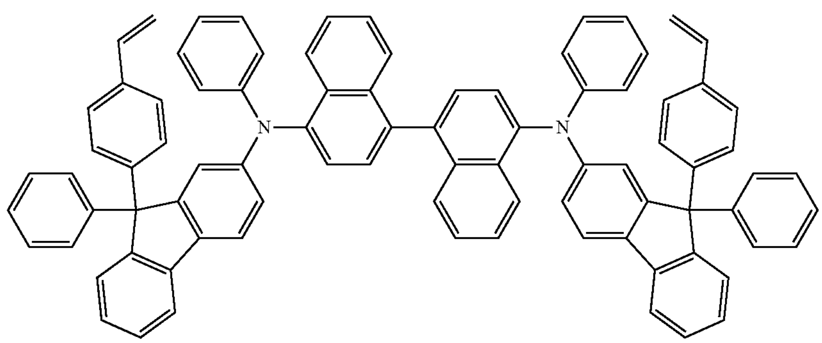
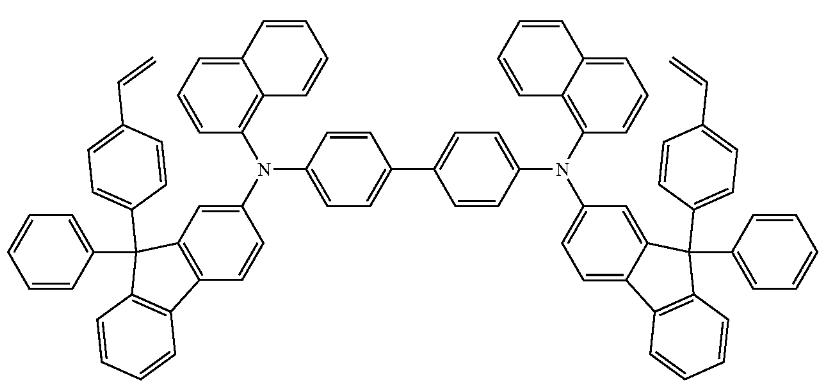

-continued
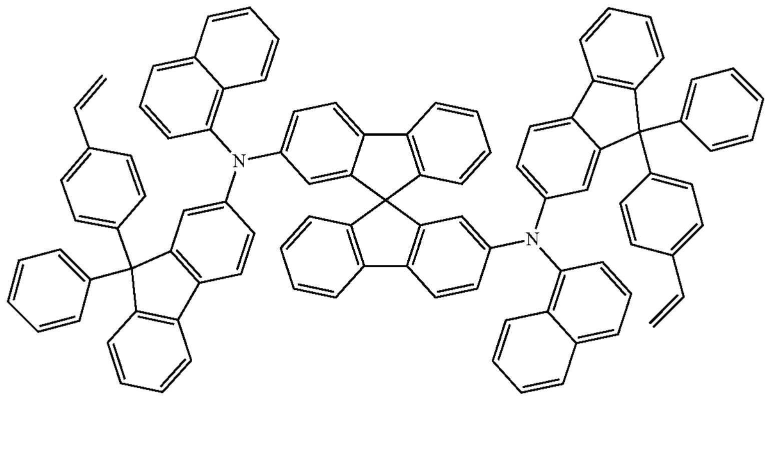
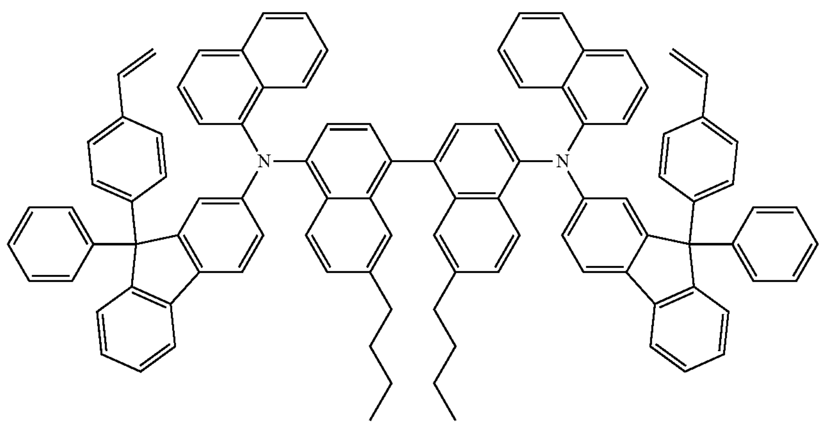
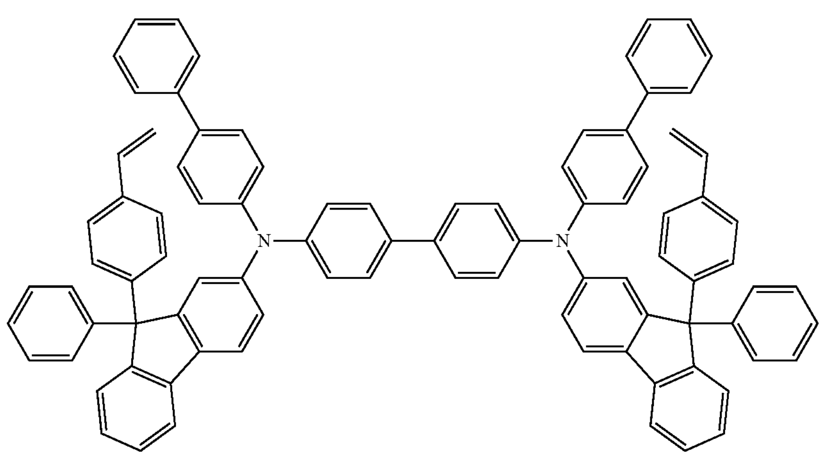

-continued
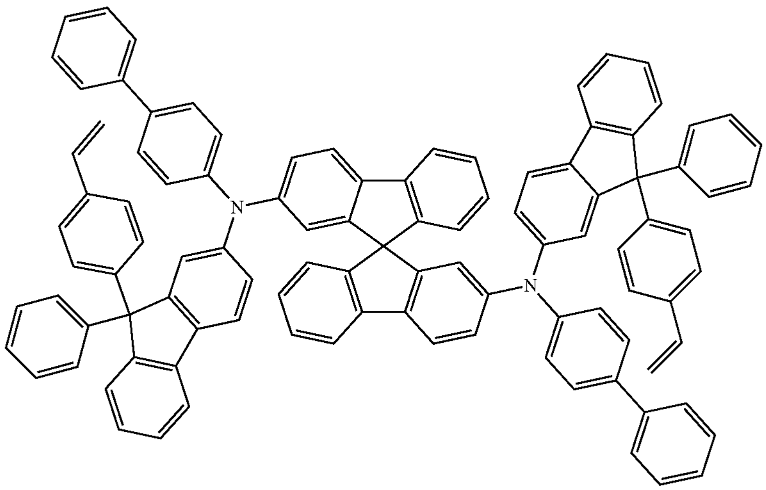
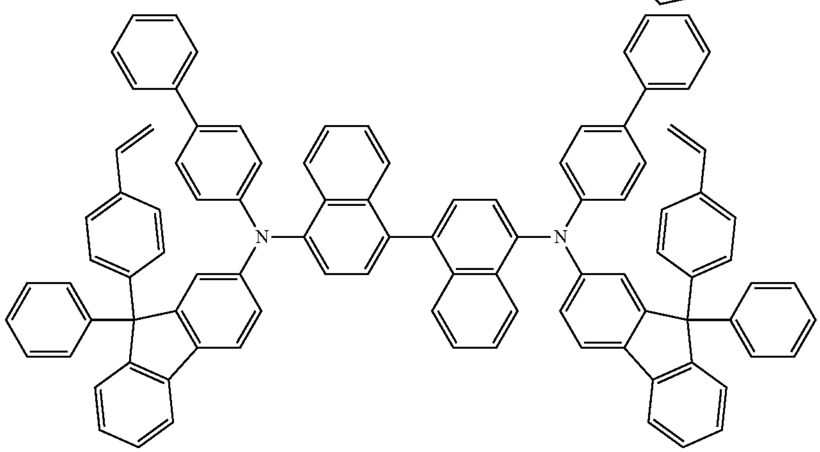
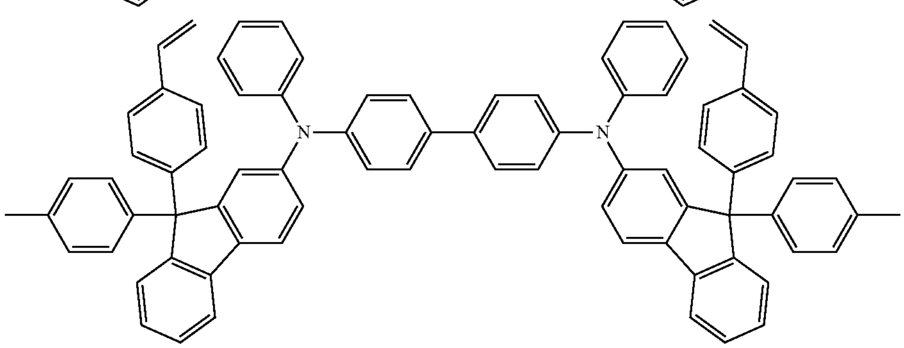
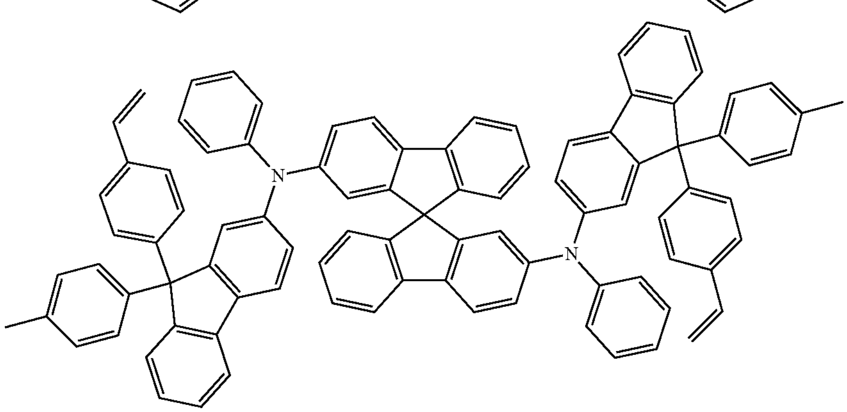

-continued
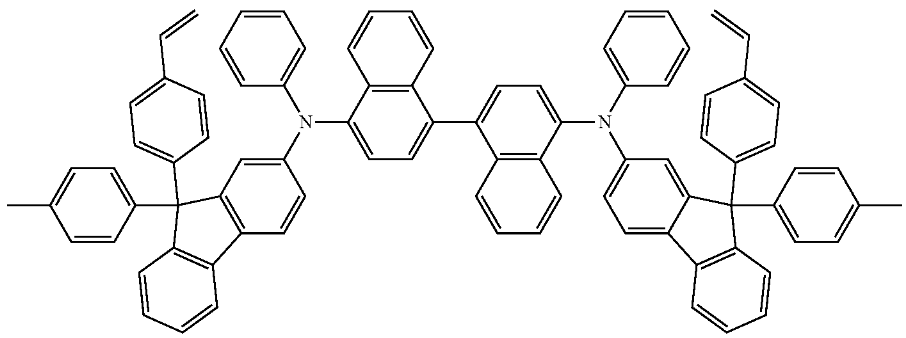
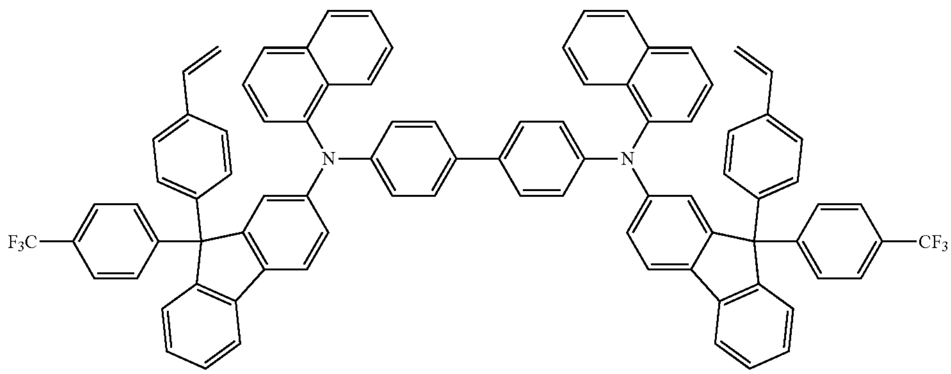
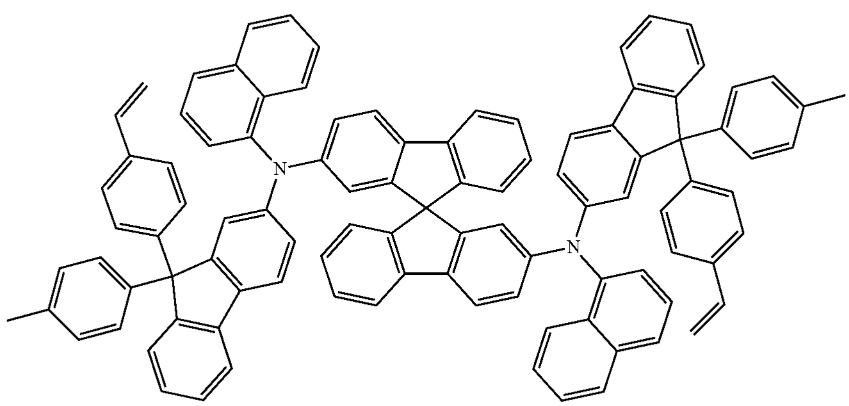
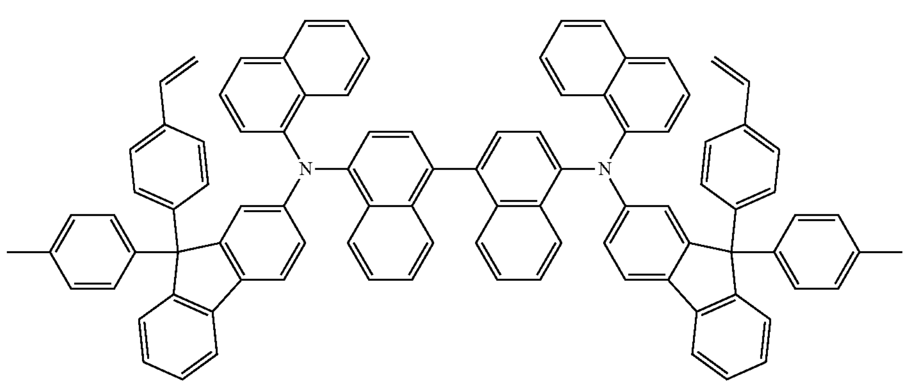

-continued
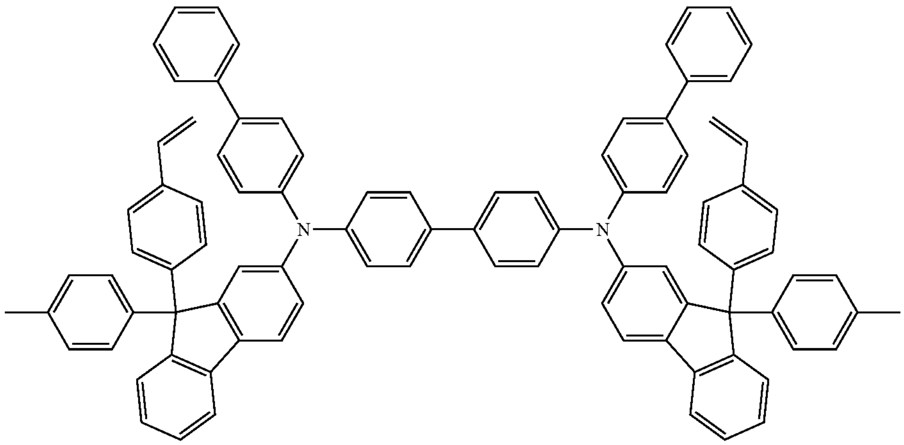
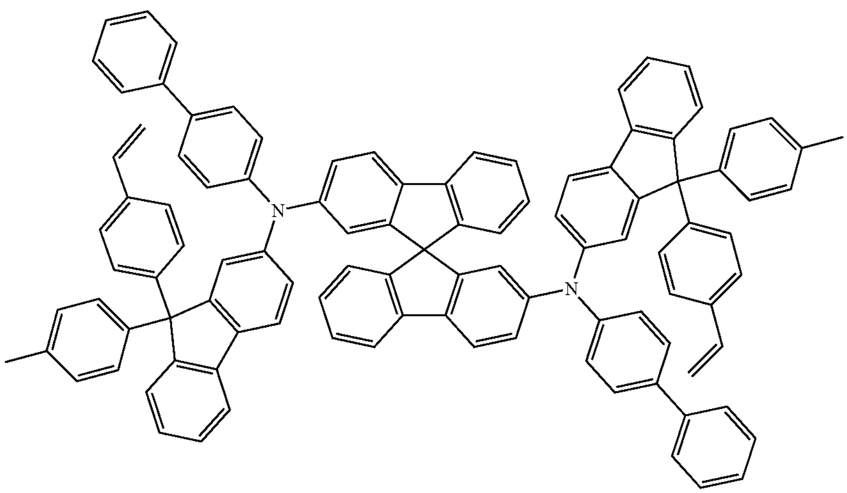
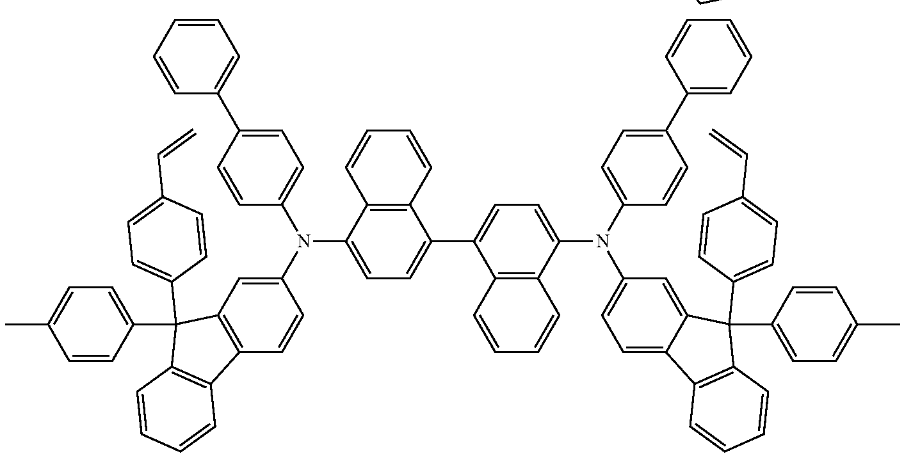
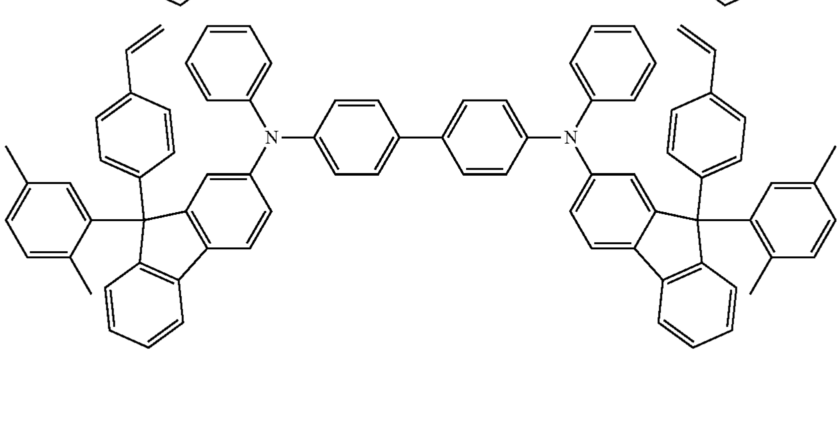

-continued
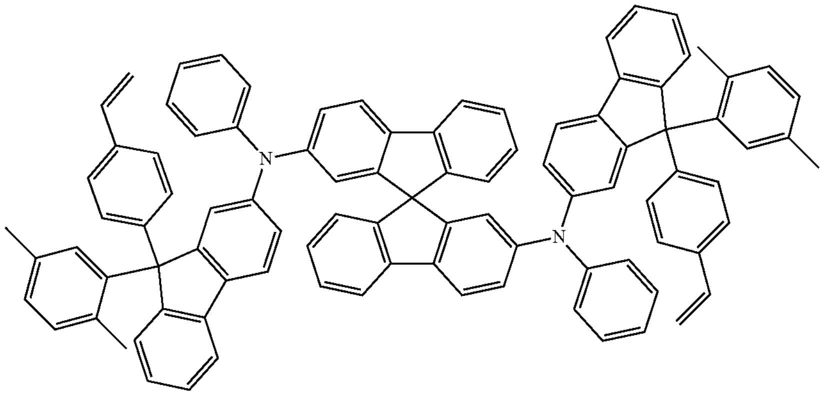
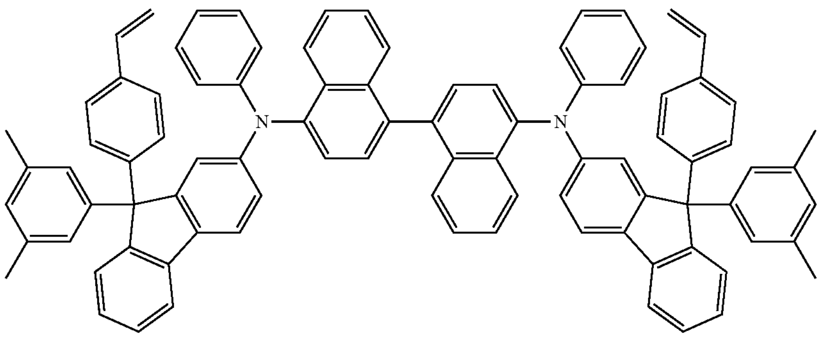
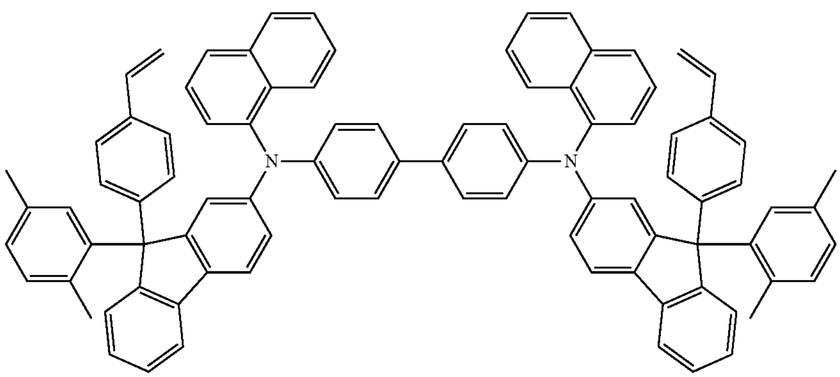
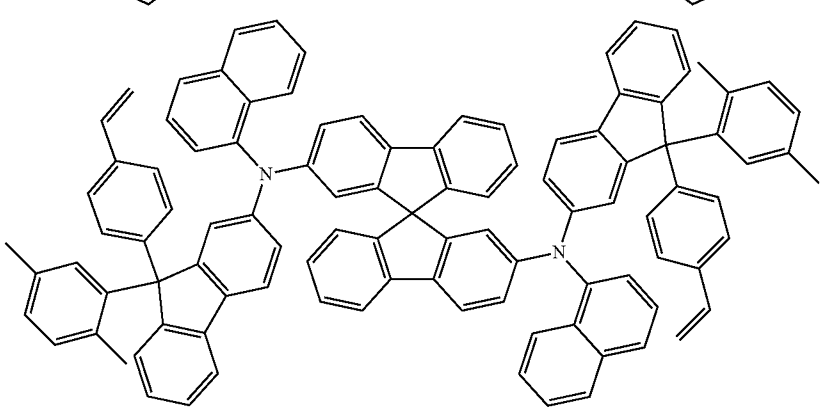

-continued
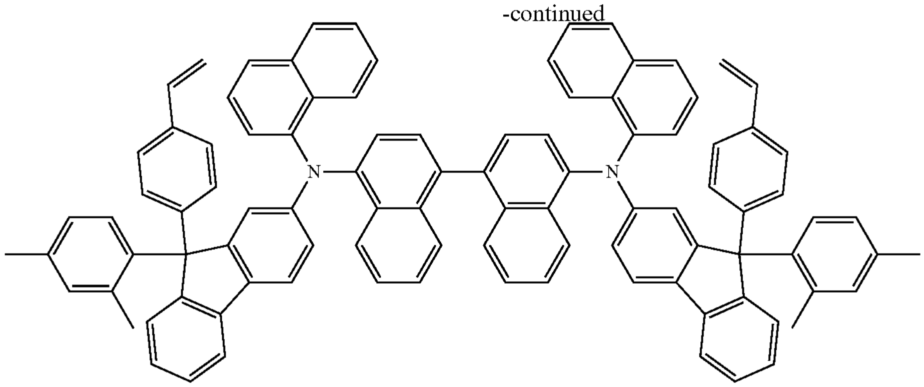
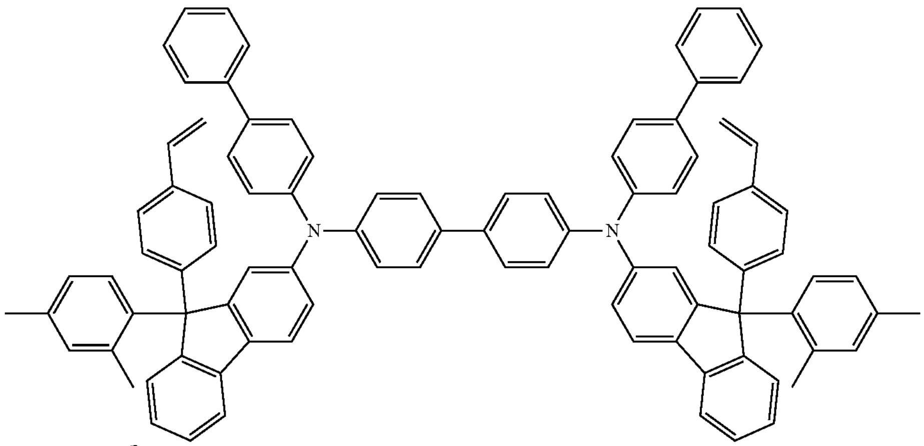
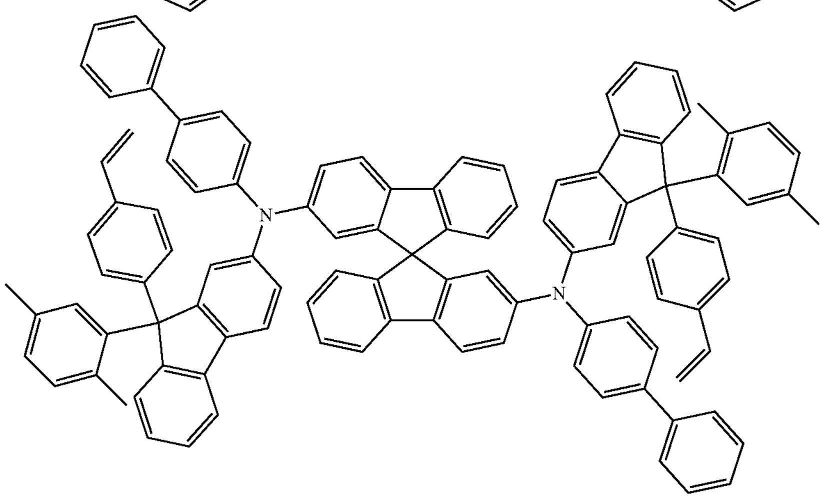
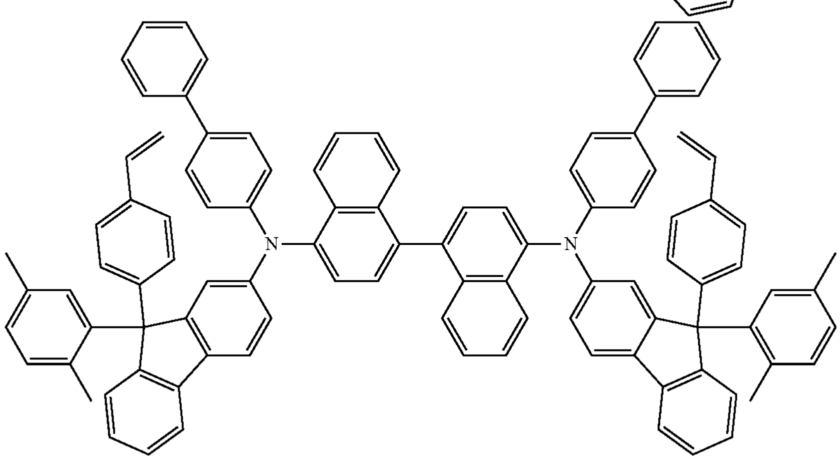

-continued
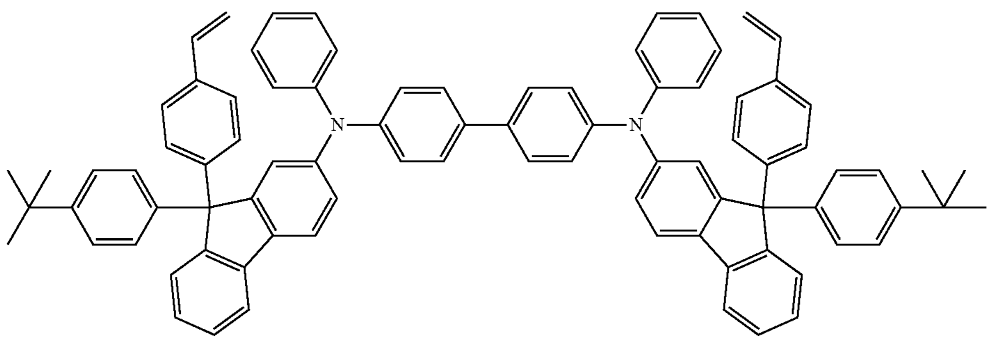
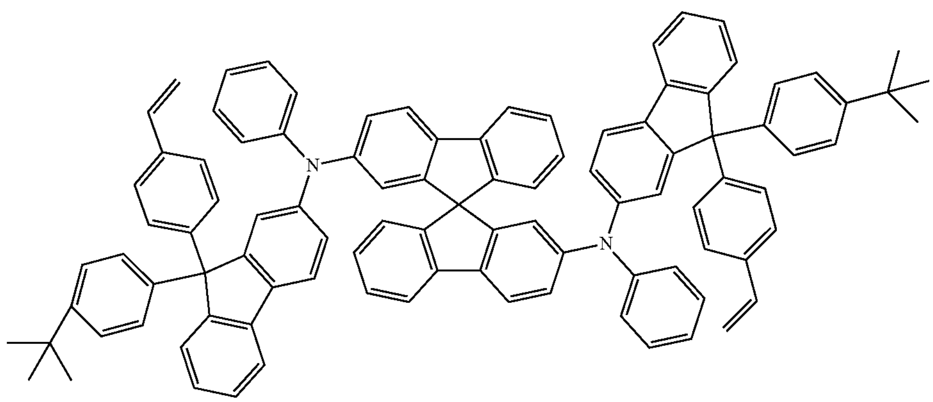
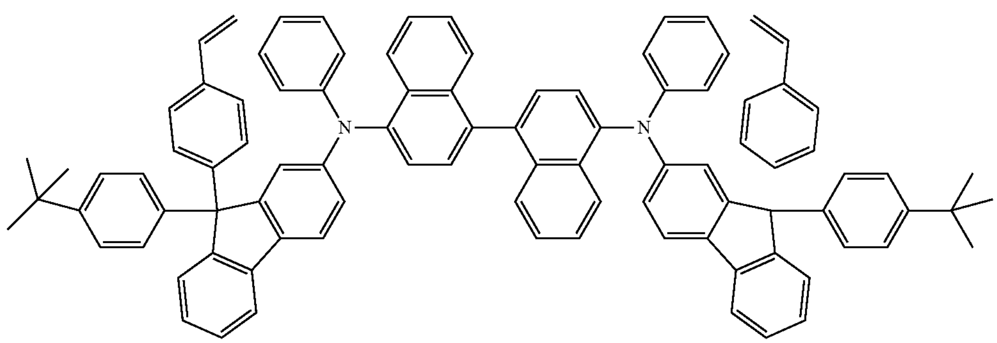
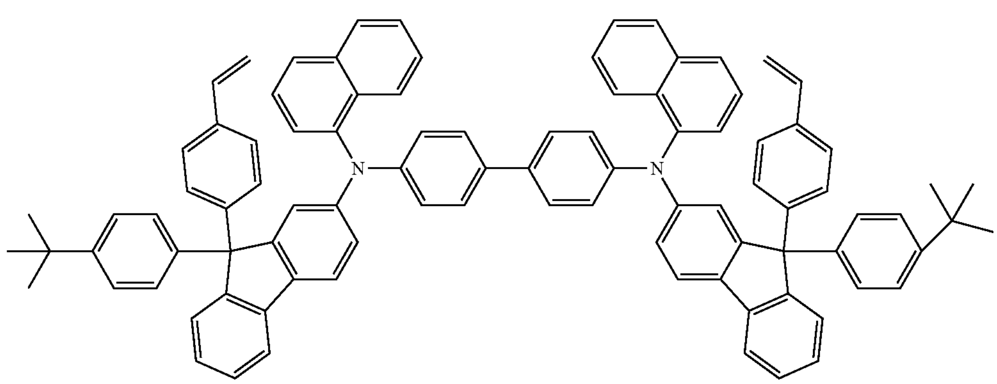

-continued
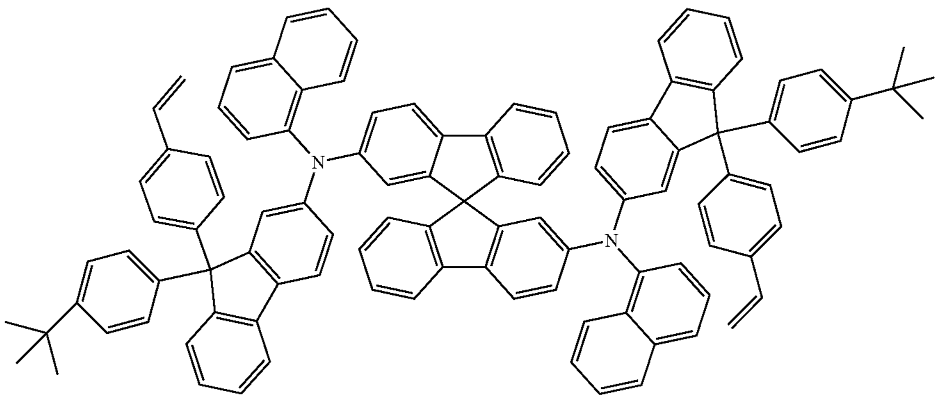
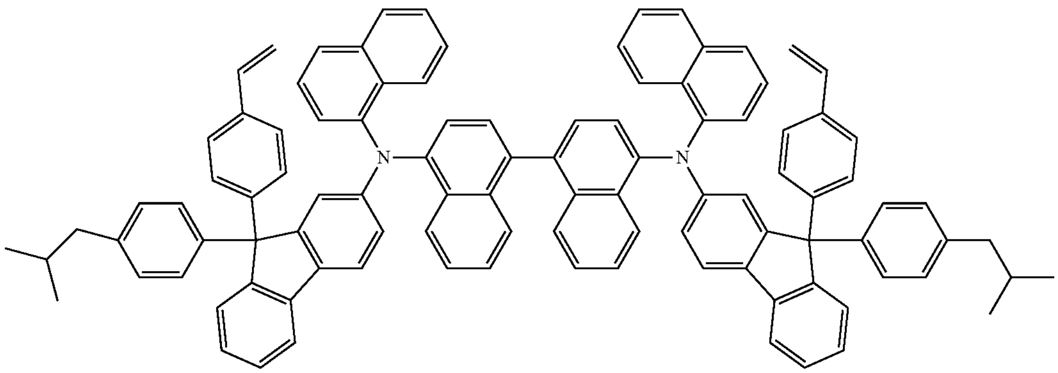
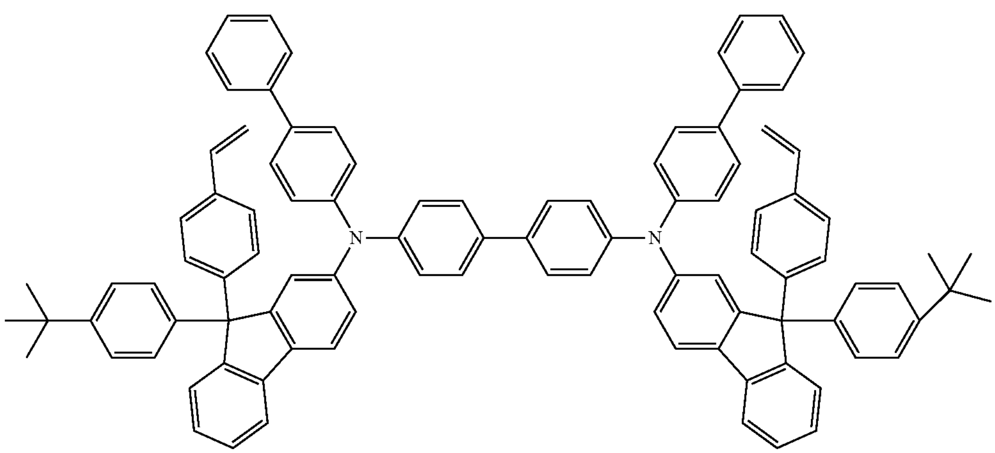
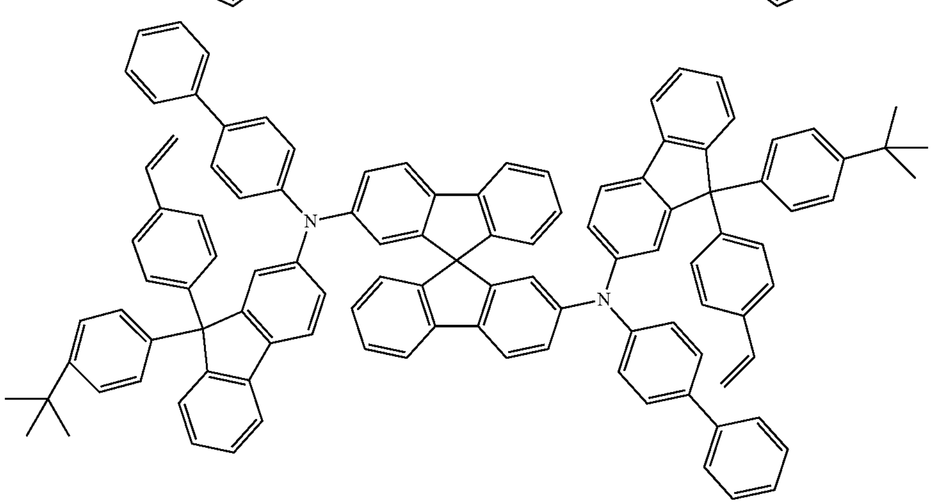

-continued
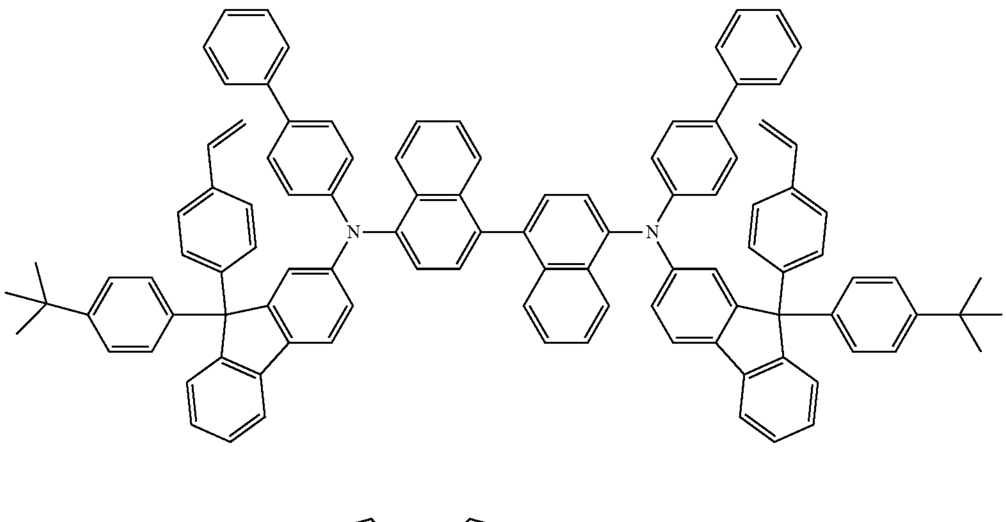
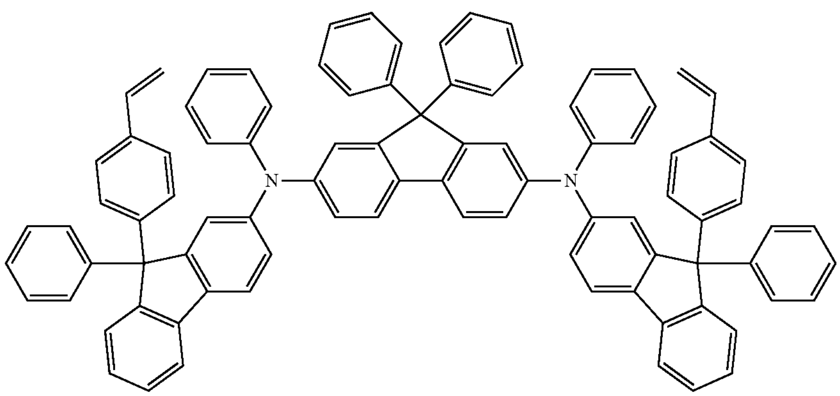
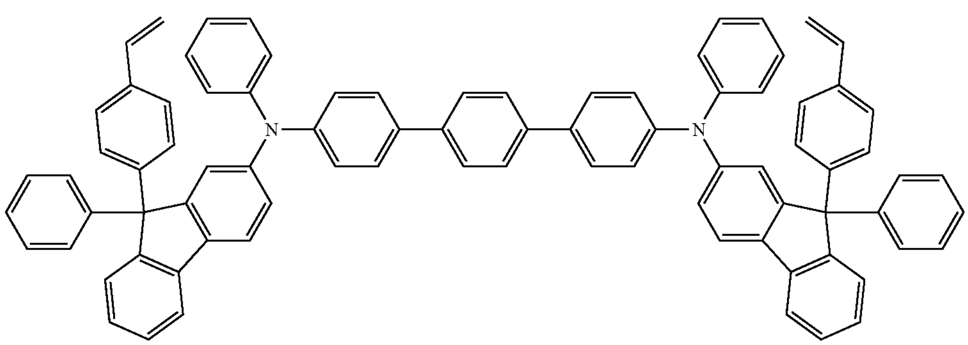
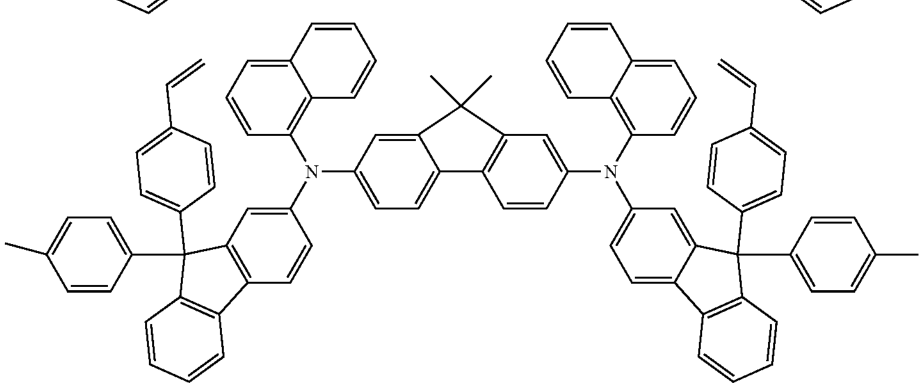

-continued
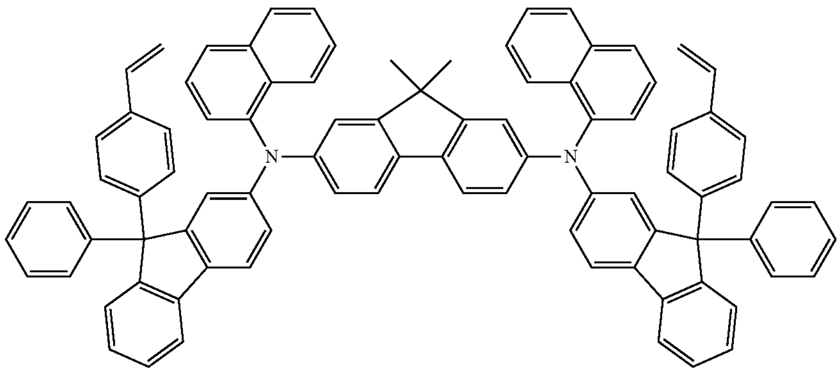
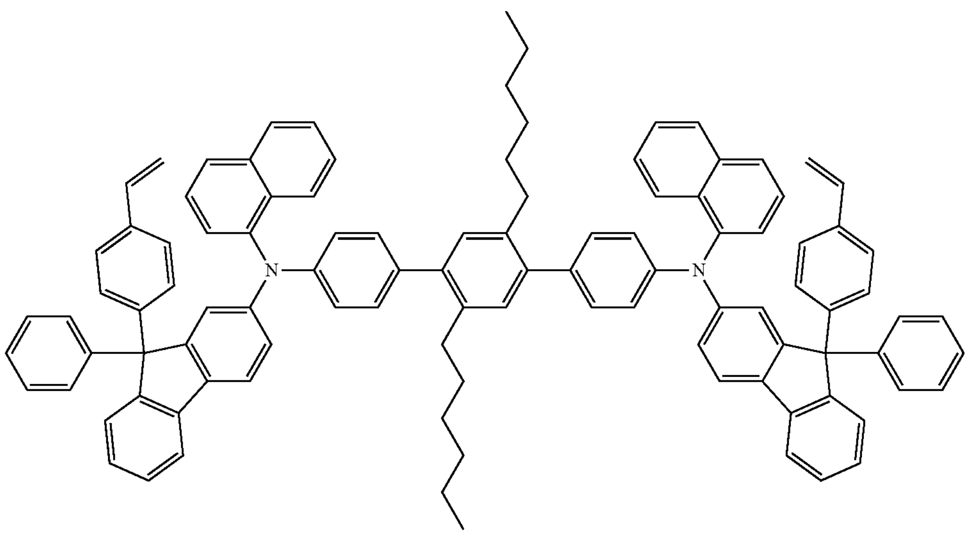
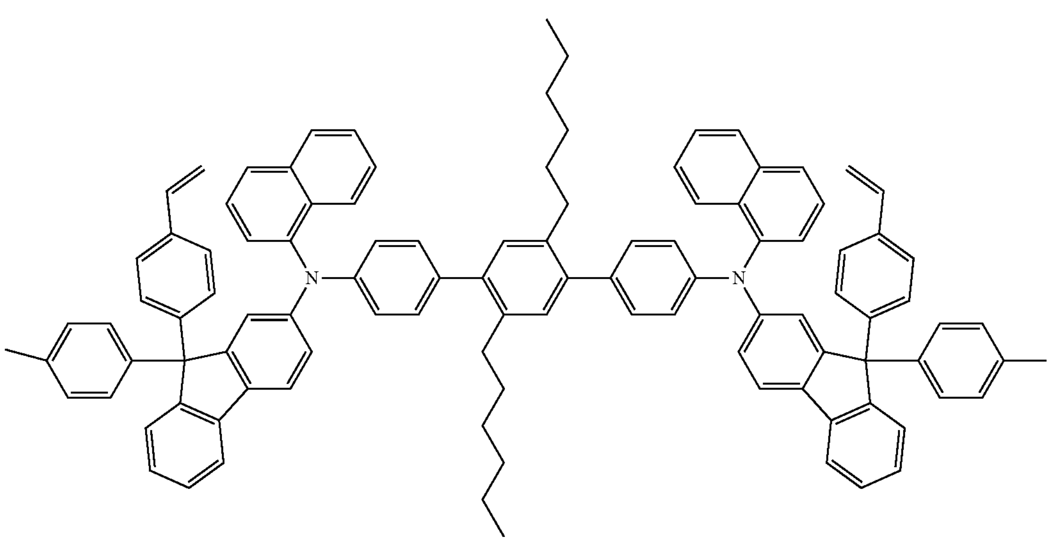

-continued
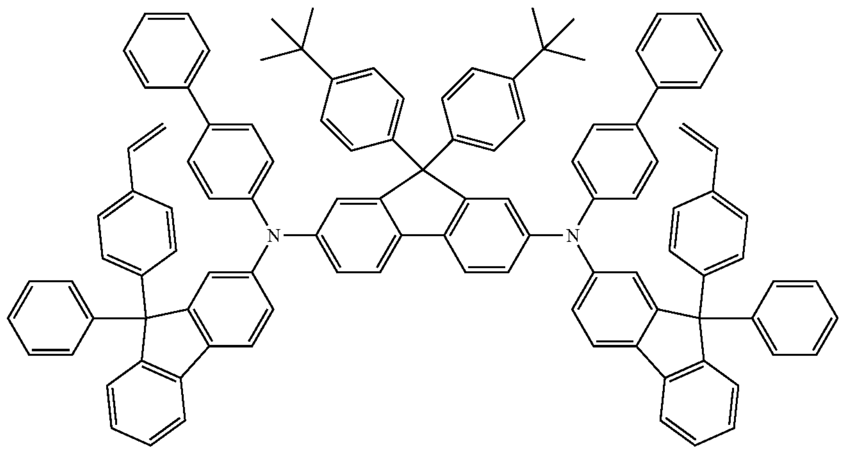
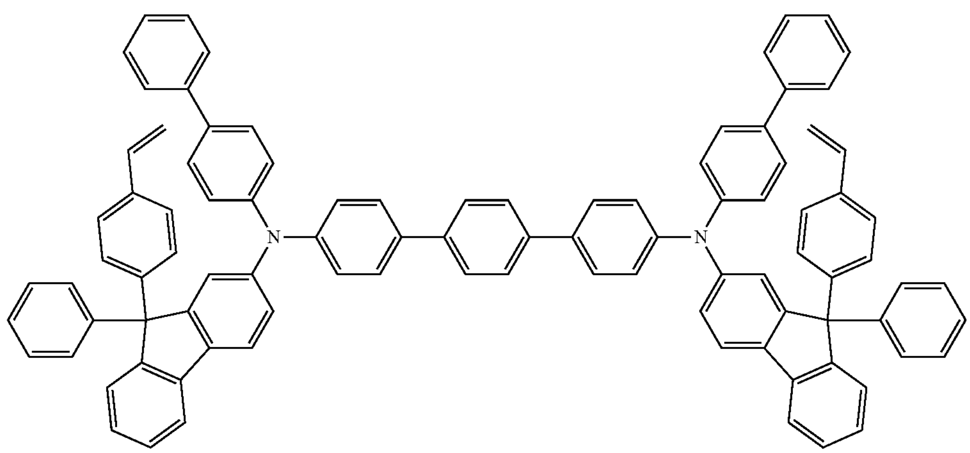
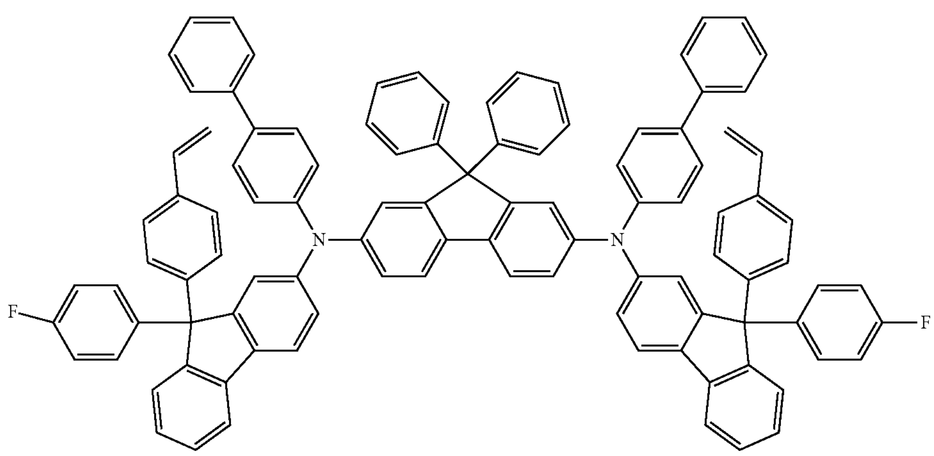

-continued
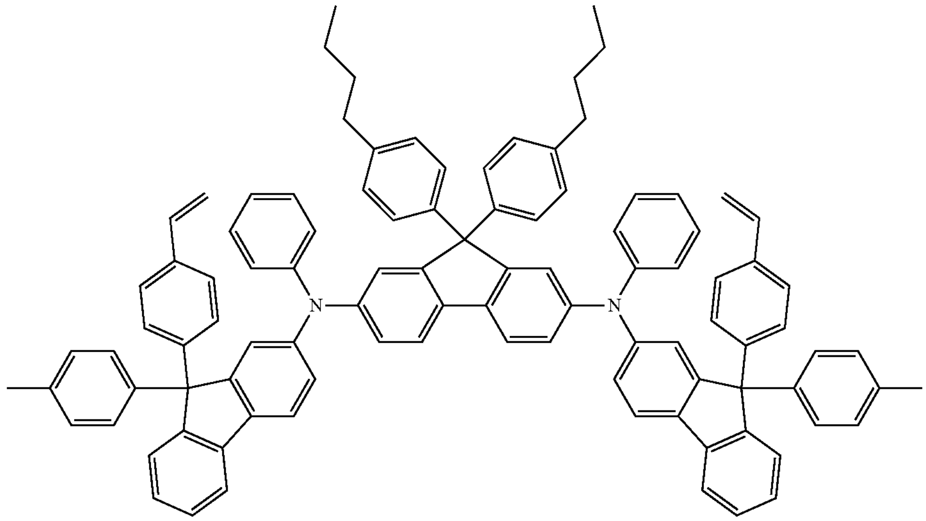
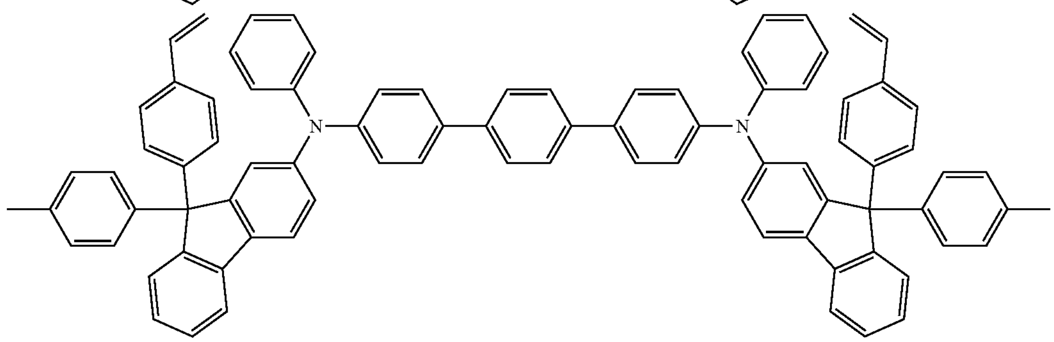
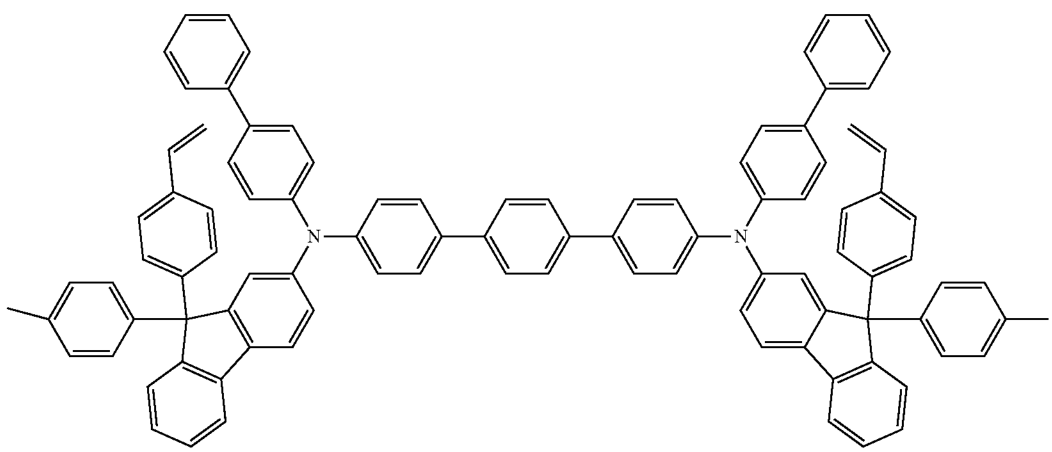
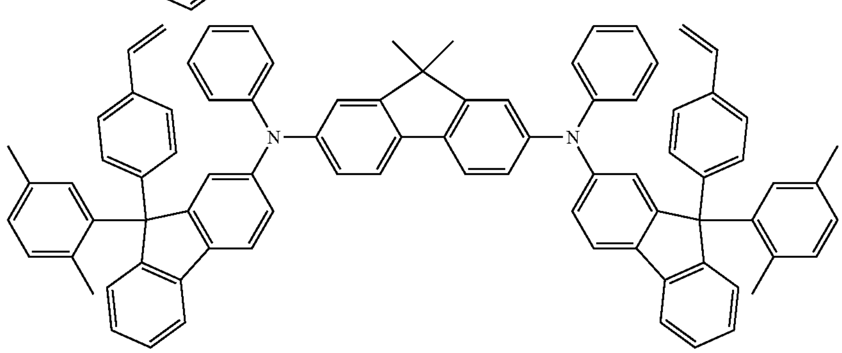

-continued
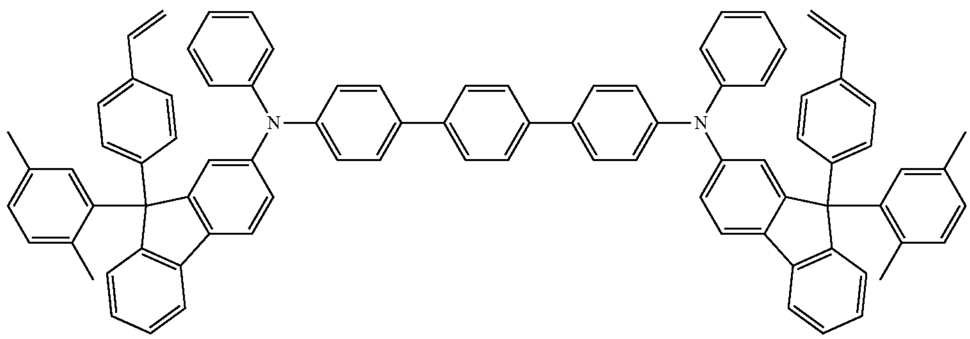
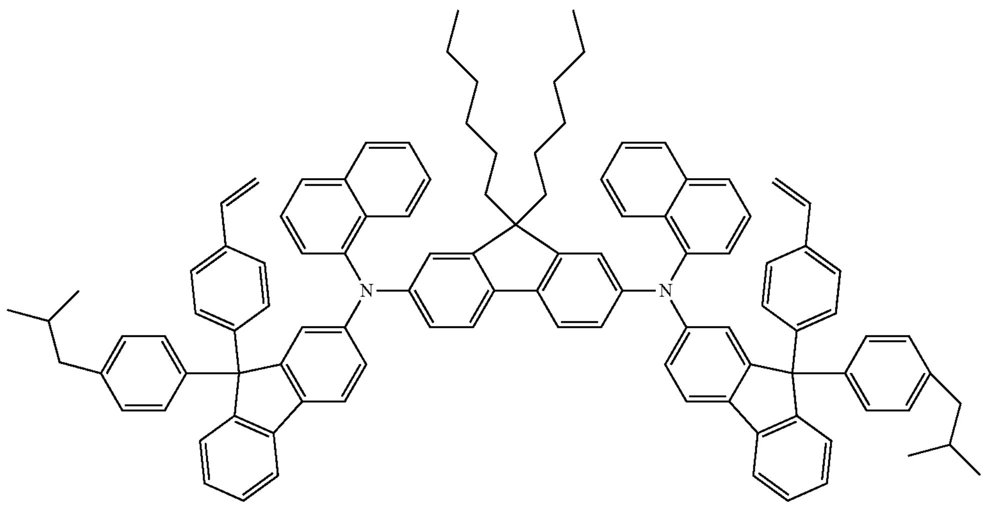
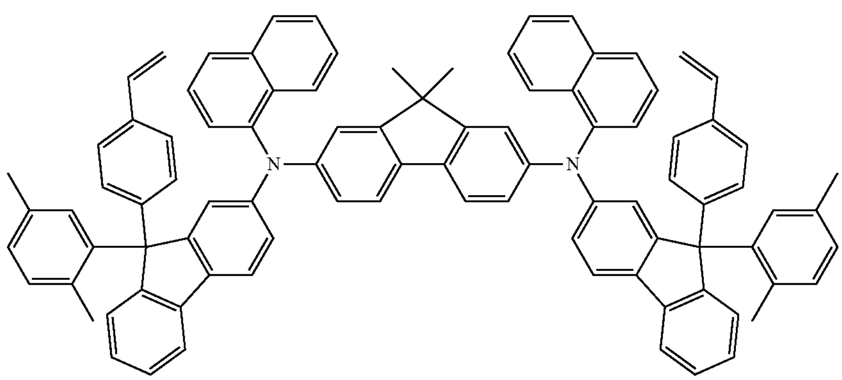
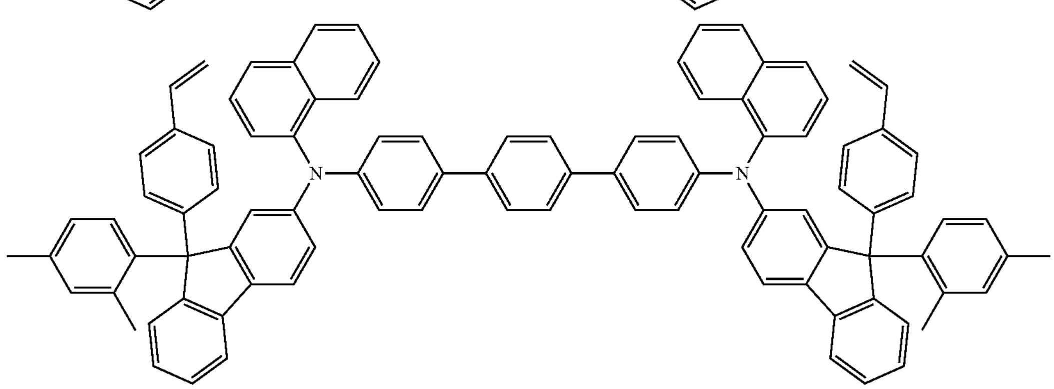

-continued
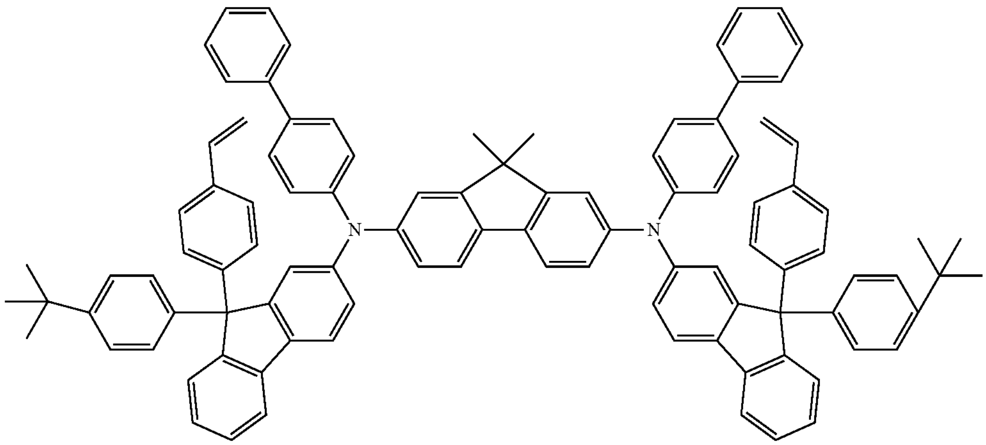
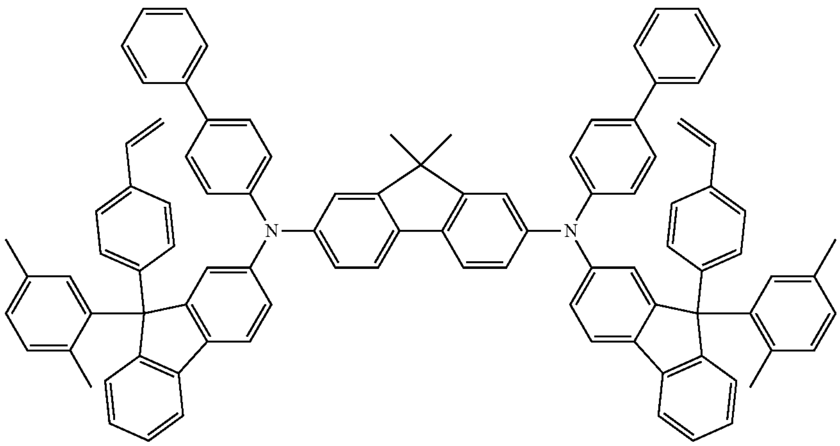
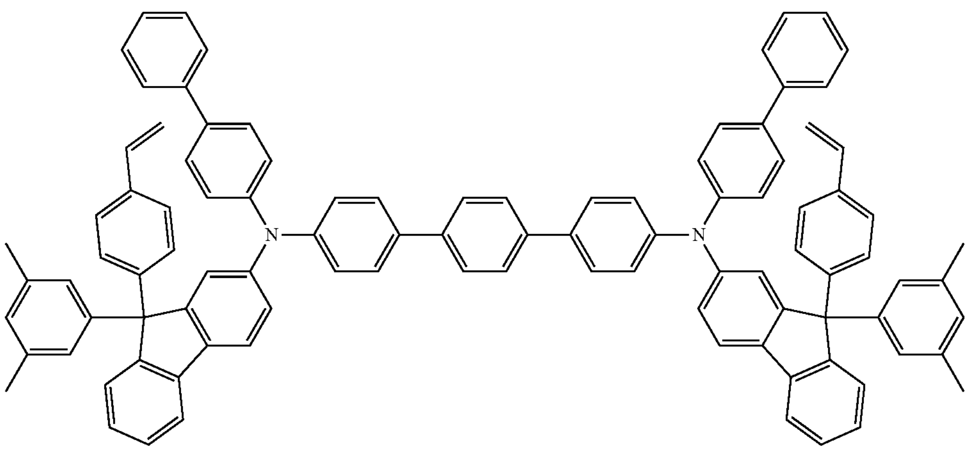
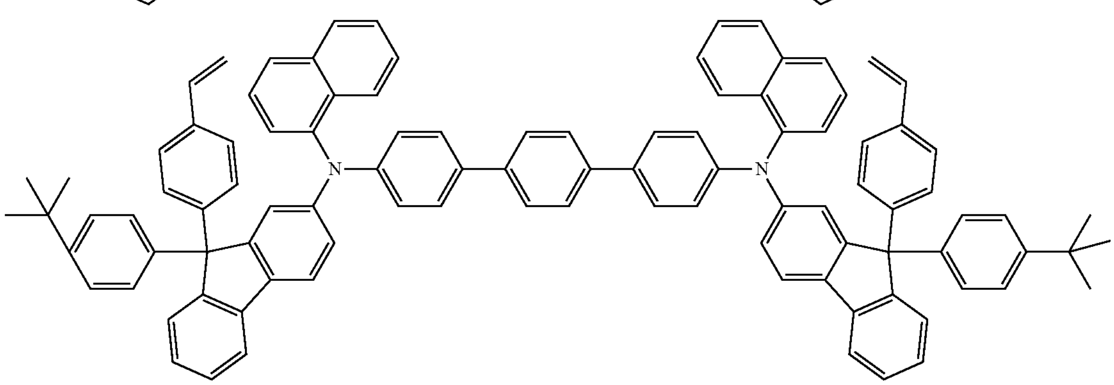

-continued
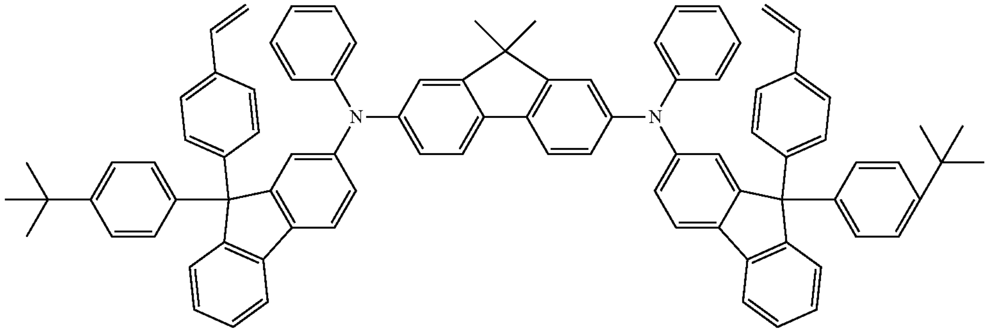
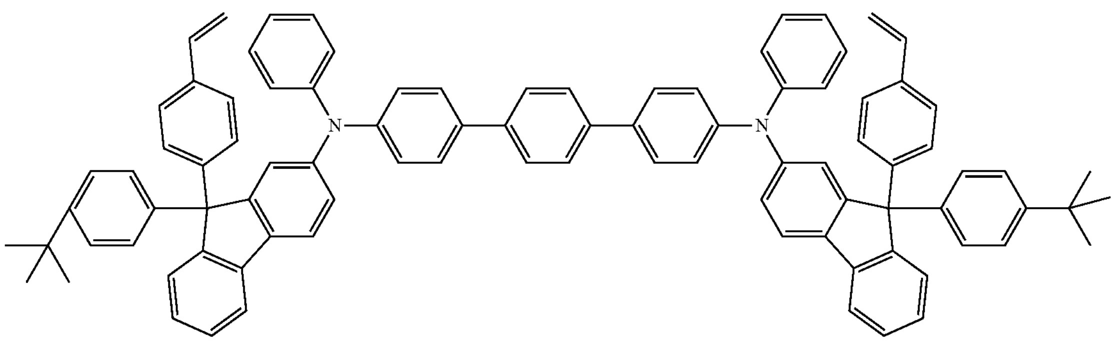
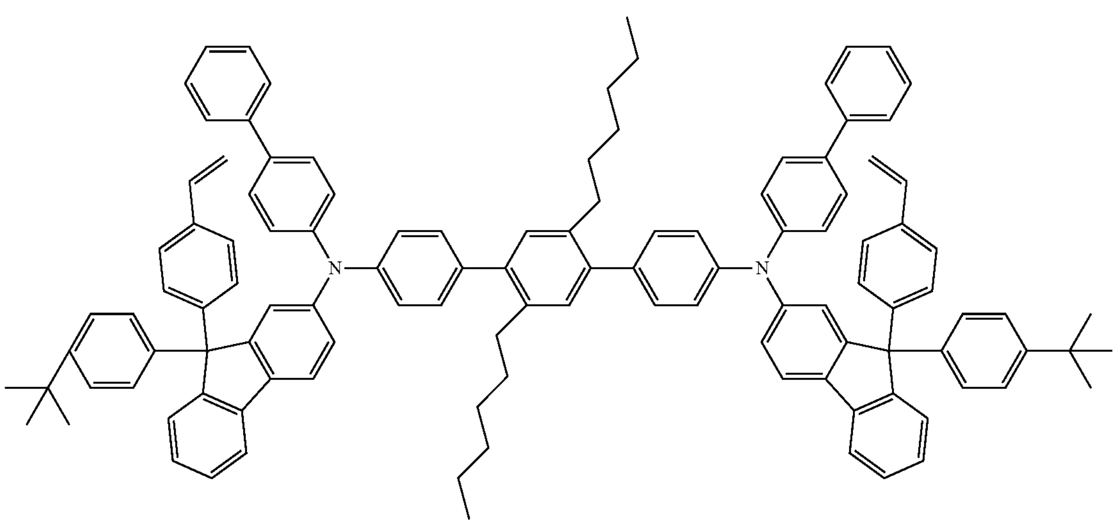
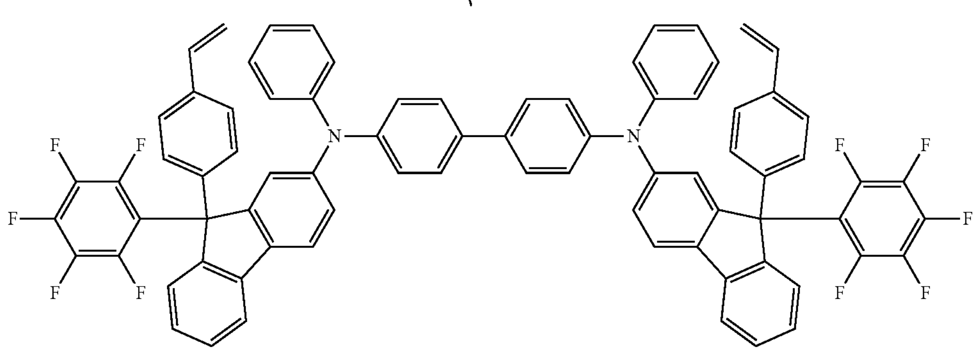

-continued
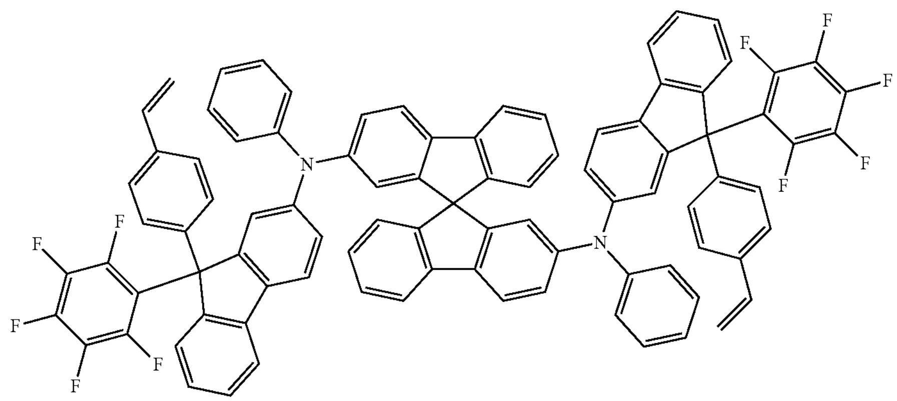
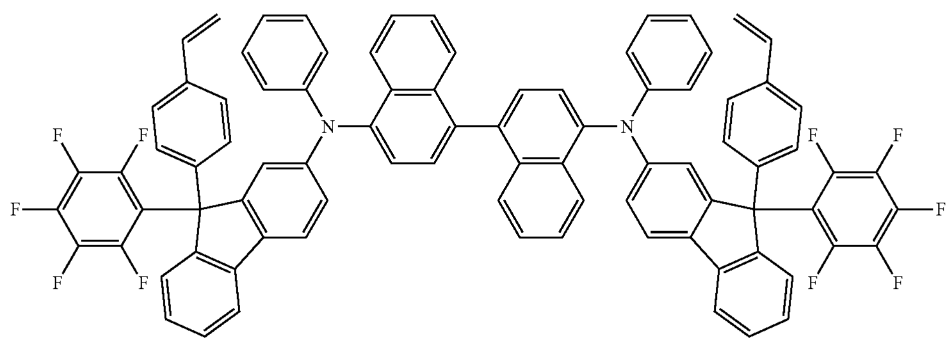
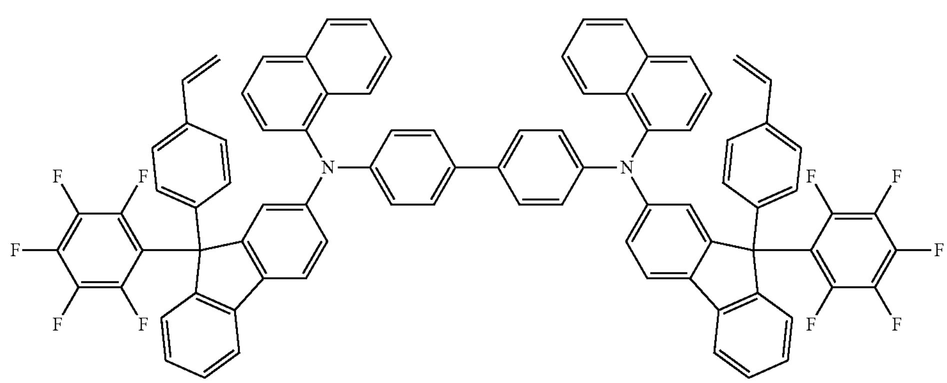
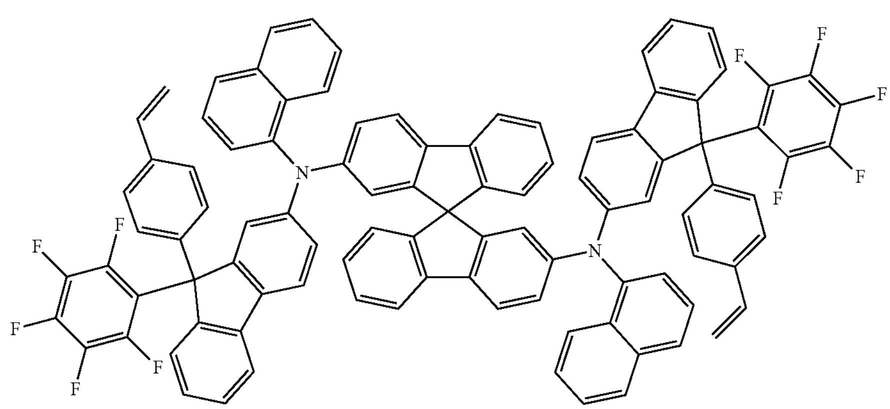

-continued
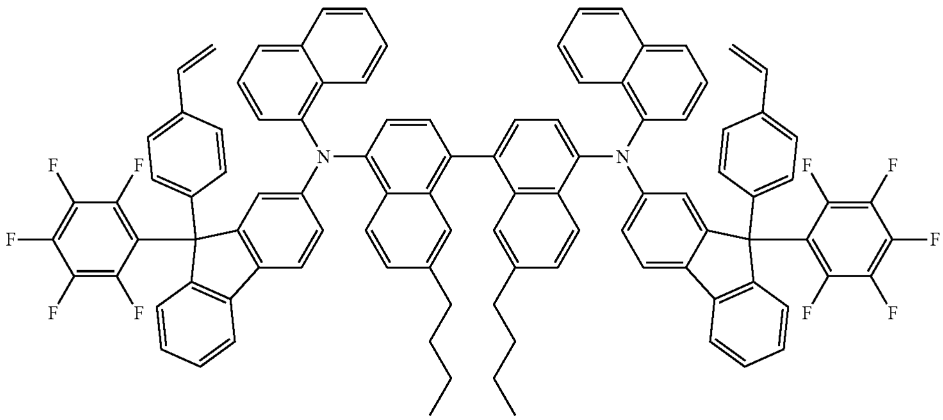
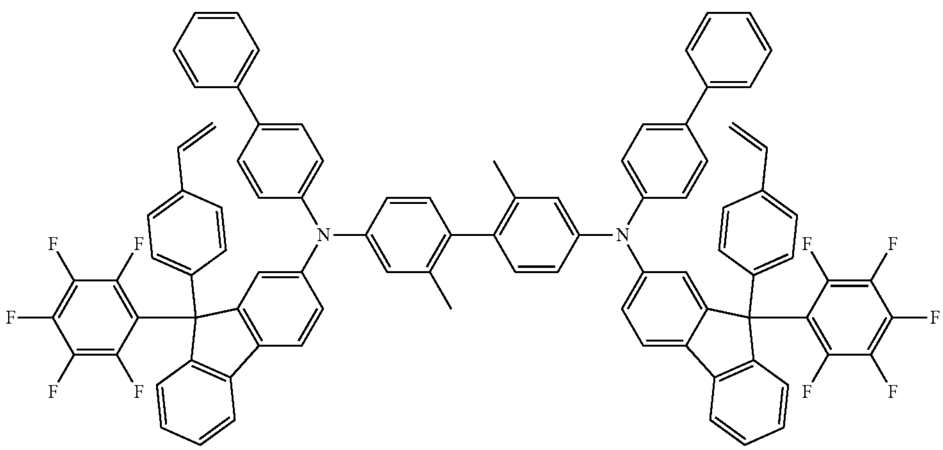
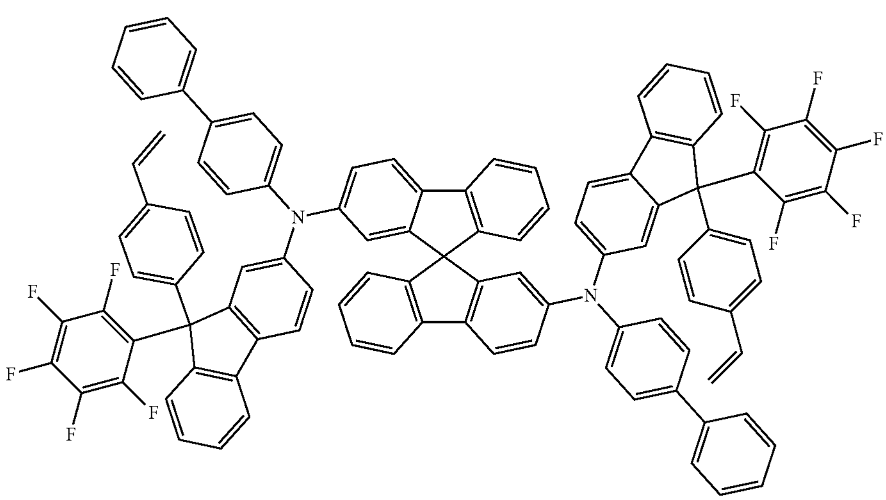

-continued
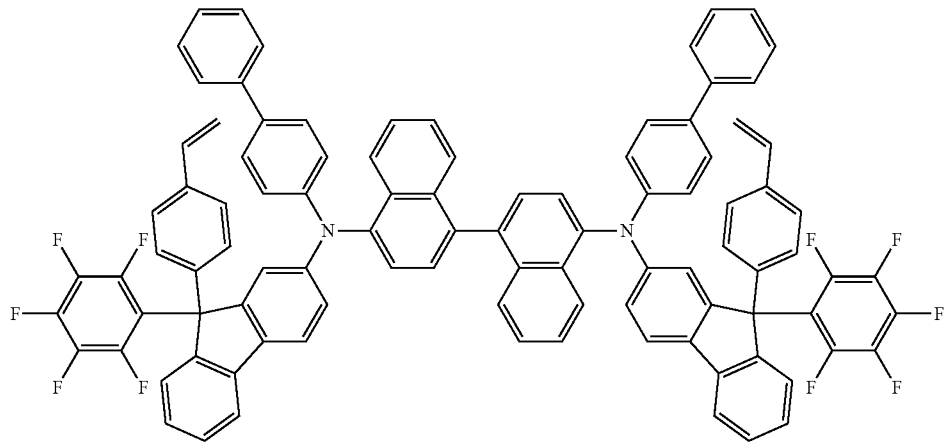
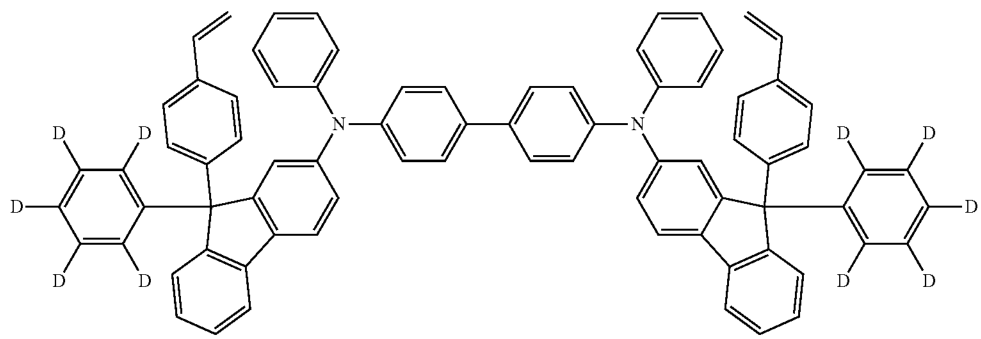
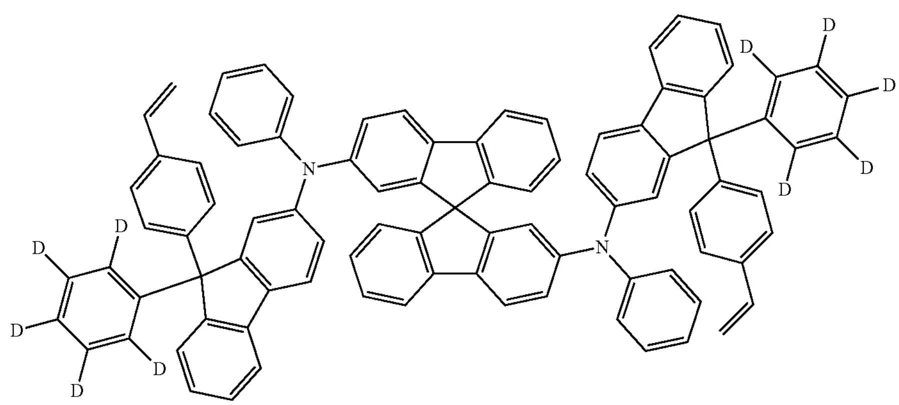
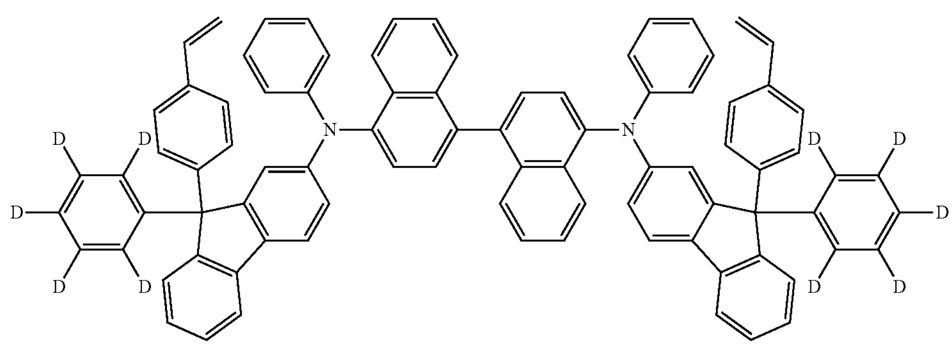

-continued
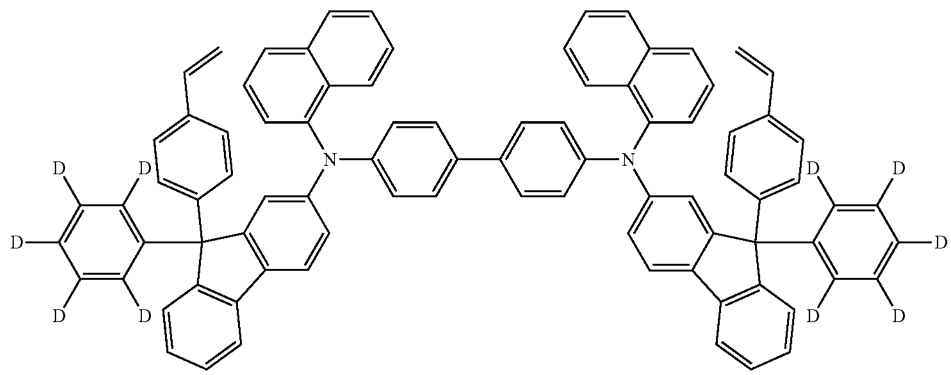
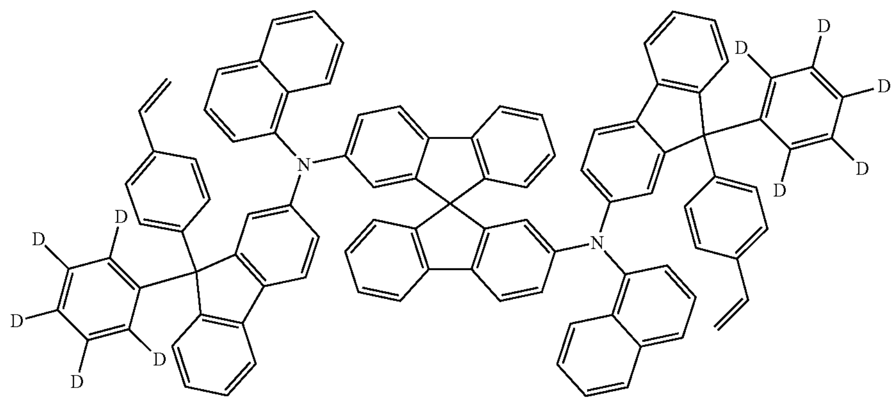
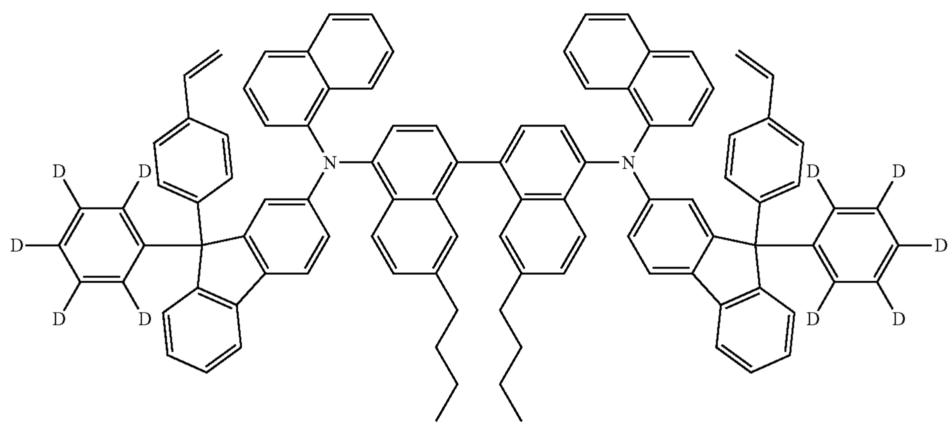
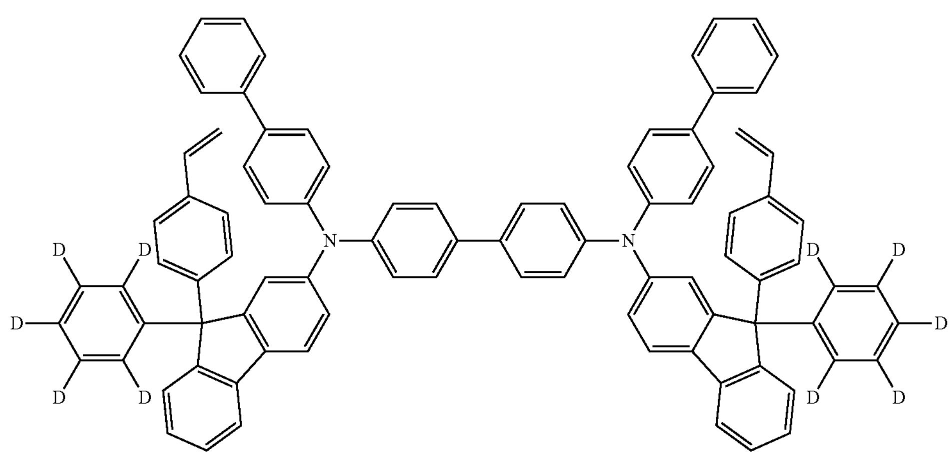

-continued
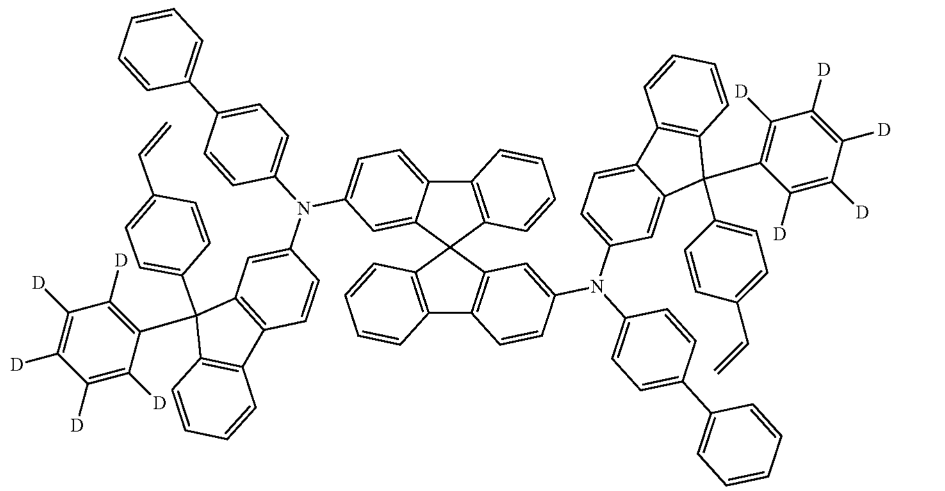
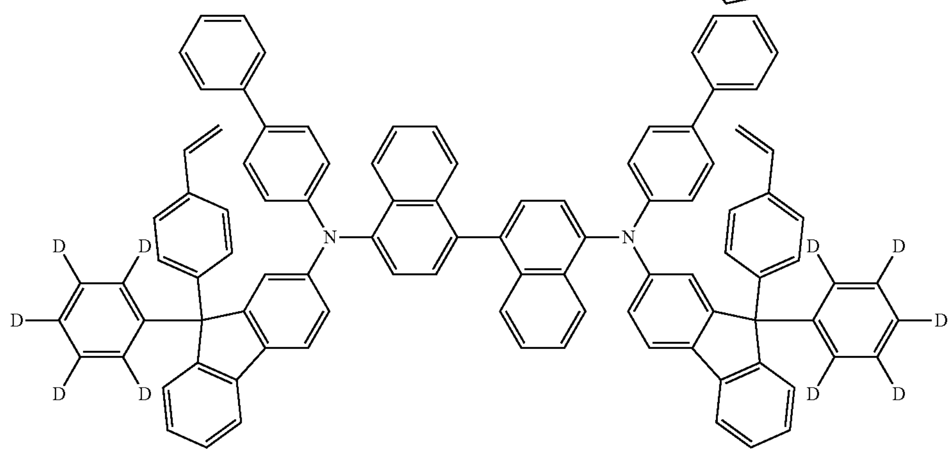
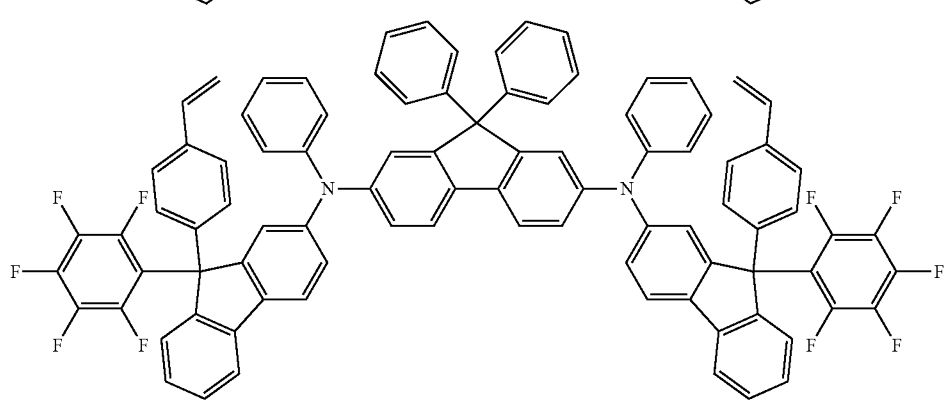
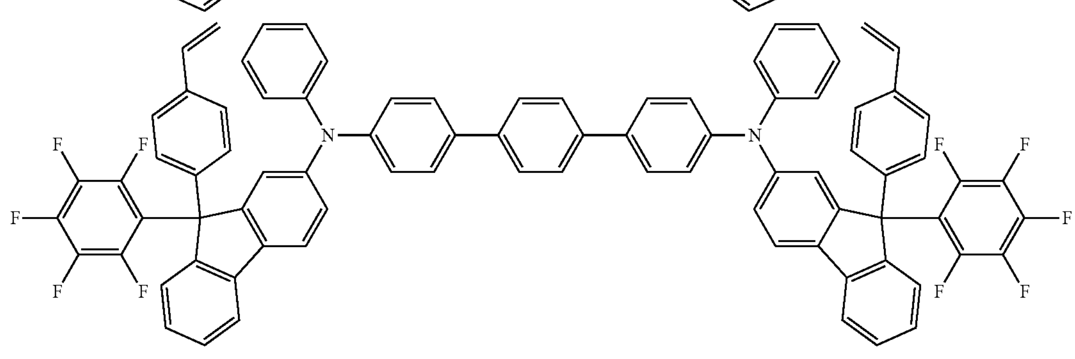

-continued
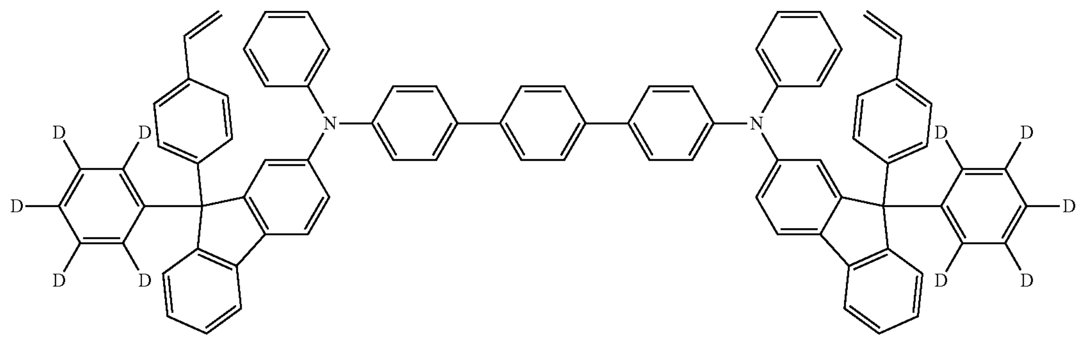
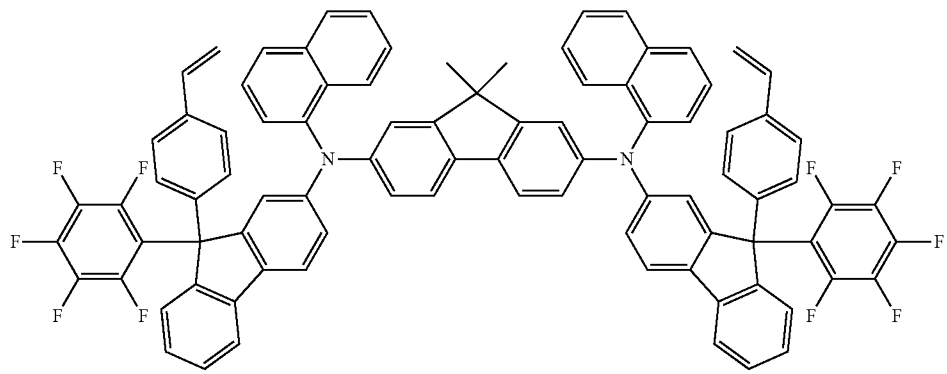
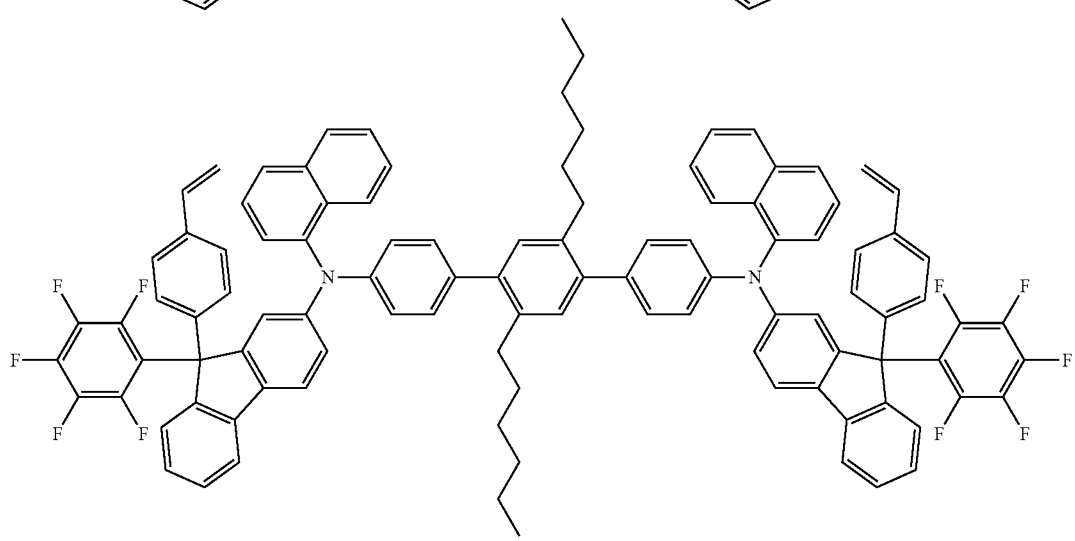
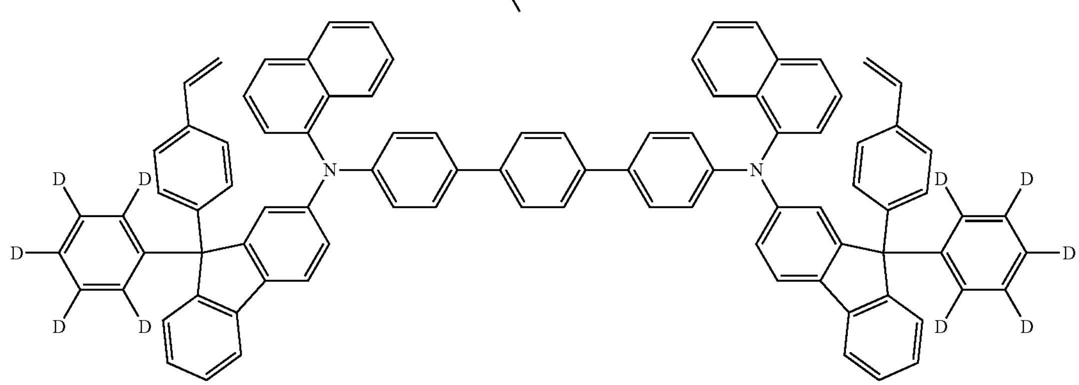

-continued
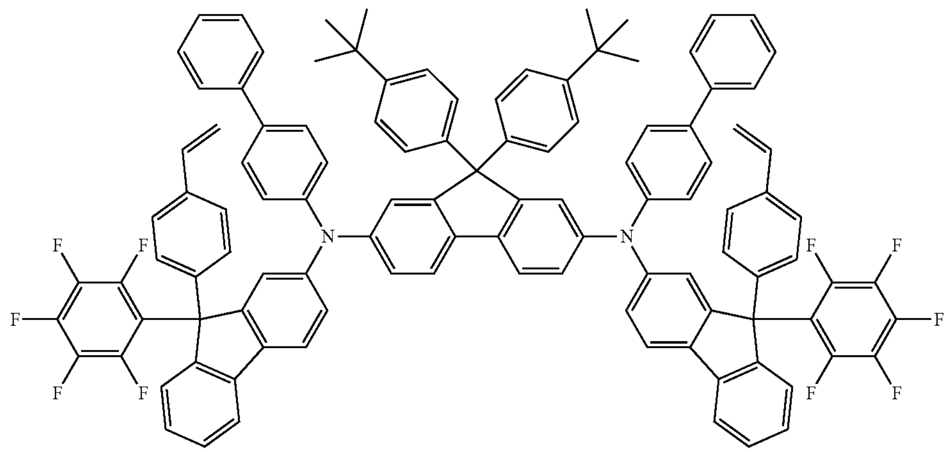
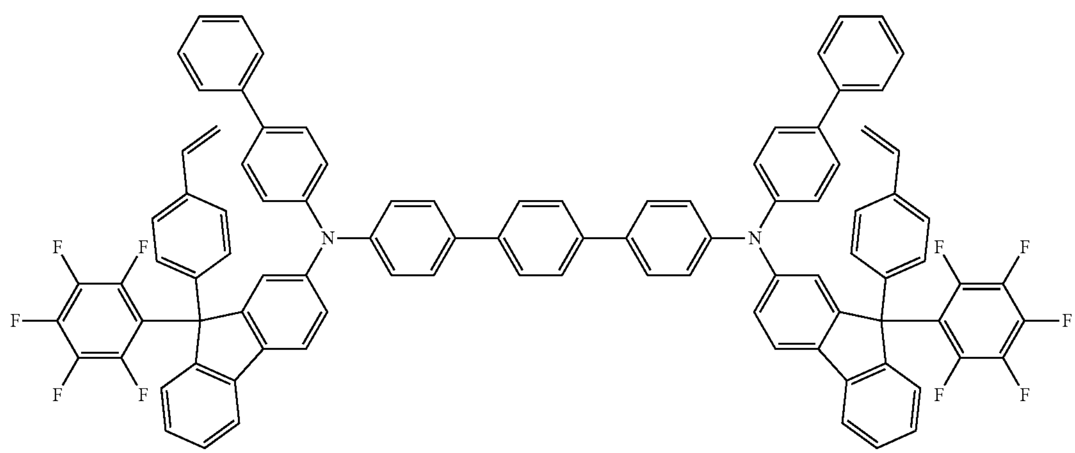
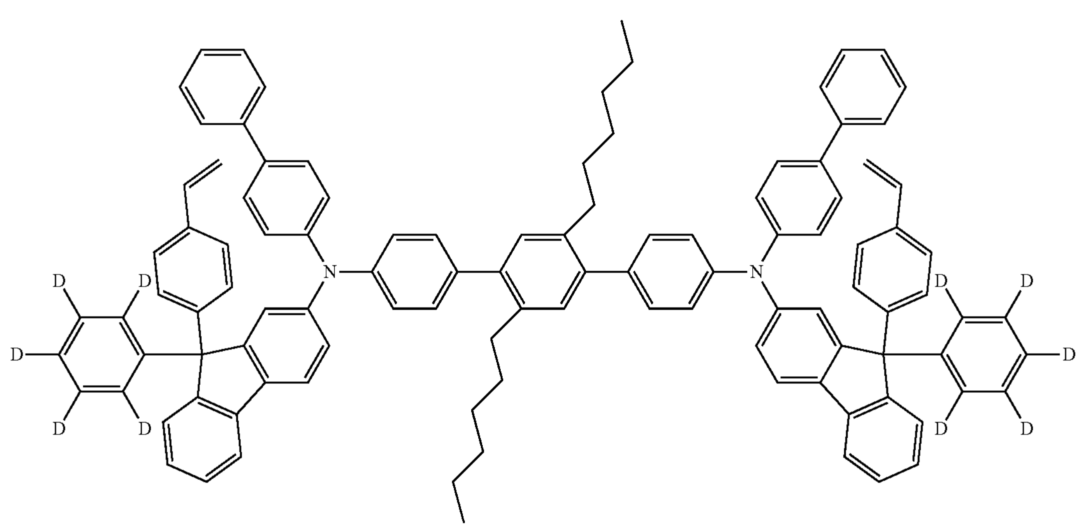

-continued
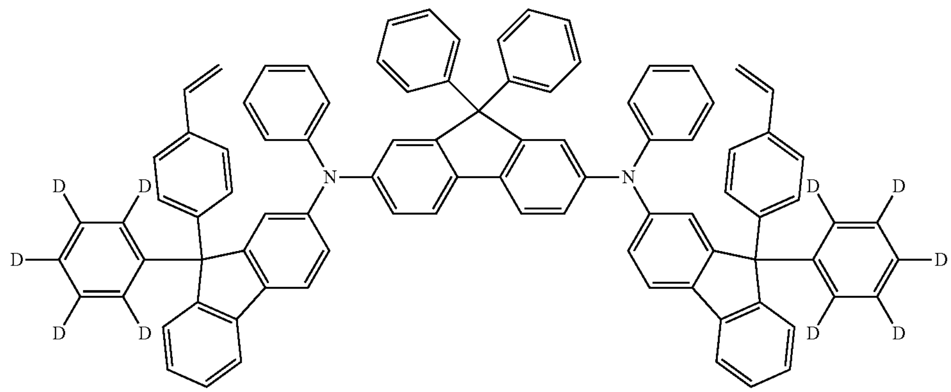
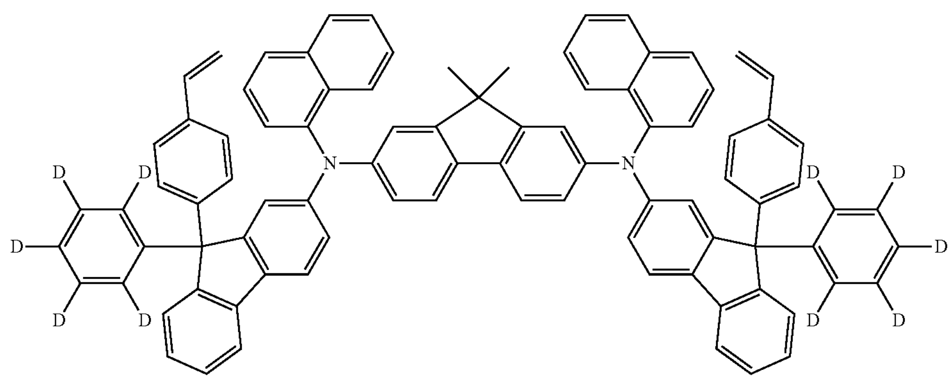
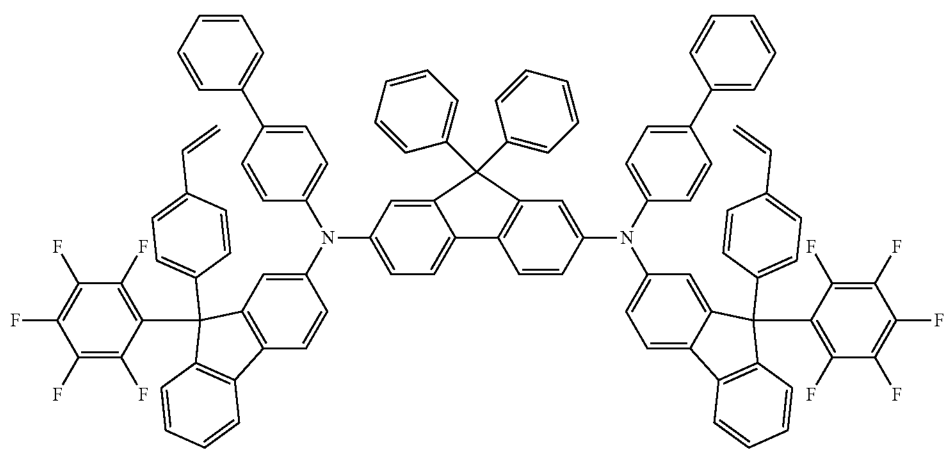
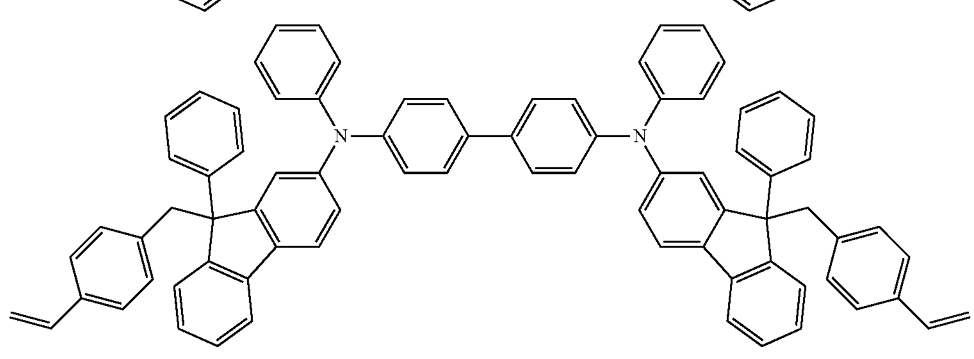

-continued
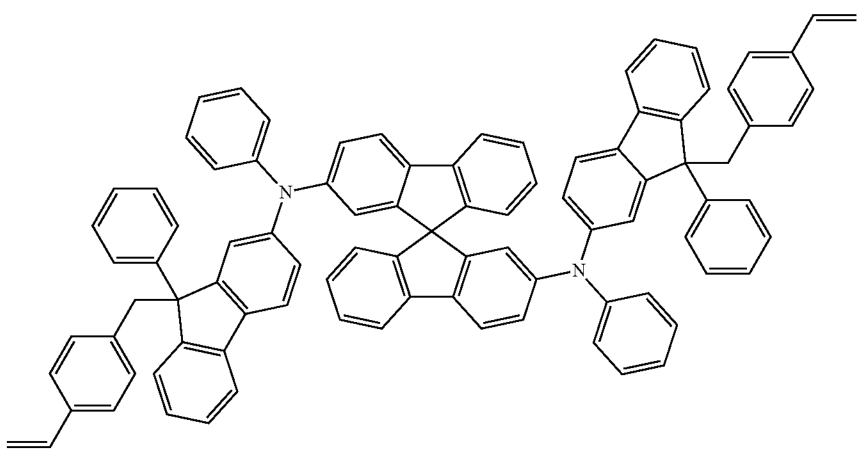
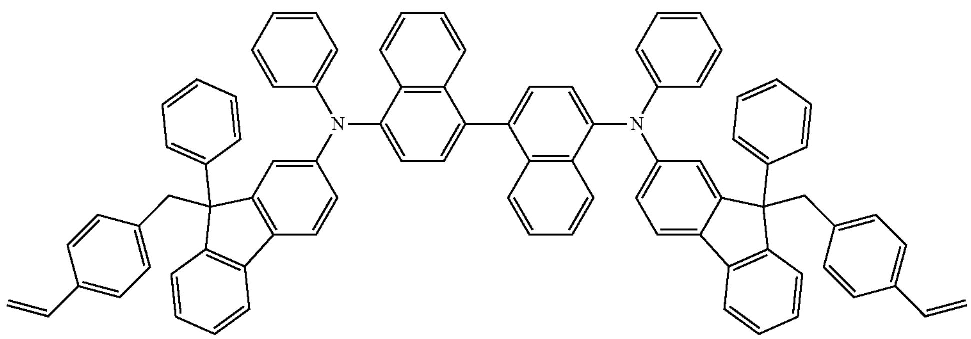
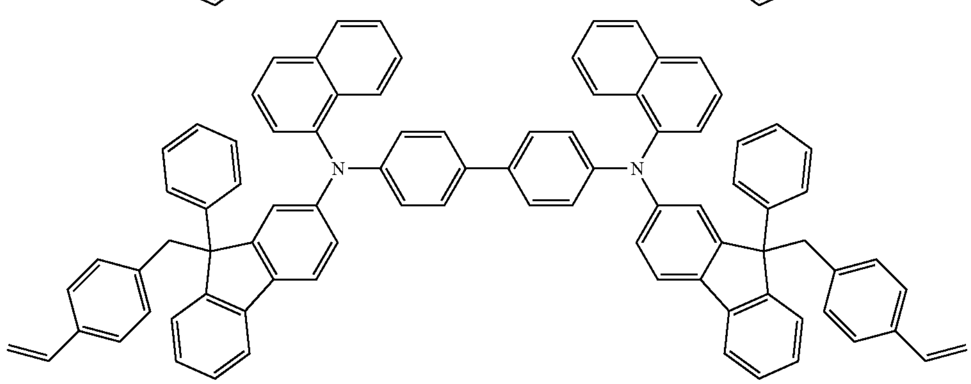
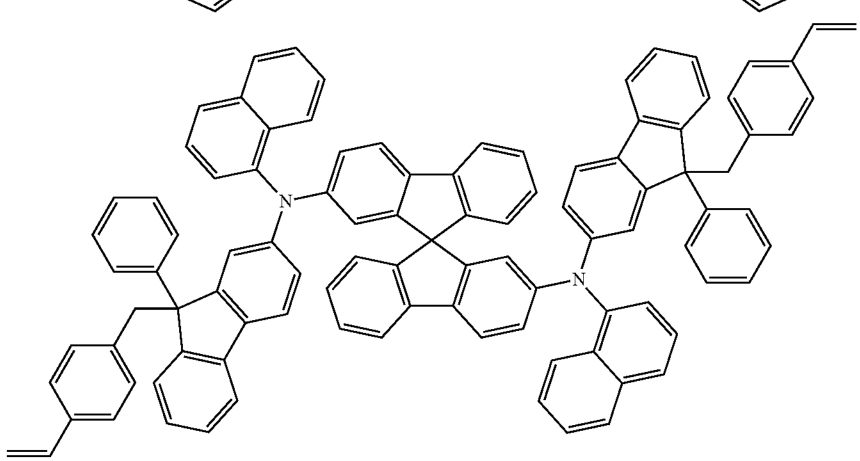

-continued
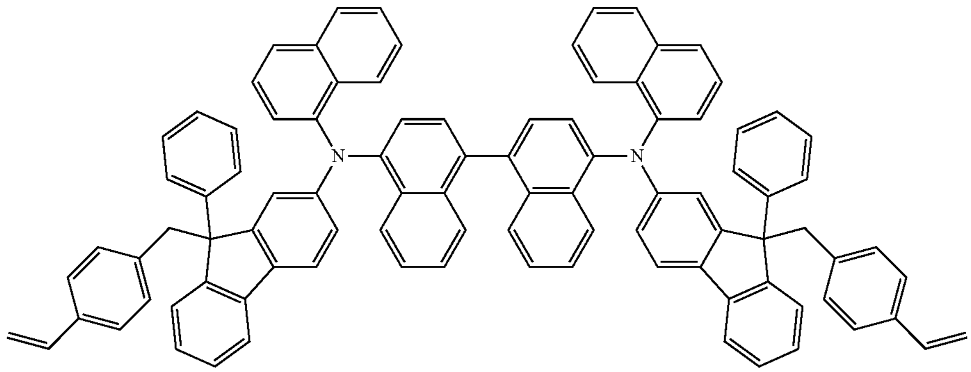
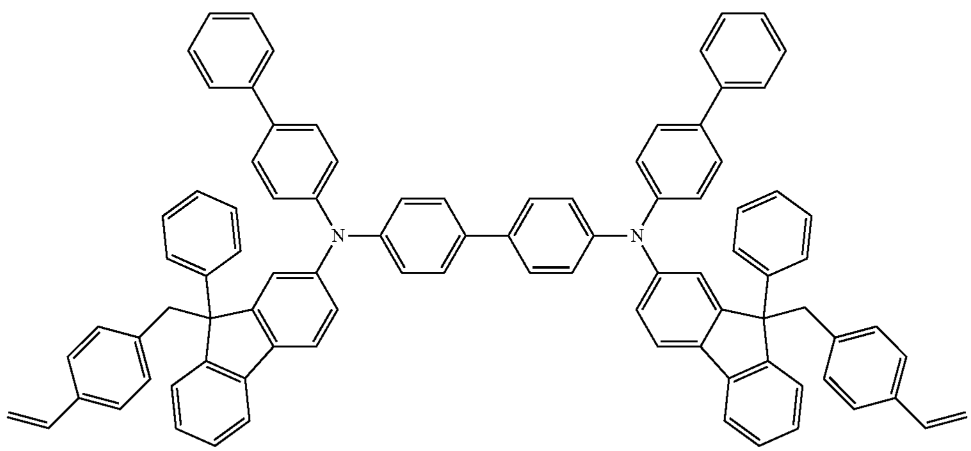
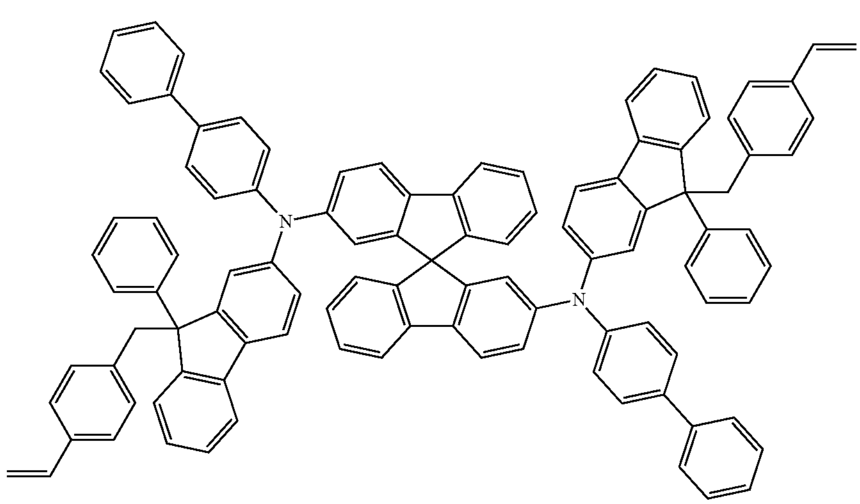

-continued
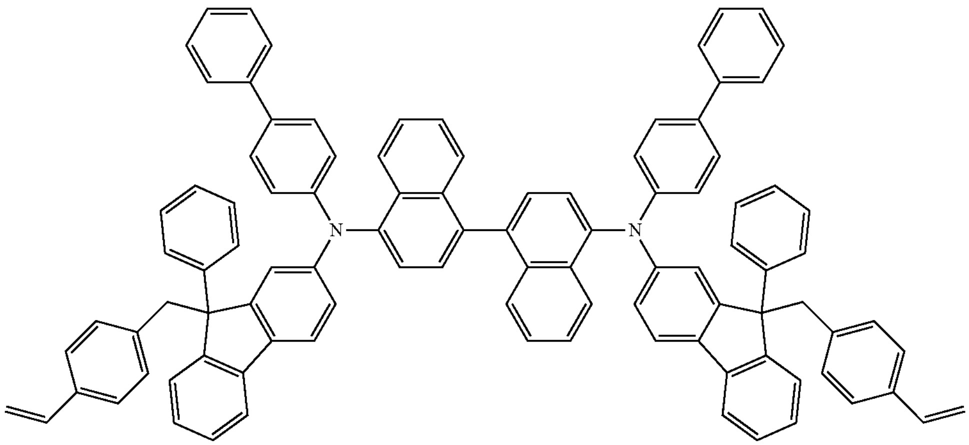
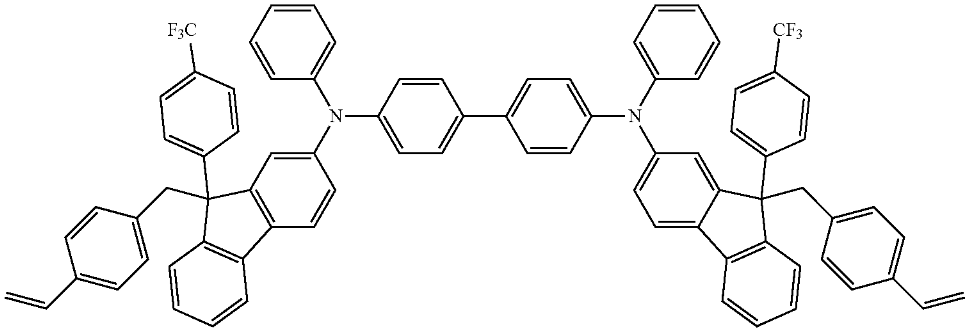
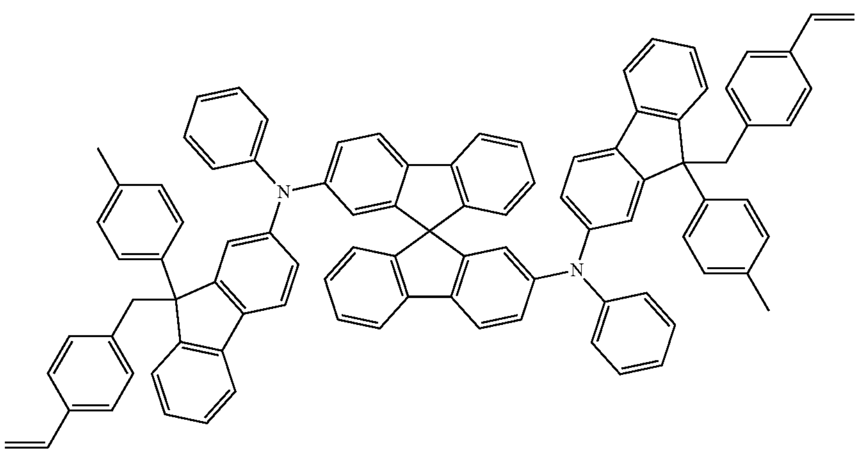
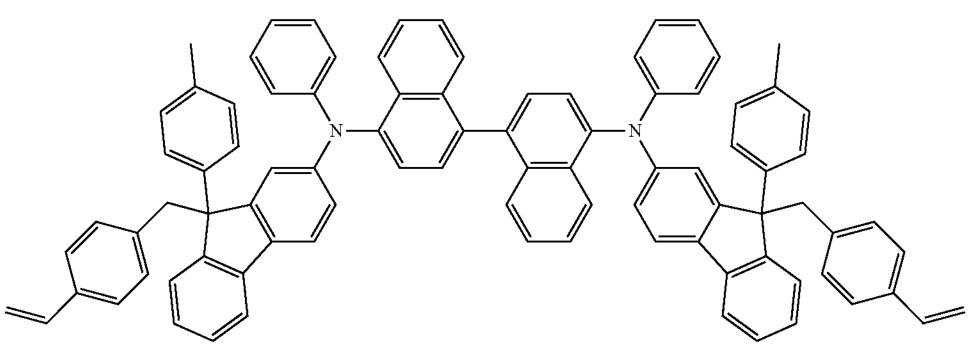

-continued
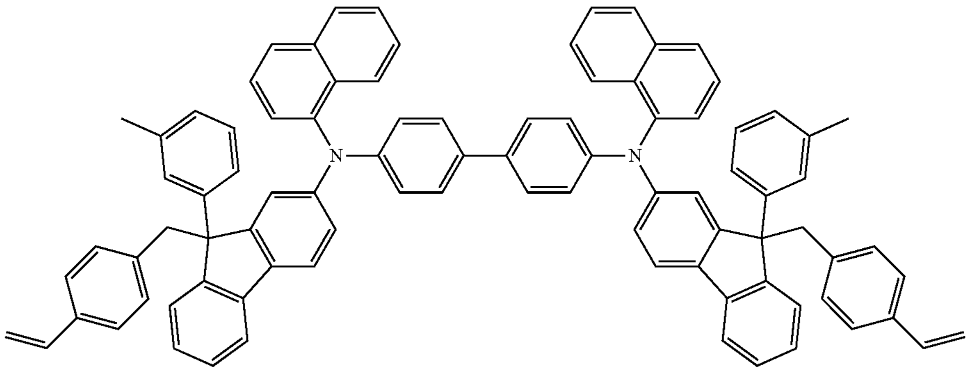
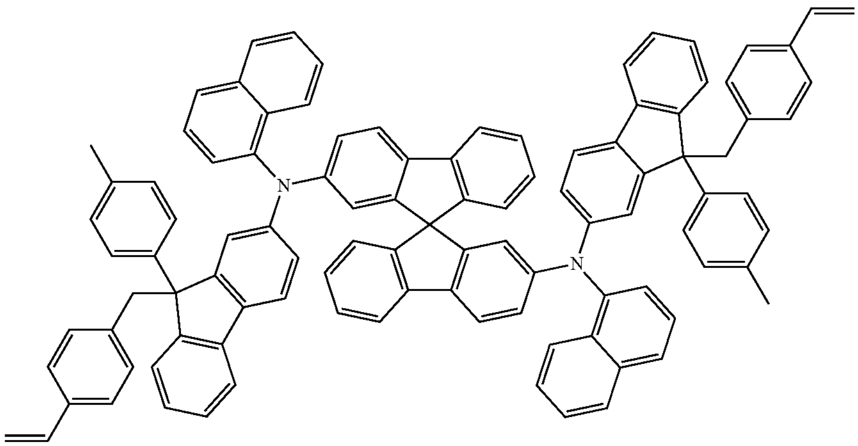
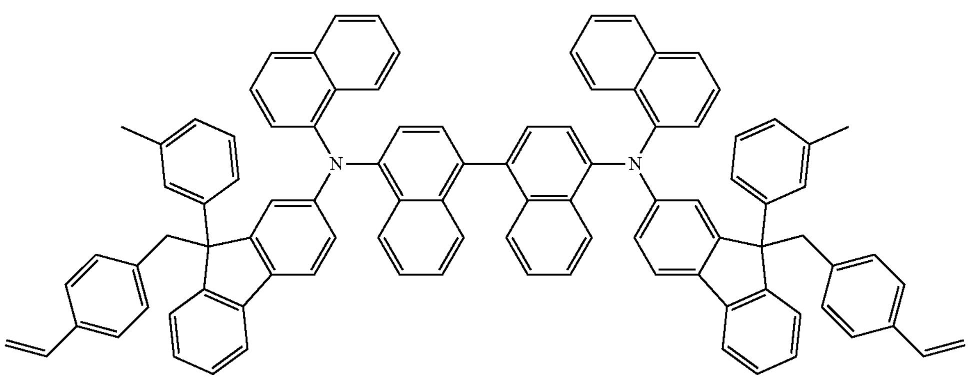
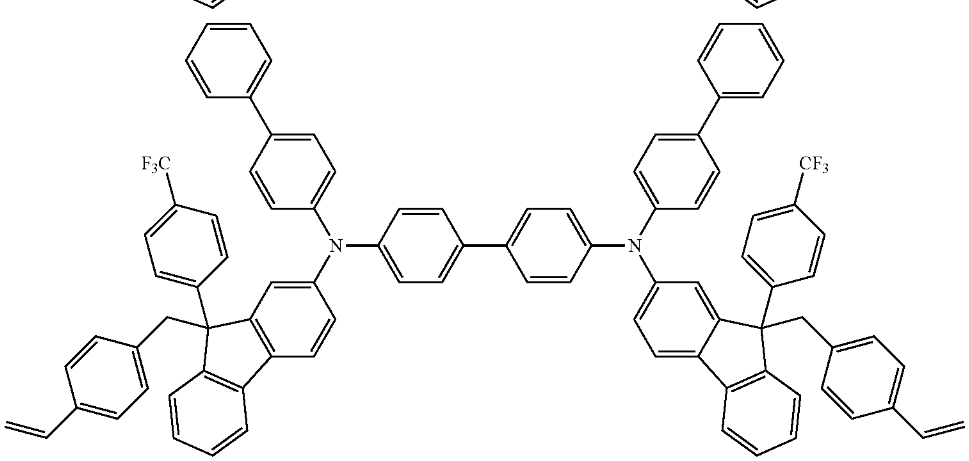

-continued
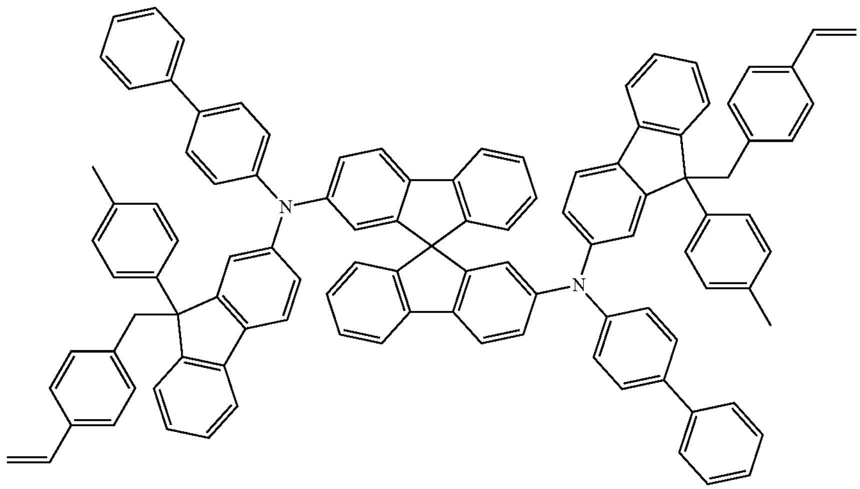
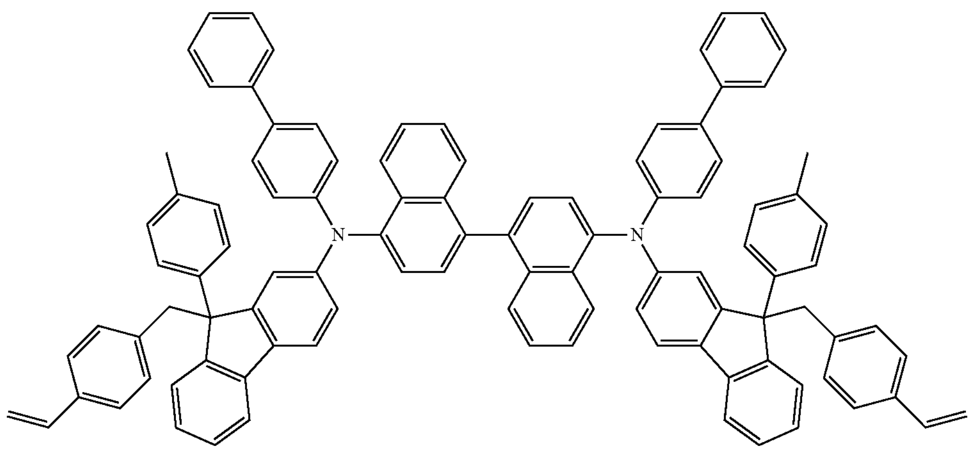
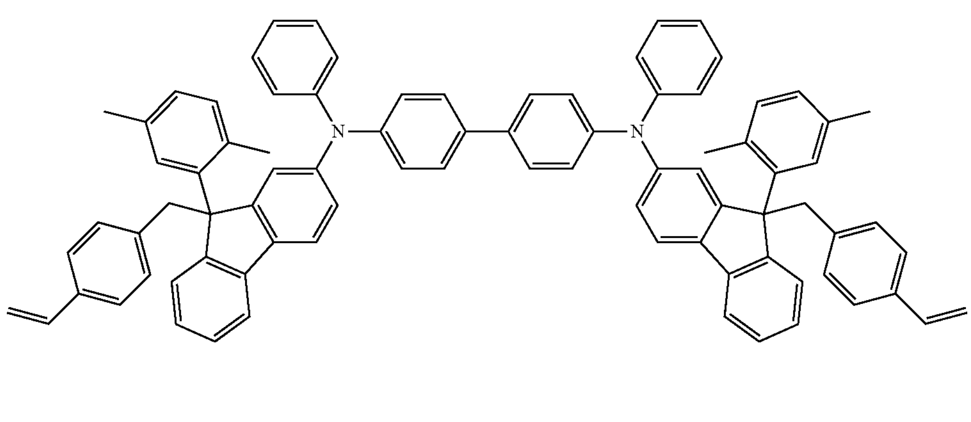

-continued
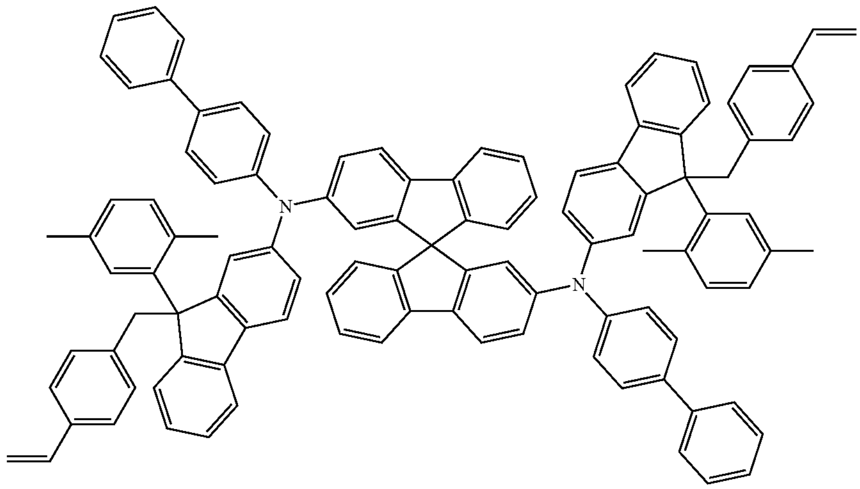
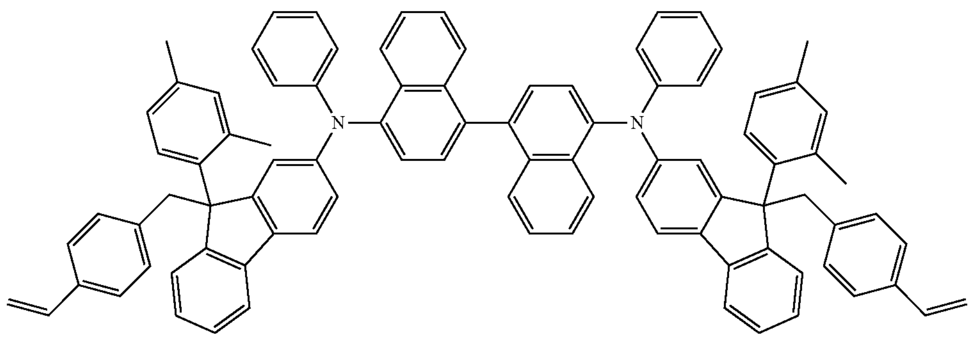
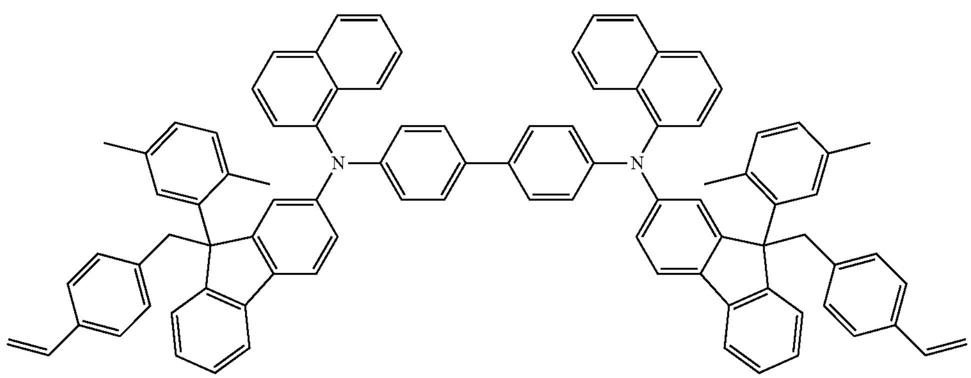
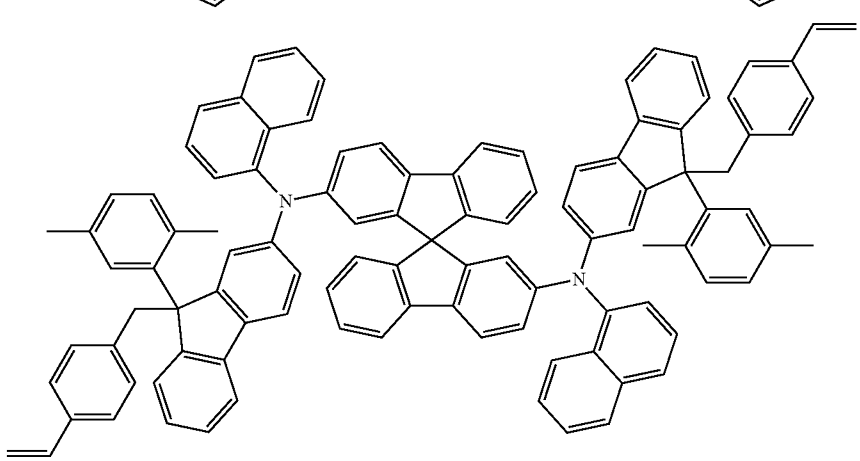

-continued
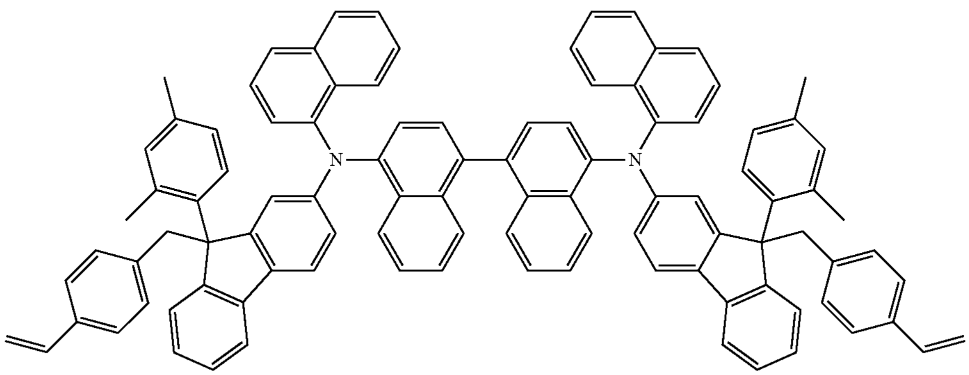
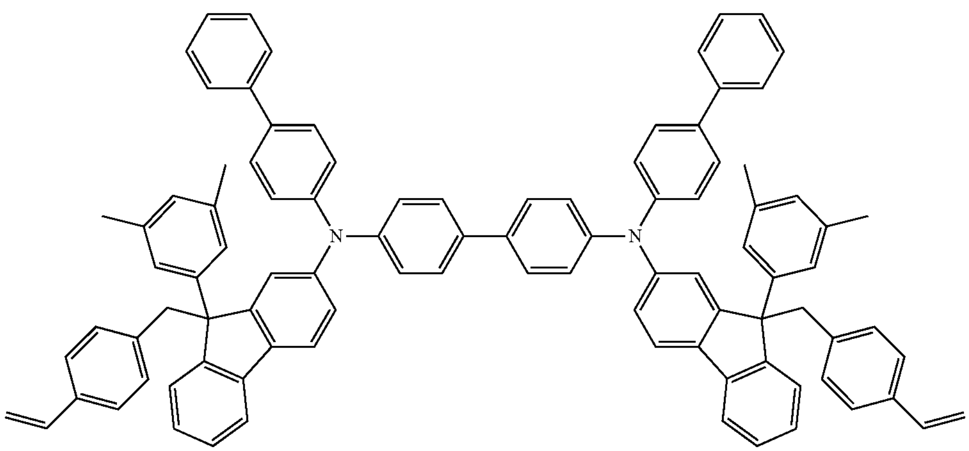
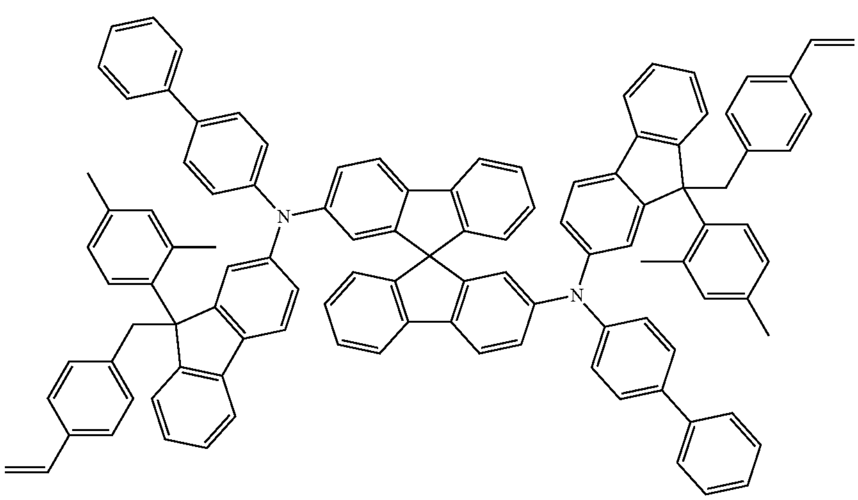
N

-continued
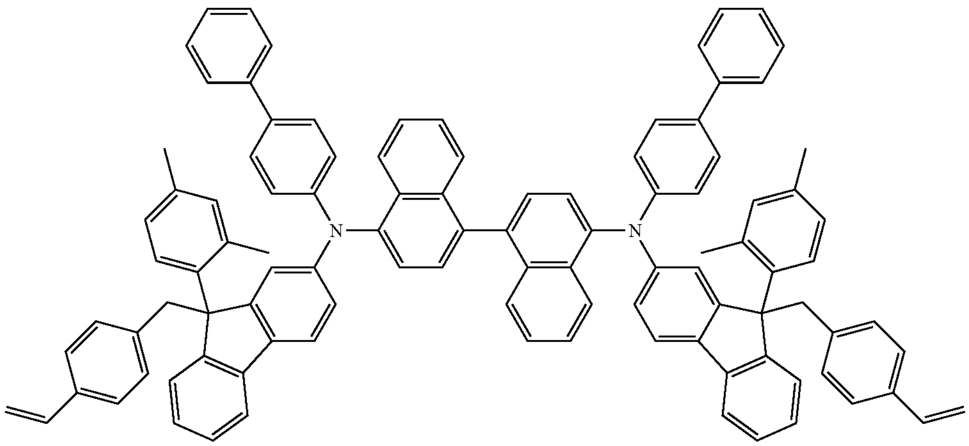
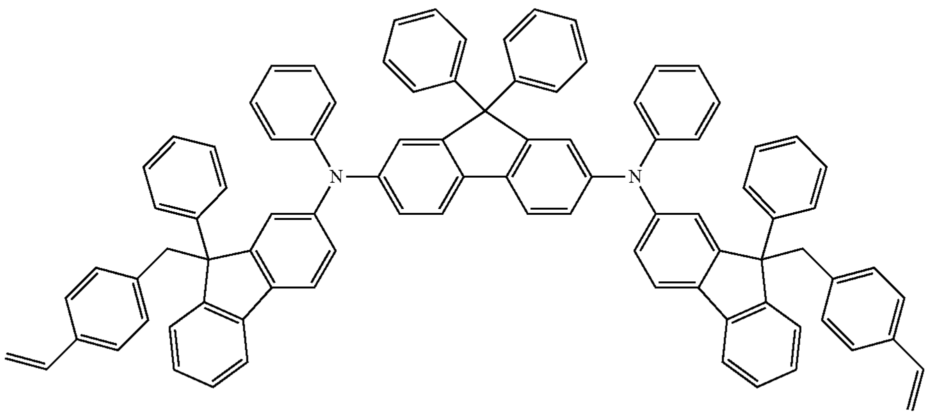
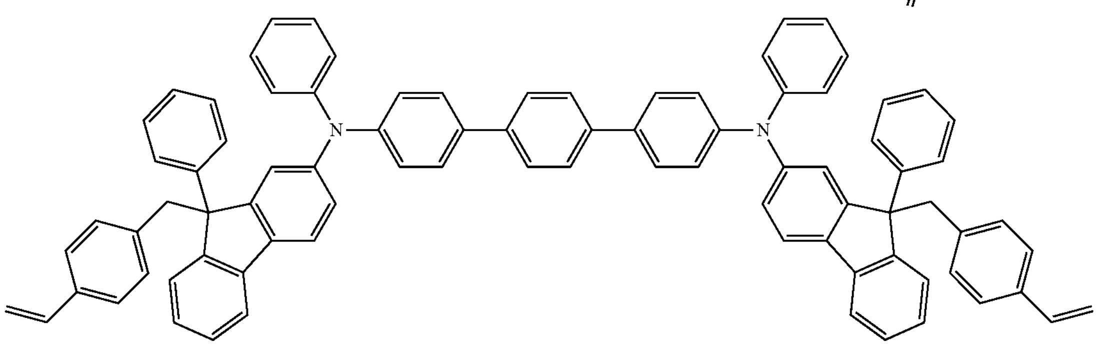
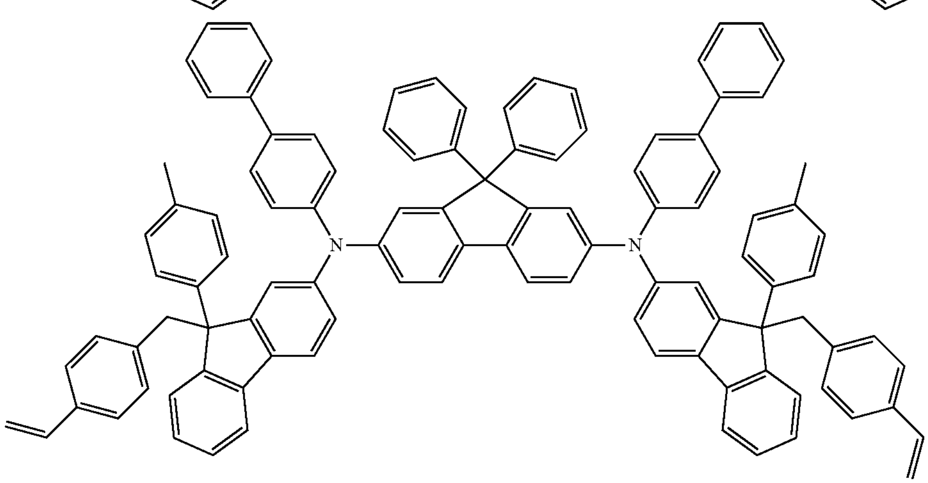

-continued
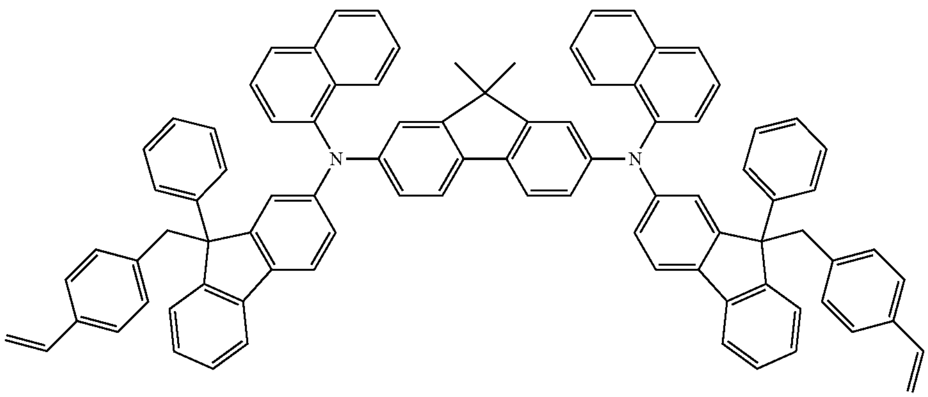
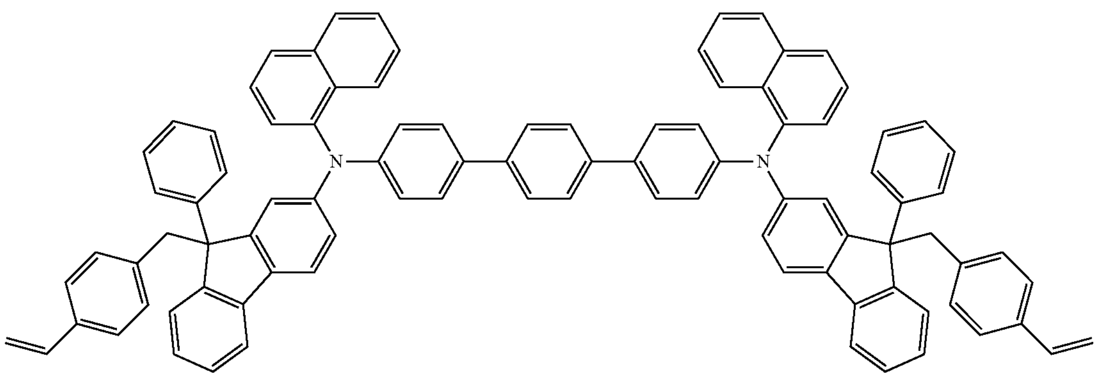
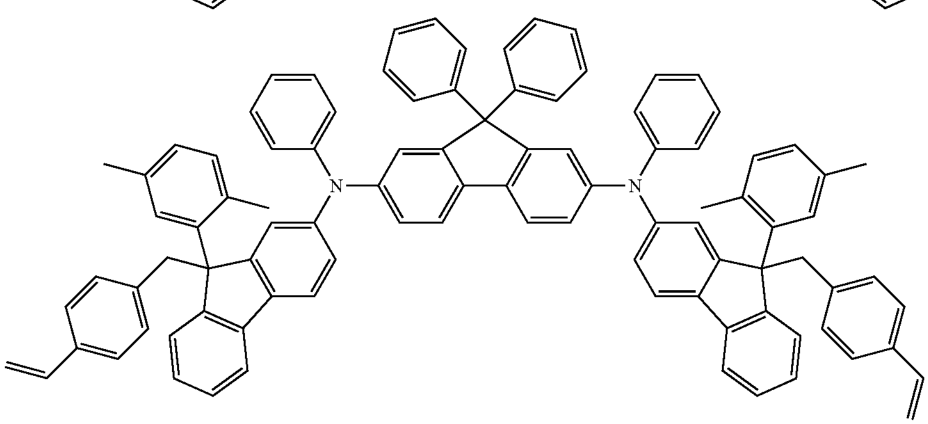
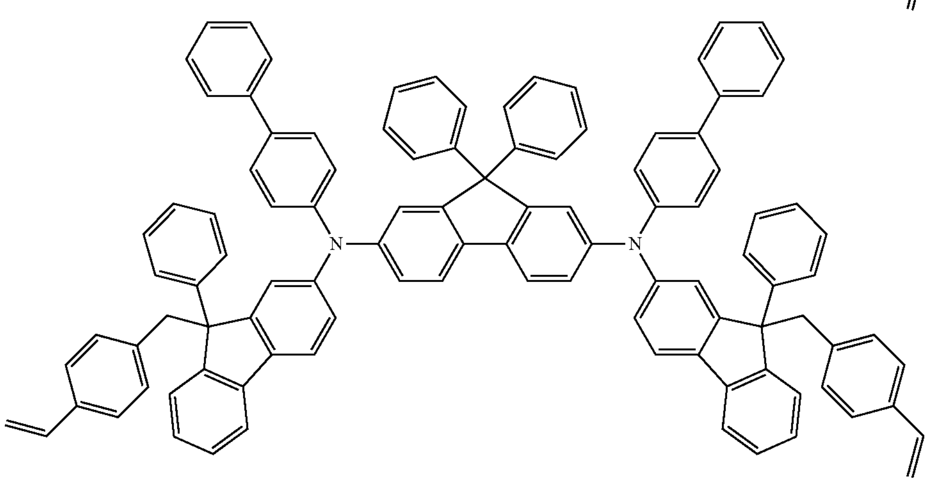

-continued
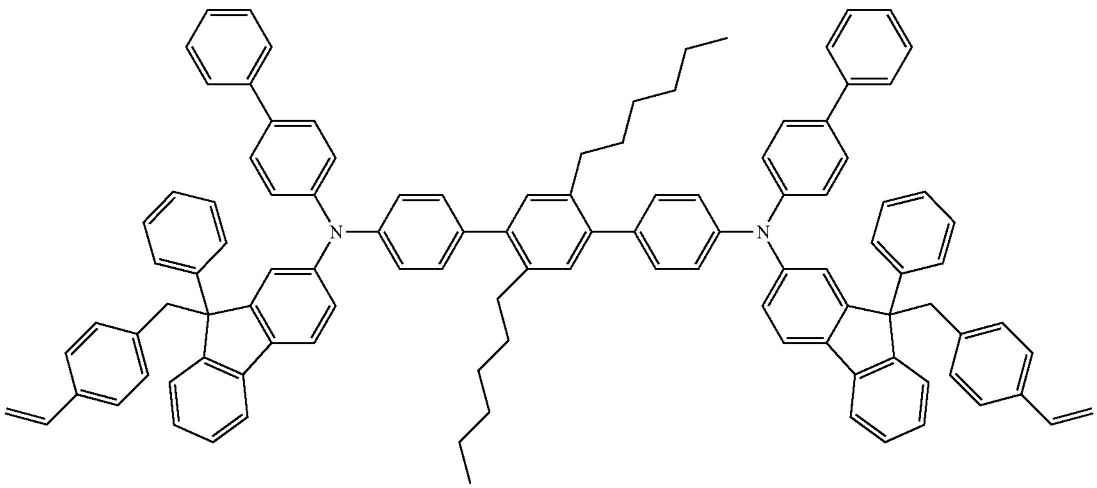
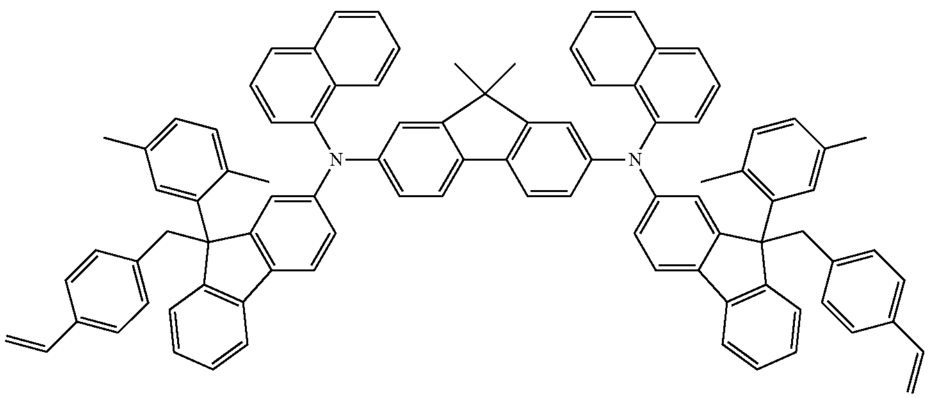
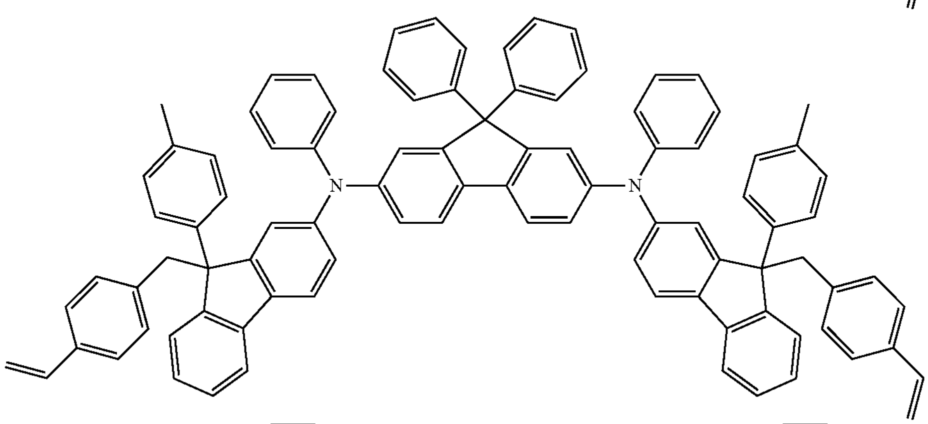
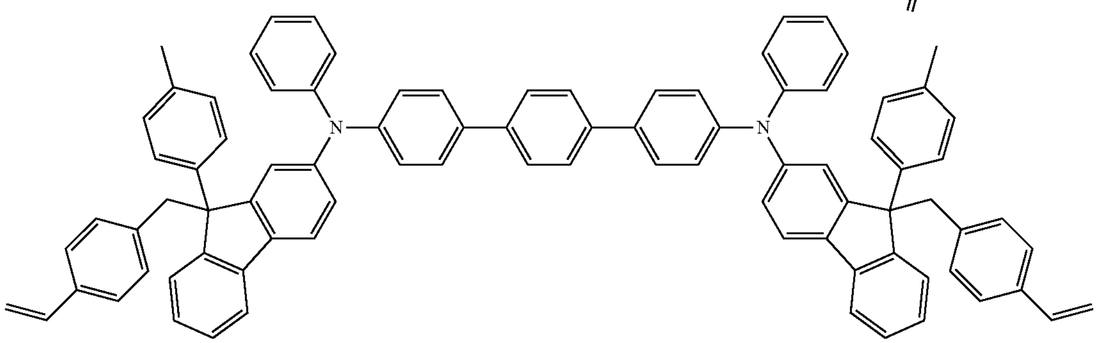

-continued
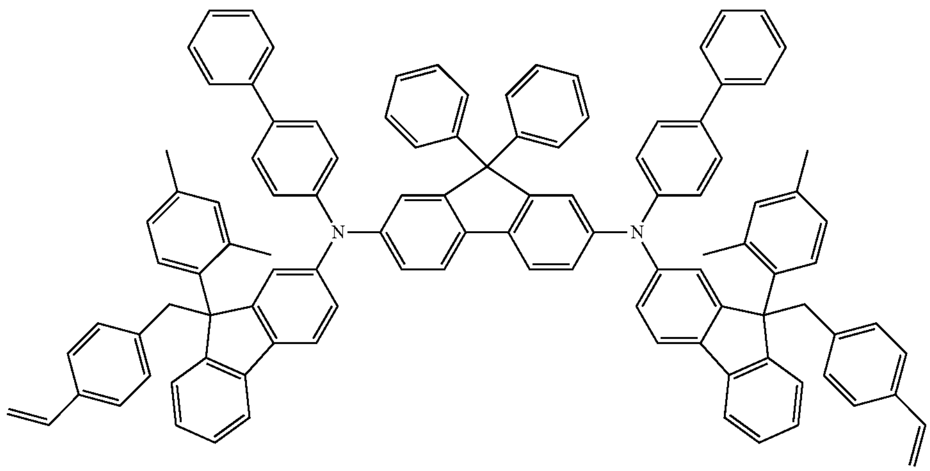
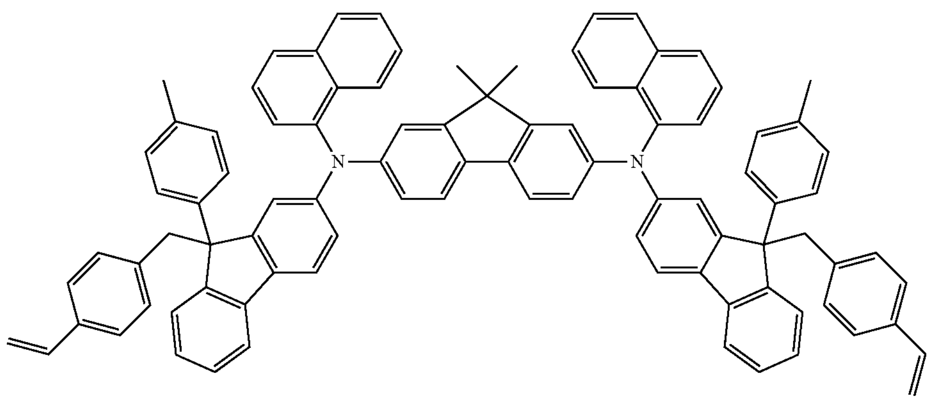
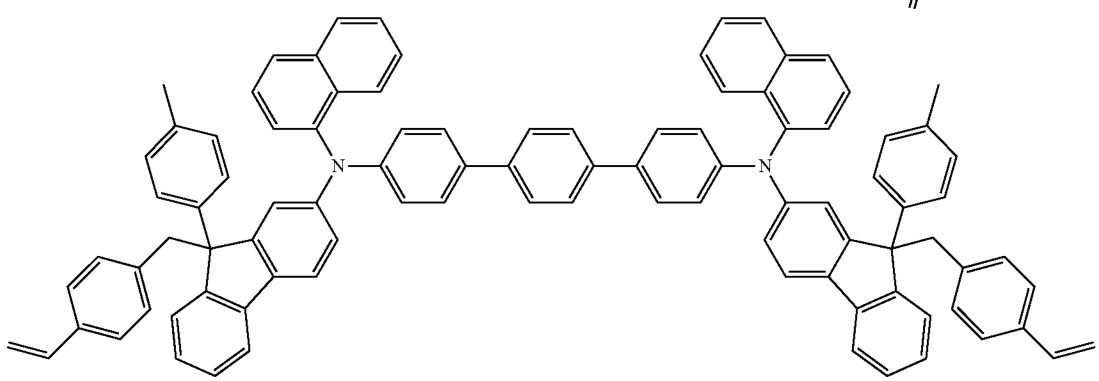
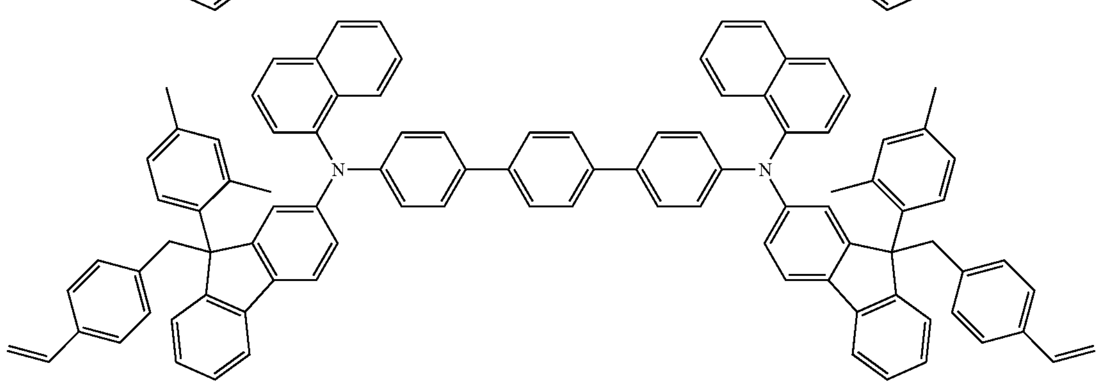

-continued
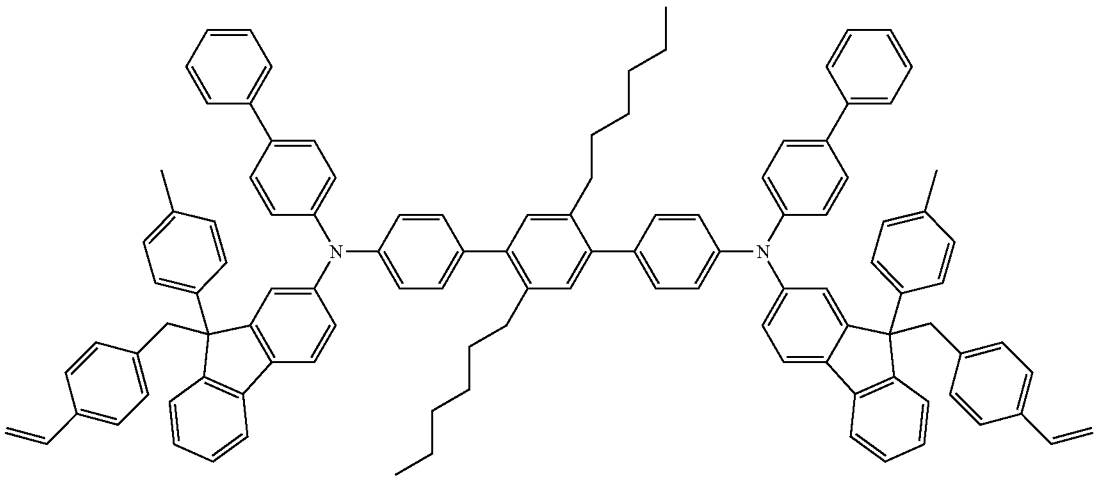
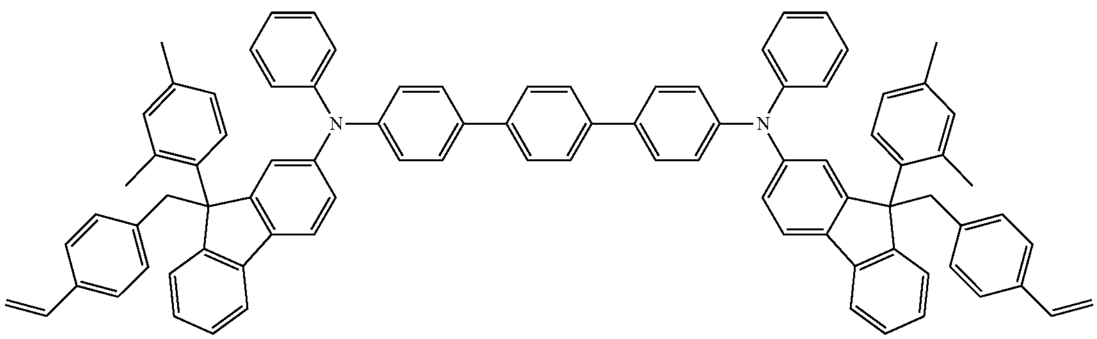
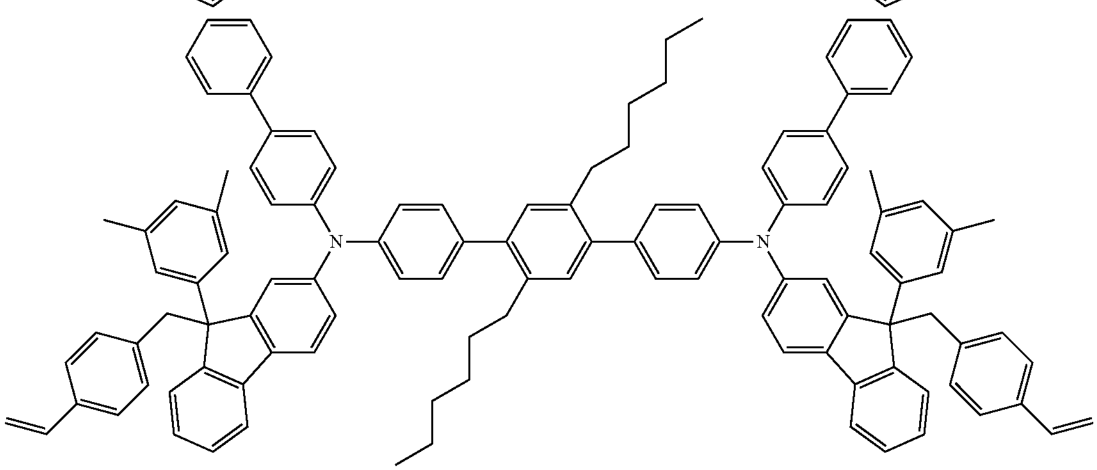
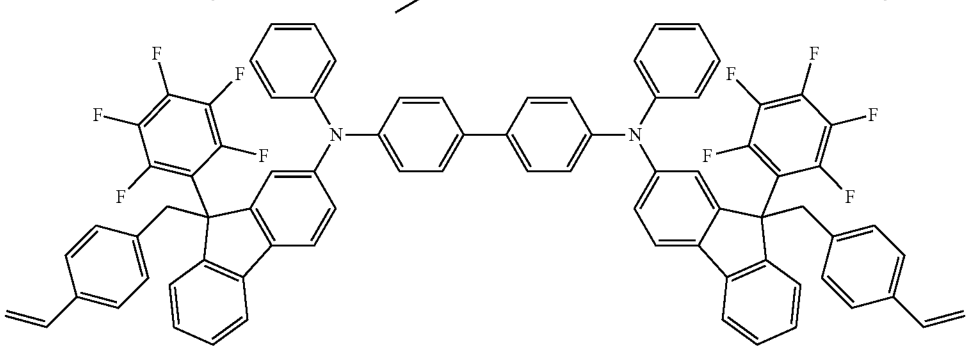

-continued
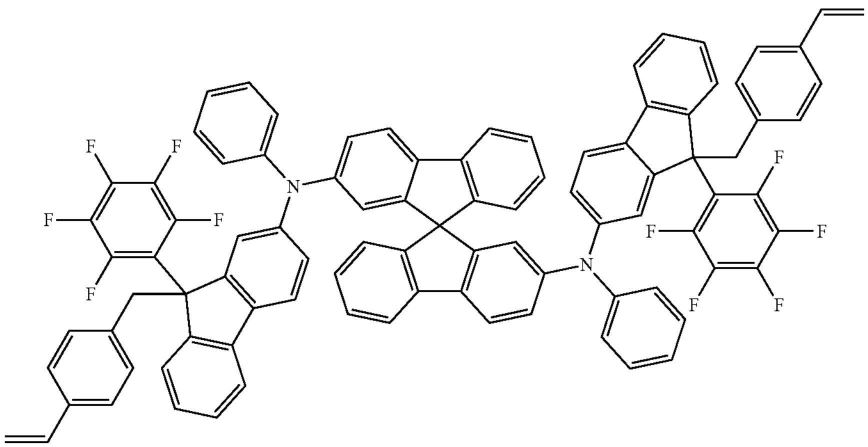
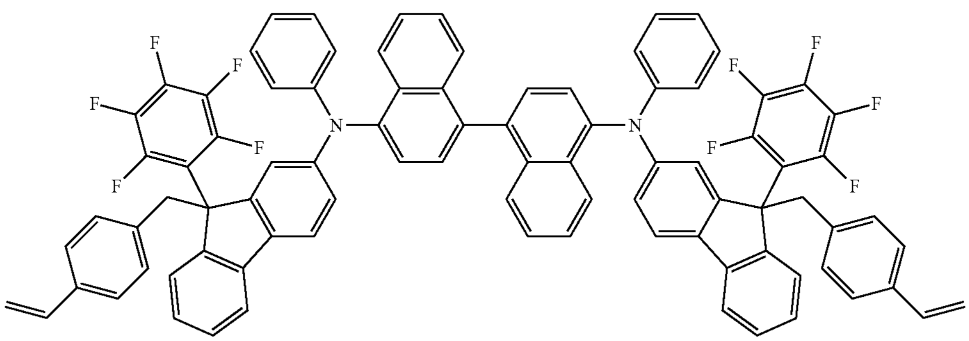
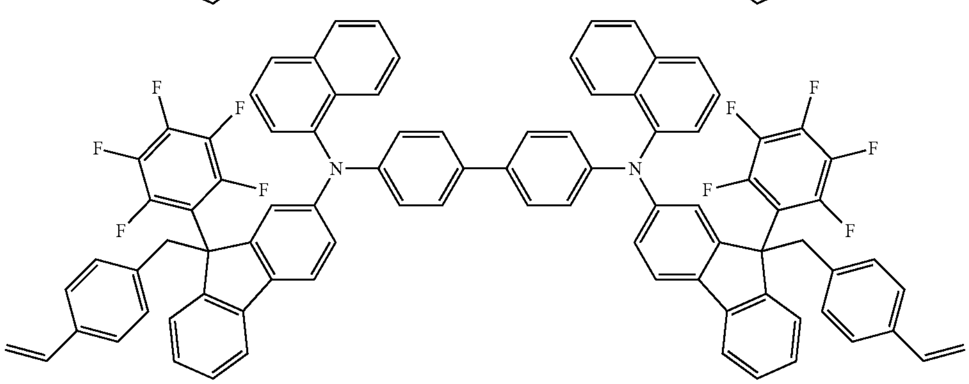
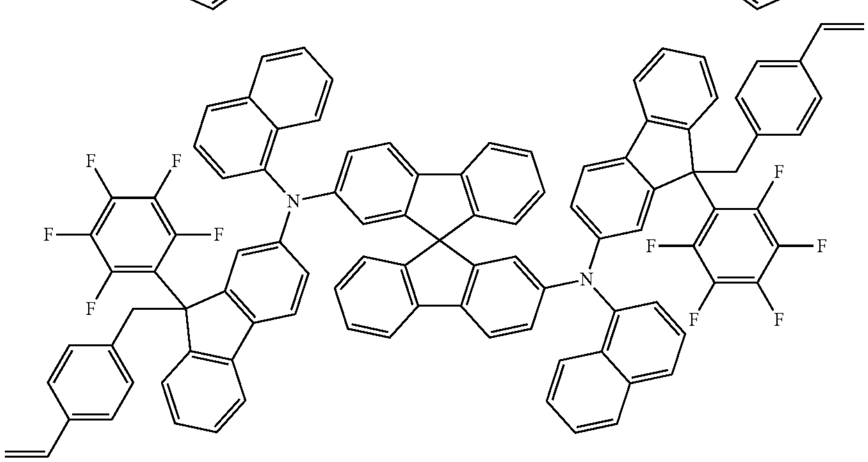

-continued
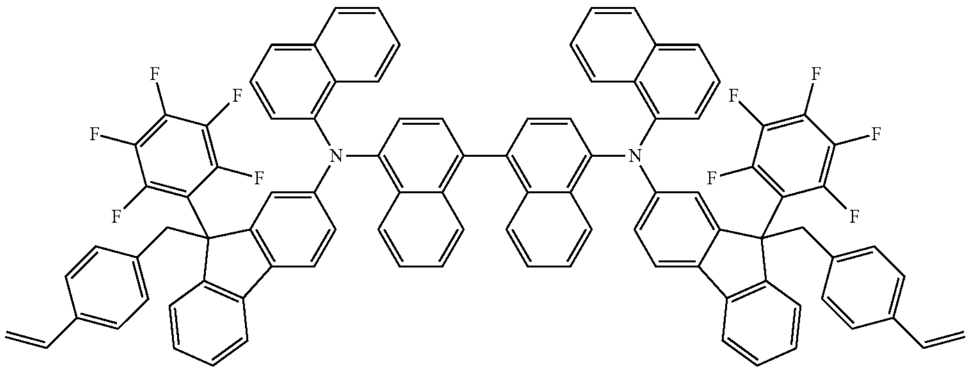
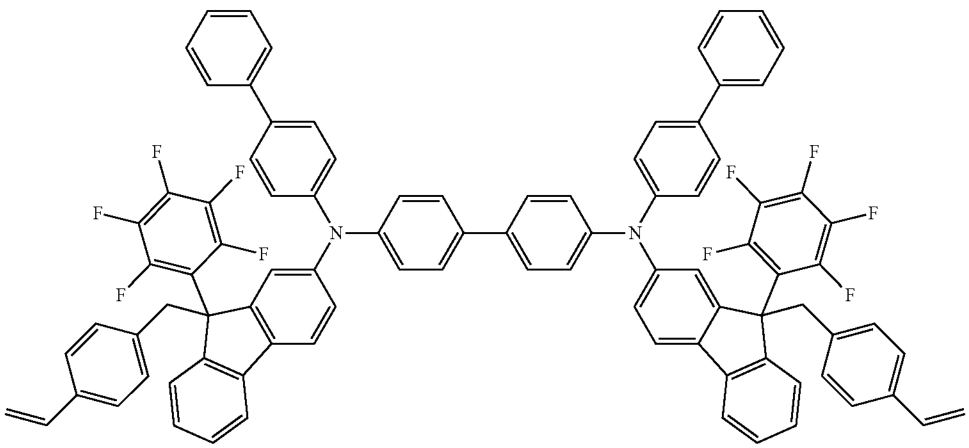
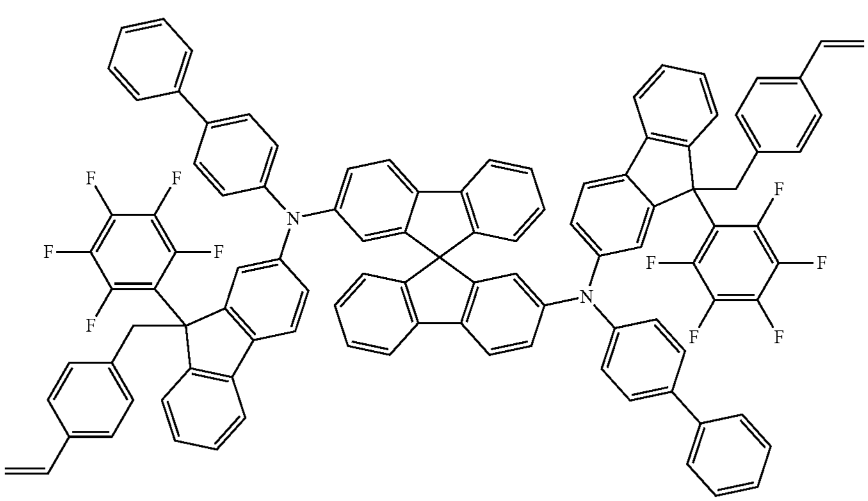

-continued
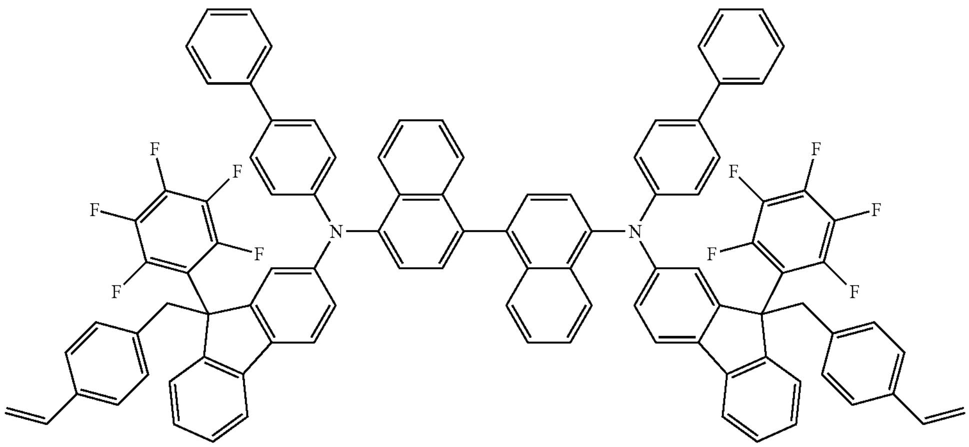
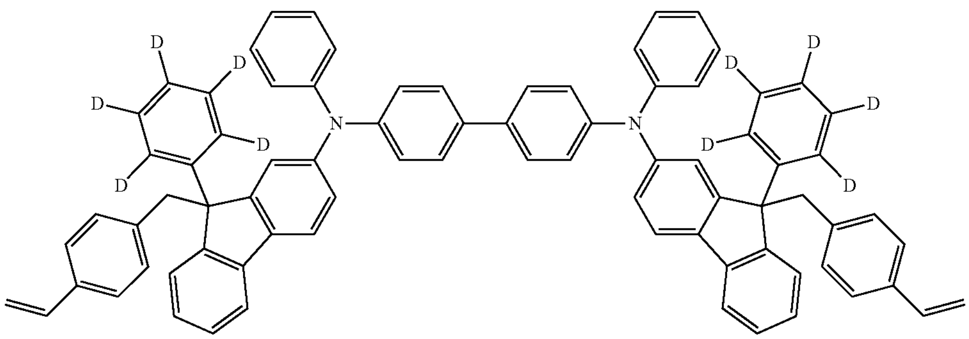
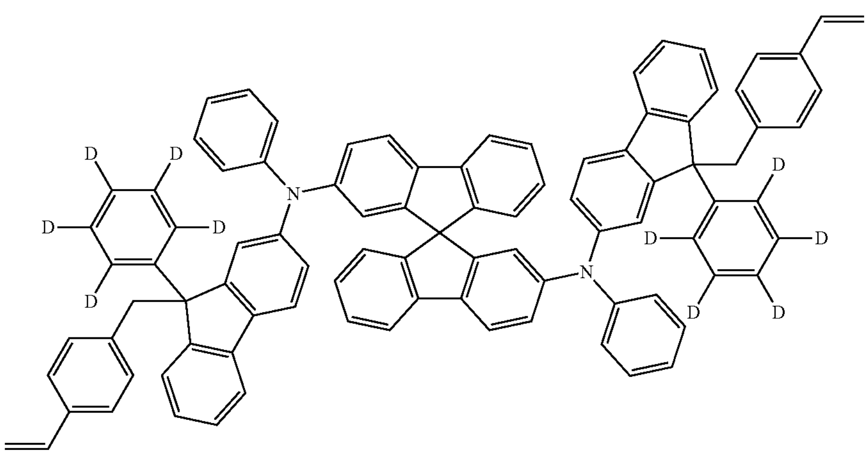
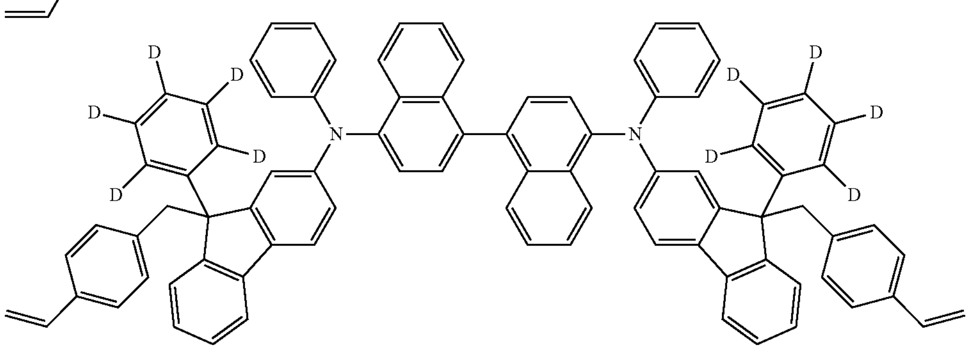

-continued
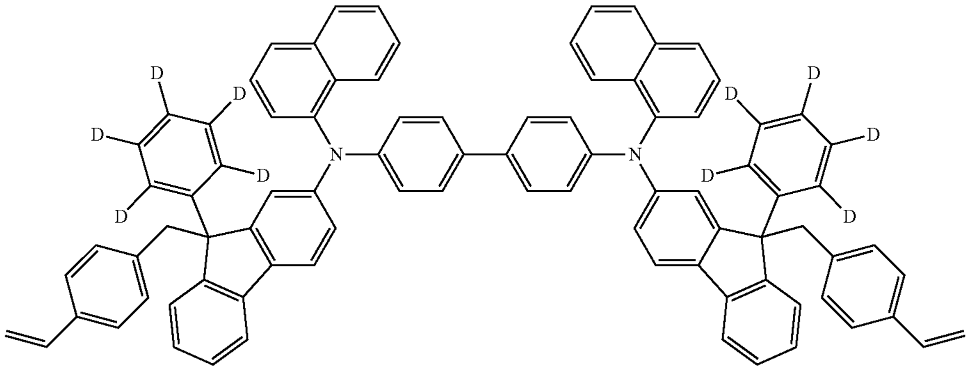
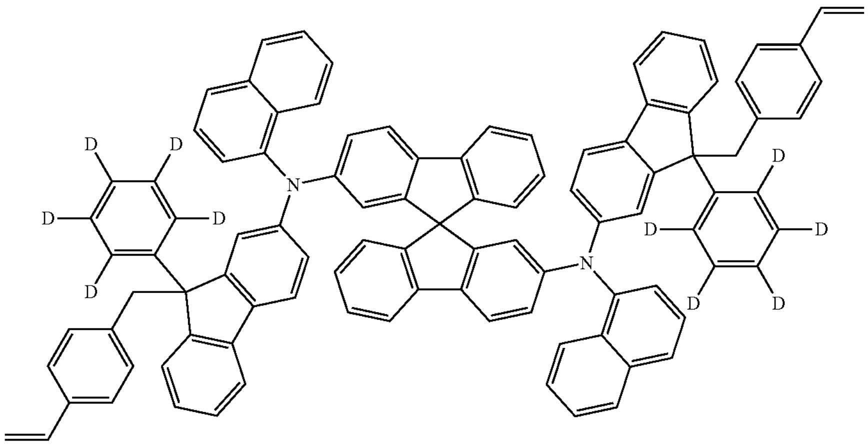
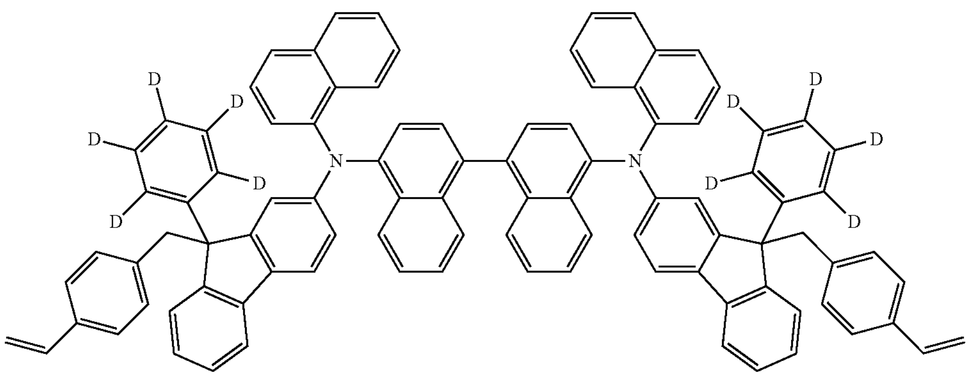
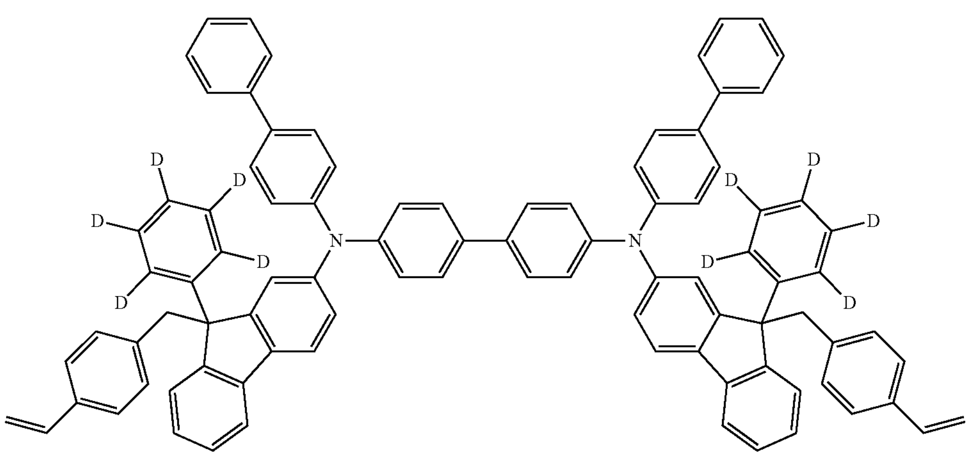

-continued
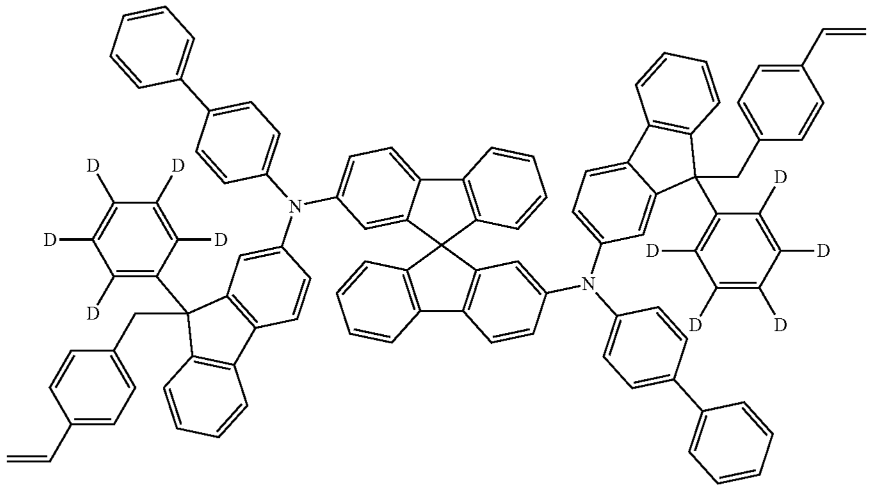
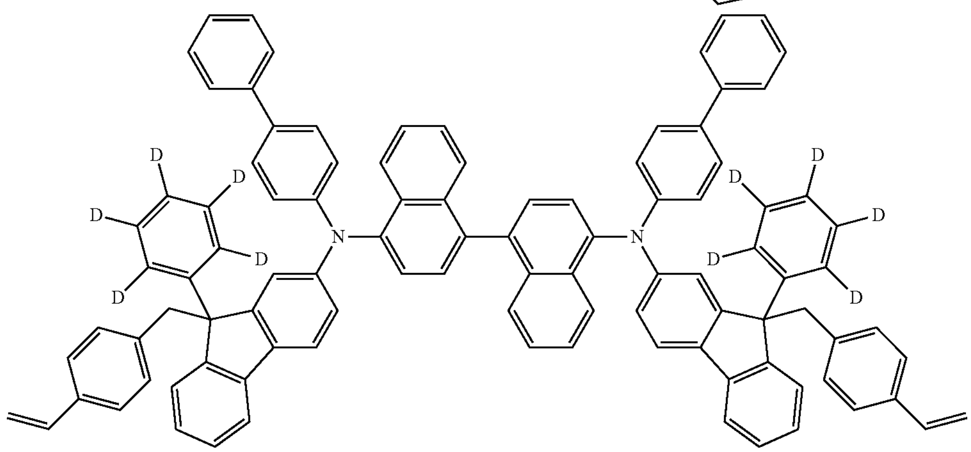
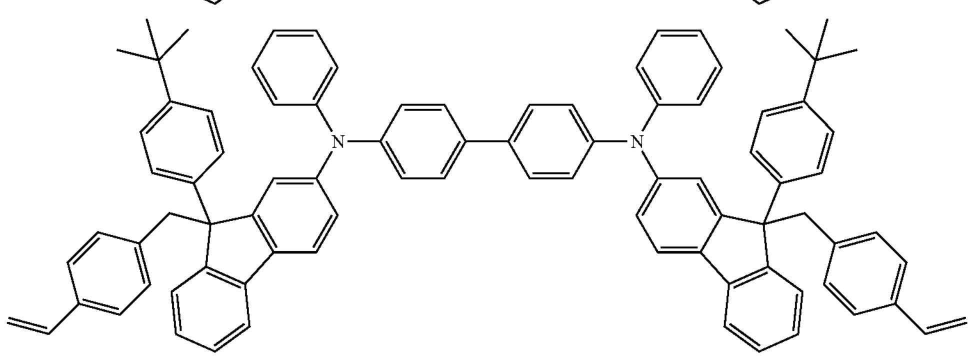
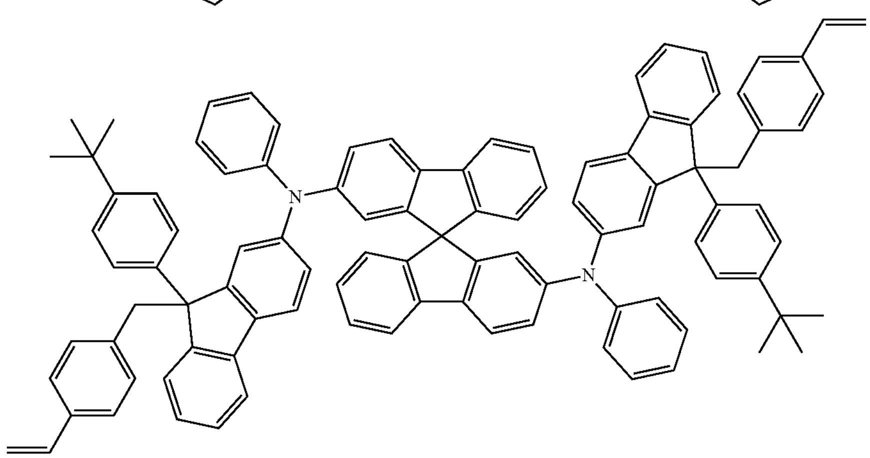

-continued
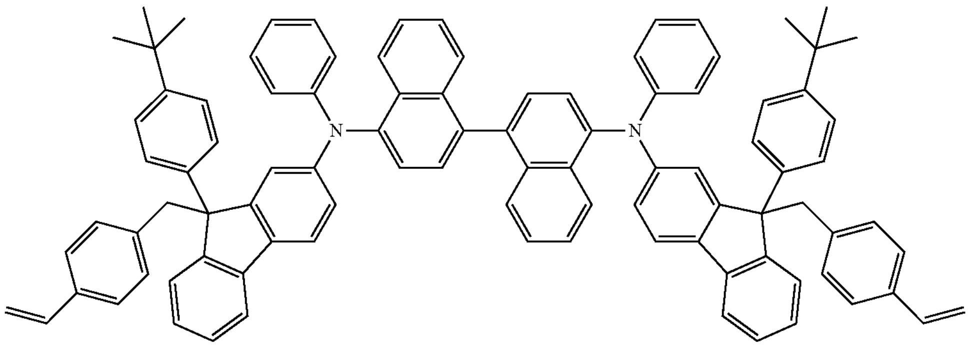
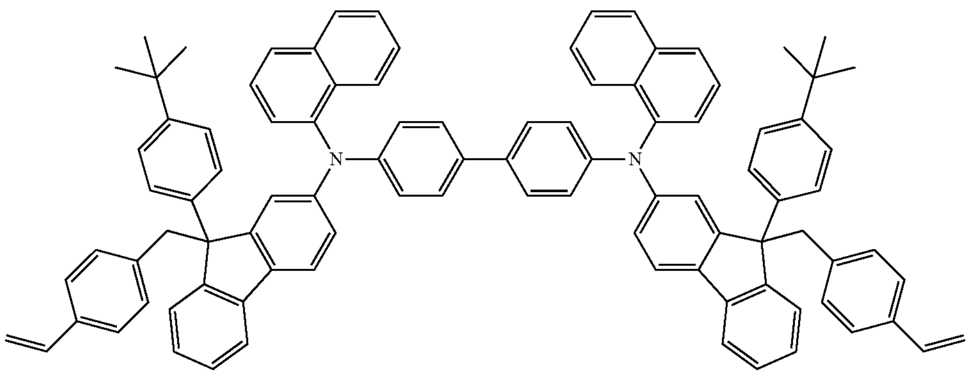
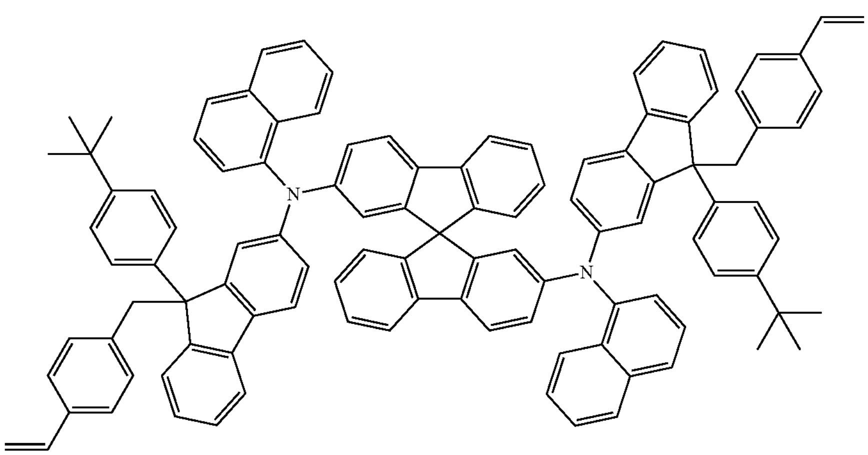
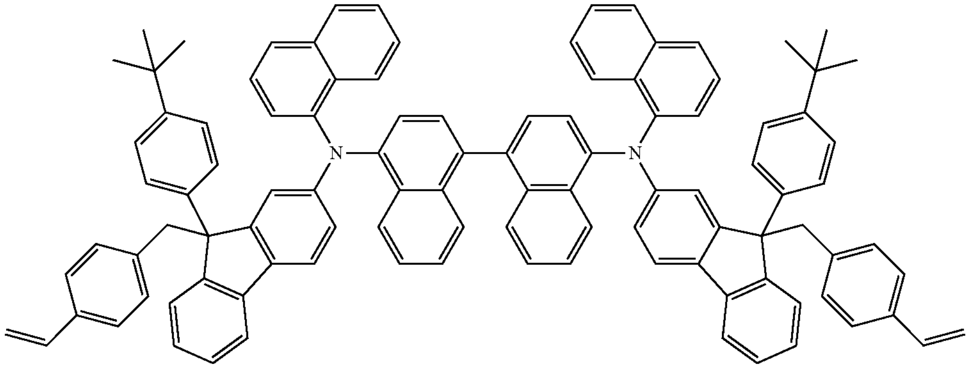

-continued
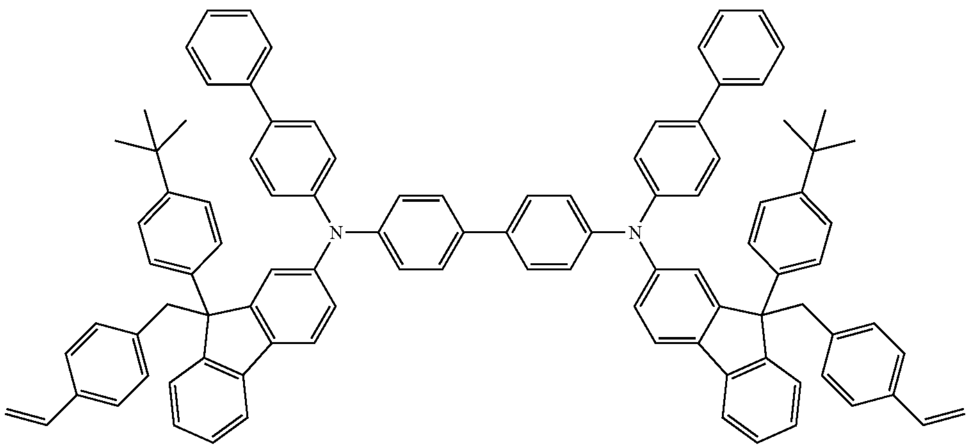
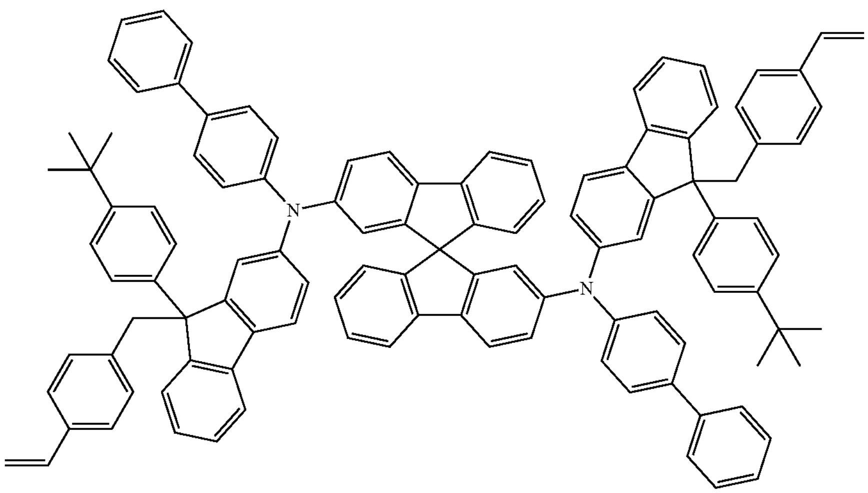
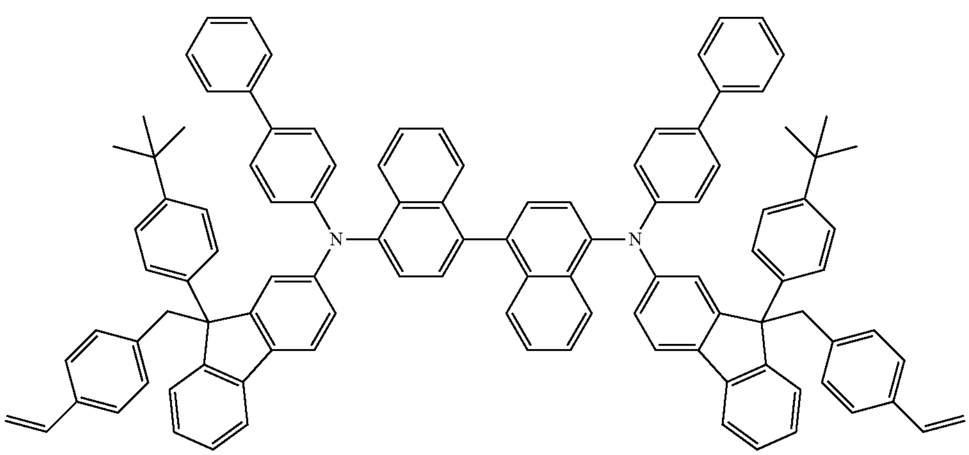

-continued
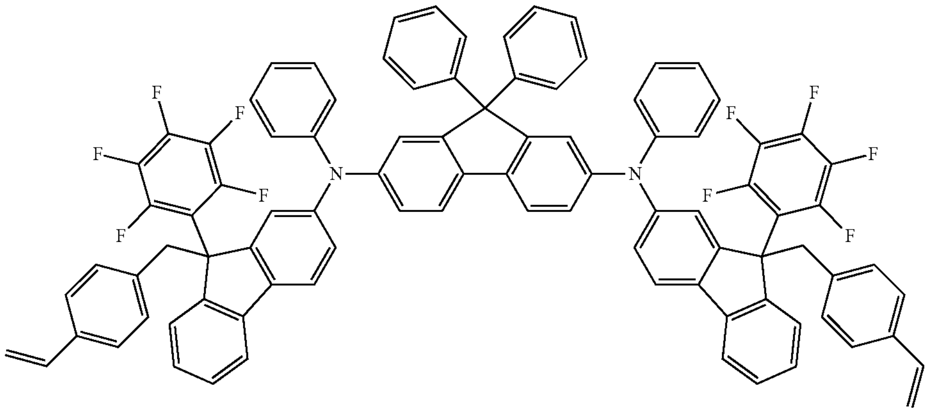
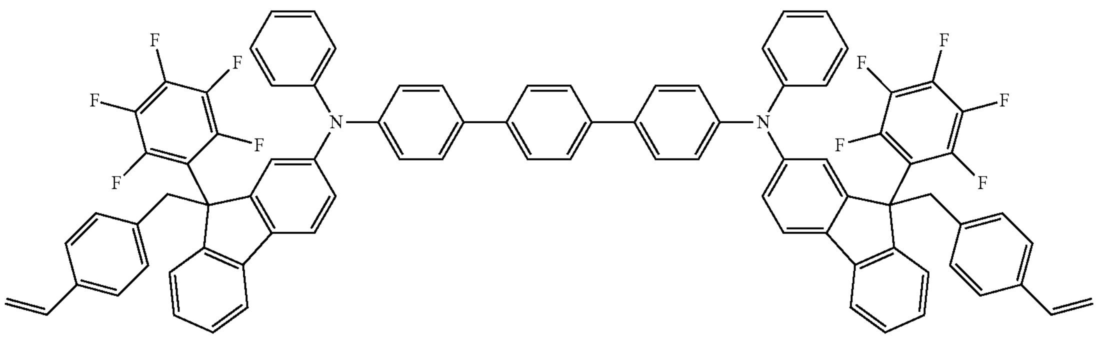
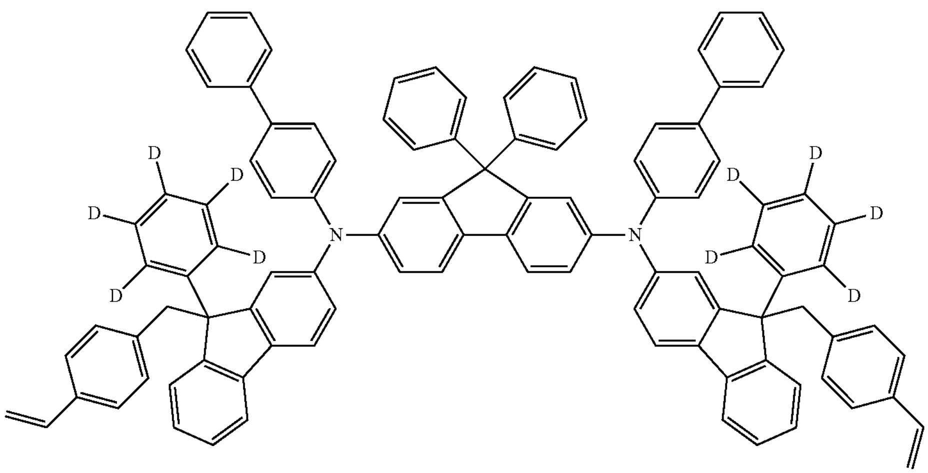
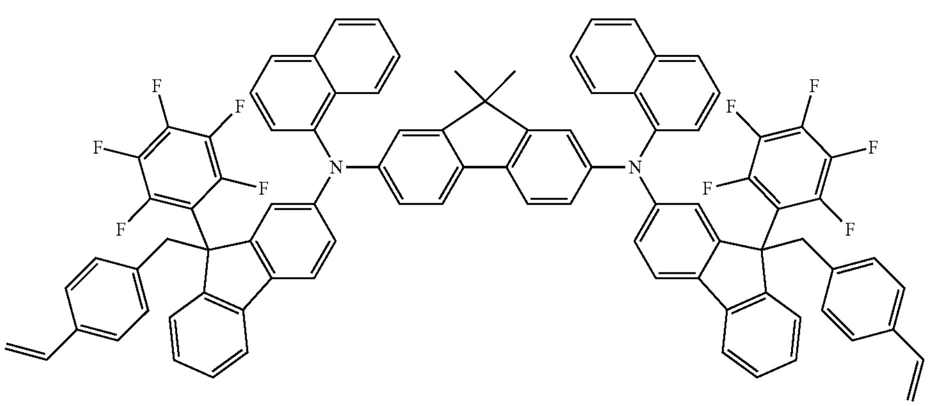

-continued
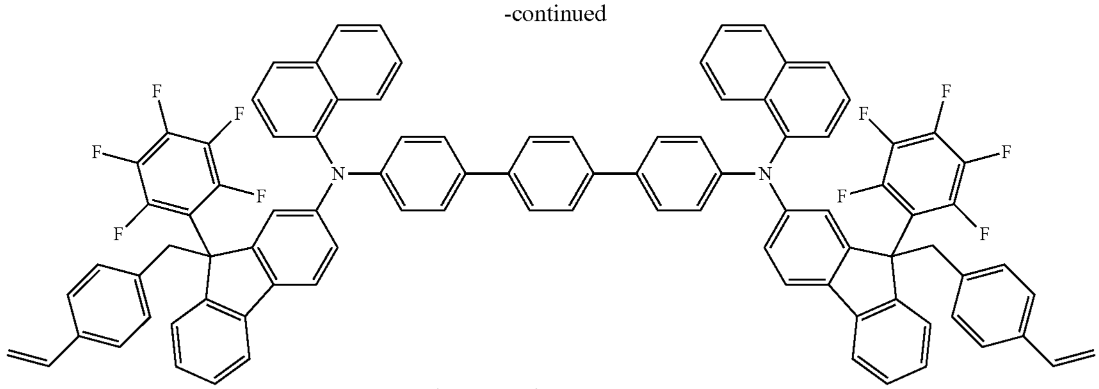
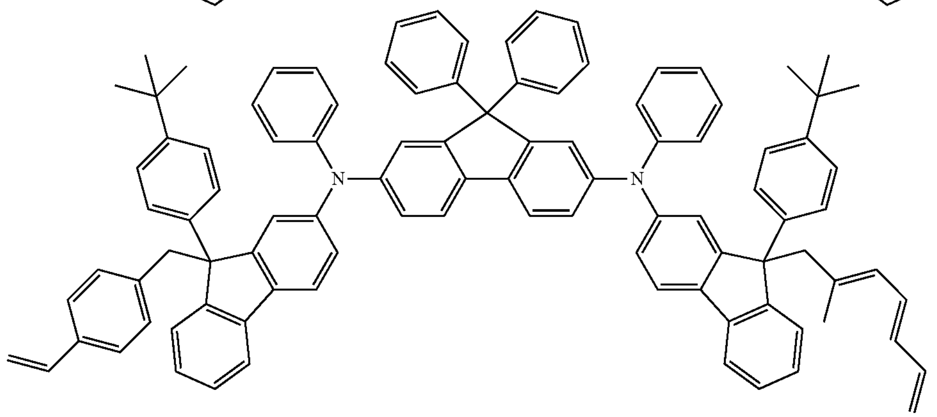
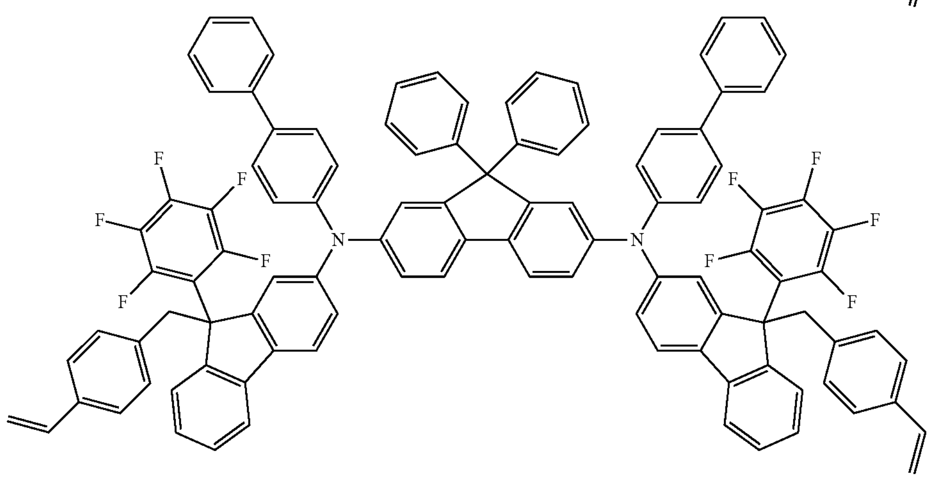
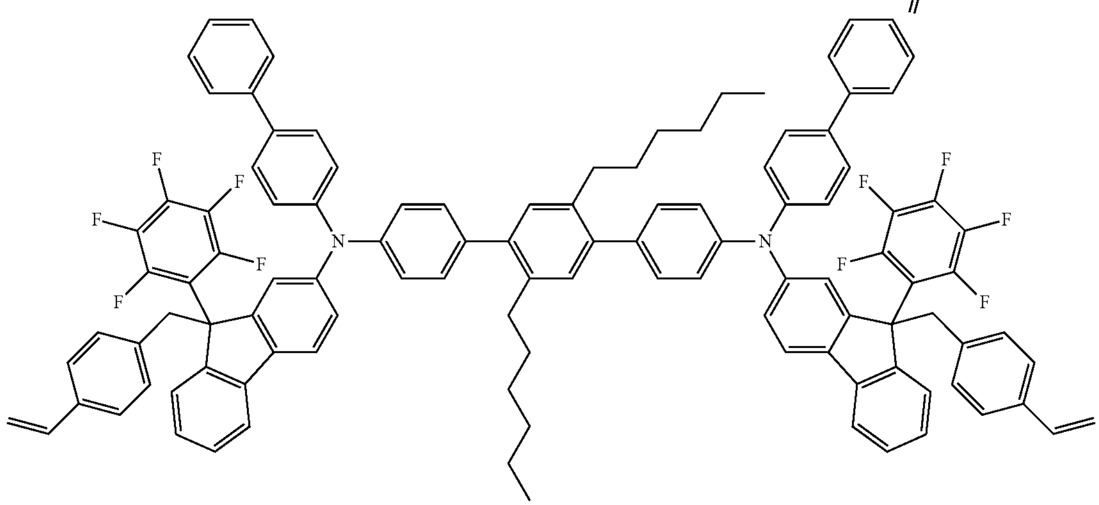

-continued
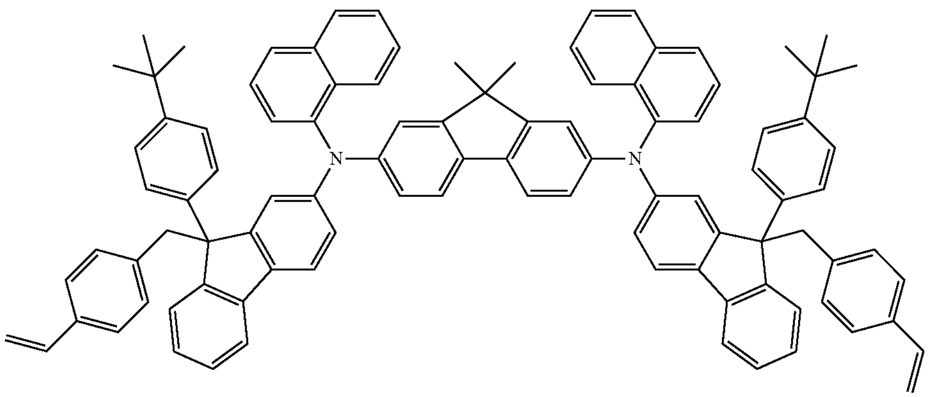
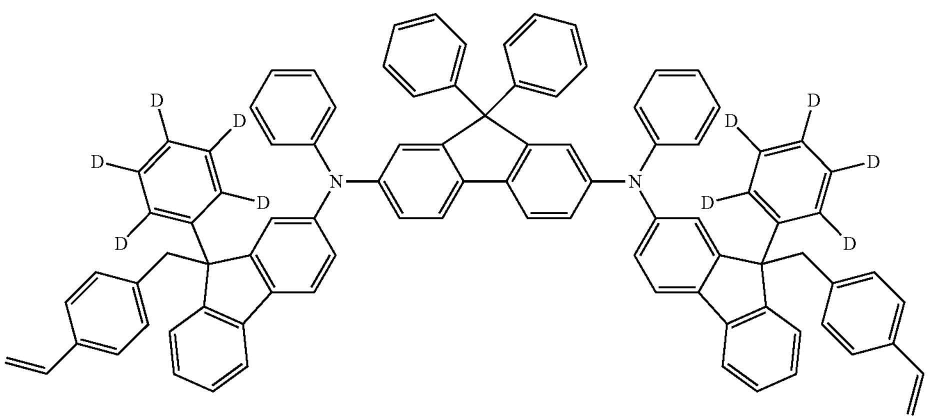
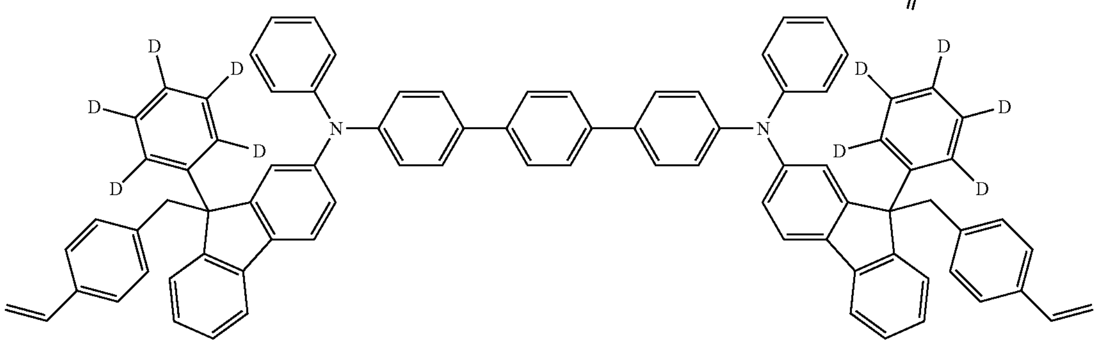
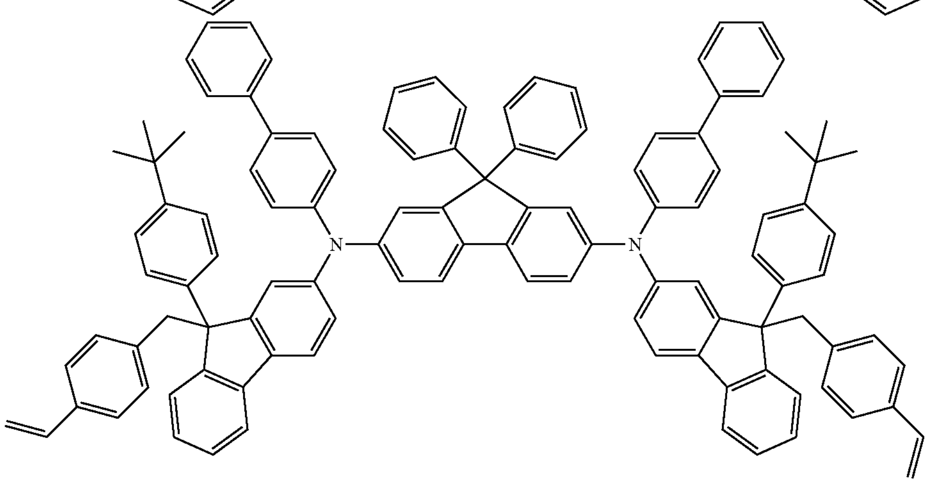

-continued
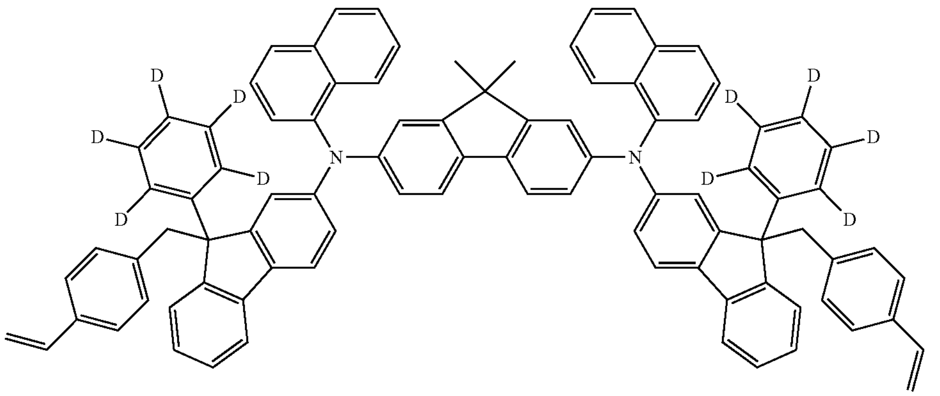
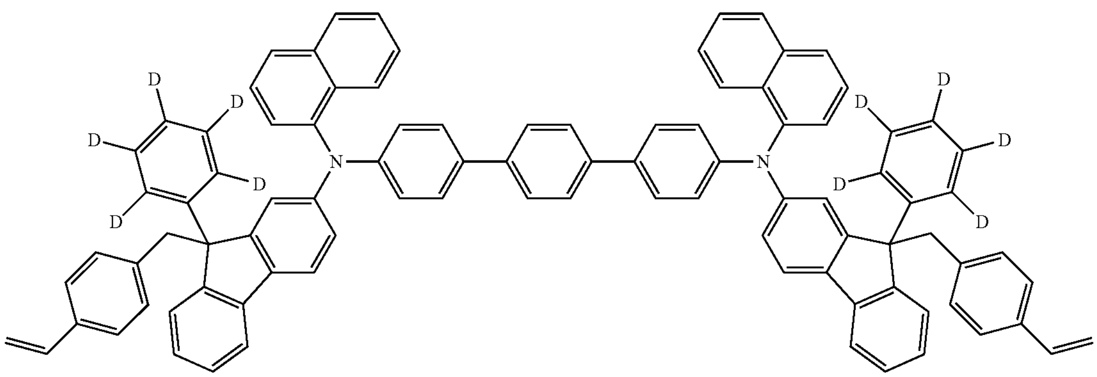
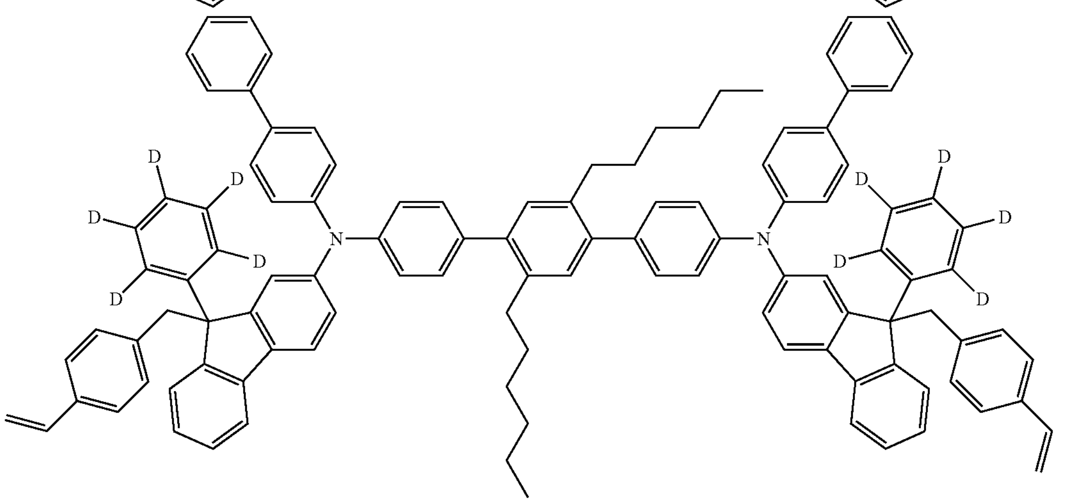
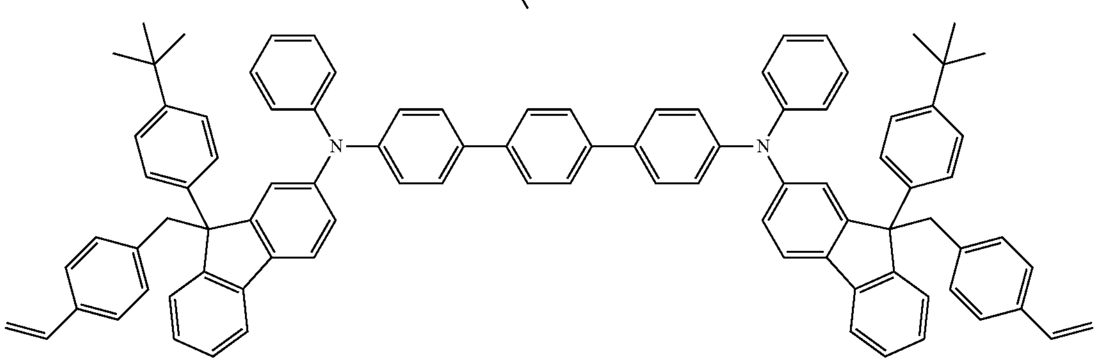

-continued
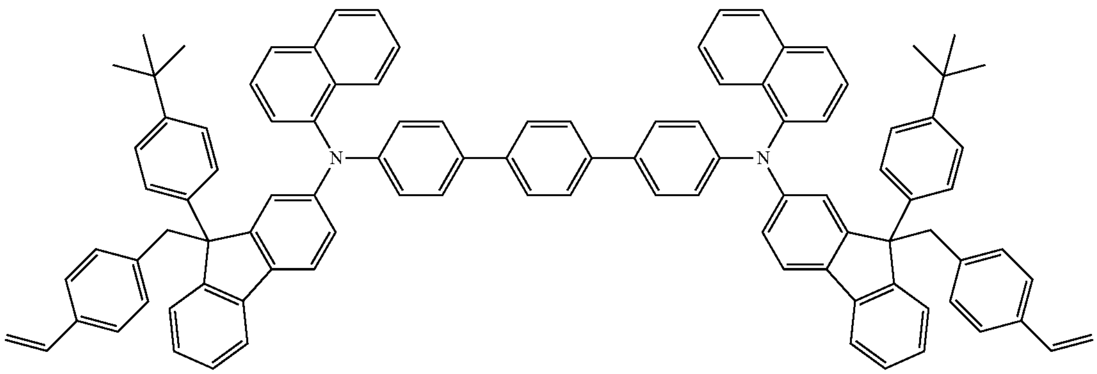
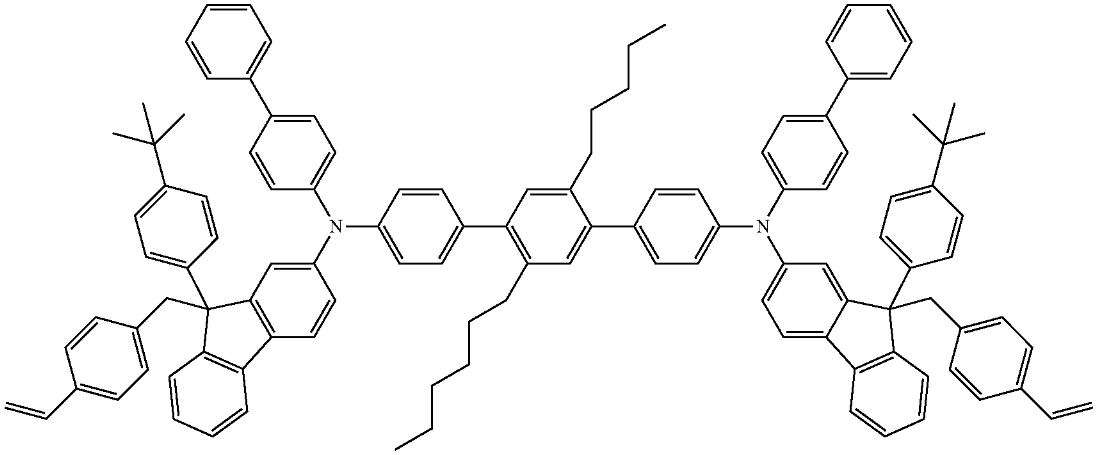
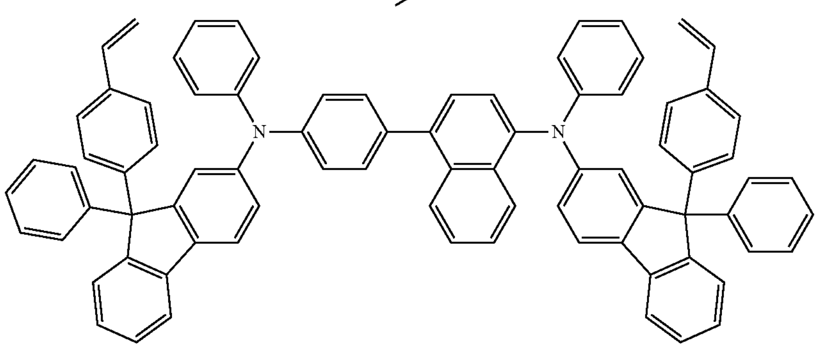
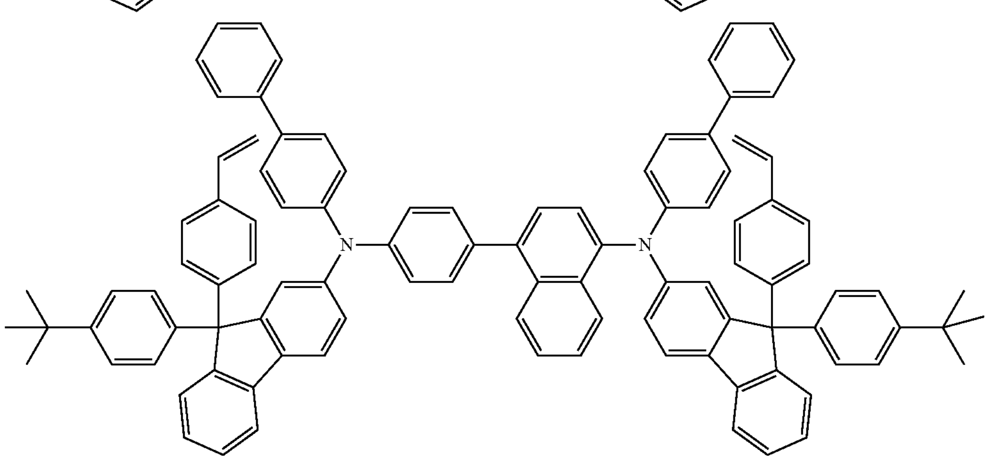

-continued
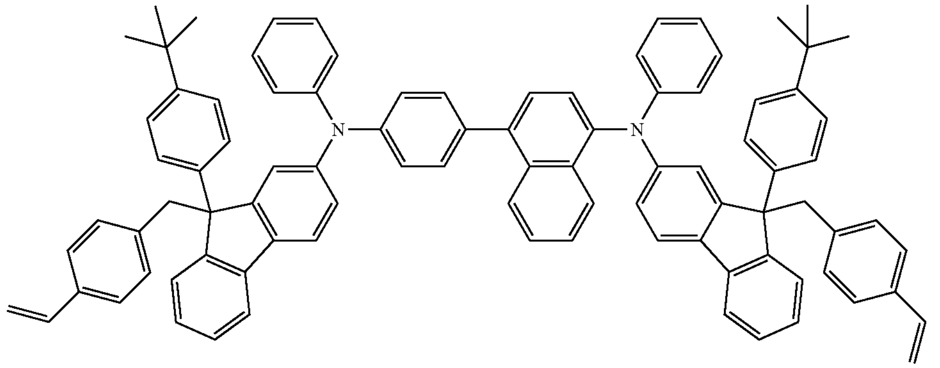
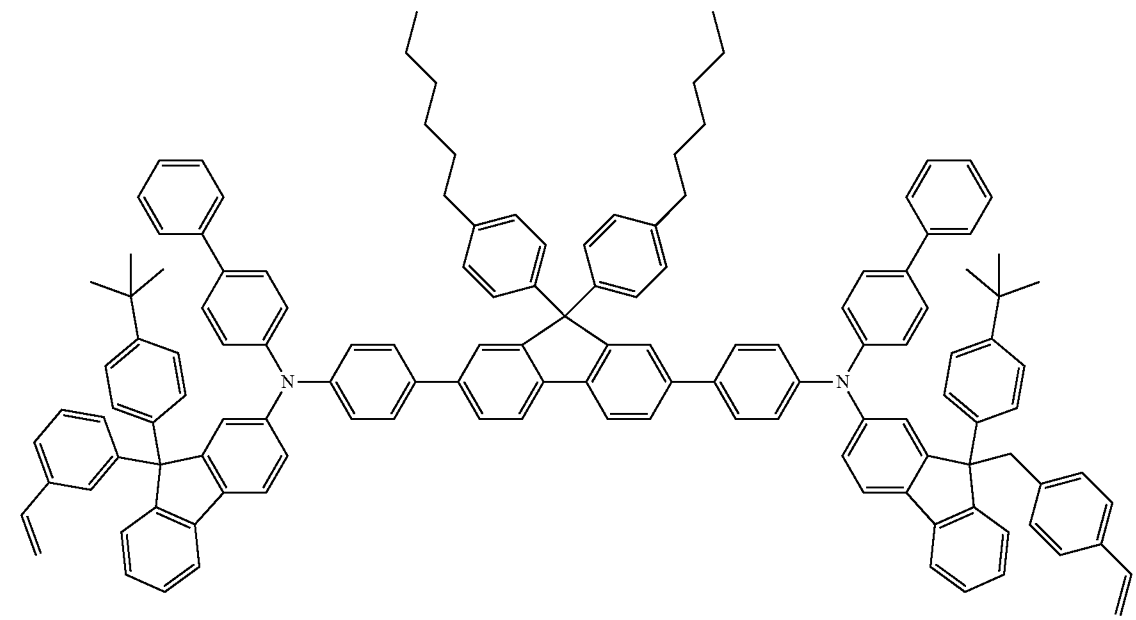
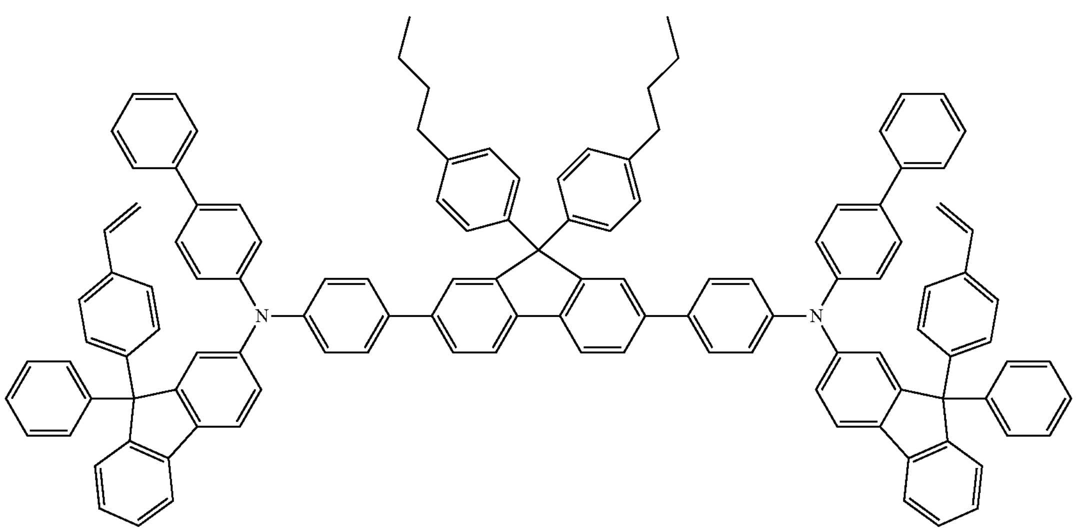

-continued
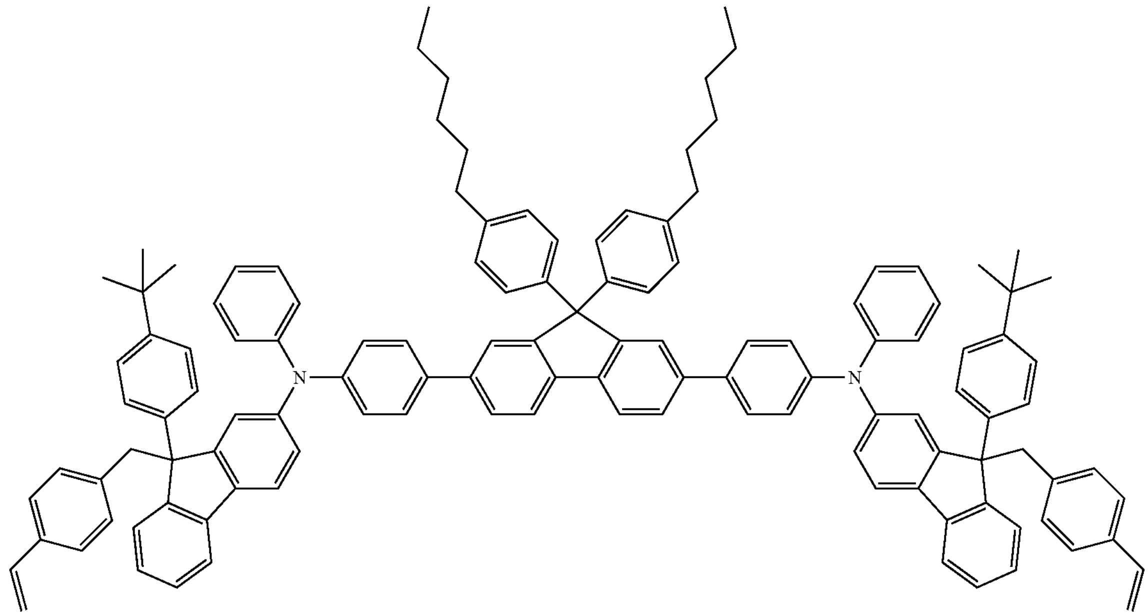
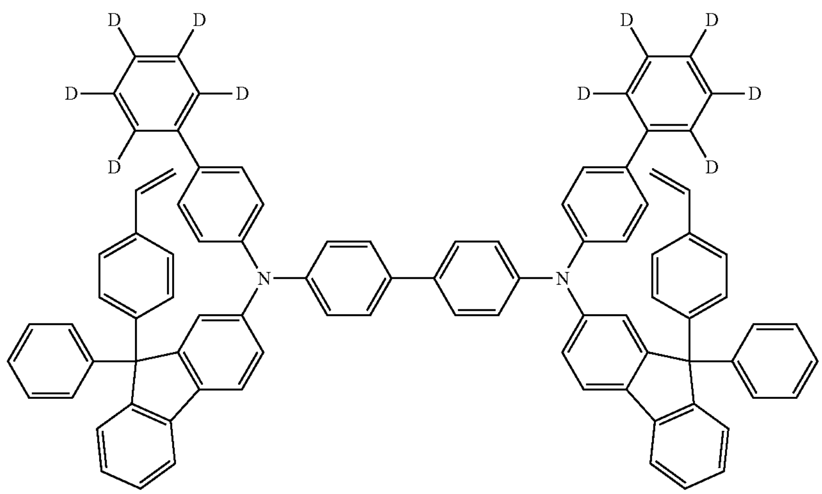
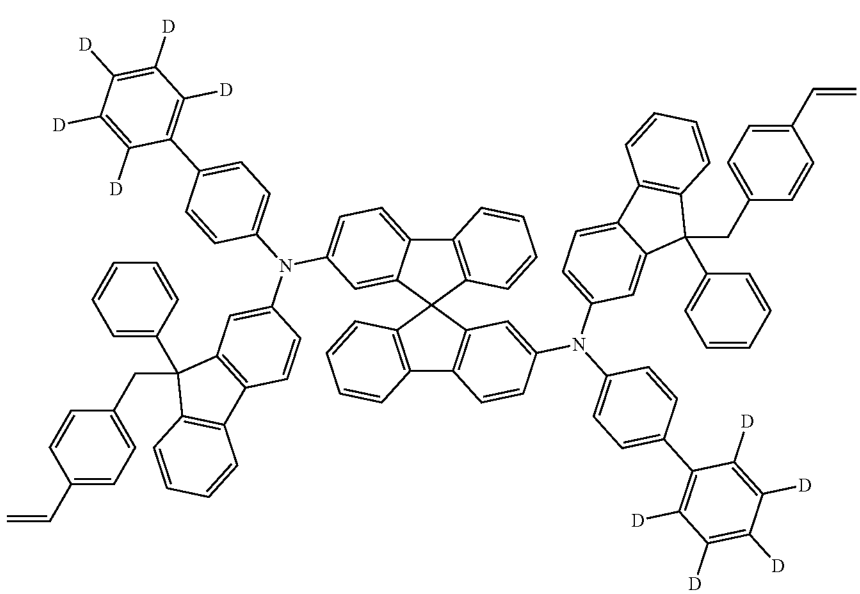

-continued
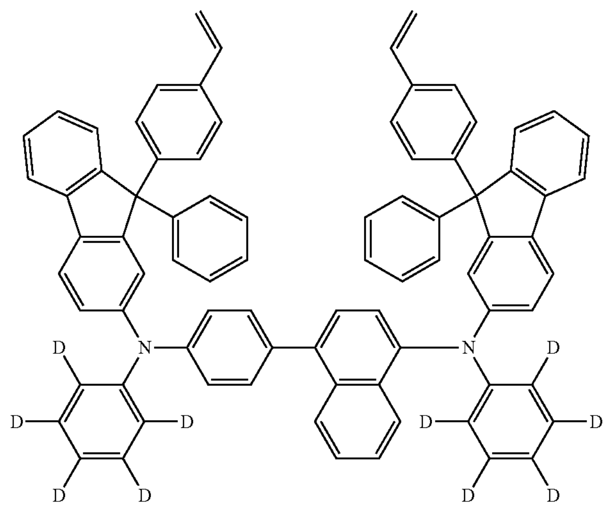
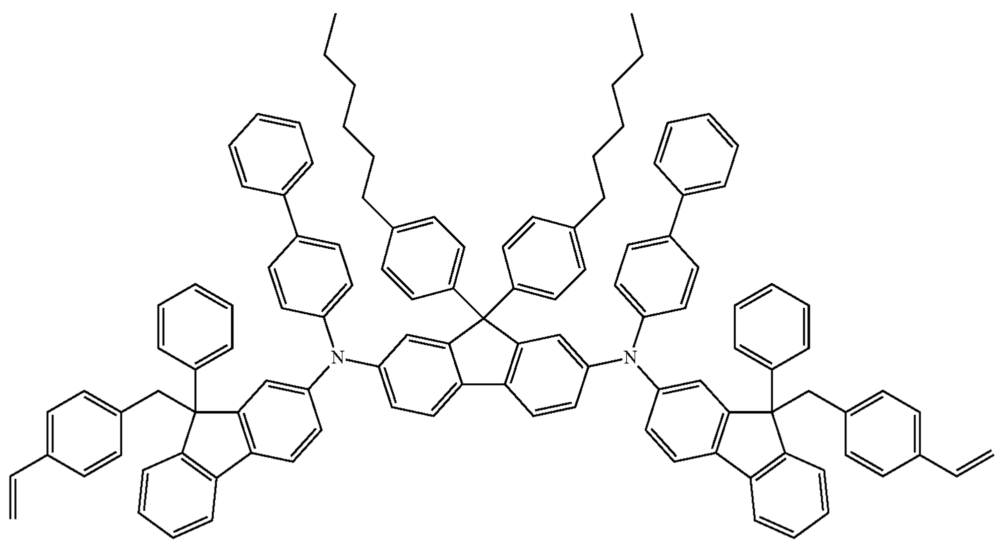
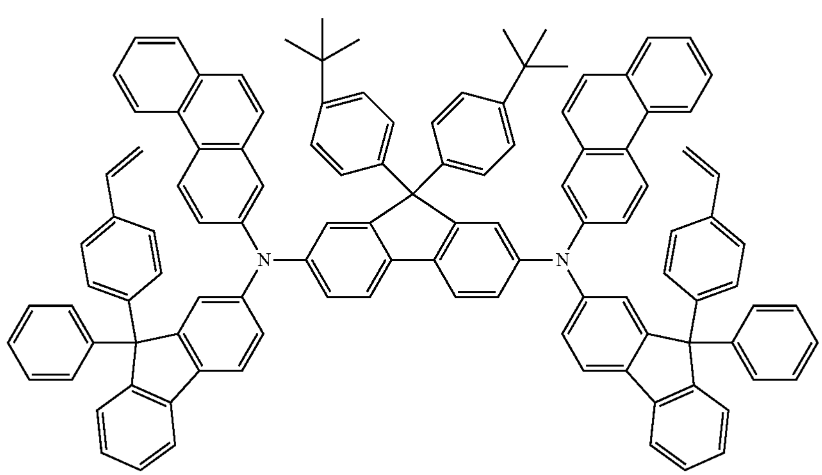

-continued
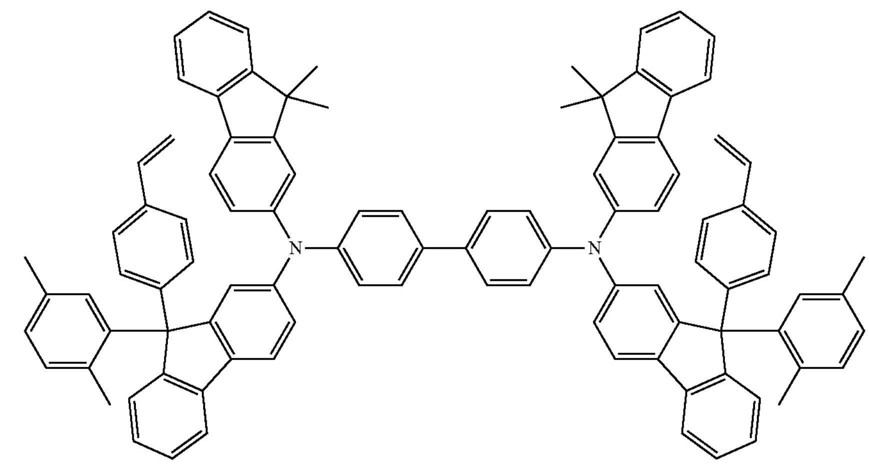
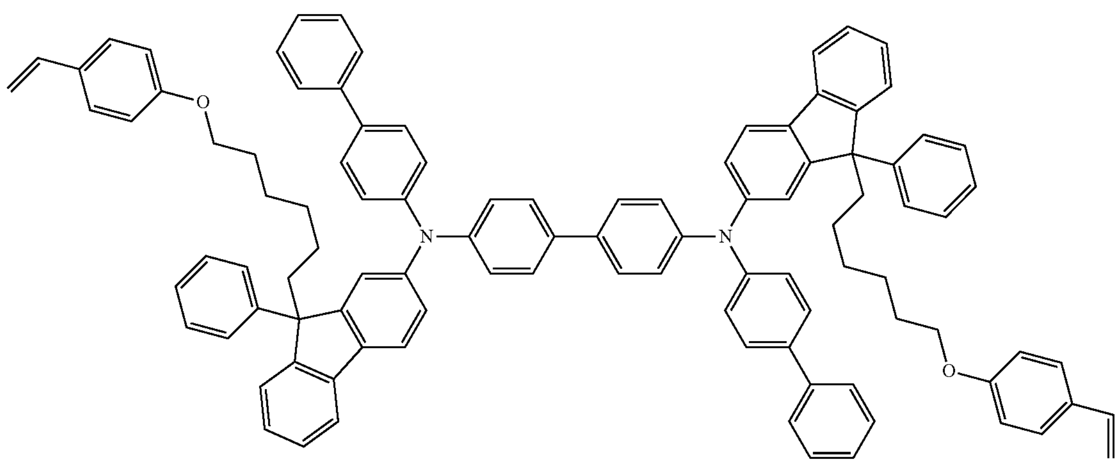
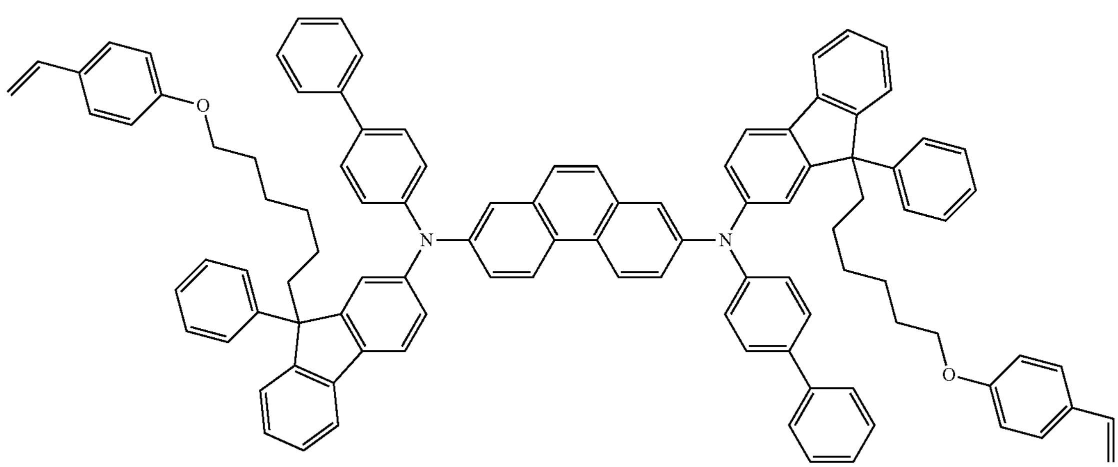

-continued
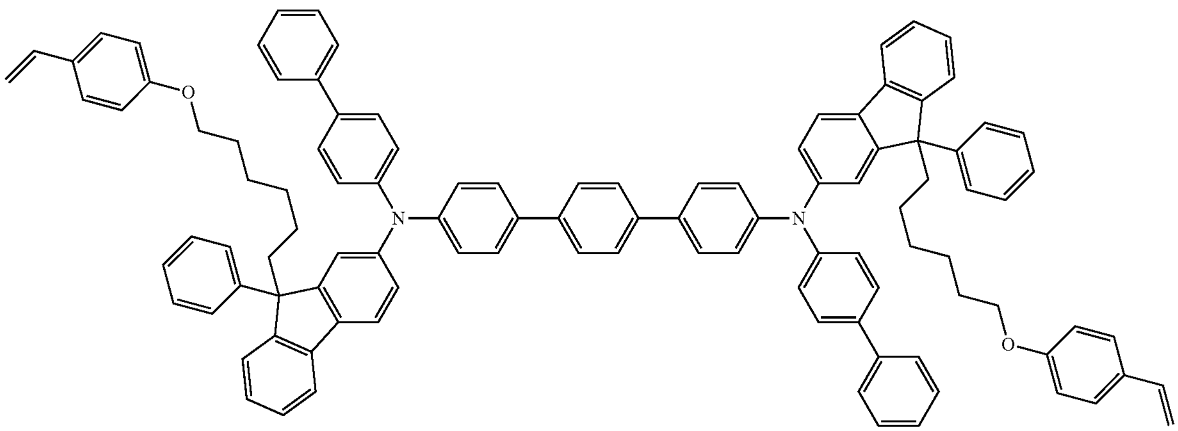
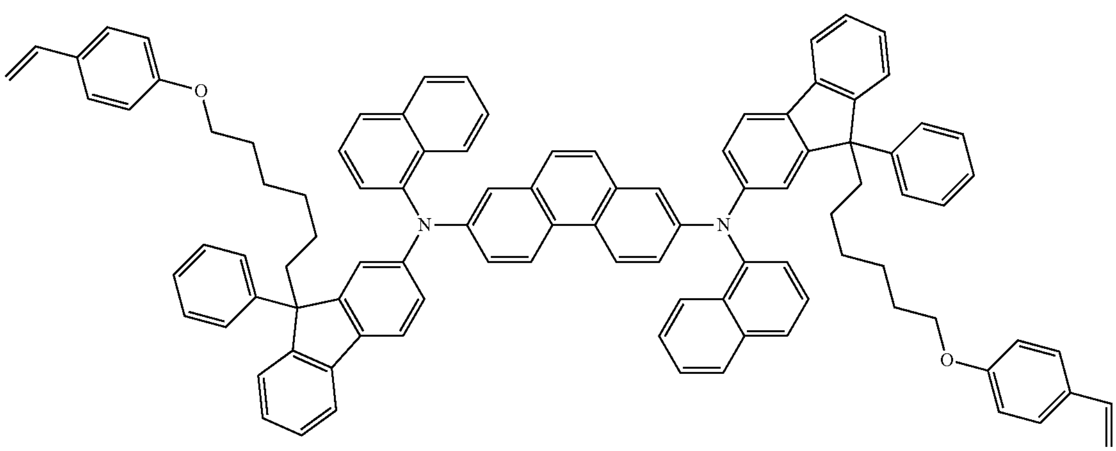
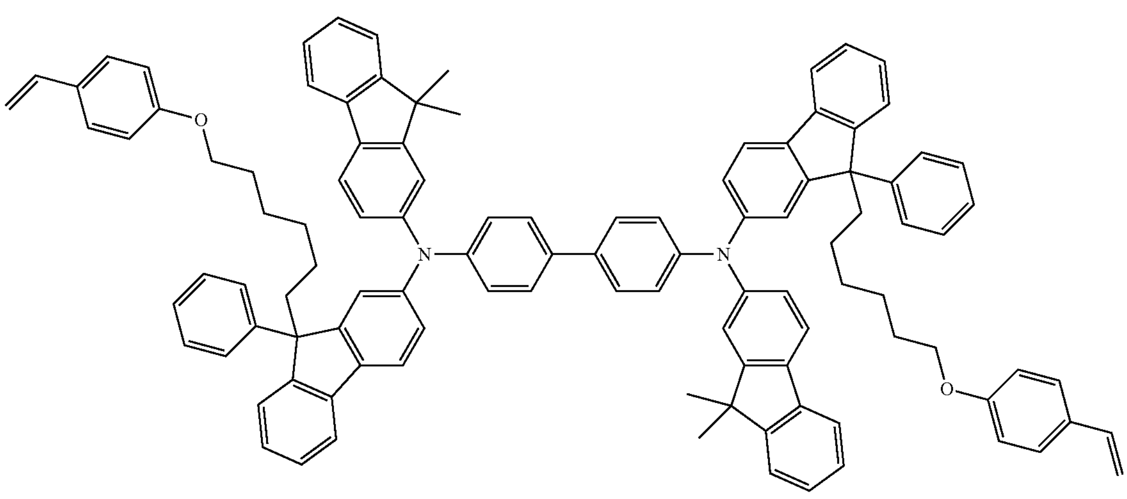

-continued
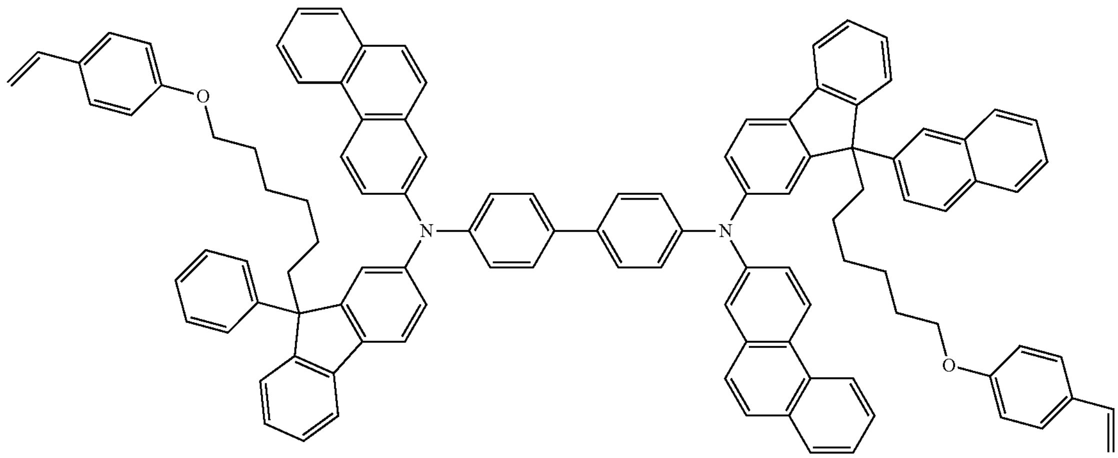
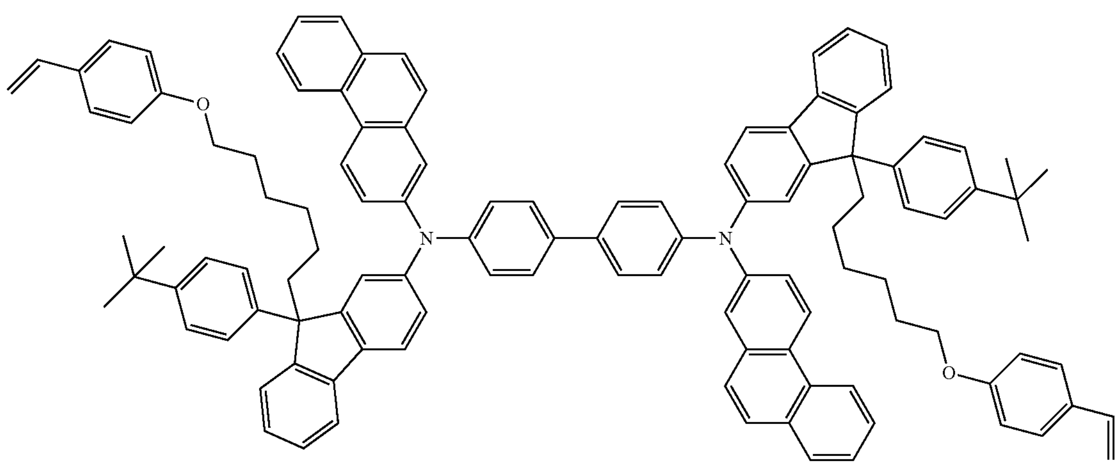
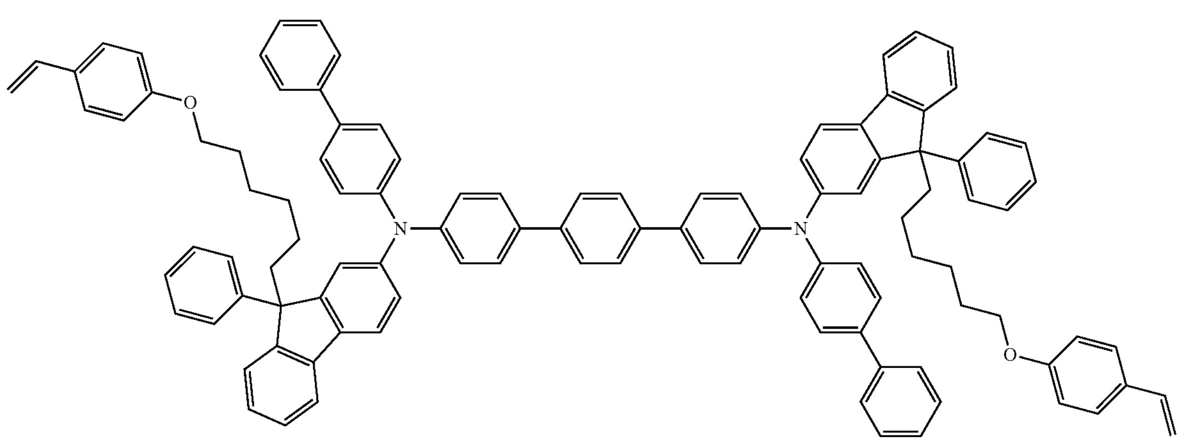

-continued
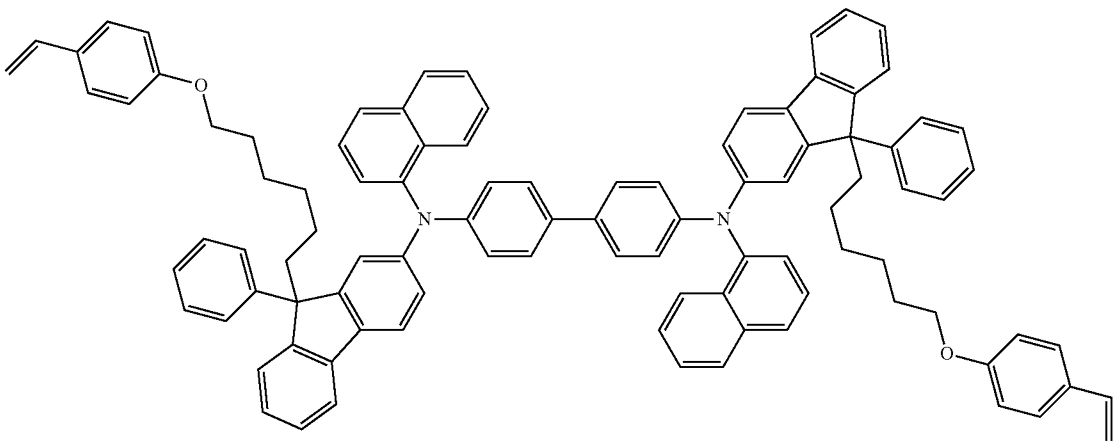
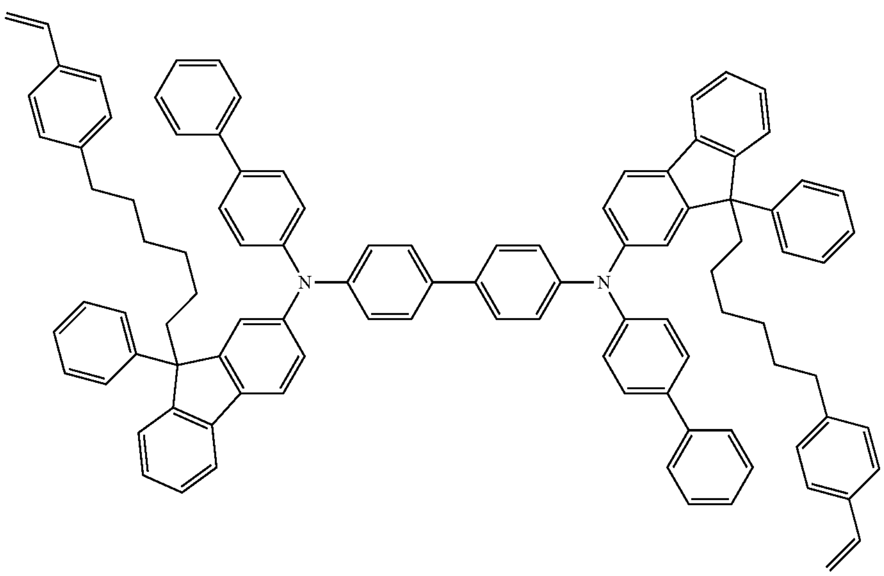
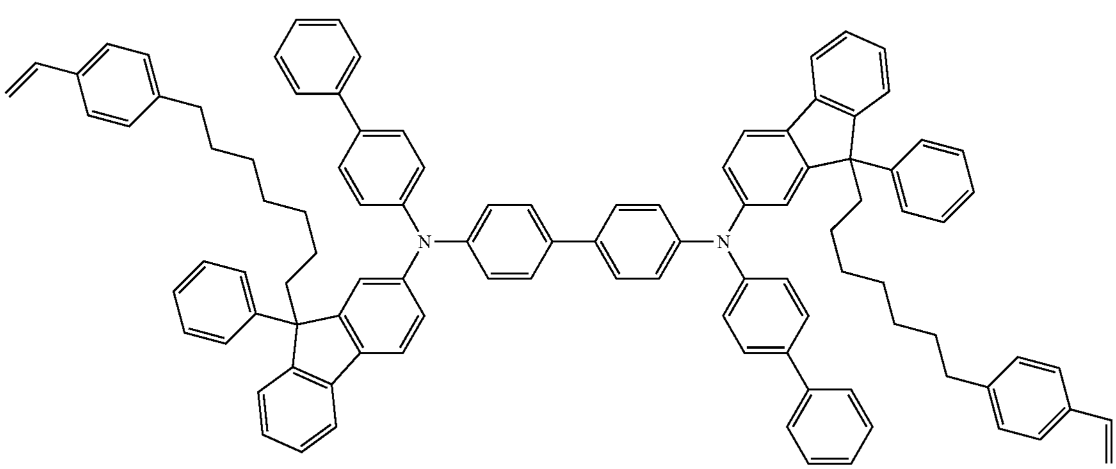

-continued
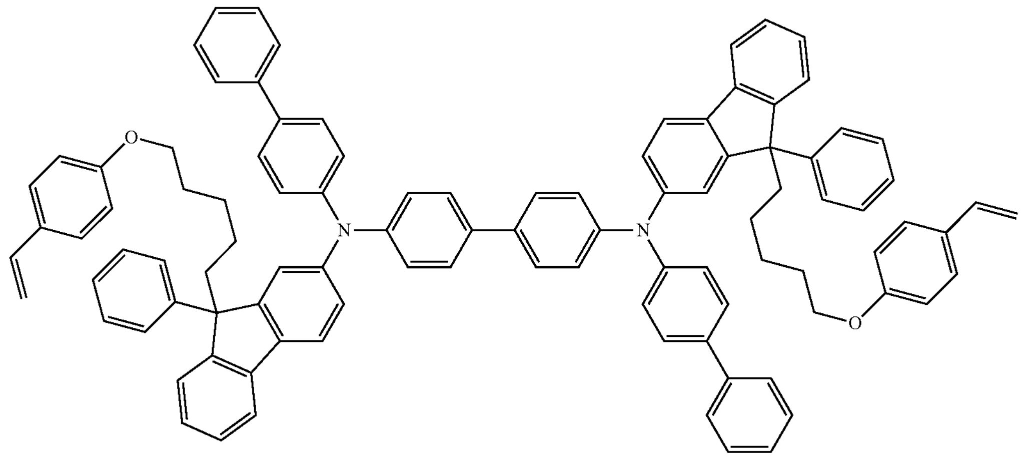
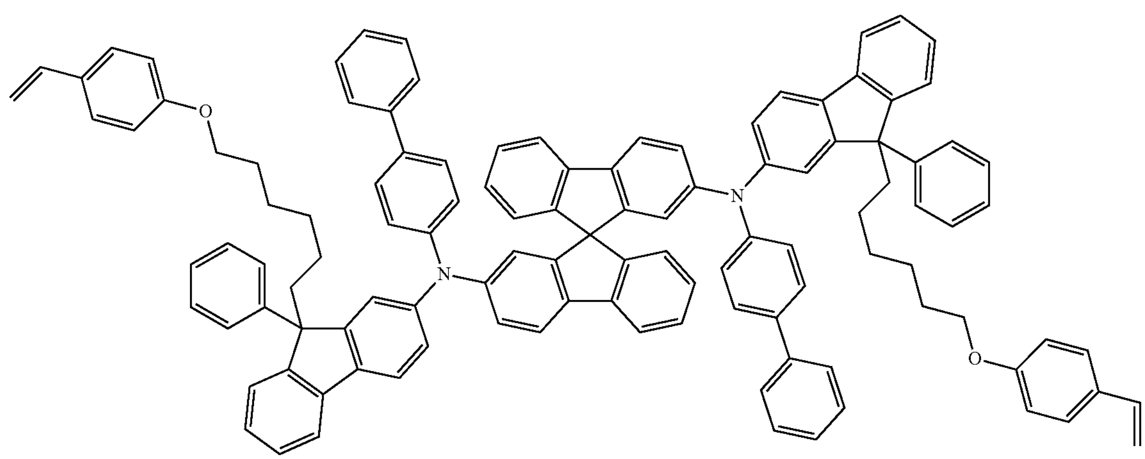
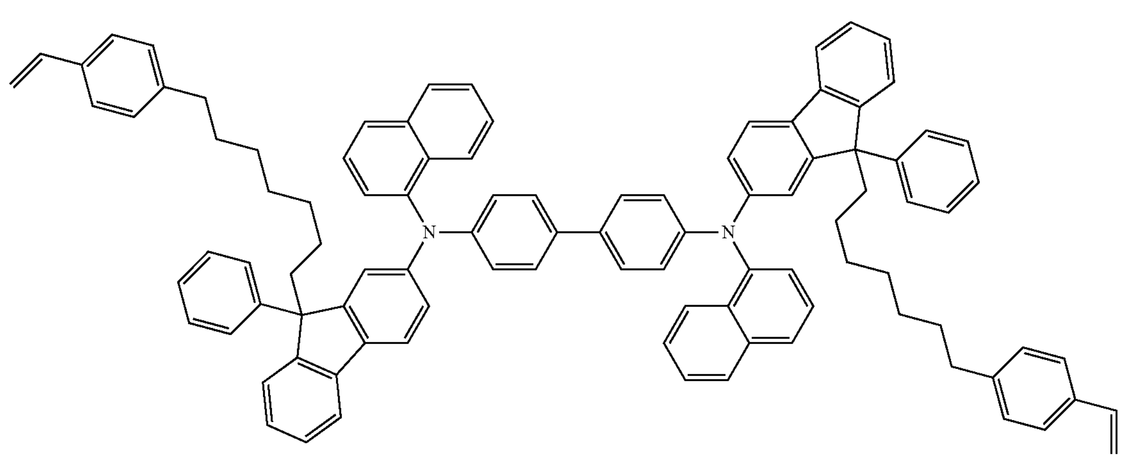

-continued
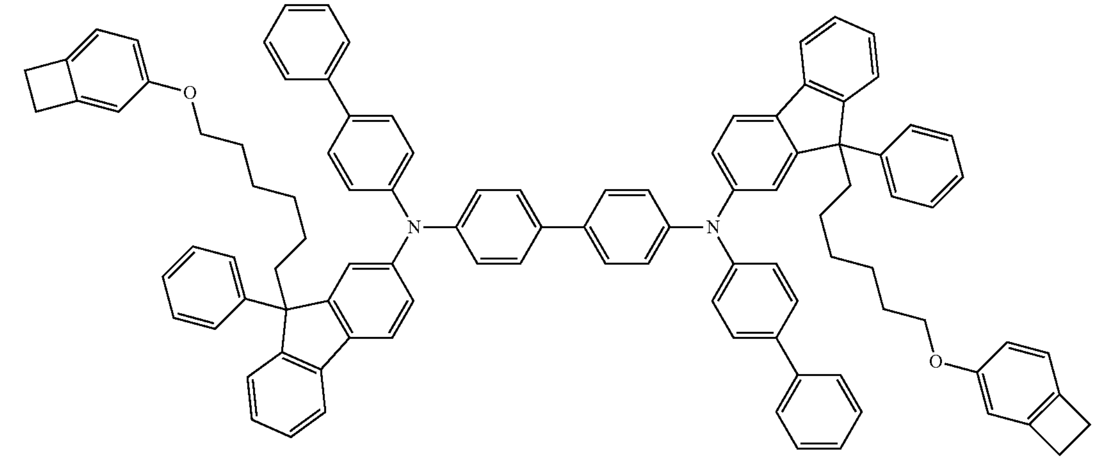
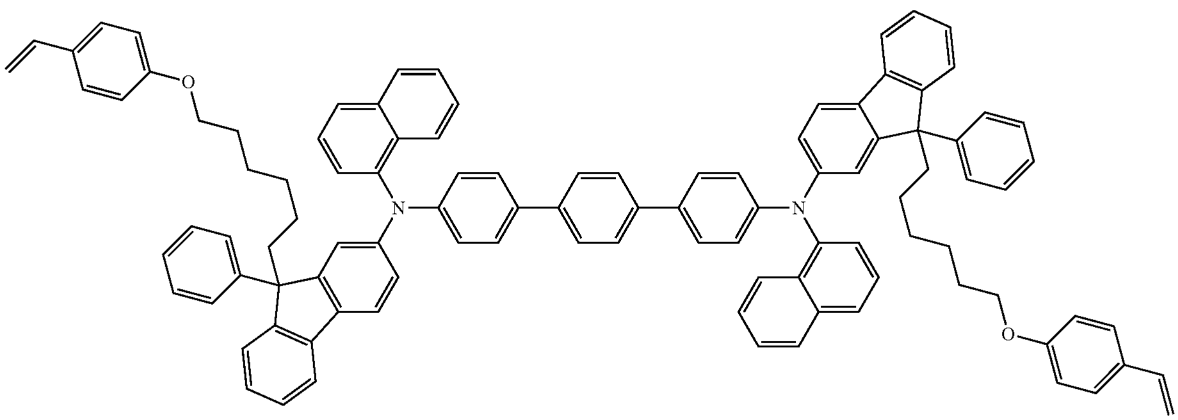
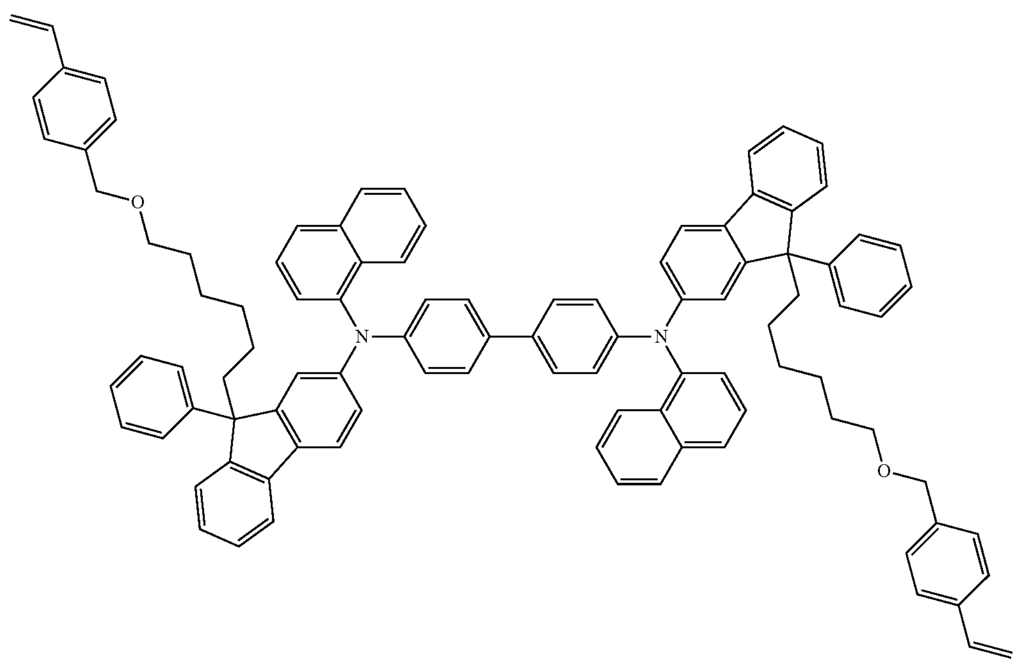

-continued
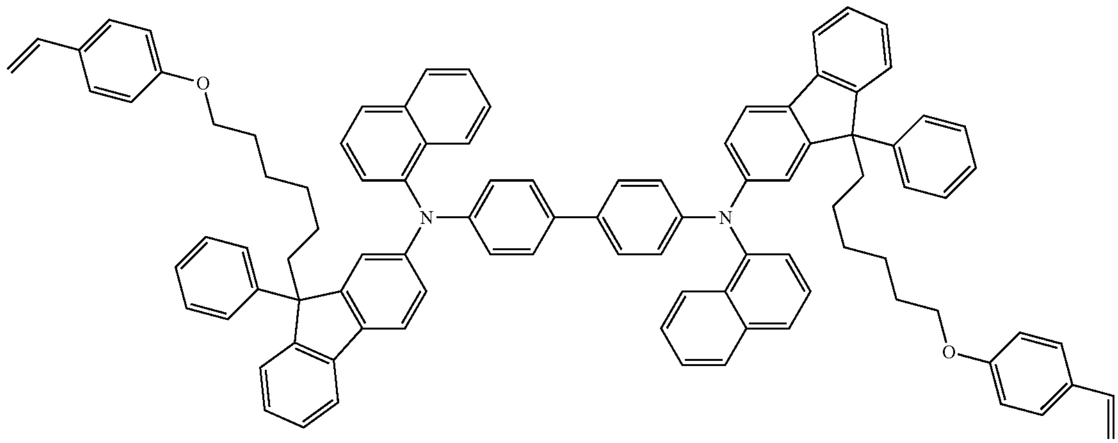
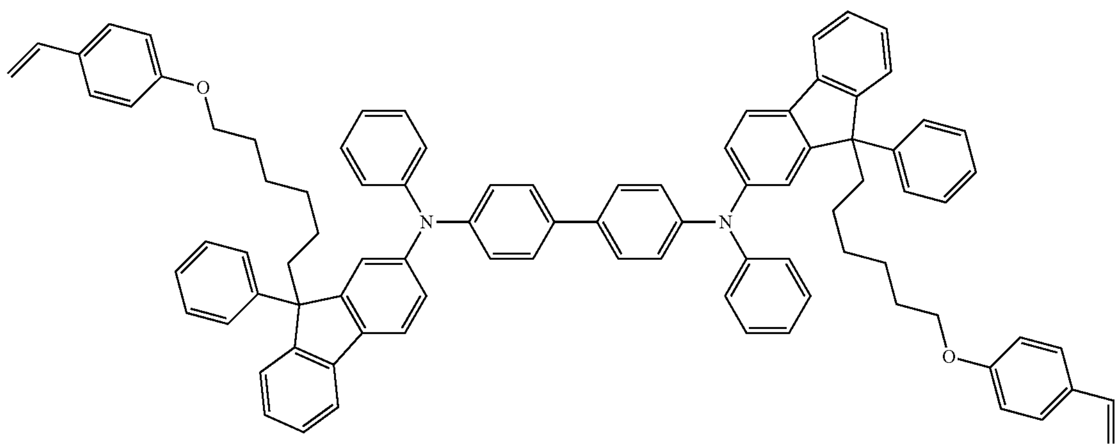
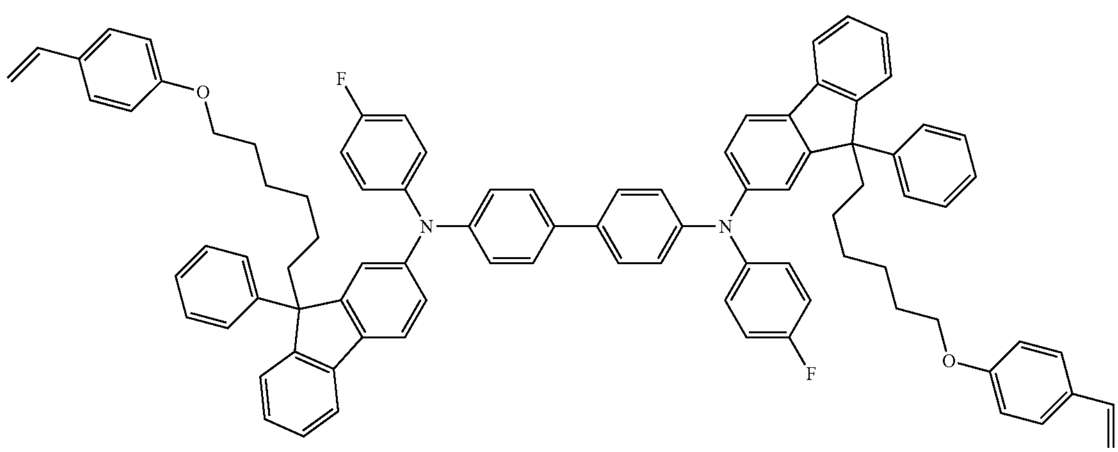

-continued
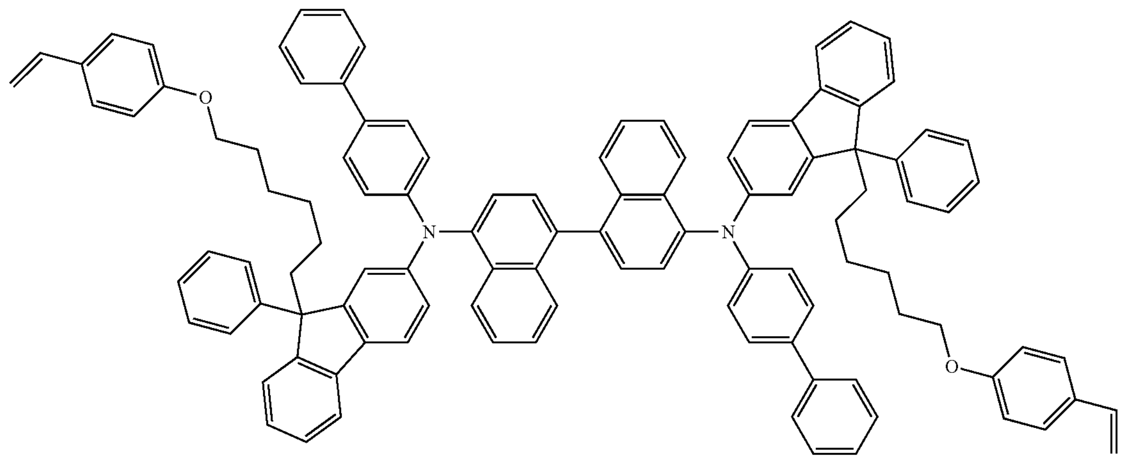
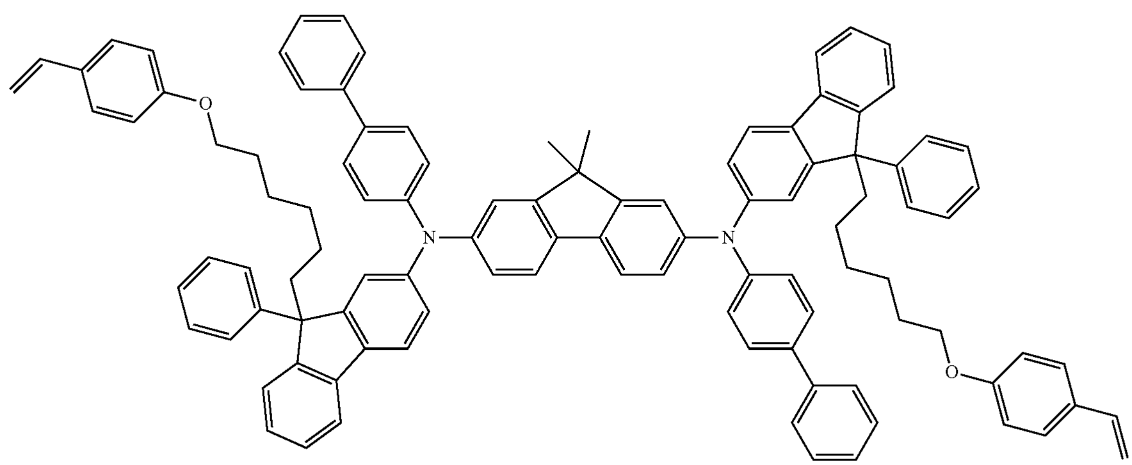
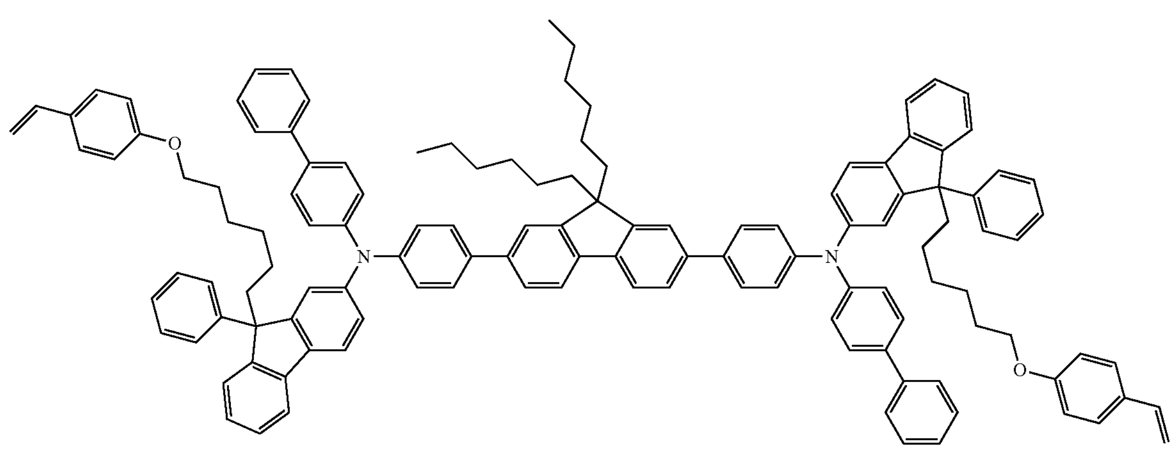

-continued
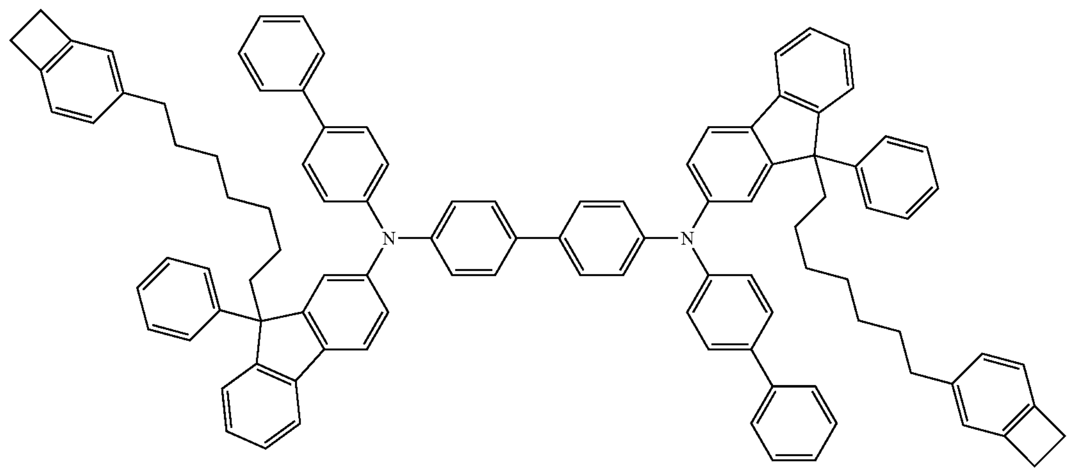
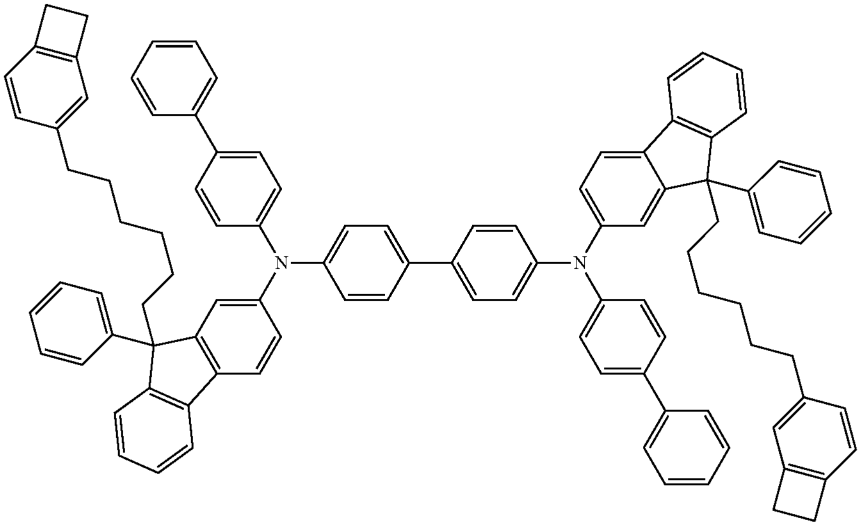
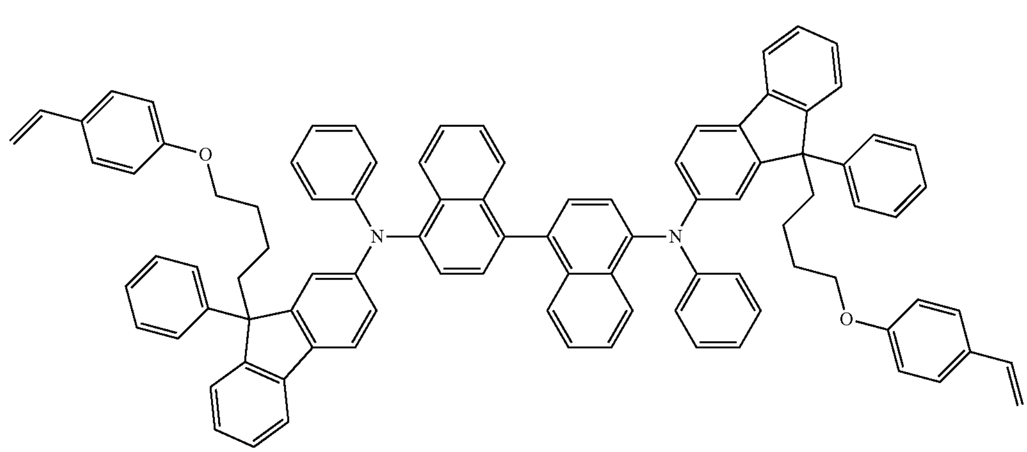

-continued
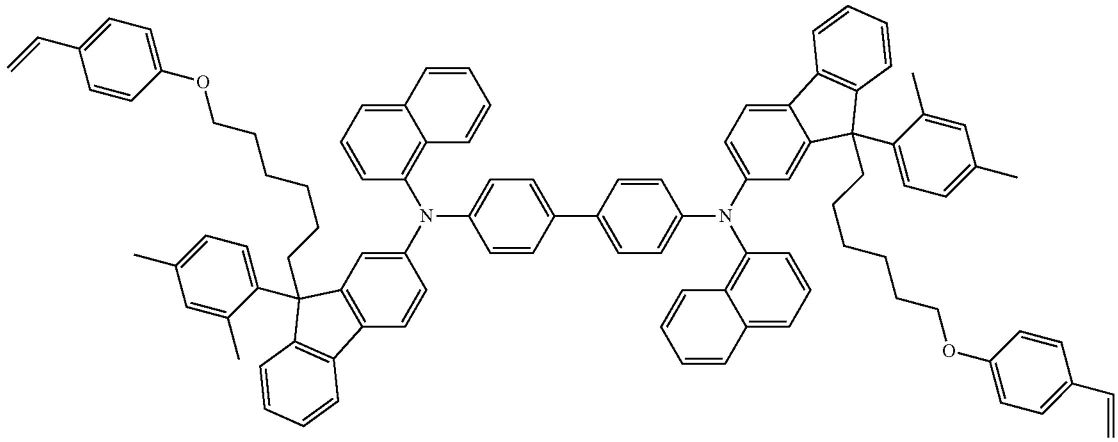
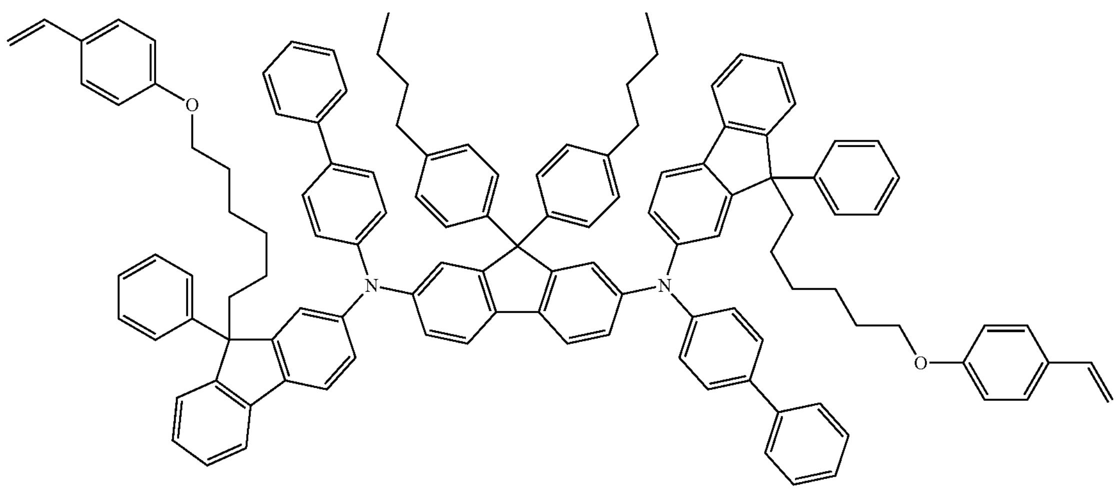
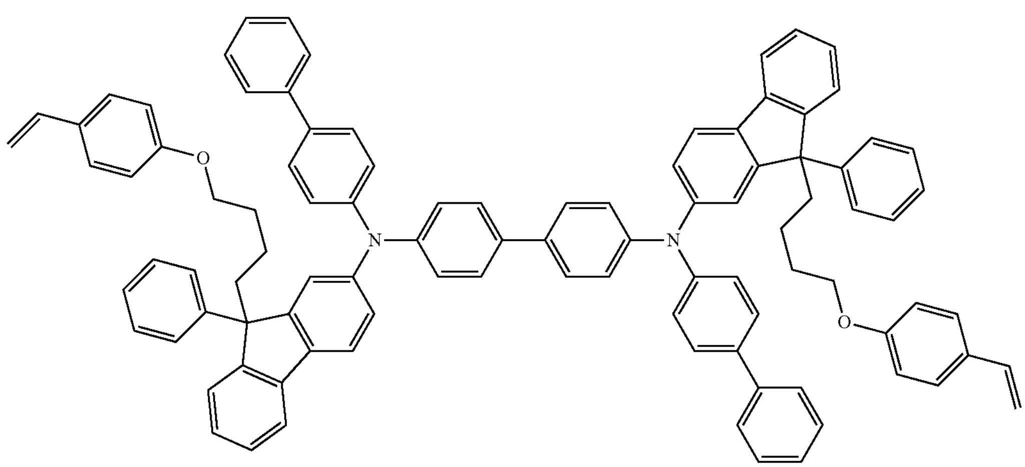

-continued
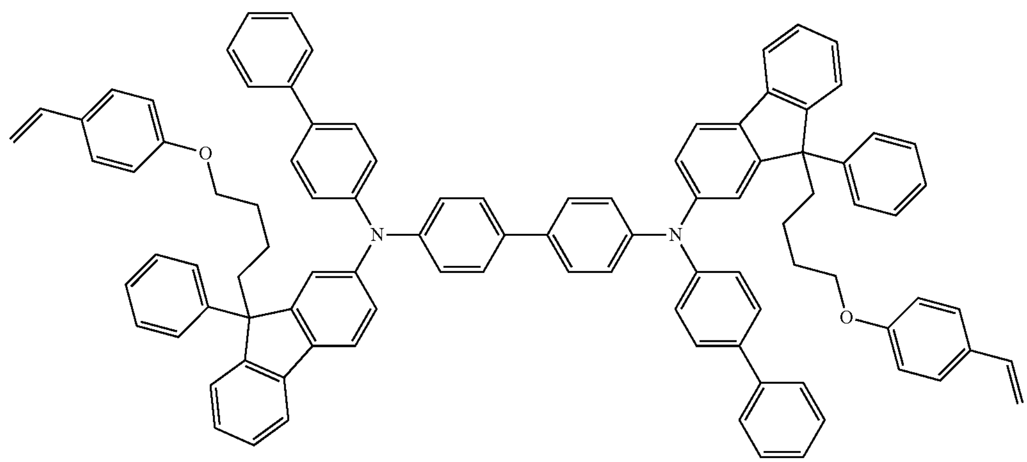
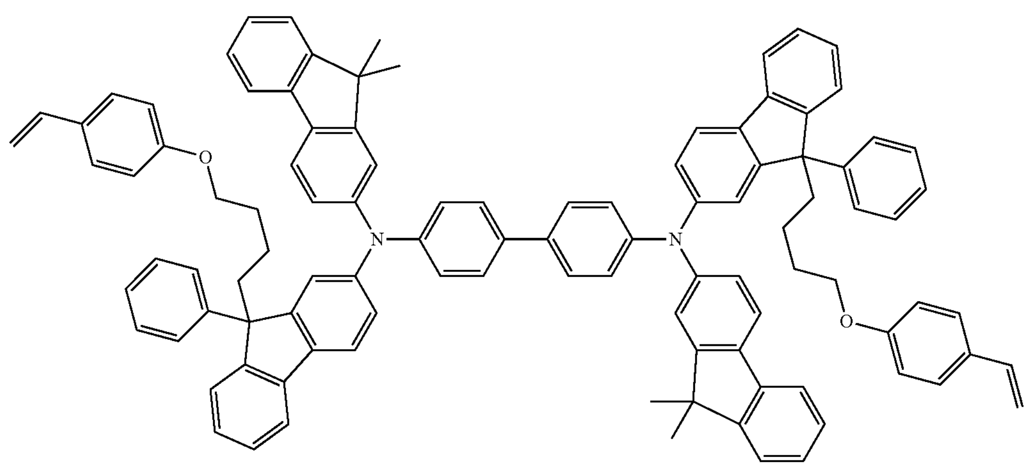
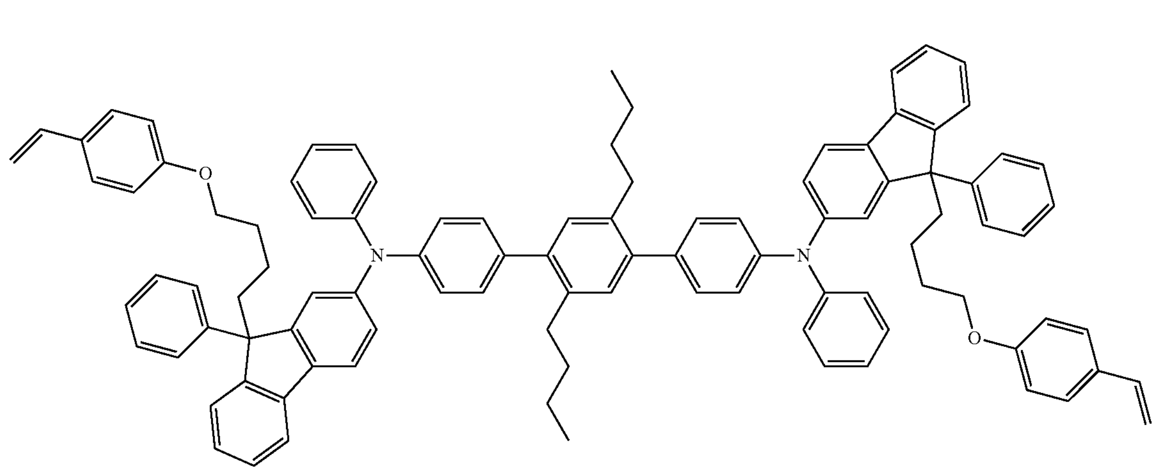

-continued
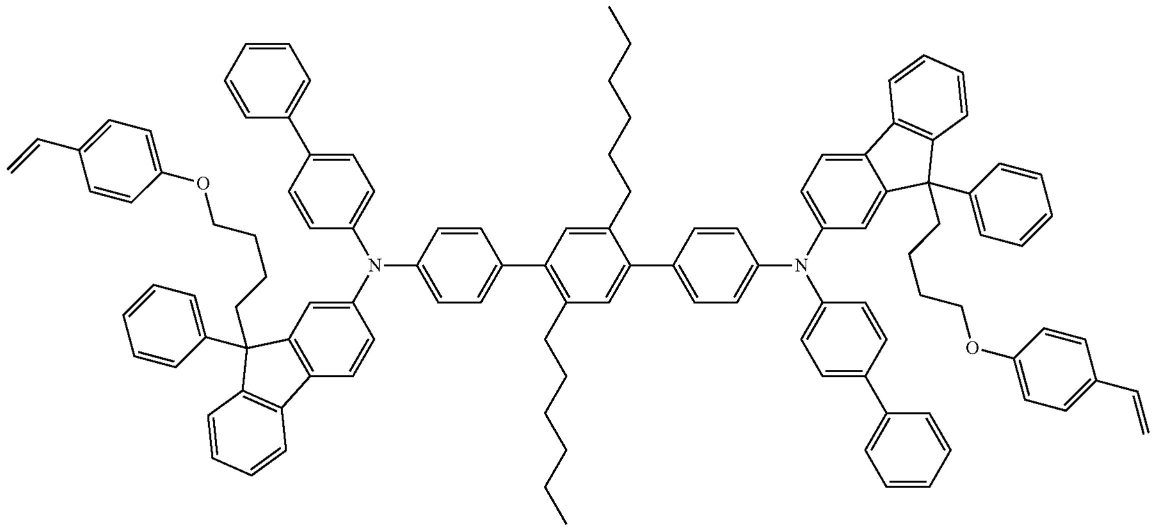
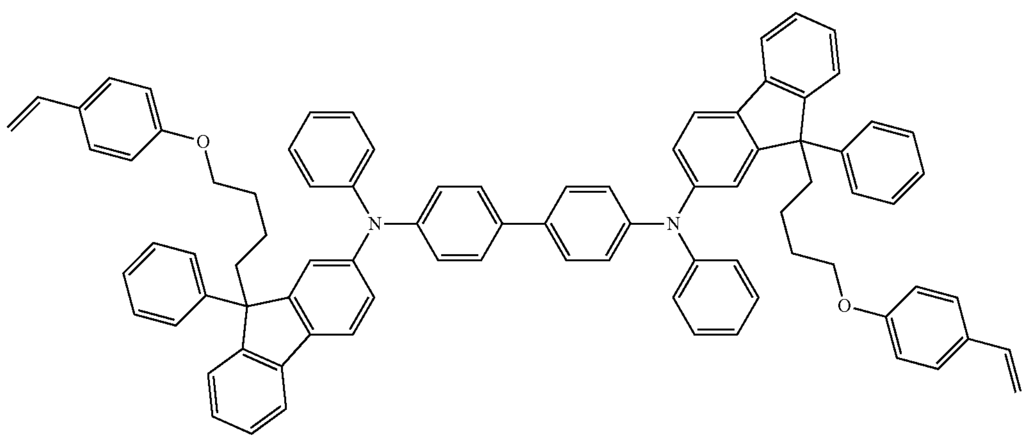
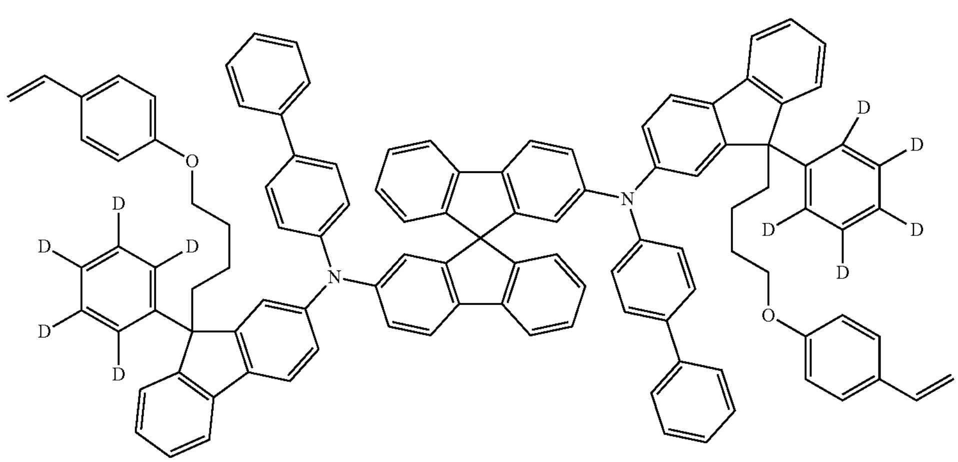

-continued
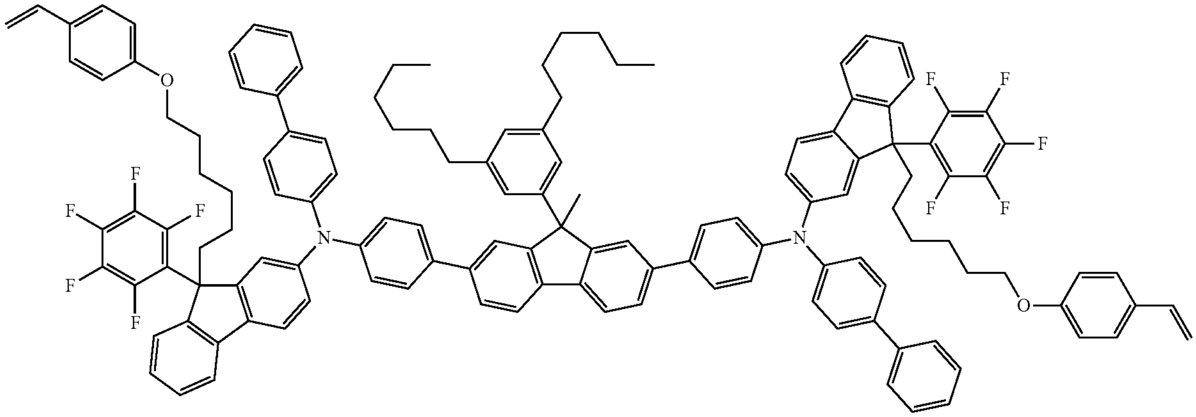
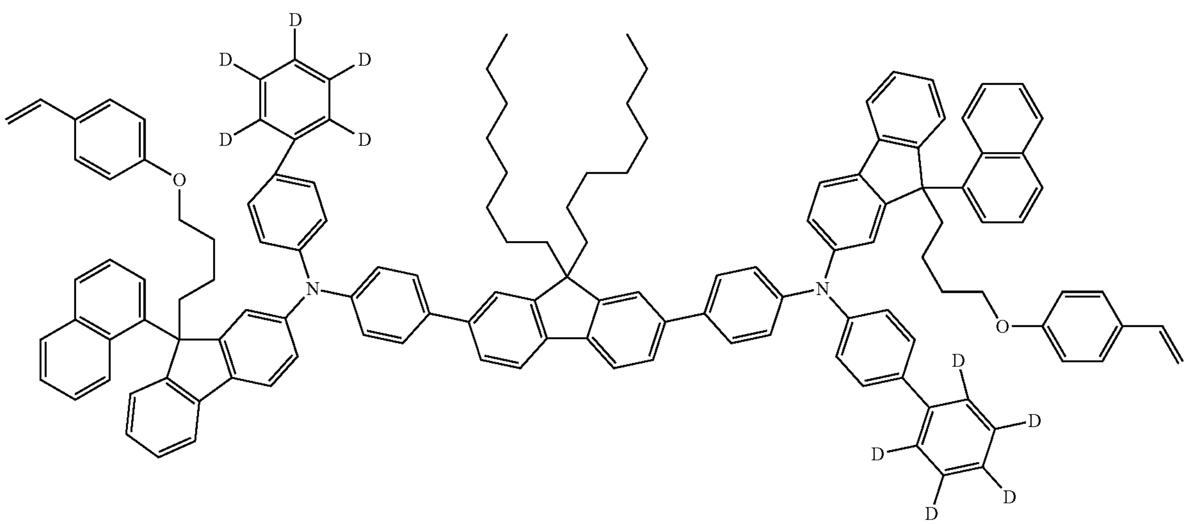
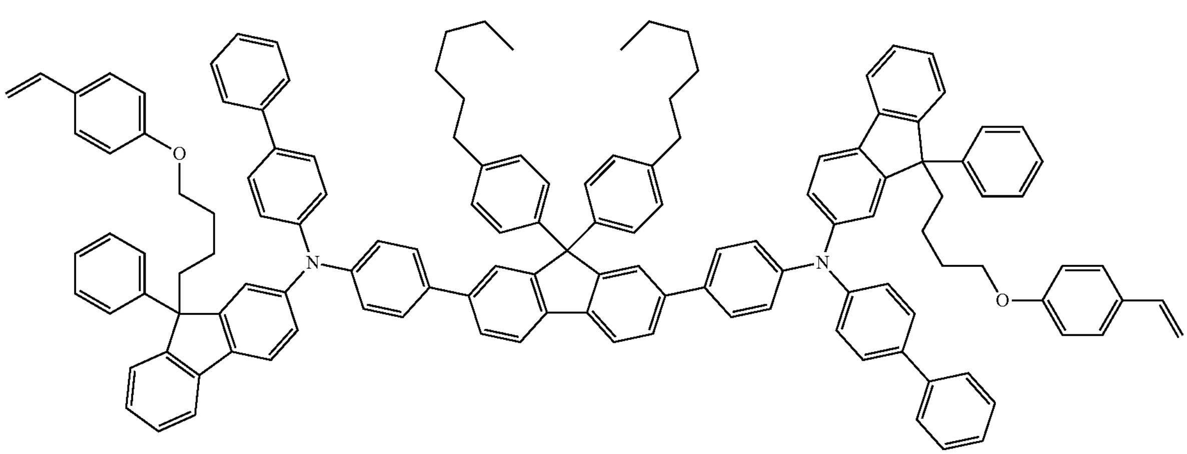

-continued
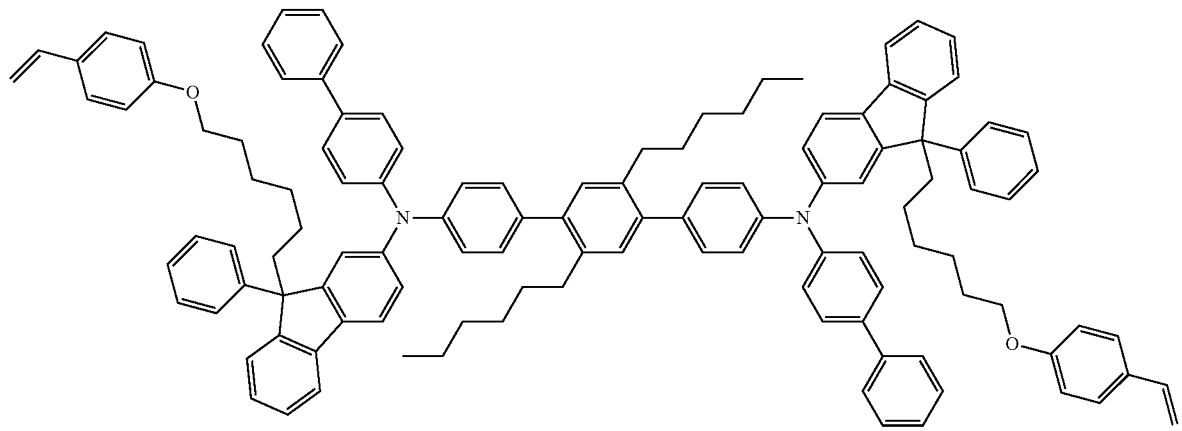
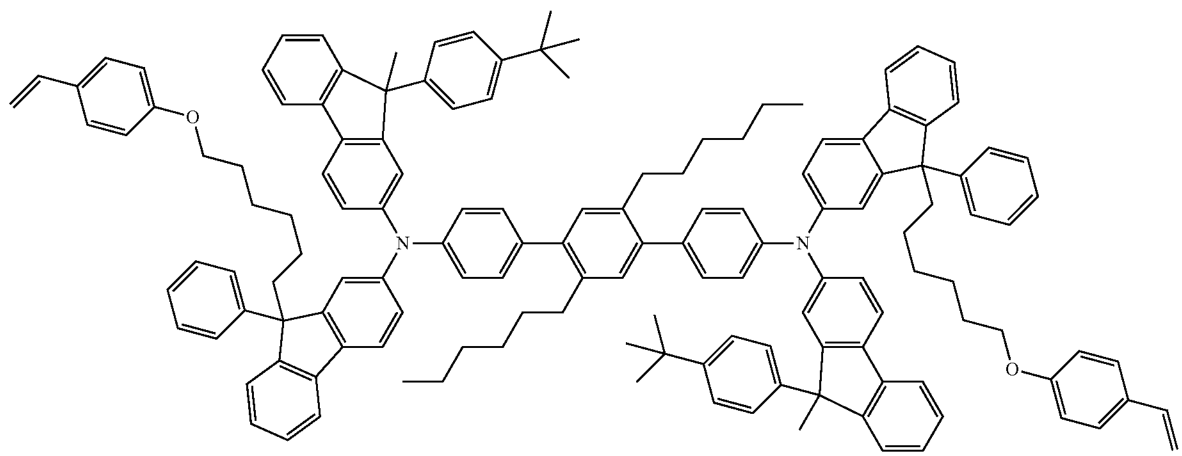
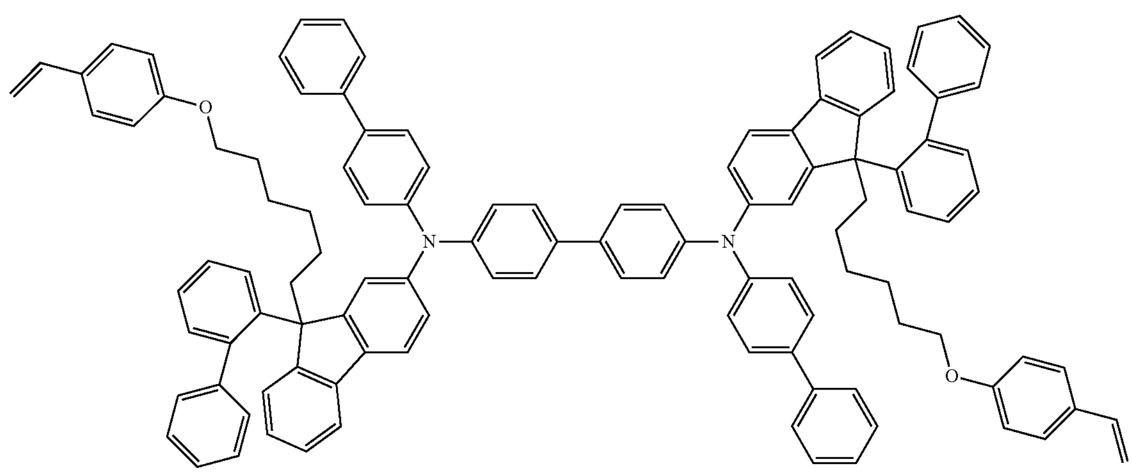

-continued
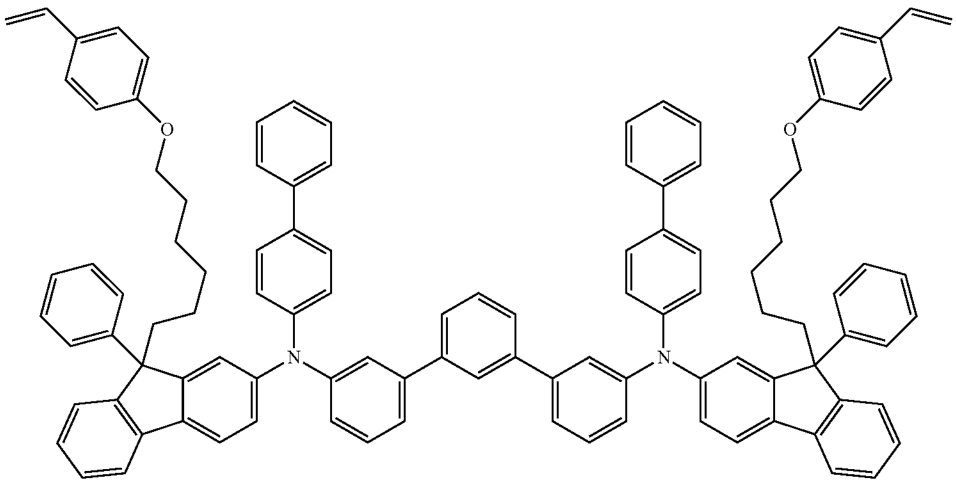
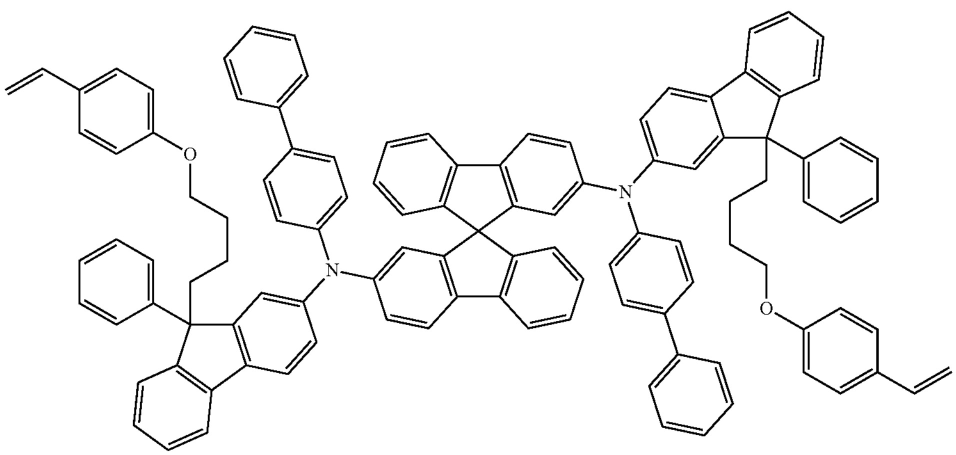
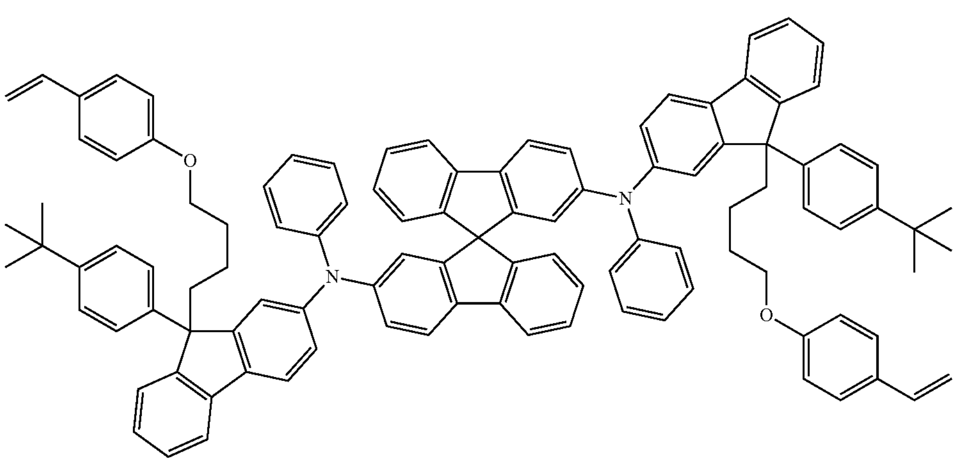

-continued
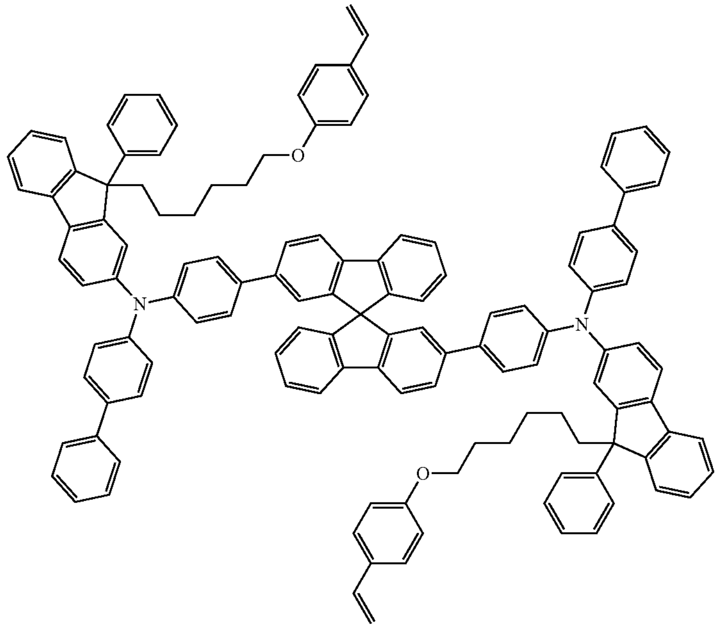
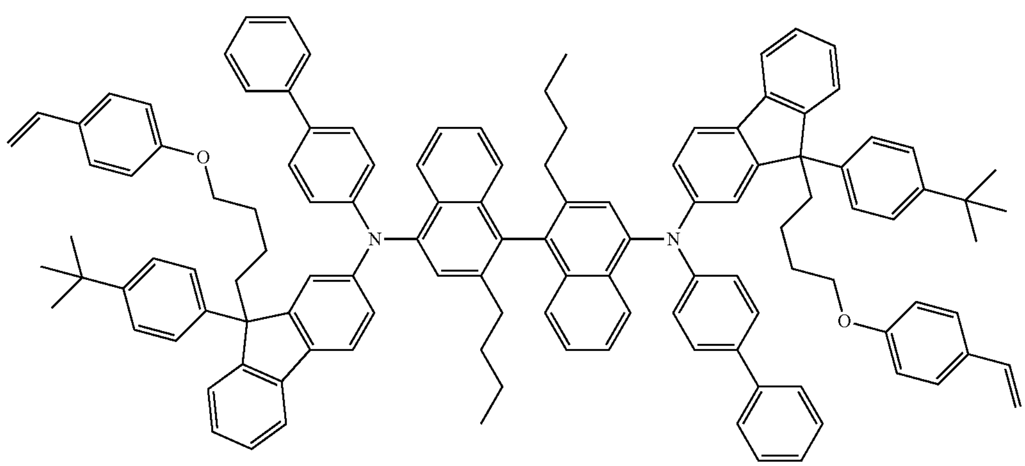
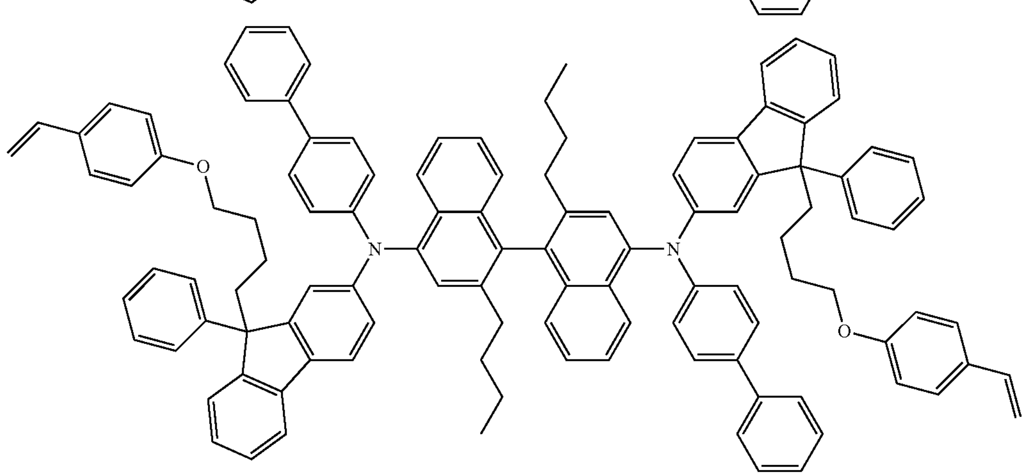

-continued

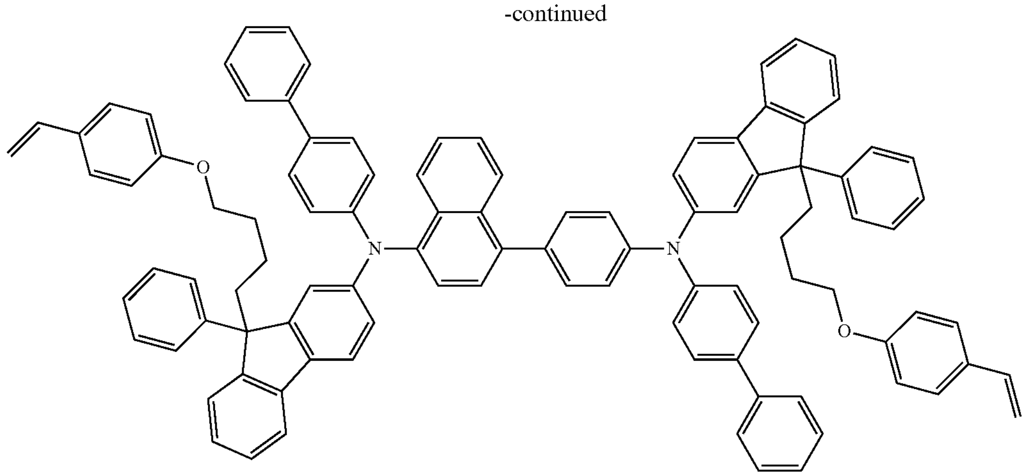

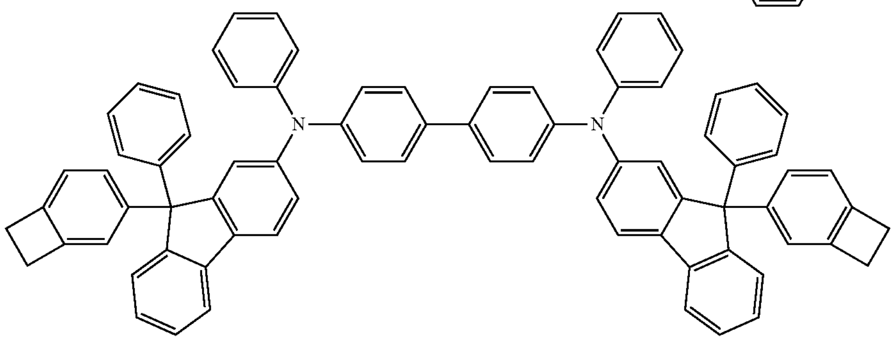

7. An organic light emitting device, comprising:

a first electrode;

a second electrode; and an organic material layer having one or more layers provided between the first electrode and the second electrode, wherein the one or more layers comprise the coating composition of claim 1.

8. The organic light emitting device of claim 7, wherein the organic material layer is a hole transport layer, a hole injection layer, or a layer which simultaneously transports and injects holes.

9. A method for manufacturing an organic light emitting device, the method comprising:

forming a first electrode on a substrate;

forming an organic material layer having one or more layers by depositing the coating composition of claim 1 on the first electrode; and forming a second electrode on the organic material layer.

10. The method of claim 9, wherein forming the organic material layer comprises:

coating the first electrode with the coating composition; and heat-treating or light-treating the coating composition.

* * * * *